(12) United States Patent
Glover et al.

(10) Patent No.: US 7,811,129 B2
(45) Date of Patent: Oct. 12, 2010

(54) ELECTRICAL CONNECTOR SYSTEM

(75) Inventors: Douglas W. Glover, Dauphin, PA (US); Evan C. Wickes, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/474,505

(22) Filed: May 29, 2009

(65) Prior Publication Data

US 2010/0144203 A1 Jun. 10, 2010

Related U.S. Application Data

(60) Provisional application No. 61/200,955, filed on Dec. 5, 2008, provisional application No. 61/205,194, filed on Jan. 16, 2009.

(51) Int. Cl.
*H01R 13/648* (2006.01)

(52) U.S. Cl. .................................. 439/607.07

(58) Field of Classification Search ............ 439/607.07, 439/607.06
See application file for complete search history.

(56) References Cited

U.S. PATENT DOCUMENTS

| | | | |
|---|---|---|---|
| 5,882,227 A | 3/1999 | Neidich | |
| 6,431,914 B1 * | 8/2002 | Billman | 439/607.07 |
| 6,506,076 B2 | 1/2003 | Cohen et al. | |
| 6,676,450 B2 | 1/2004 | Schroll | |
| 6,709,294 B1 * | 3/2004 | Cohen et al. | 439/607.07 |
| 6,899,566 B2 | 5/2005 | Kline et al. | |
| 6,932,626 B2 | 8/2005 | Costello et al. | |
| 7,163,421 B1 | 1/2007 | Cohen et al. | |
| 7,207,807 B2 | 4/2007 | Fogg | |
| 7,217,889 B1 | 5/2007 | Parameswaran et al. | |
| 7,335,063 B2 | 2/2008 | Cohen et al. | |
| 7,371,117 B2 | 5/2008 | Gailus | |
| 7,381,092 B2 | 6/2008 | Nakada | |
| 7,722,401 B2 * | 5/2010 | Kirk et al. | 439/607.07 |
| 2002/0111069 A1 * | 8/2002 | Astbury et al. | 439/608 |
| 2003/0022555 A1 | 1/2003 | Vicich et al. | |
| 2003/0203677 A1 | 10/2003 | Spiegel et al. | |
| 2005/0032430 A1 * | 2/2005 | Otsu et al. | 439/608 |
| 2008/0268708 A1 | 10/2008 | Yamada et al. | |

FOREIGN PATENT DOCUMENTS

| | | |
|---|---|---|
| EP | 1 710 873 A1 | 10/2006 |
| JP | 2000311749 | 11/2000 |

OTHER PUBLICATIONS

European Search Report, European Application No. EP09178099, European Filing Date Apr. 12, 2009.
Office Action for U.S. Appl. No. 12/474,587, mailed Dec. 3, 2009, 7 pgs.

* cited by examiner

*Primary Examiner*—Gary F. Paumen

(57) ABSTRACT

High-speed backplane connectors systems for mounting a substrate that are capable of operating at speeds of up to at least 25 Gbps, while in some implementations also providing pin densities of at least 50 pairs of electrical connectors per inch are disclosed. Implementations of the high-speed connector systems may provide ground shields and/or other ground structures that substantially encapsulate electrical connector pairs, which may be differential electrical connector pairs, in a three-dimensional manner throughout a backplane footprint, a backplane connector, and a daughtercard footprint. These encapsulating ground shields and/or ground structures prevent undesirable propagation of non-traverse, longitudinal, and higher-order modes when the high-speed backplane connector systems operates at frequencies up to at least 30 GHz.

17 Claims, 127 Drawing Sheets

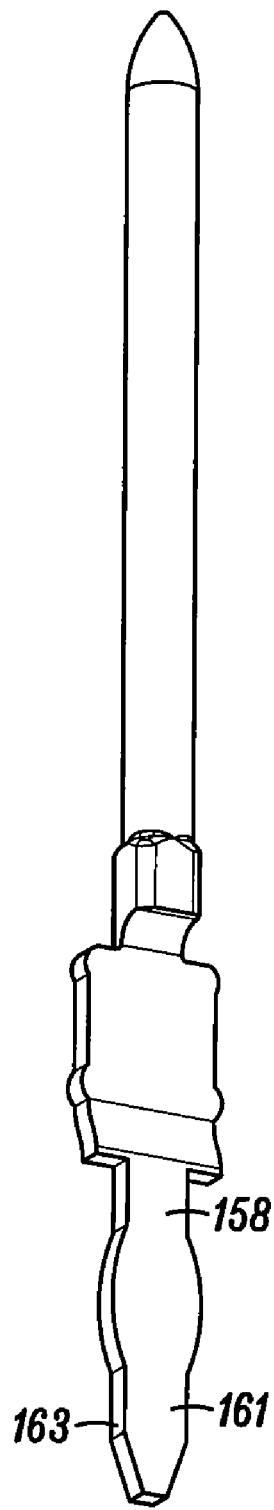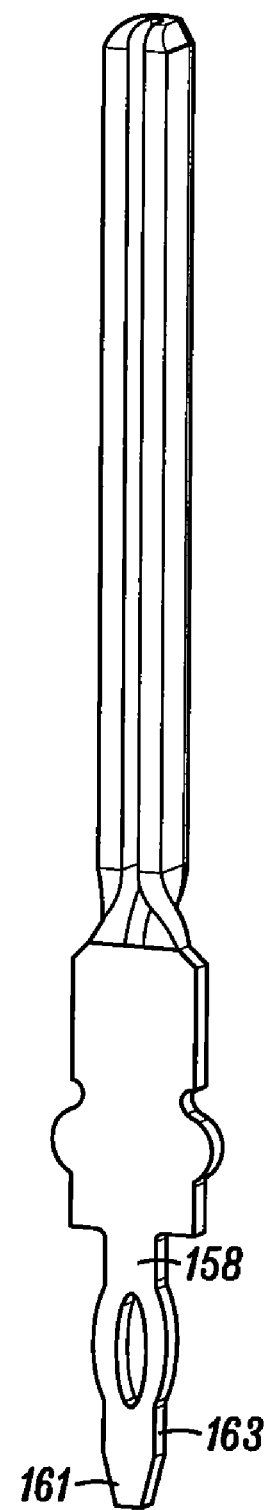
*FIG. 19A*  *FIG. 19B*

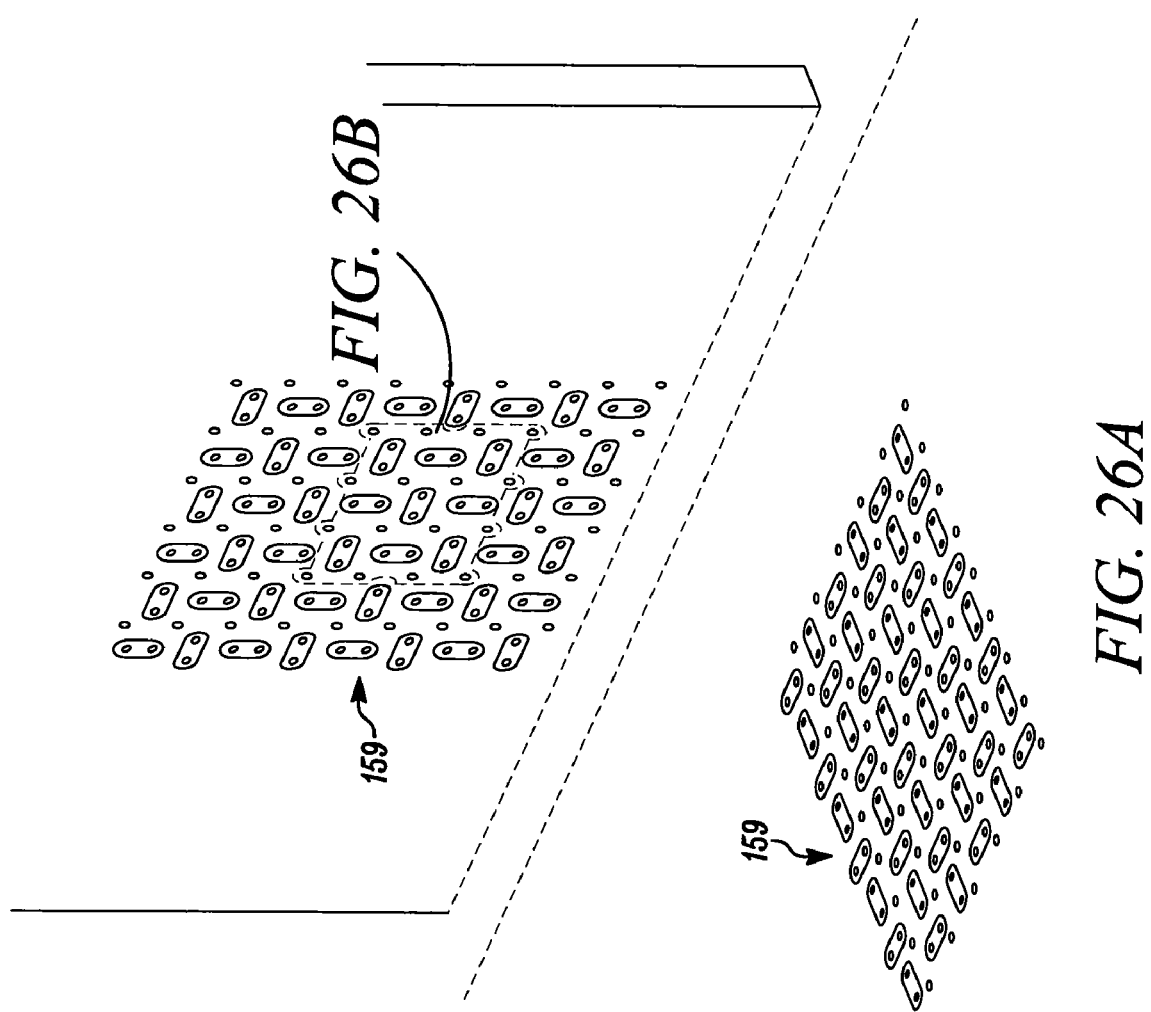

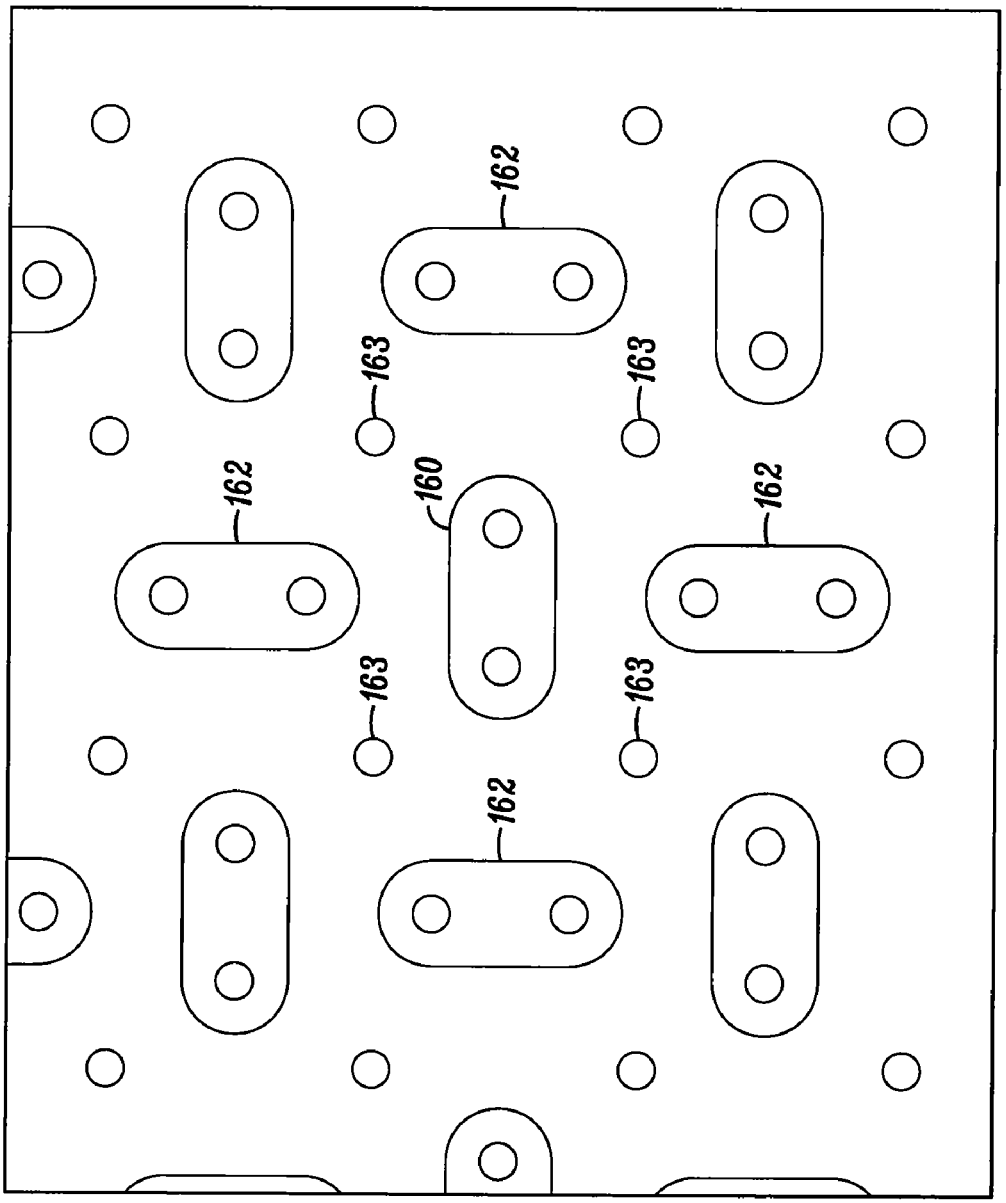

SECTION D-D

ELECTRICAL CONNECTOR SYSTEM

RELATED APPLICATIONS

The present application claims priority to U.S. Provisional Patent Application No. 61/200,955, filed Dec. 5, 2008, and U.S. Provisional Patent Application No. 61/205,194, filed Jan. 16, 2009, the entirety of each of which are hereby incorporated by reference.

The present application is related to U.S. patent application Ser. No. 12/474,568, titled "Electrical Connector System," filed May 29, 2009, the entirety of which is hereby incorporated by reference.

The present application is related to U.S. patent application Ser. No. 12/474,587, titled "Electrical Connector System," filed May 29, 2009, the entirety of which is hereby incorporated by reference.

The present application is related to U.S. patent application Ser. No. 12/474,605, titled "Electrical Connector System," filed May 29, 2009, the entirety of which is hereby incorporated by reference.

The present application is related to U.S. patent application Ser. No. 12/474,545, titled "Electrical Connector System," filed May 29, 2009, the entirety of which is hereby incorporated by reference.

The present application is related to U.S. patent application Ser. No. 12/474,772, titled "Electrical Connector System," filed May 29, 2009, the entirety of which is hereby incorporated by reference.

The present application is related to U.S. patent application Ser. No. 12/474,626, titled "Electrical Connector System," filed May 29, 2009, the entirety of which is hereby incorporated by reference.

The present application is related to U.S. patent application Ser. No. 12/474,674, titled "Electrical Connector System," filed May 29, 2009, the entirety of which is hereby Incorporated by reference.

BACKGROUND

As shown in FIG. 1, backplane connector systems are typically used to connect a first substrate 2, such as a printed circuit board, in parallel (perpendicular) with a second substrate 3, such as another printed circuit board. As the size of electronic components is reduced and electronic components generally become more complex, it is often desirable to fit more components in less space on a circuit board or other substrate. Consequently, it has become desirable to reduce the spacing between electrical terminals within backplane connector systems and to increase the number of electrical terminals housed within backplane connector systems. Accordingly, it is desirable to develop backplane connector systems capable of operating at increased speeds, while also increasing the number of electrical terminals housed within the backplane connector system.

SUMMARY OF THE INVENTION

The high-speed backplane connector systems described below address these desires by providing electrical connector systems for mounting a substrate that are capable of operating at speeds of up to at least 25 Gbps.

In one aspect, an electrical connector system for mounting a substrate is disclosed. The system comprises a plurality of wafer assemblies and a wafer housing to position the wafer assemblies adjacent to one another in the electrical connector system. Each wafer assembly comprises a plurality of electrical contacts, a frame, and a plurality of ground-able contacts. The frame defines a first side and a second side, where the first side defines a plurality of channels, each channel comprising a conductive surface and each channel adapted to receive at least one electrical contact of the plurality of electrical contacts. The frame further defines a plurality of apertures extending into the conductive surfaces of the plurality of channels, the apertures spaced apart from one another and positioned between the channels of the plurality of channels. Each ground-able contact of the plurality of ground-able contacts is positioned within an aperture of the plurality of apertures.

In another aspect, a wafer assembly is disclosed. The wafer assembly comprises a frame, a plurality of ground-able contacts, and a plurality of electrical contacts positioned in a signal lead shell. The frame defines a first side and a second side, the first side defining a plurality of channels, each channel comprising a conductive surface and each channel adapted to receive at least a portion of the signal lead shell holding at least two electrical contacts. Each ground-able contact is positioned within an aperture of the plurality of apertures

BRIEF DESCRIPTION OF THE DRAWINGS

FIG. 19a illustrates one implementation of a signal pin of a header unit.

FIG. 19b illustrates another implementation of a signal pin of a header unit.

FIG. 26a illustrates a noise-cancelling footprint of one implementation of a high-speed backplane connector system.

FIG. 26b is an enlarged view of a portion of the noise-cancelling footprint of FIG. 26a.

FIG. 27b illustrates a noise-cancelling footprint of the mounting face of the header unit of FIG. 27a.

FIG. 28b illustrates an enlarged view of the substrate footprint of FIG. 28a.

FIG. 29b illustrates a wafer housing for use with the header unit of FIG. 28a.

FIG. 30b is an enlarged view of a portion of a noise-cancelling footprint of the mounting end of the plurality of wafer assemblies illustrates in FIG. 29a.

FIG. 52c is a perspective view of the high-speed backplane connector of FIG. 41 with the mounting-face organizer of FIG. 52a.

FIG. 53b illustrates an air gap at a mounting end of a plurality of wafer assemblies created by a plurality of projections extending through the mounting-face organizer of FIG. 53a.

FIGS. 53c and 53d are additional illustrations of a plurality of projections extending through the mounting face organizer of FIG. 53a.

FIG. 62 illustrates a ground shield and plurality of wafer assemblies mating with a header unit.

FIG. 63a is a performance plot illustrating insertion loss vs. frequency for the high-speed backplane connector system of FIG. 55.

FIG. 63b is a performance plot illustrating return loss vs. frequency for the high-speed backplane connector system of FIG. 55.

FIG. 63c is a performance plot illustrating near-end crosstalk noise vs. frequency for the high-speed backplane connector system of FIG. 55.

FIG. 63d is a performance plot illustrating far-end crosstalk noise vs. frequency for the high-speed connector system of FIG. 55.

FIG. 64 is an illustration of a mating end of a plurality of wafer assemblies.

FIG. 65 is another illustration of a mating end of a plurality of wafer assemblies.

FIG. 66a is a perspective view of a header assembly.

FIG. 66b is a side view of the header assembly of FIG. 66a.

FIG. 67 illustrates a mounting pin layout of the header assembly of FIGS. 66a and 66b.

FIG. 68 is an illustration of a mating end of one implementations of a plurality of wafer assemblies.

FIG. 69 is an illustration of a mating end of another implementation of a plurality of wafer assemblies.

Figure 70:
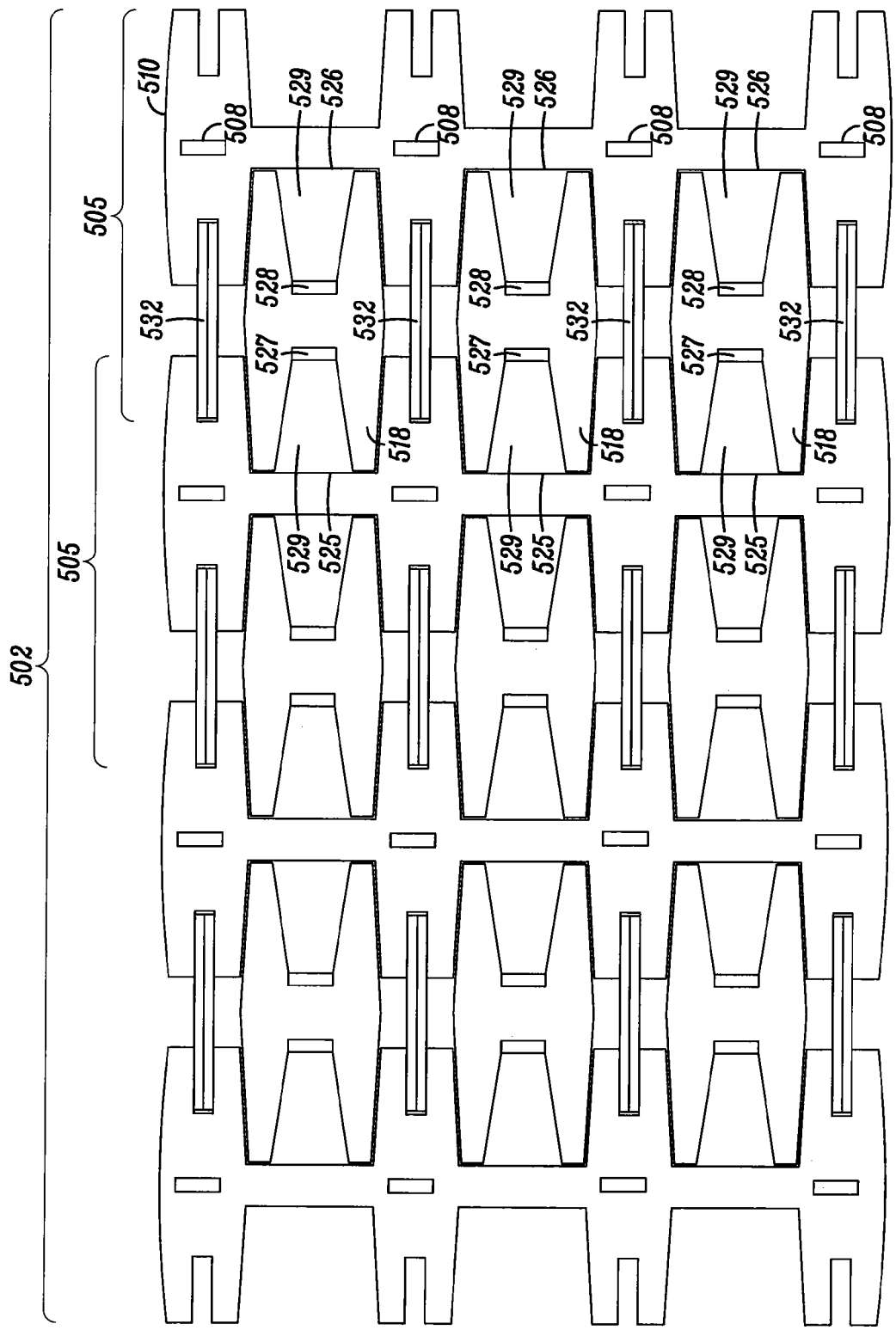

FIG. 70 is an illustration of a mating end of yet another implementation of a plurality of wafer assemblies.

Figure 71A:
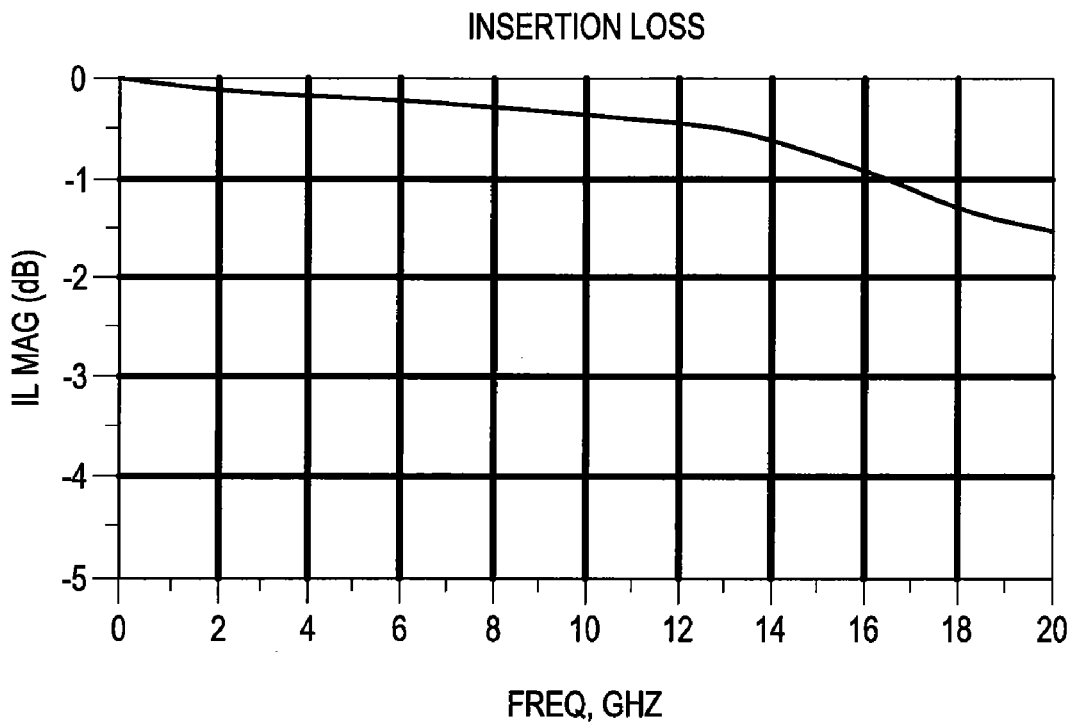

FIG. 71a is a performance plot illustrating insertion loss vs. frequency for a high-speed backplane connector system including the wafer assembly design of FIGS. 66-70.

Figure 71B:
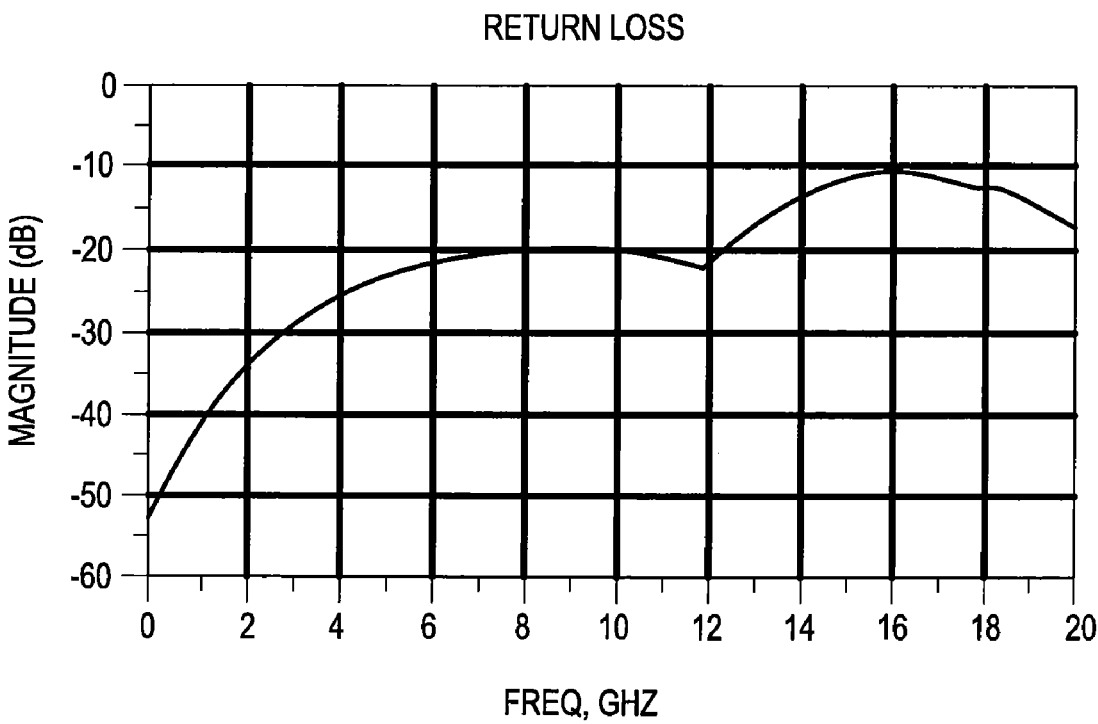

FIG. 71b is a performance plot illustrating return loss vs. frequency for the high-speed backplane connector system including the wafer assembly design of FIGS. 66-70.

Figure 71C:
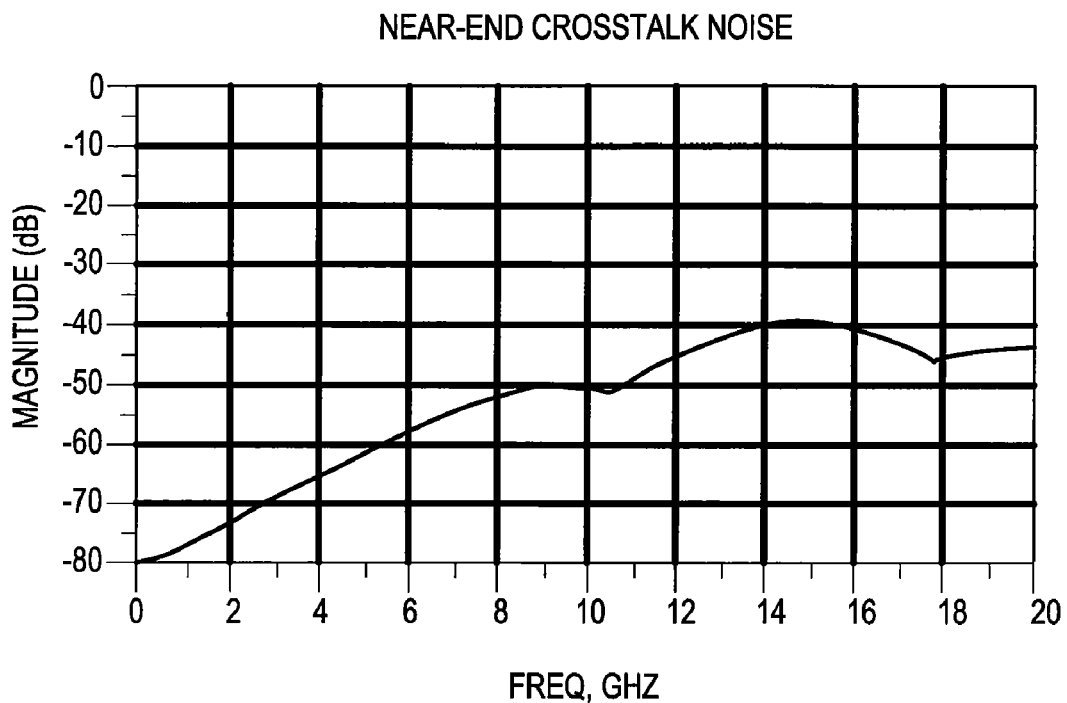

FIG. 71c is a performance plot illustrating near-end crosstalk noise vs. frequency for the high-speed backplane connector system including the wafer assembly design of FIGS. 66-70.

Figure 71D:
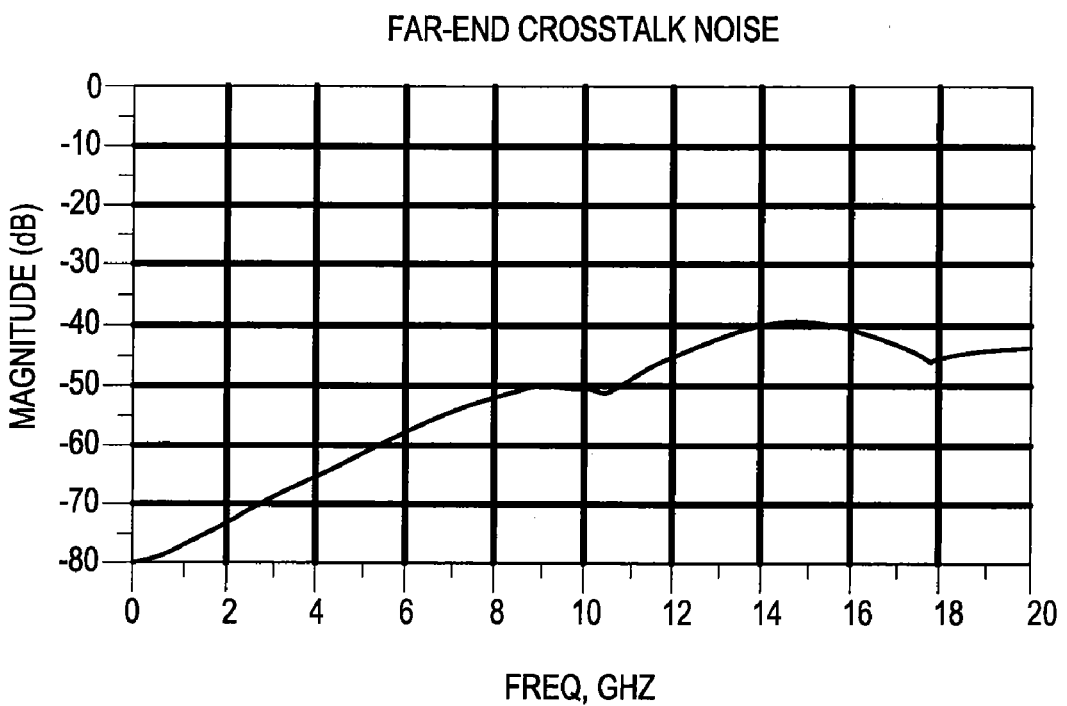

FIG. 71d is a performance plot illustrating far-end crosstalk noise vs. frequency for the high-speed connector system including the wafer assembly design of FIGS. 66-70.

DETAILED DESCRIPTION

The present disclosure is directed to high-speed backplane connectors systems for mounting a substrate that are capable of operating at speeds of up to at least 25 Gbps, while in some implementations also providing pin densities of at least 50 pairs of electrical connectors per inch. As will be explained in more detail below, implementations of the disclosed high-speed connector systems may provide ground shields and/or other ground structures that substantially encapsulate electrical connector pairs, which may be differential electrical connector pairs, in a three-dimensional manner throughout a backplane footprint, a backplane connector, and a daughter-card footprint. These encapsulating ground shields and/or ground structures, along with a dielectric filler of the differential cavities surrounding the electrical connector pairs themselves, prevent undesirable propagation of non-traverse, longitudinal, and higher-order modes when the high-speed backplane connector systems operates at frequencies up to at least 30 GHz.

Further, as explained in more detail below, implementations of the disclosed high-speed connector systems may provide substantially identical geometry between each connector of an electrical connector pair to prevent longitudinal moding.

A first high-speed backplane connector system 100 is described with respect to FIGS. 2-32. The high-speed backplane connector 100 includes a plurality of wafer assemblies 102 that, as explained in more detail below, are positioned adjacent to one another within the connector system 100 by a wafer housing 104.

Each wafer assembly 106 of the plurality of wafer assemblies 102 includes a center frame 108, a first array of electrical contacts 110 (also known as a first lead frame assembly), a second array of electrical contacts 112 (also known as a second lead frame assembly), a plurality of ground tabs 132, and an organizer 134. In some implementations, the center frame 108 comprises a plated plastic or diecast ground wafer such as tin (Sn) over nickel (Ni) plated or a zinc (Zn) die cast, and the first and second arrays of electrical contacts 110, 112 comprise phosphor bronze and gold (Au) or tin (Sn) over nickel (Ni) plating. However, in other implementations, the center frame 108 may comprise an aluminum (Al) die cast, a conductive polymer, a metal injection molding, or any other type of metal; the first and second arrays of electrical contacts 110, 112 may comprise any copper (Cu) alloy material; and the platings could be any noble metal such as Pd or an alloy such as Pd—Ni or Au flashed Pd in the contact area, tin (Sn) or nickel (Ni) in the mounting area, and nickel (Ni) in the underplating or base plating.

The center frame 108 defines a first side 114 and a second side 116 opposing the first side 114. The first side 114 comprises a conductive surface that defines a plurality of first channels 118. In some implementations, each channel of the plurality of first channels 118 is lined with an insulation layer 119, such as an overmolded plastic dielectric, so that when the first array of electrical contacts 110 is positioned substantially within the plurality of first channels 118, the insulation layer 119 electrically isolates the electrical contacts from the conductive surface of the first side 114.

Similarly, the second side 116 also comprises a conductive surface that defines a plurality of second channels 120. As with the plurality of first channels 118, in some implementations, each channel of the plurality of second channels 120 is lined with an insulation layer 121, such as an overmolded plastic dielectric, so that when the second array of electrical contacts 112 is positioned substantially within the plurality of second channels 120, the insulation layer 121 electrically isolates the electrical contacts from the conductive surface of the second side 116.

Figure 7A:
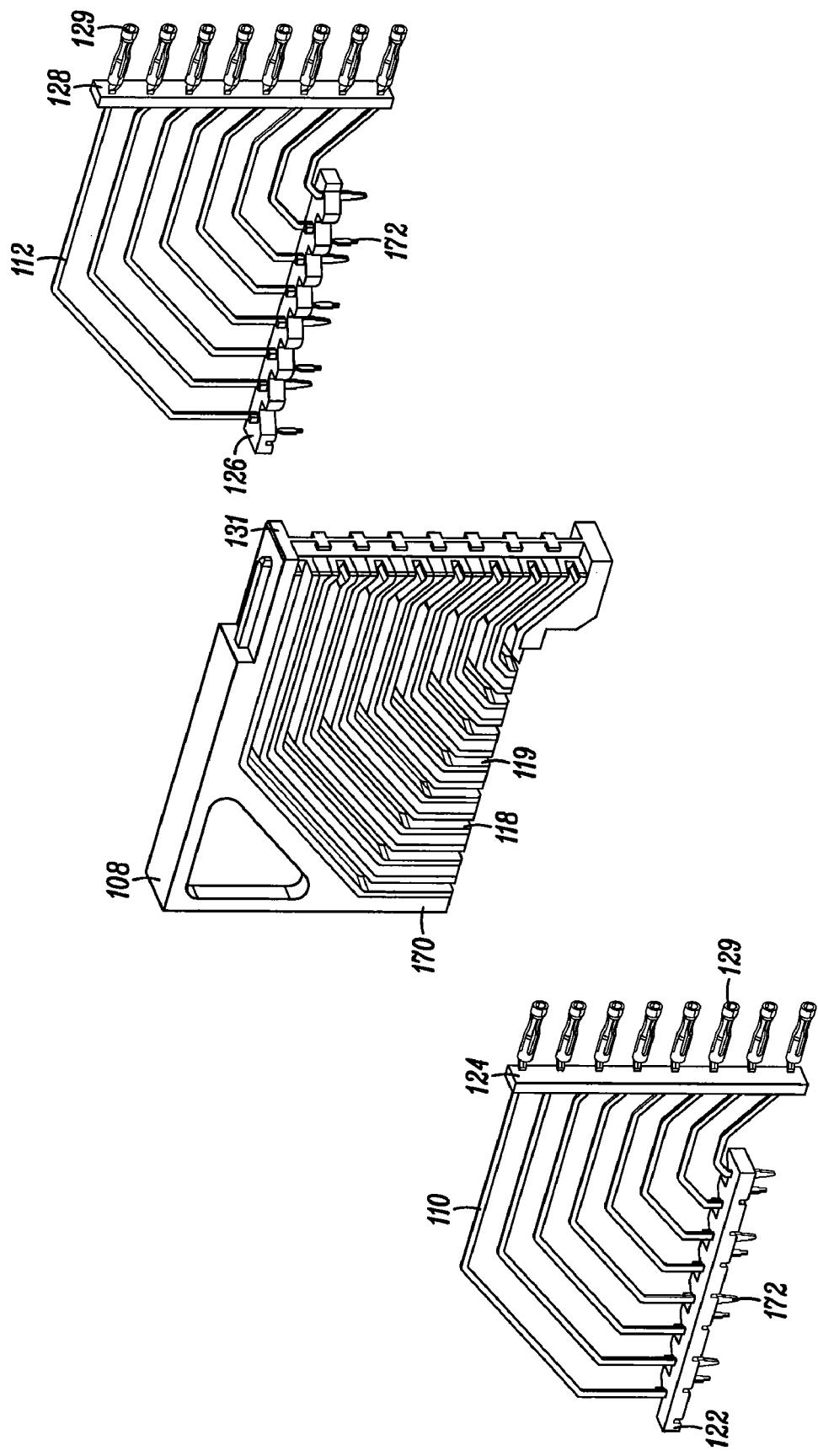
FIG. 7a is a partially exploded view of the wafer assembly of FIG. 4.
Figure 7B:
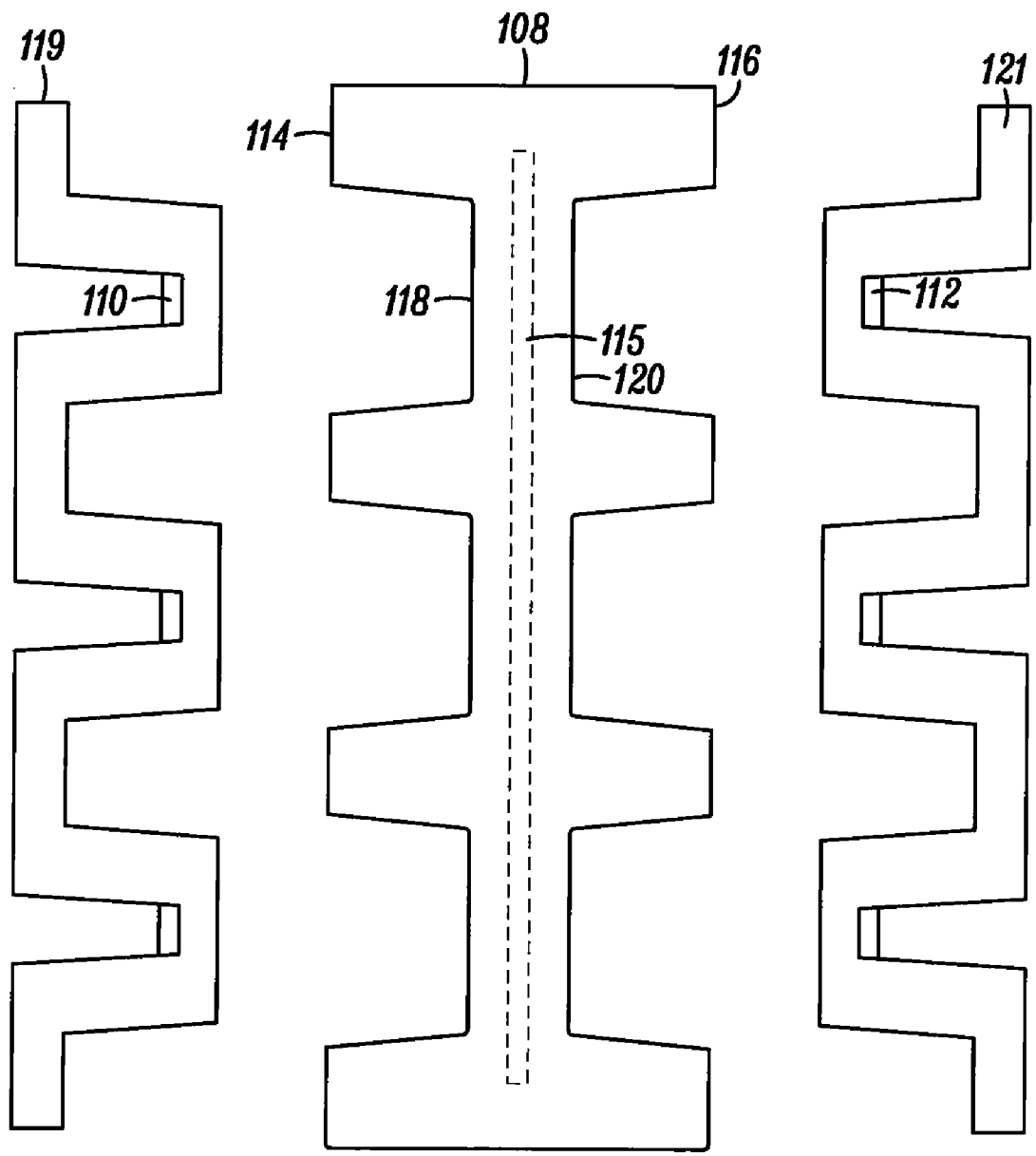
FIG. 7b is a cross-sectional view of a center frame.

As shown in FIG. 7b, in some implementations, the centerframe includes an embedded conductive shield 115 positioned between the first and second sides 114, 116. The conductive shield 115 is electrically connected to the conductive surfaces of the first side 114 and the conductive surface of the second side 116.

Figure 4:
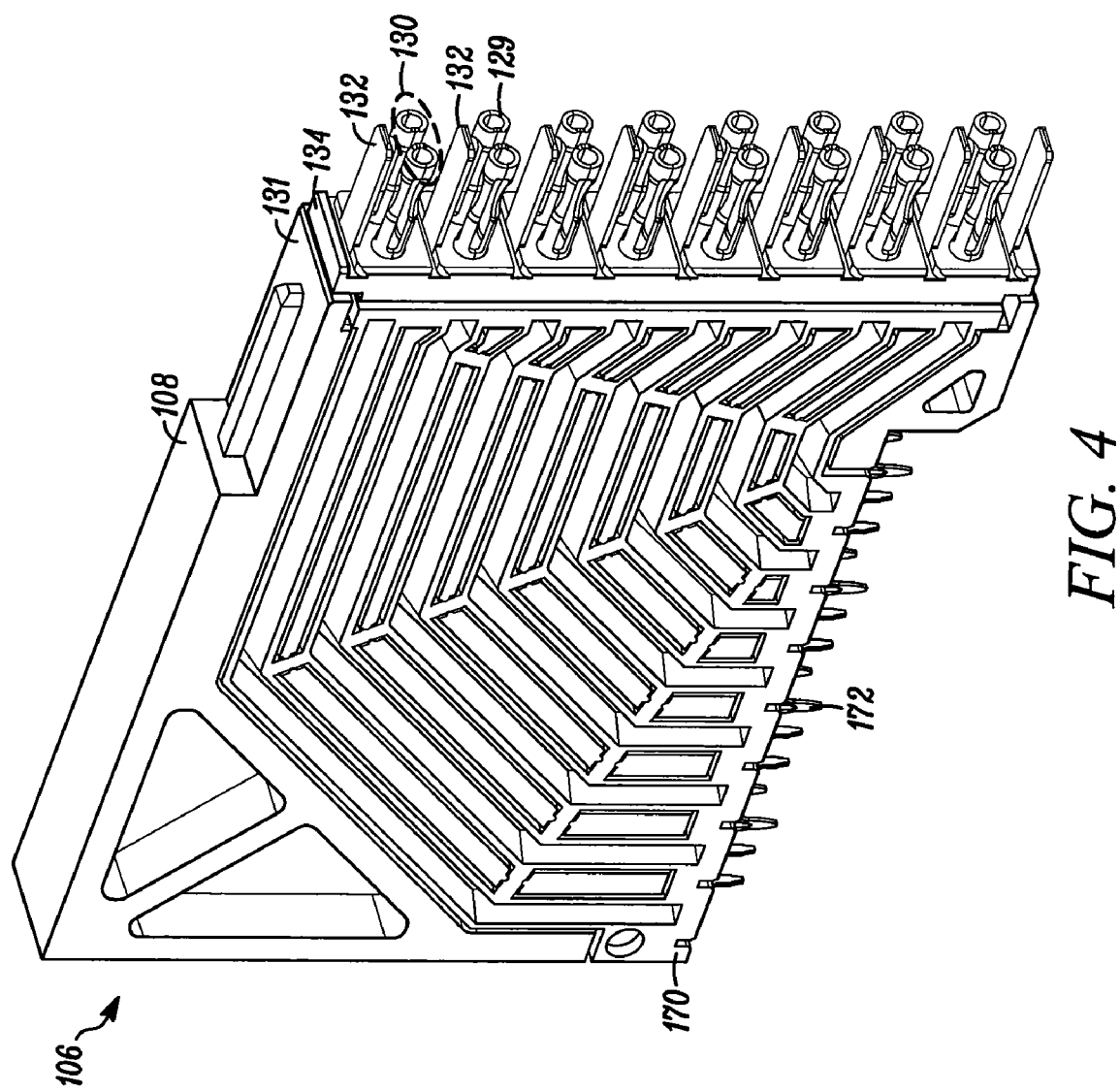
FIG. 4 is a perspective view of a wafer assembly.
Figure 5:
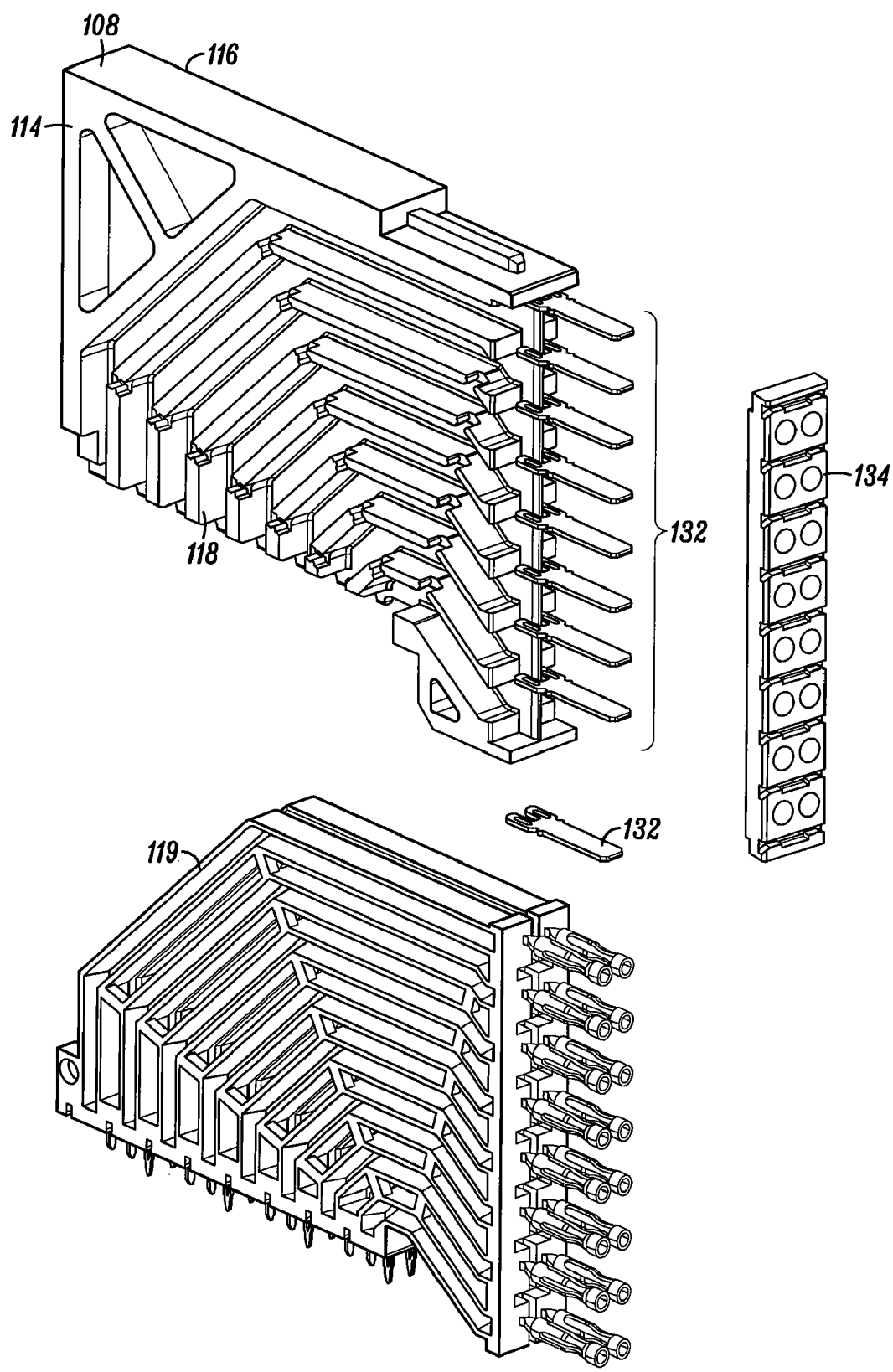
FIG. 5 is a partially exploded view of the wafer assembly of FIG. 4.
Figure 6A:
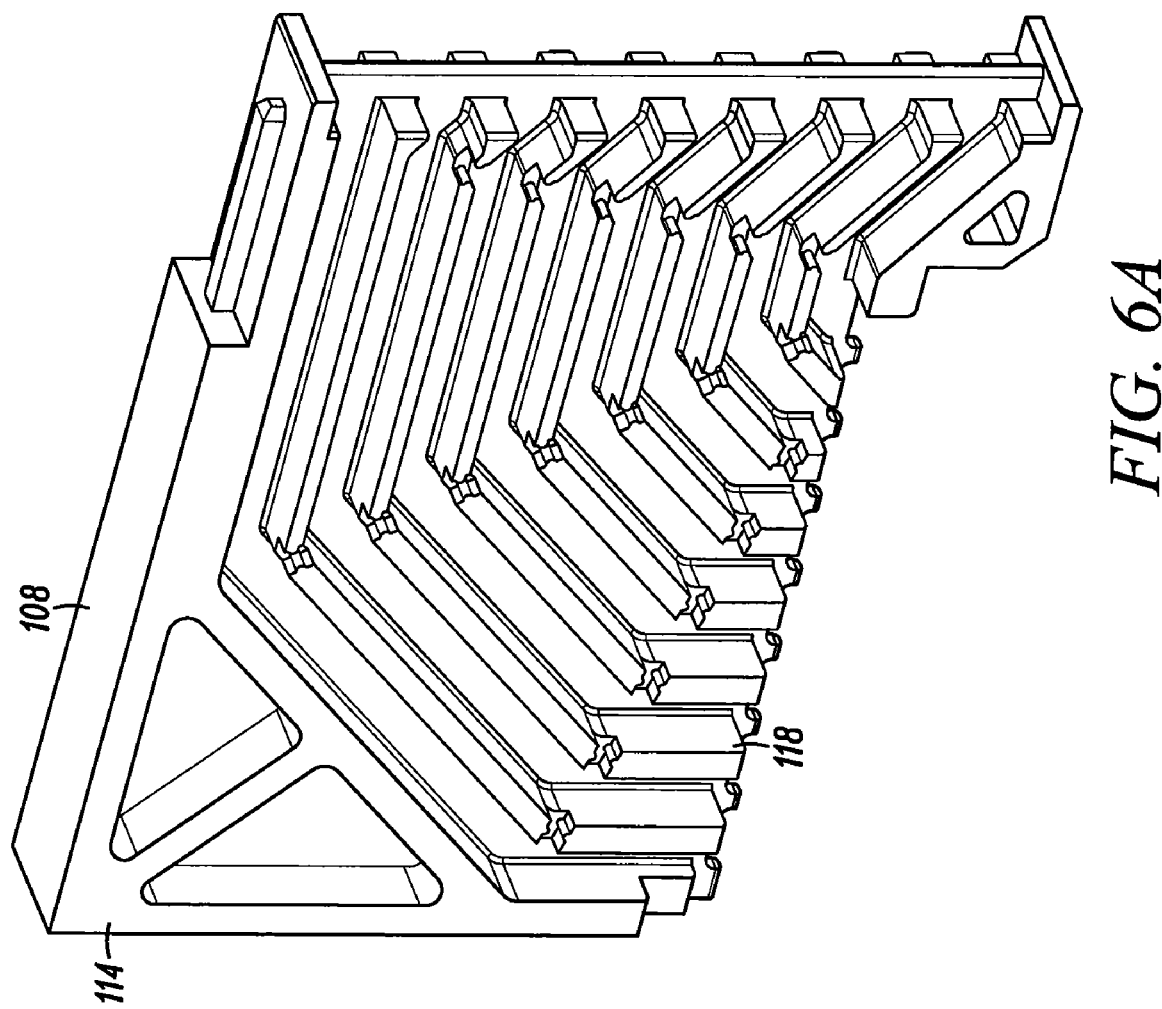
FIG. 6a is a perspective view of a center frame of a wafer assembly.
Figure 6B:
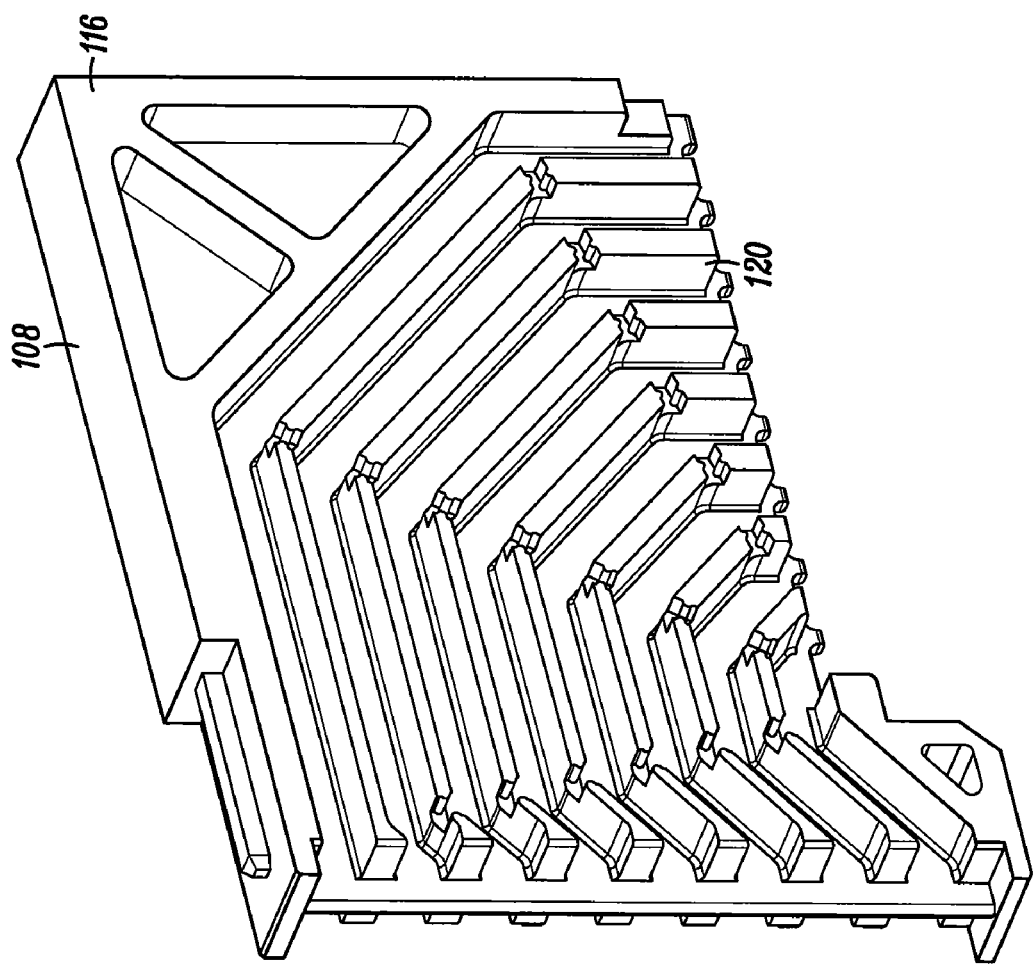
FIG. 6b is another perspective view of a center frame of a wafer assembly.

Referring to FIG. 4, when assembled, the first array of electrical contacts 110 is positioned substantially within the plurality of channels 118 of the first side 114 of the center frame 108 and the second array of electrical contacts 112 is positioned substantially within the plurality of channels 120 of the second side 116 of the center frame 108. When positioned within the plurality of channels 118, 120, each electrical contact of the first array of electrical contacts 110 is positioned adjacent to an electrical contact of the second array of electrical contacts 112. In some implementations, the first and second arrays of electrical contacts 110, 112 are positioned in the plurality of channels 118, 120 such that a distance between adjacent electrical contacts is substantially the same throughout the wafer assembly 106. Together, the adjacent electrical contacts of the first and second arrays of electrical contacts 110, 112 form an electrical contact pair 130. In some implementations, the electrical contact pair 130 may be a differential pair of electrical contacts.

Figure 8:
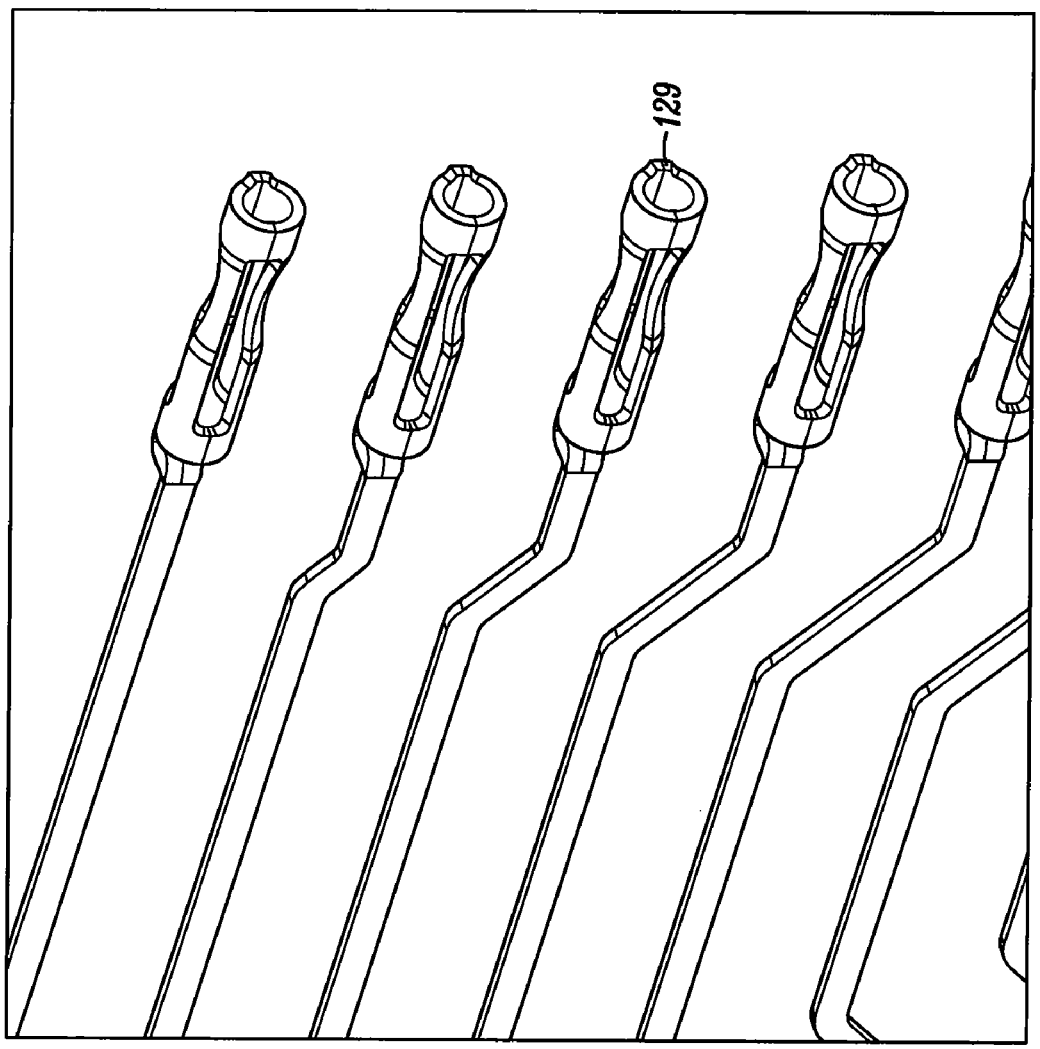
FIG. 8 illustrates a closed-band electrical mating connector.
Figure 9A:
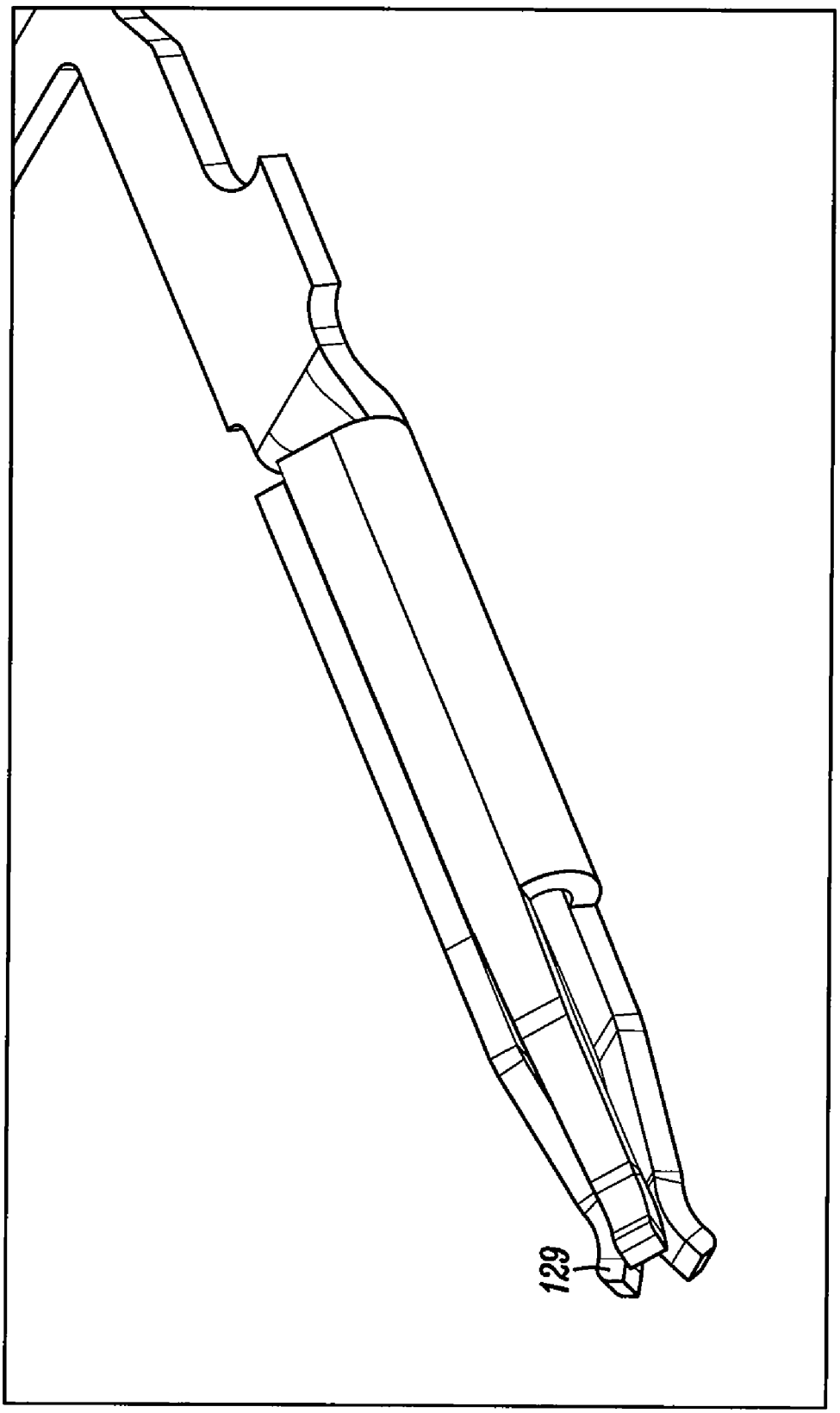
FIG. 9a illustrates a tri-beam electrical mating connector.
Figure 9B:
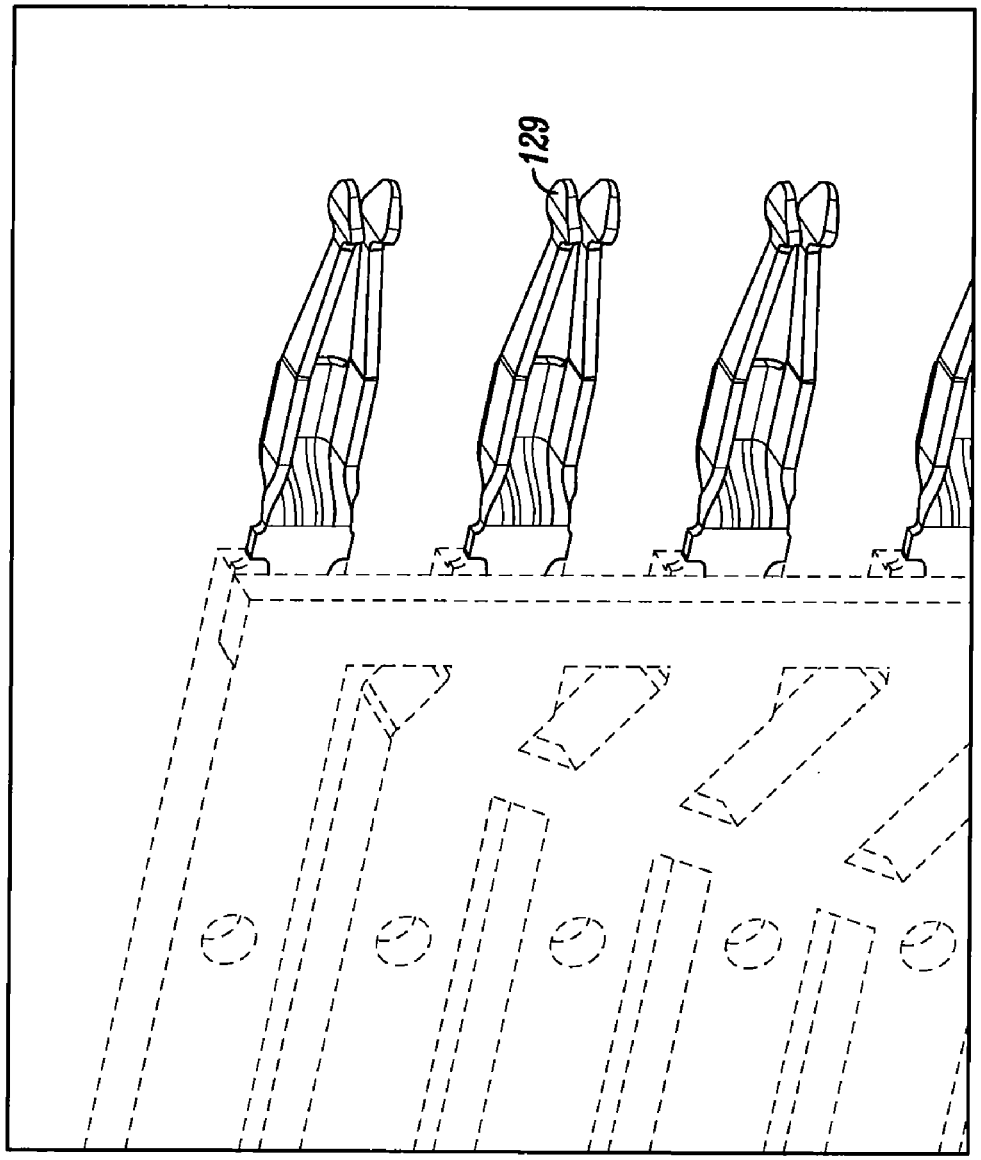
FIG. 9b illustrates a dual-beam electrical mating connector.
Figure 9C:
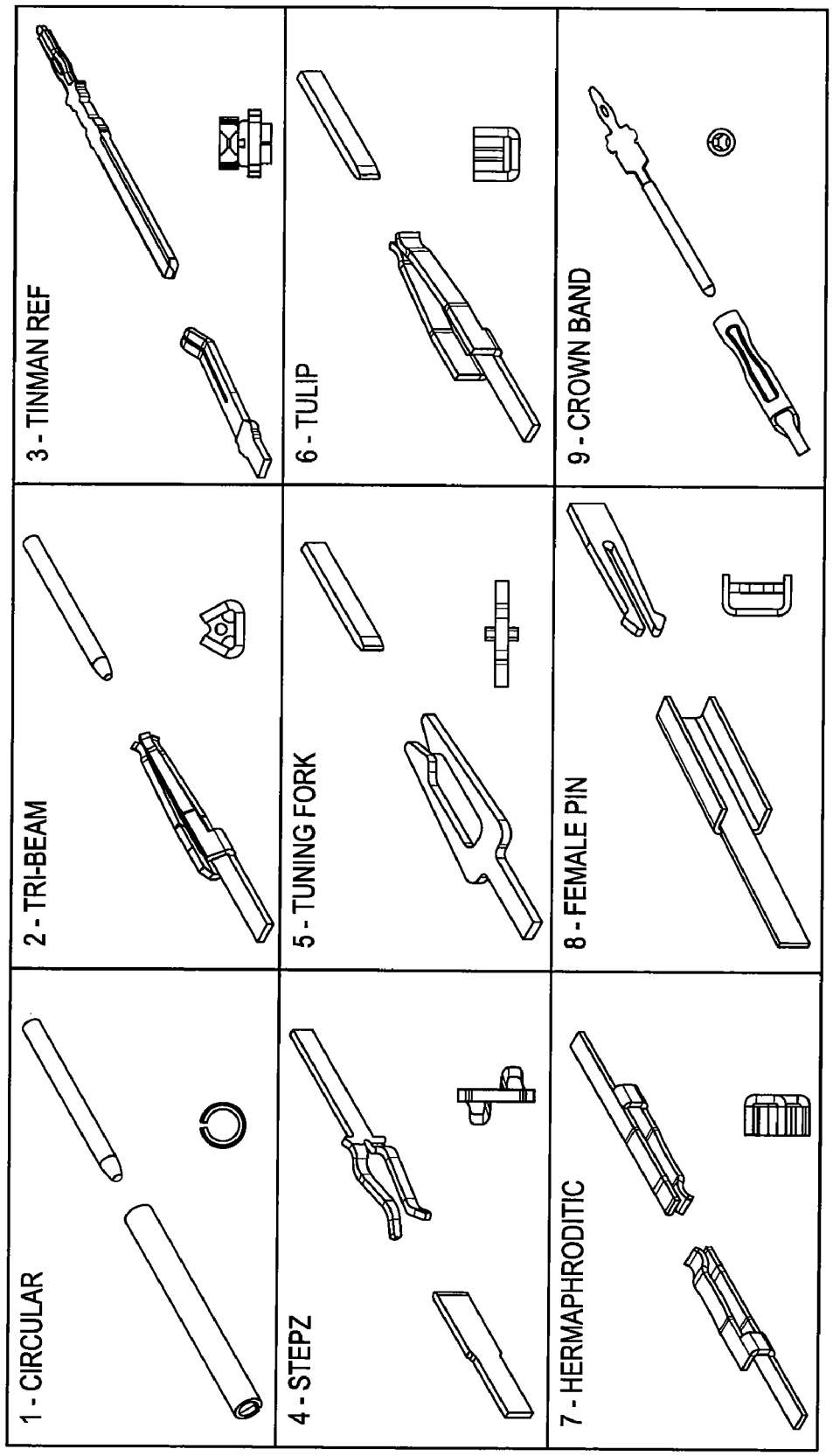
FIG. 9c illustrates additional implementations of electrical mating connectors.

When positioned within the plurality of channels 118, 120, electrical mating connectors 129 of the first and second array of electrical contacts 110, 112 extend away from a mating end 131 of the wafer assembly 106. In some implementations, the electrical mating connectors 129 are closed-band shaped as shown in FIGS. 7a and 8, where in other implementations, the electrical mating connectors 129 are tri-beam shaped as shown in FIG. 9a or dual-beam shaped as shown in FIG. 9b. Other mating connector styles could have a multiplicity of beams. Examples of yet other implementations of electrical mating connectors 129 are shown in FIG. 9c.

It will be appreciated that the tri-beam shaped, dual-beam shaped, or closed-band shaped electrical mating connectors 129 provide improved reliability in a dusty environment; provide improved performance in a non-stable environment, such as an environment with vibration or physical shock; result in lower contact resistance due to parallel electrical paths; and the closed-band or tri-beam shaped arrangements provide improved electromagnetic properties due to the fact energy tends to radiate from sharp corners of electrical mating connectors 129 with a boxier geometry.

Figure 9D:
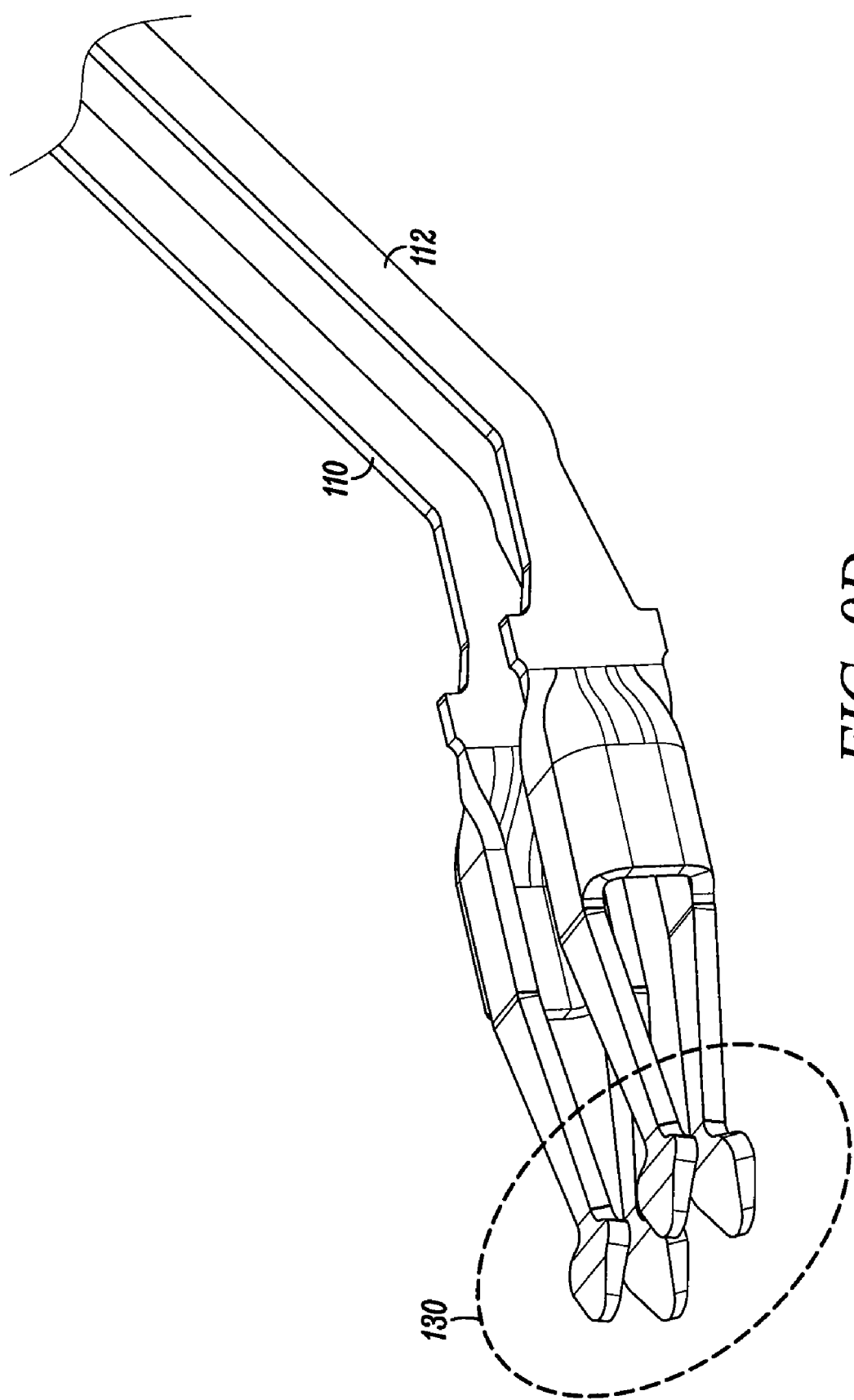
FIG. 9d illustrates a mirrored pair of electrical mating connectors.
Figure 9E:
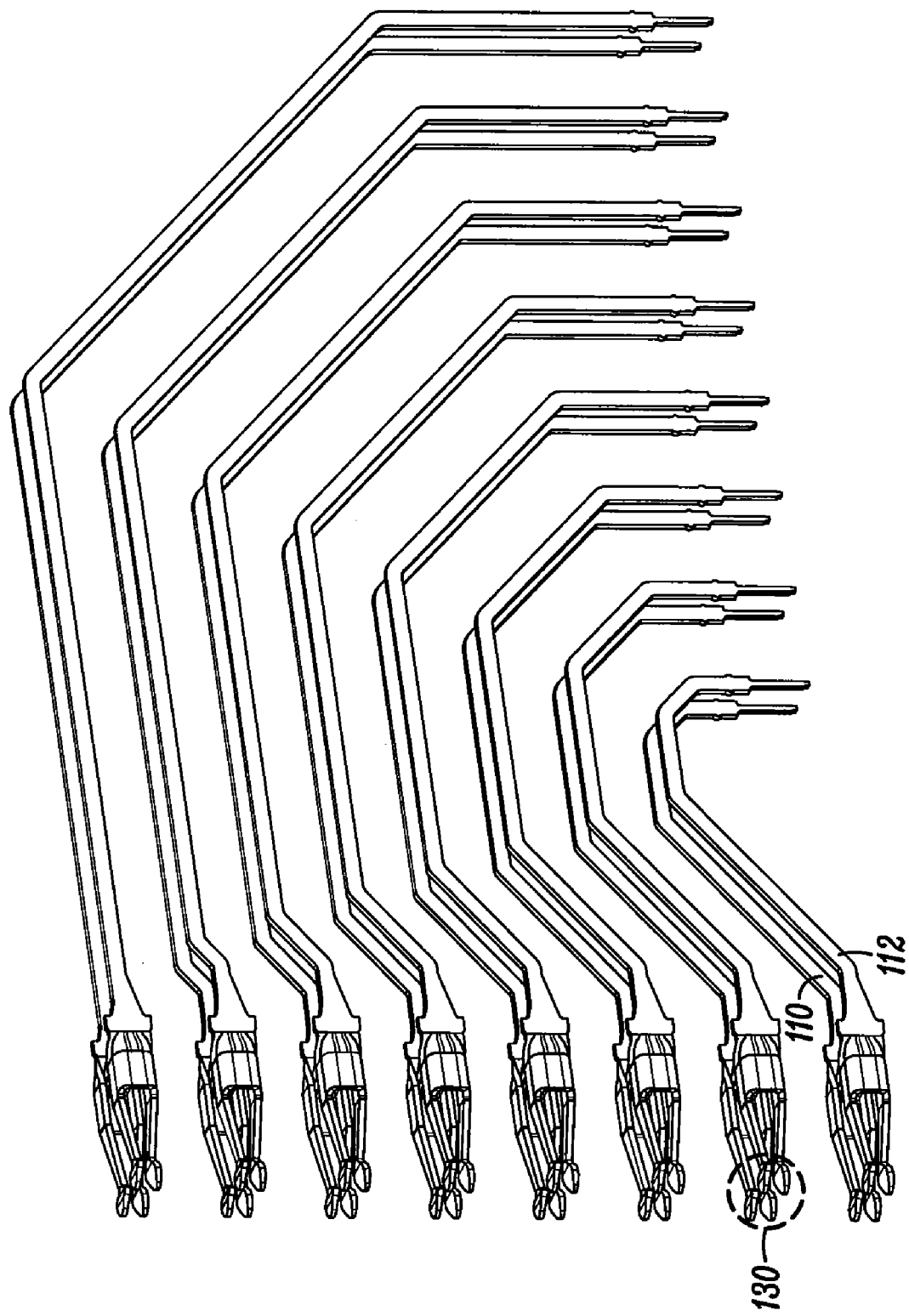
FIG. 9e illustrates a plurality of mirrored pairs of electrical mating connectors.

Referring to FIGS. 9d and 9e, in some implementations, for each electrical contact pair 130, the electrical contact of the first array of electrical contacts 110 mirrors the adjacent electrical contact of the second array of electrical contacts 112. It will be appreciated that mirroring the electrical contacts of the electrical contact pair provides advantages in manufacturing as well as column-to-column consistency for high-speed electrical performance, while still providing a unique structure in pairs of two columns.

When positioned within the plurality of channels 118, 120, substrate engagement elements 172, such as electrical contact mounting pins, of the first and second array of electrical contacts 110, 112 also extend away from a mounting end 170 of the wafer assembly 106.

The first array of electrical contacts 110 includes a first spacer 122 and a second spacer 124 to space each electrical contact appropriately for insertion substantially within the plurality of first channels 118. Similarly, the second array of electrical contacts 112 includes a first spacer 126 and a second spacer 128 to space each electrical contact appropriately for insertion within the plurality of second channels 120. In some implementations, the first and second spacers 122, 124 of the first array of electrical contacts 110 and the first and second spacers 126, 128 of the second array of electrical contacts 112 comprise molded plastic. The first and second arrays of electrical contacts 110, 112 are substantially positioned within the plurality of channels 118, 120, the first spacer 122 of the first array of electrical contacts 110 abuts the first spacer 126 of the second array of electrical contacts 112.

In some implementations the first spacer 122 of the first array of electrical contacts 110 may define a tooth-shaped side, or a wave-shaped side, and the first spacer 126 of the second array of electrical contacts may define a complementary tooth-shaped side, or a complementary wave-shaped side, so that when the first spacers 122, 126 abut, the complementary sides of the first spacers 122, 126 engage and mate.

Figure 10:
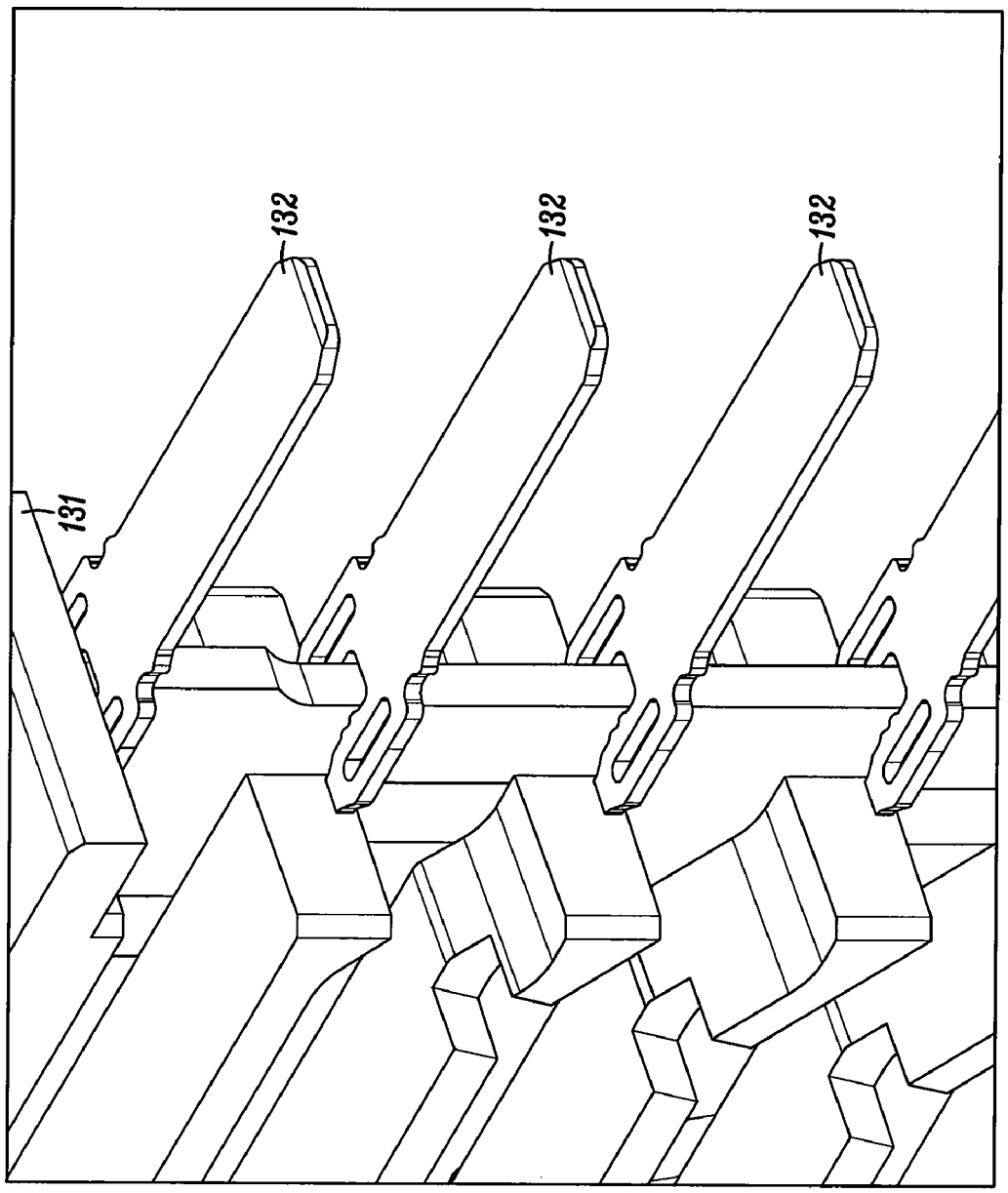
FIG. 10 illustrates a plurality of ground tabs.
Figure 11:
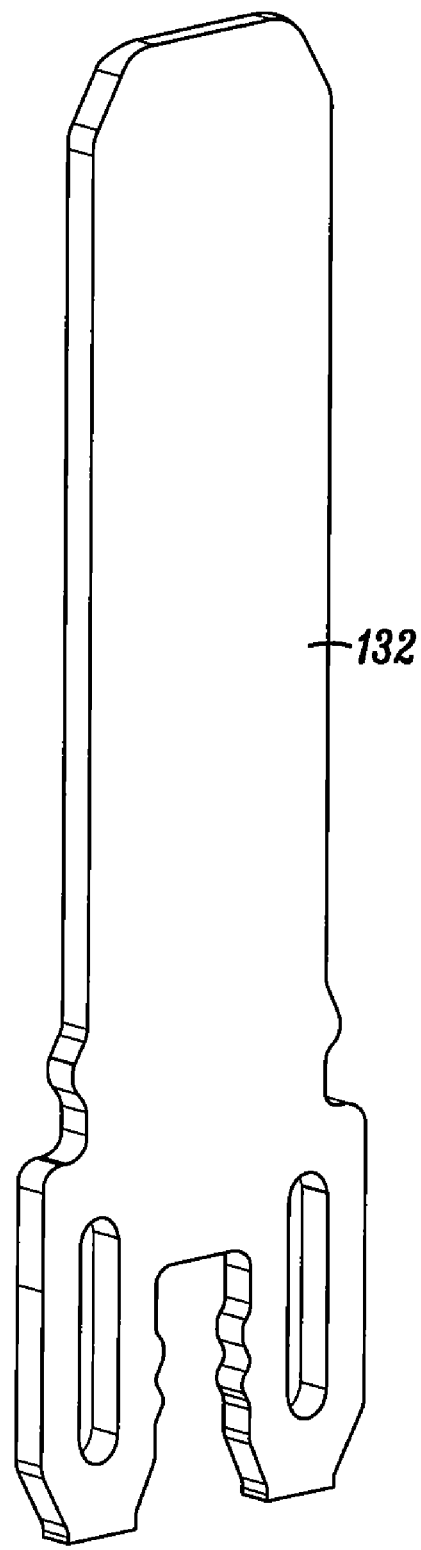
FIG. 11 is a perspective view of a ground tab.
Figure 12:
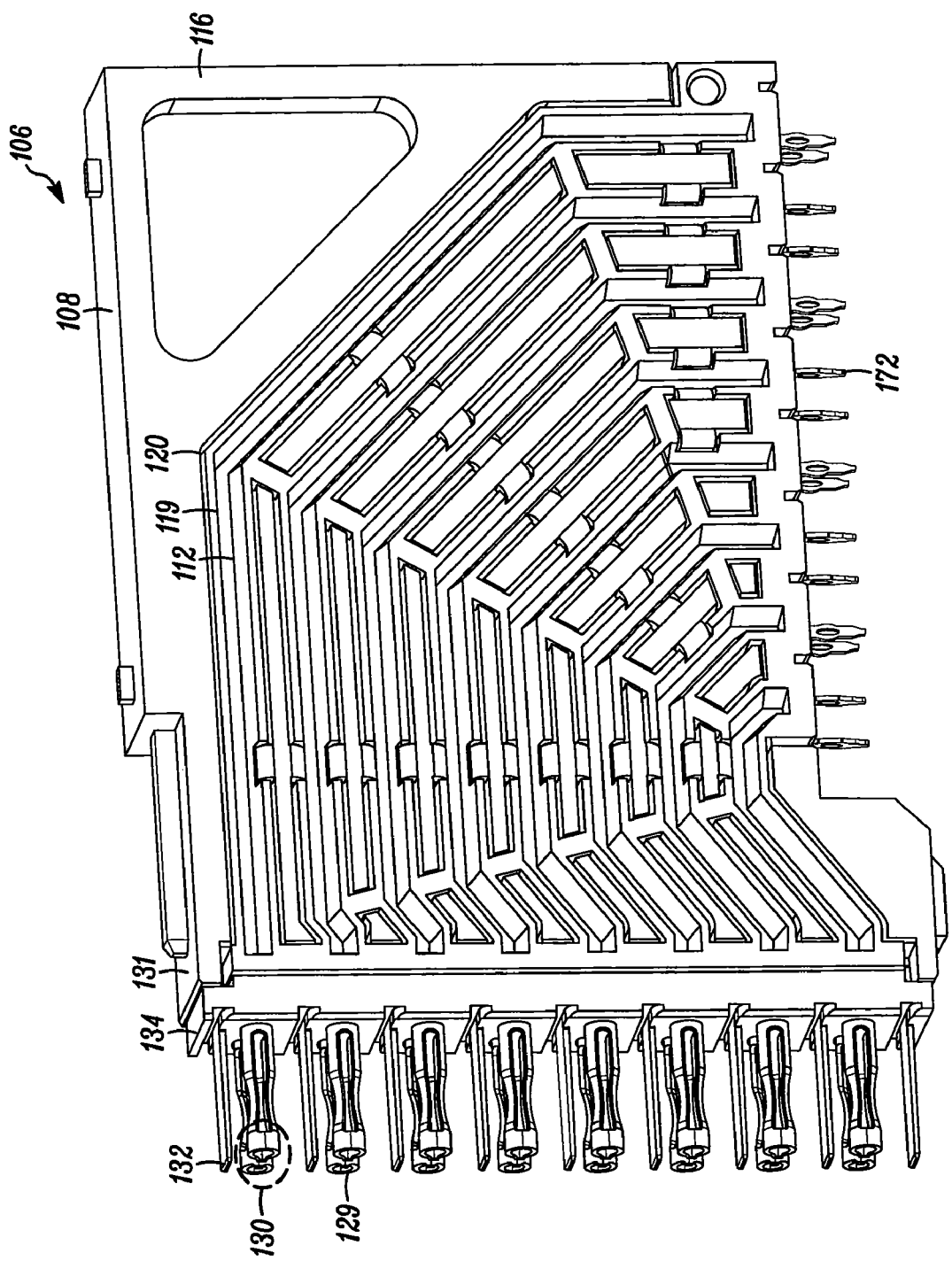
FIG. 12 is another perspective view of a wafer assembly.
Figure 13:
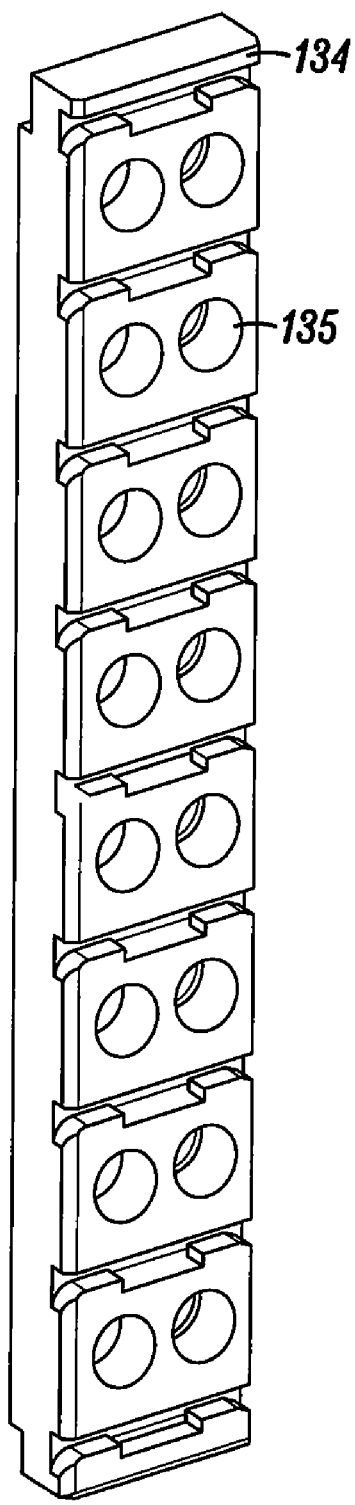
FIG. 13 illustrates an organizer.
Figure 14:
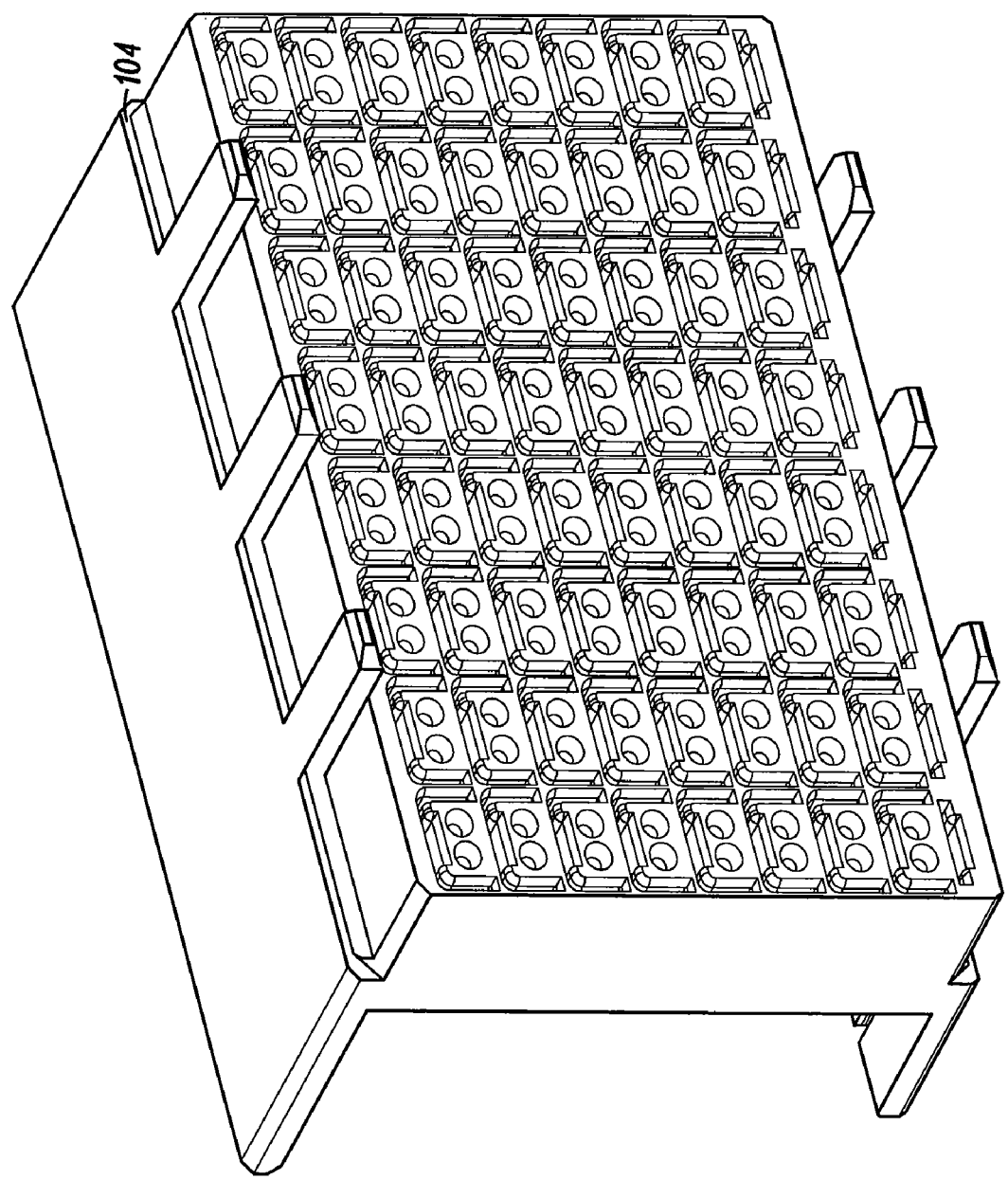
FIG. 14 is a perspective view of a wafer housing.
Figure 15:
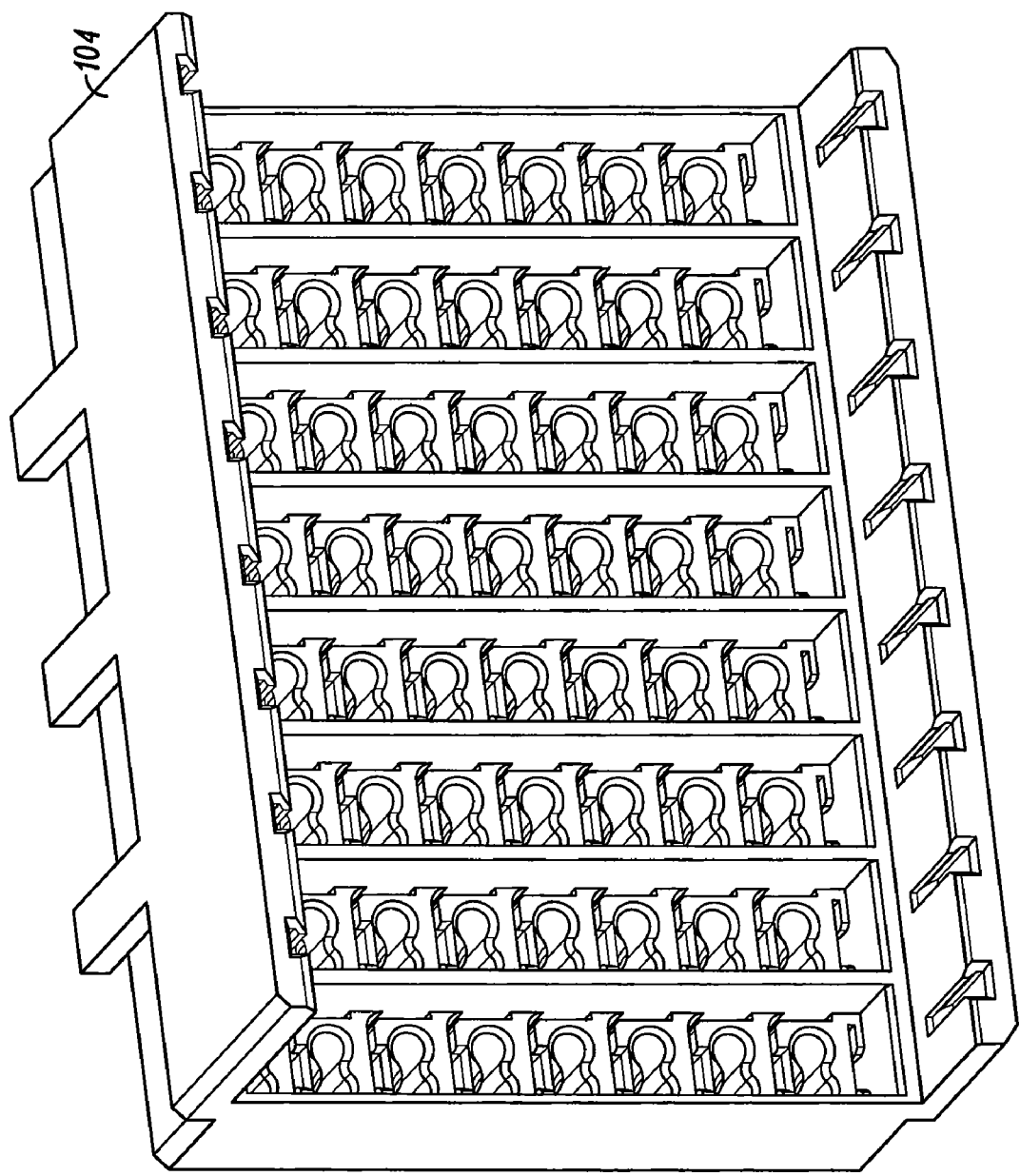
FIG. 15 is an additional perspective view of a wafer housing.

As shown in FIGS. 4, 10, and 11, the plurality of ground tabs 132 is positioned at the mating end 131 of the wafer assembly 106 to extend away from the center frame 108. The ground tabs 132 are electrically connected to at least one of the first and second sides 114, 116 of the central frame 108. Typically, a ground tab 132 is paddle shaped and at least one ground tab 132 is positioned above and below each electrical contact pair 130 at the mating end 131 of the wafer assembly.

In some implementations, the ground tabs comprise tin (Sn) over nickel (Ni) plated brass or other electrically conductive platings or base metals.

The organizer 134 is positioned at the mating end 131 of the wafer assembly 106. The organizer comprises a plurality of apertures 135 that allow the electrical mating connectors 129 and ground tabs 132 extending from the wafer assembly 106 to pass through the organizer 134 when the organizer 134 is positioned at the mating end 131 of the wafer assembly 106. The organizer serves to securely lock the center frame 108, first array of electrical contacts 110, second array of electrical contacts 112, and ground tabs 132 together.

Figure 1:
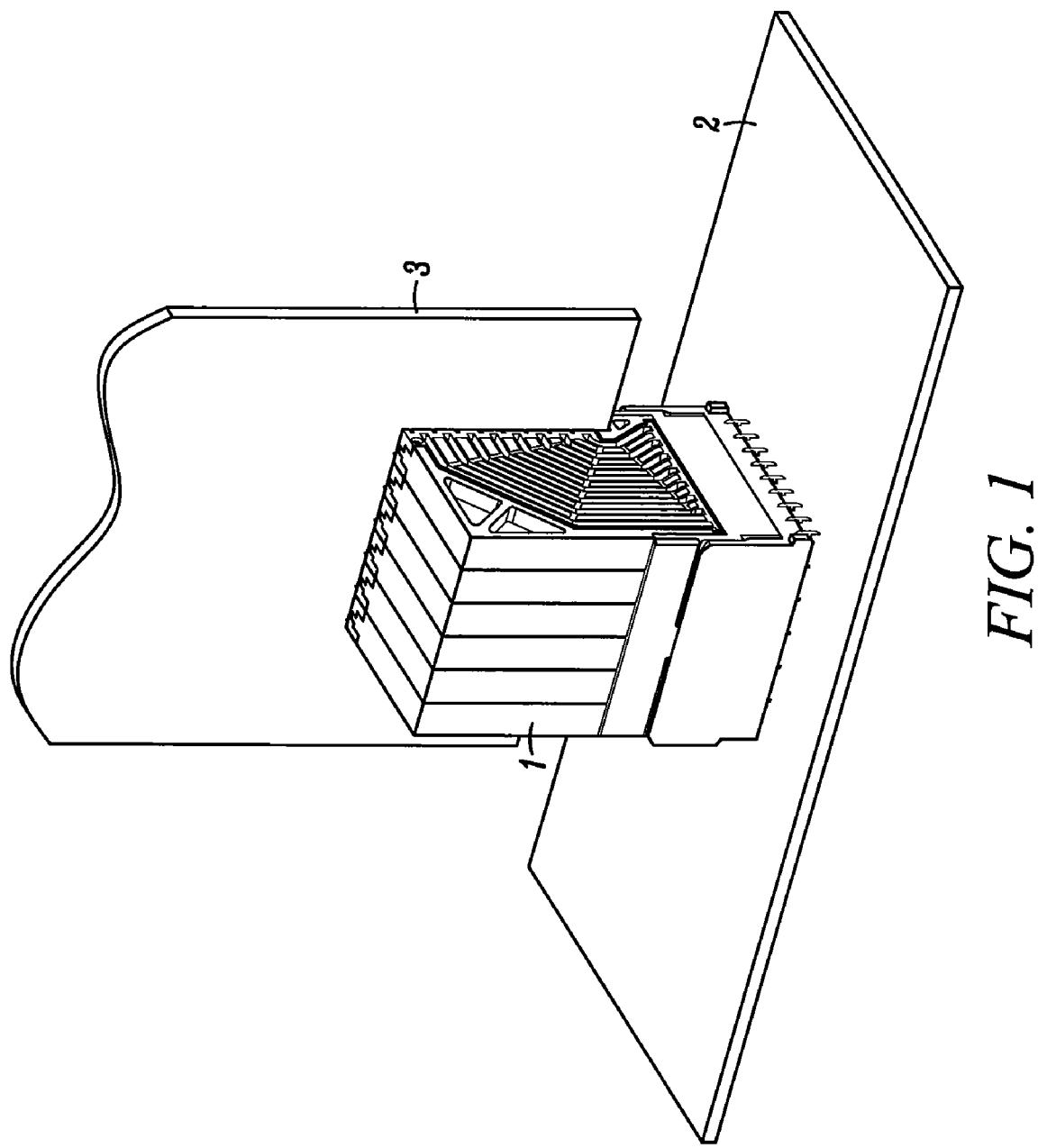
FIG. 1 is a diagram of a backplane connector system connecting a first substrate to a second substrate.
Figure 2:
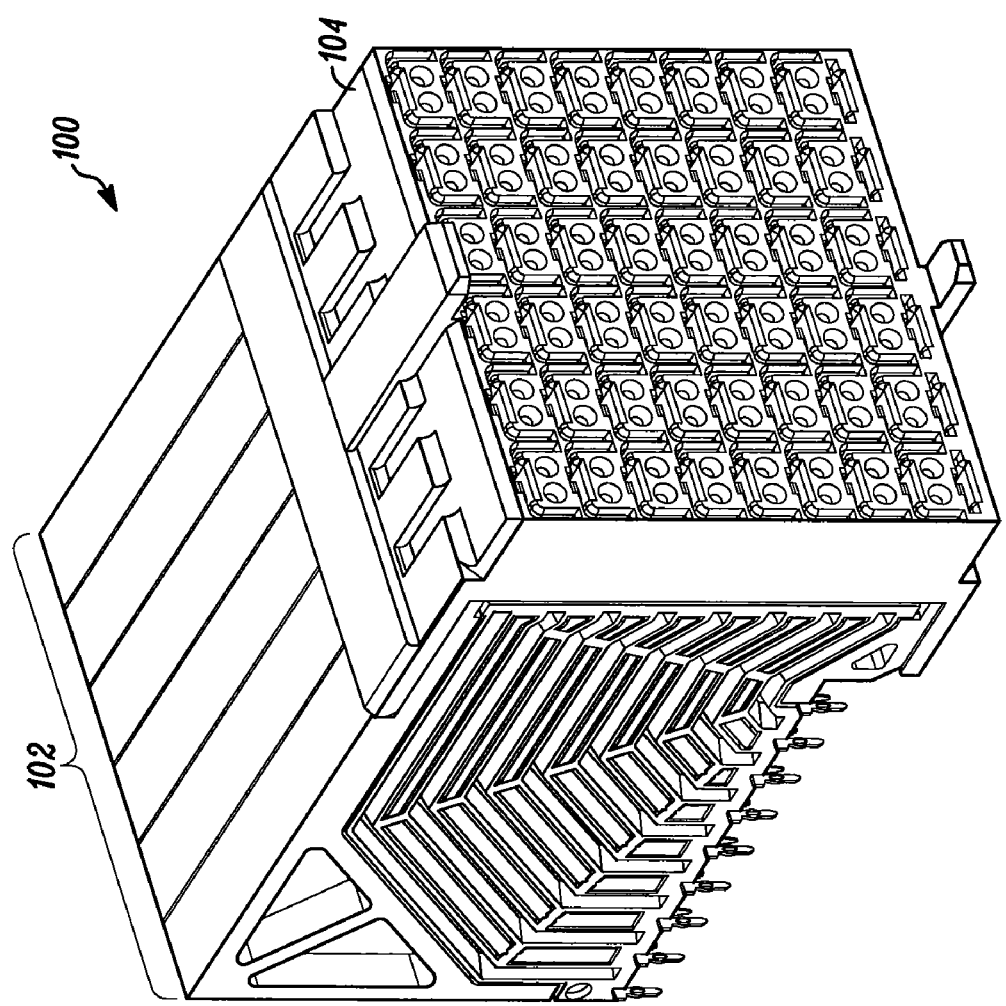
FIG. 2 is a perspective view of a portion of a high-speed backplane connector system.
Figure 3:
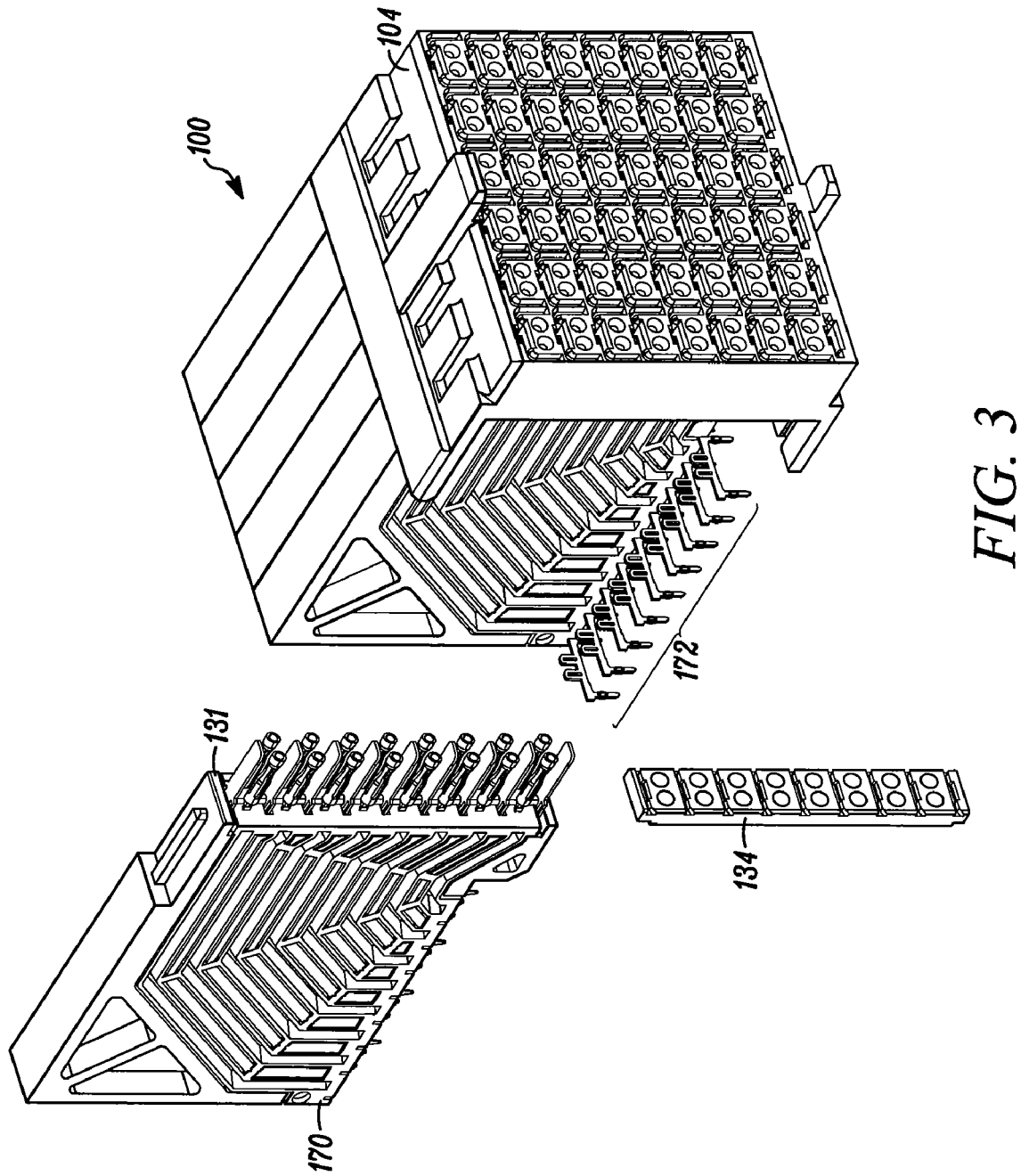
FIG. 3 is a partially exploded view of the high-speed backplane connector system of FIG. 2.
Figure 16:
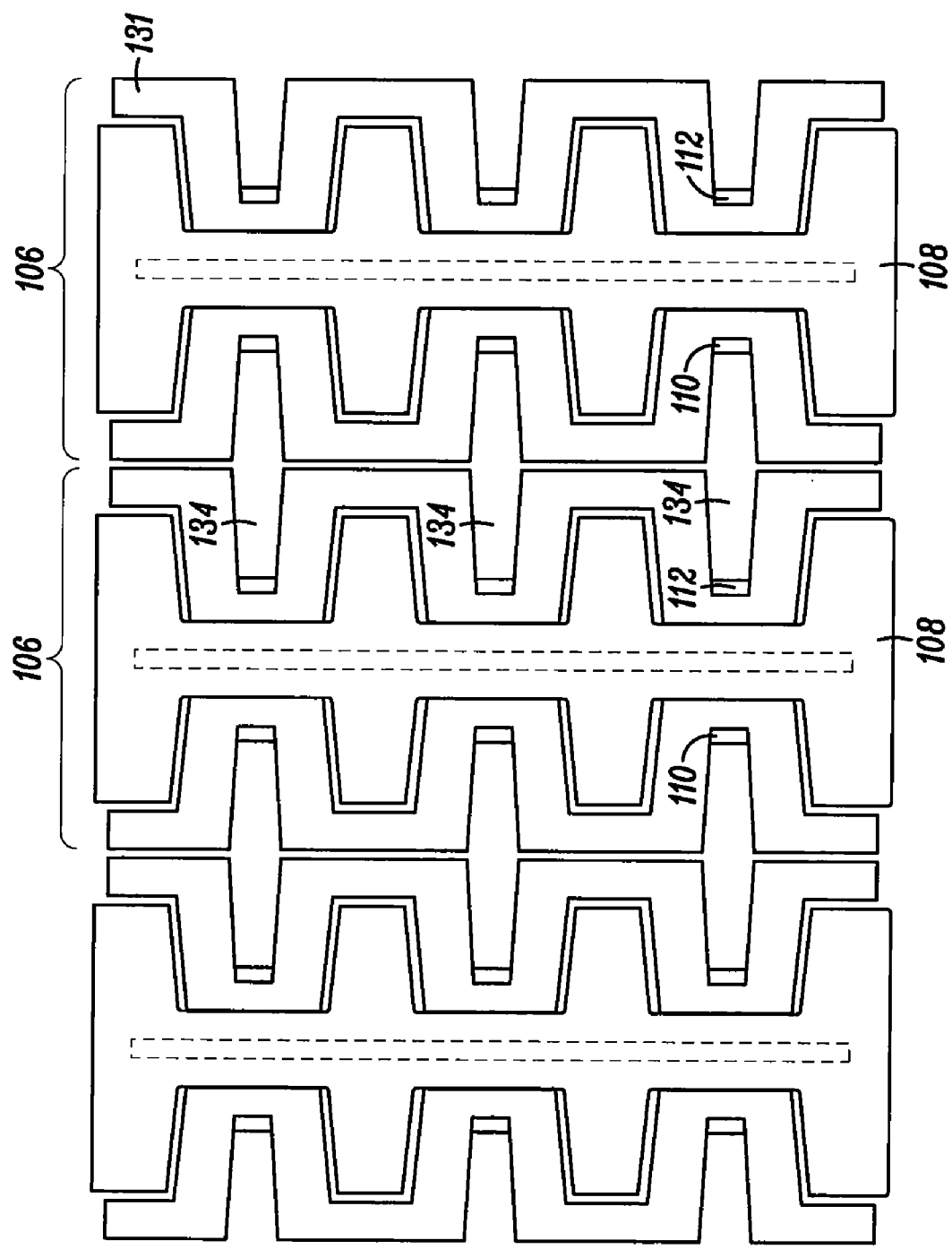
FIG. 16 is a cross-sectional view of a plurality of wafer assemblies.

Referring to FIGS. 2 and 3, the wafer housing 104 engages the plurality of wafer assemblies 102 at the mating end 131 of each wafer assembly 106. The wafer housing 104 accepts the electrical mating connectors 129 and ground tabs 132 extending from the plurality of wafer assemblies 102, and positions each wafer assembly 106 adjacent to another wafer assembly 106 of the plurality of wafer assemblies 102. As shown in FIG. 16, when positioned adjacent to one another, two wafer assemblies 106 define a plurality of air gaps 134 substantially between a length of an electrical contact of a first wafer assembly 106 and a length of an electrical contact of a second wafer assembly 106. Each air gap 134 serves to electrically isolate the electrical contacts positioned with the air gap 134 of the wafer assemblies 106.

Figure 17A:
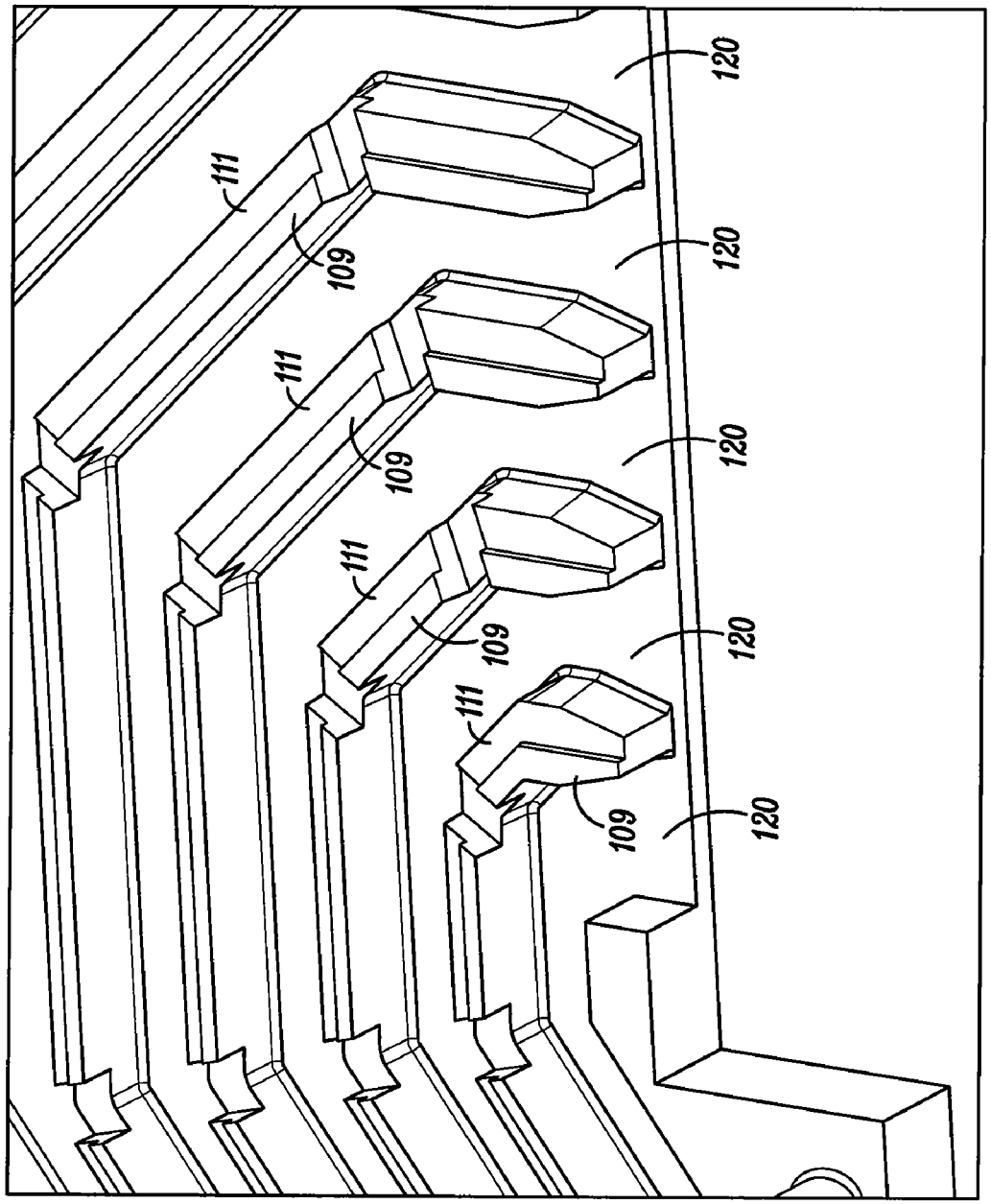
FIG. 17a is a side view of a center frame that includes a plurality of mating ridges and a plurality of mating recesses.
Figure 17B:
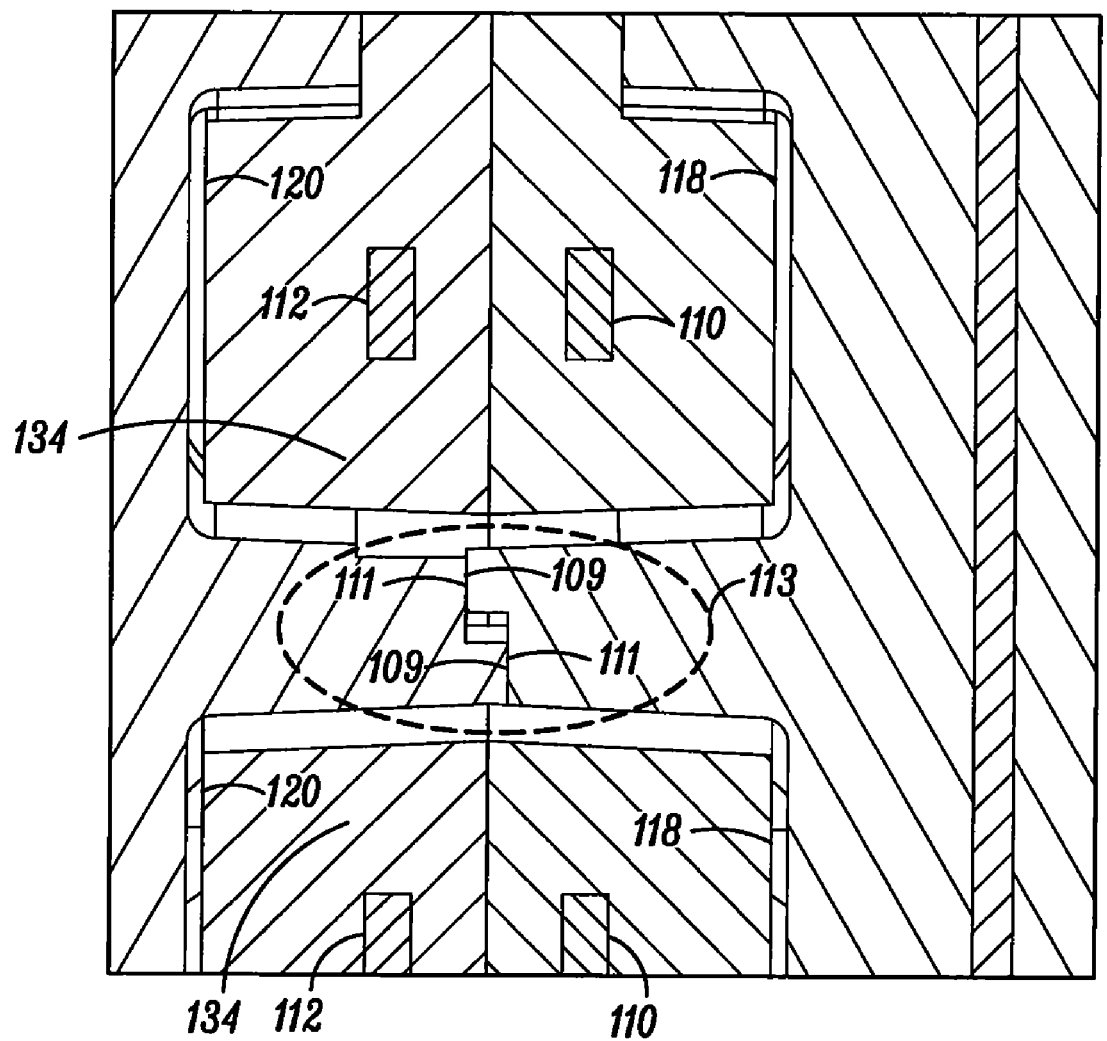
FIG. 17b is a cross-sectional view of a plurality of wafer assemblies that include a plurality of mating ridges and a plurality of mating recesses.

Referring to FIGS. 17a and 17b, in some implementations, each center frame 108 defines a plurality of mating ridges 109 extending from the first side 114 of the center frame 108 and a plurality of mating ridges 109 extending from the second side 116 of the center frame 108. Additionally, each center frame defines a plurality of mating recesses 111 at the first side 114 of the center frame 108 and a plurality of mating recesses 111 at the second side 116 of the center frame 108.

As shown in FIG. 17a, in some implementations, one of the mating ridges 109 and one of the mating recesses 111 are positioned between each channel of the plurality of second channels 120 on the second side 116 of the center frame 108. Further, mating ridges 109 and mating recesses 111 are positioned between each channel of the plurality of first channels 118 on the first side 114 of the center frame 108 that complement the mating ridges 109 and mating recesses 111 on the second side. Therefore, as shown in FIG. 17b, when two wafer assemblies 106 are positioned adjacent to each other in the wafer housing 104, the mating ridges 109 extending from the first side 114 of a first wafer assembly 106 engage the mating recesses 111 positioned on the second side 116 of the second adjacent wafer assembly 106, and the mating ridges 109 extending from the second side 116 of the second wafer assembly 106 engage the mating recesses 111 positioned on the first side 114 of the adjacent first wafer assembly 106.

The resulting overlap 113 provides for improved contact between adjacent wafer assemblies 106. Additionally, the resulting overlap 113 disrupts a direct signal path between adjacent air gaps 134, thereby improving the performance of signals traveling on the electrical contacts of the first and second arrays of electrical contacts 110, 112 positioned in the air gaps 134.

As shown in FIGS. 18-23, the connector system 100 further includes a header module 136 adapted to mate with the wafer housing 104. A mating face of the header module 136 that engages the wafer housing 104 includes a plurality of C-shaped ground shields 138, a row of ground tabs 140, and a plurality of signal pin pairs 142. In some implementations, the header module 136 may comprise a liquid crystal polymer (LCP) insulator; the signal pin pairs 142 comprise phosphor bronze base material and, gold (Au), and tin (Sn) platings over nickel (Ni) plating; and the ground shields 138 and ground tabs 140 comprise brass base material with tin (Sn) over nickel (Ni) plating. Other electrically conductive base materials and platings (noble or non-noble) can be used to construct signal pins, ground shields, and ground tabs. Other polymers can be used to construct housings.

Figure 18A:
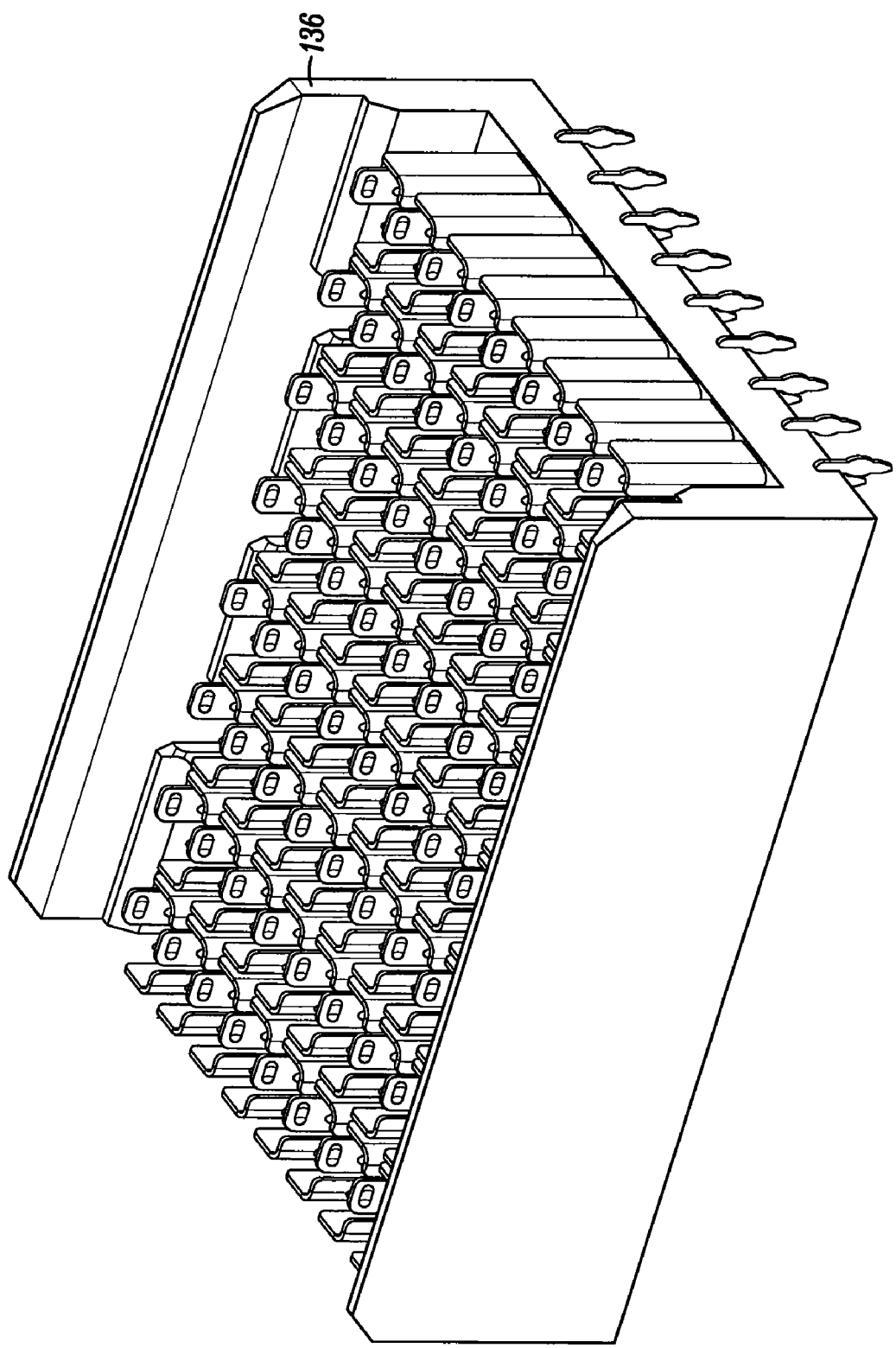
FIG. 18a is a perspective view of a header unit.
Figure 18B:
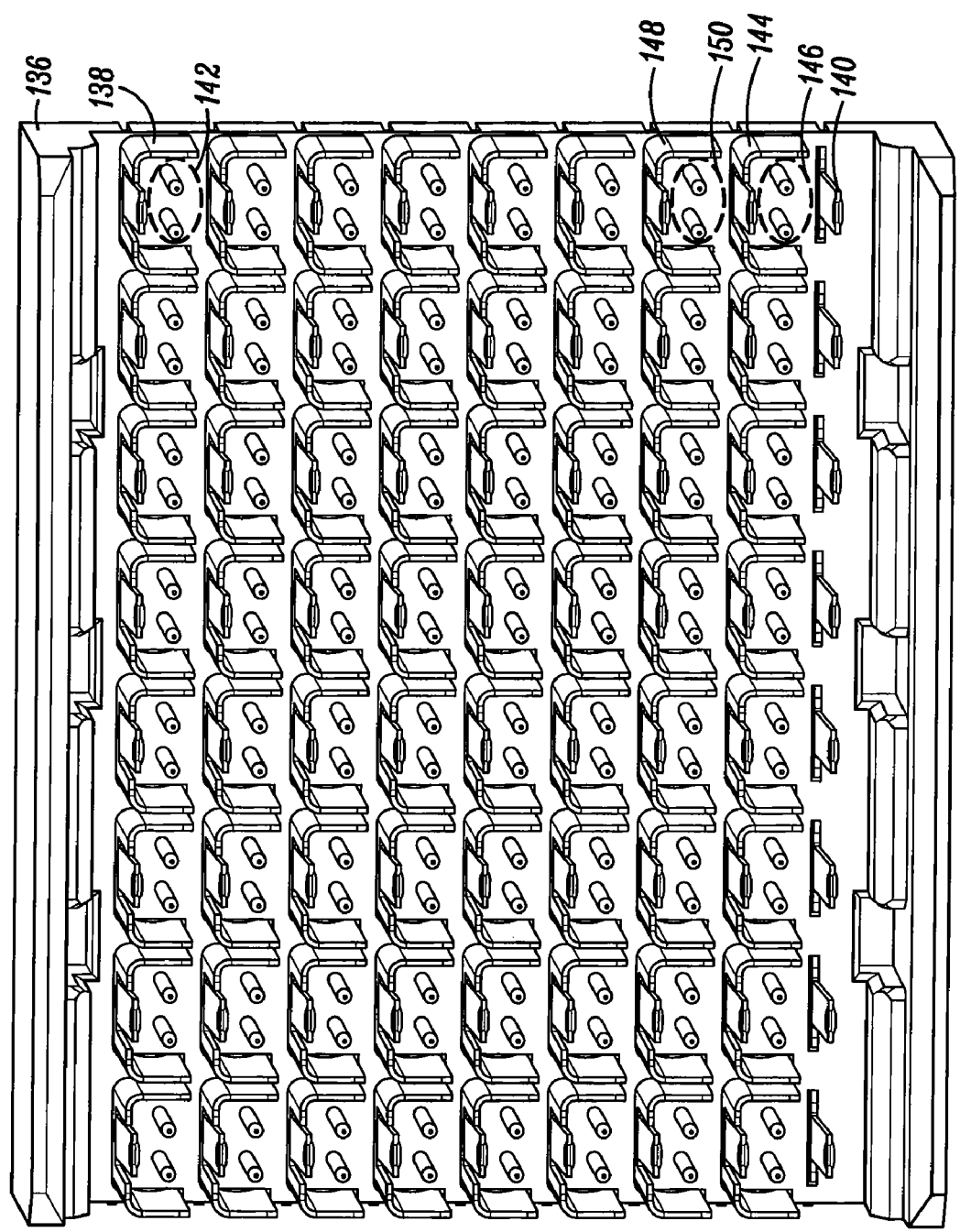
FIG. 18b illustrates one implementation a mating face of a header unit.
Figure 18C:
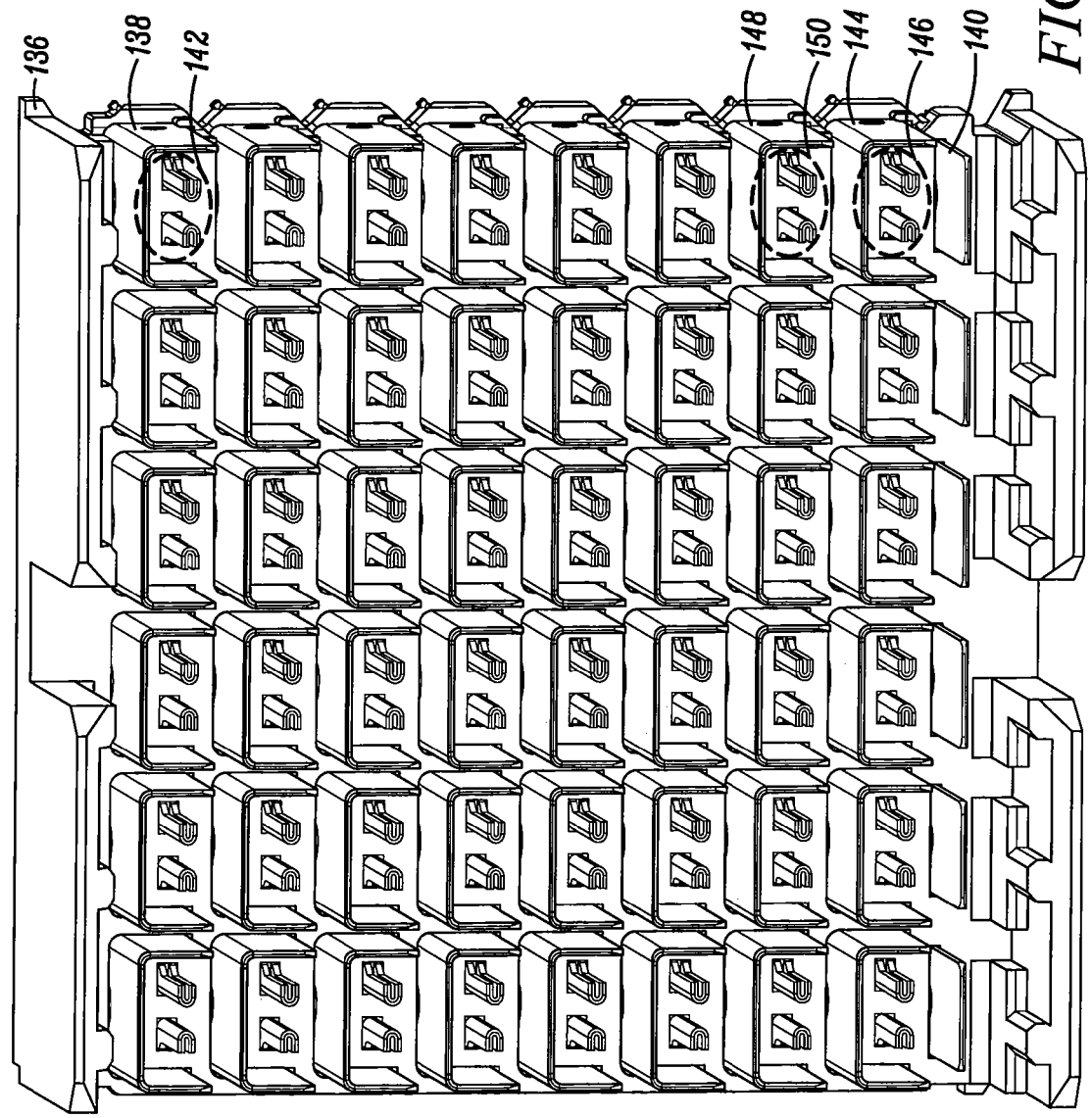
FIG. 18c illustrates another implementation of a mating face of a header unit.

As shown in FIGS. 18a and 18b, the row of ground tabs 140 is positioned along one side of the mating face of the header module 136. A first row 144 of the plurality of C-shaped ground shields 138 is positioned above the row of ground tabs 140 at an open end of the C-shaped ground shields 138 so that a signal pin pair 146 of the plurality of signal pin pairs 142 is substantially surrounded by a ground tab and a C-shaped ground shield.

A second row 148 of the plurality of C-shaped ground shields 138 is positioned above the first row 144 of the plurality of C-shaped ground shields 138 at an open end of C-shaped ground shields of the second row 148 so that a signal pin pair 150 of the plurality of signal pin pairs 142 is substantially surrounded by an edge of a C-shaped ground shield of the first row 144 and a C-shaped ground shield of the second row 148. It will be appreciated that this pattern is repeated so that each subsequent signal pin pair 142 is substantially surrounded by an edge of a first C-shaped ground shield and a second C-shaped ground shield.

The row of ground tabs 140 and plurality of C-shaped ground shields 138 are positioned on the header module 136 such that when the header module 136 mates with the plurality of wafer assemblies 102 and wafer housing, as described in more detail below, each C-shaped ground shield is horizontal and perpendicular to a wafer assembly 106, and spans both an electrical contact of the first array of electrical contacts 110 and an electrical contact of the second array of electrical contacts of the wafer assembly 106.

Figure 18D:
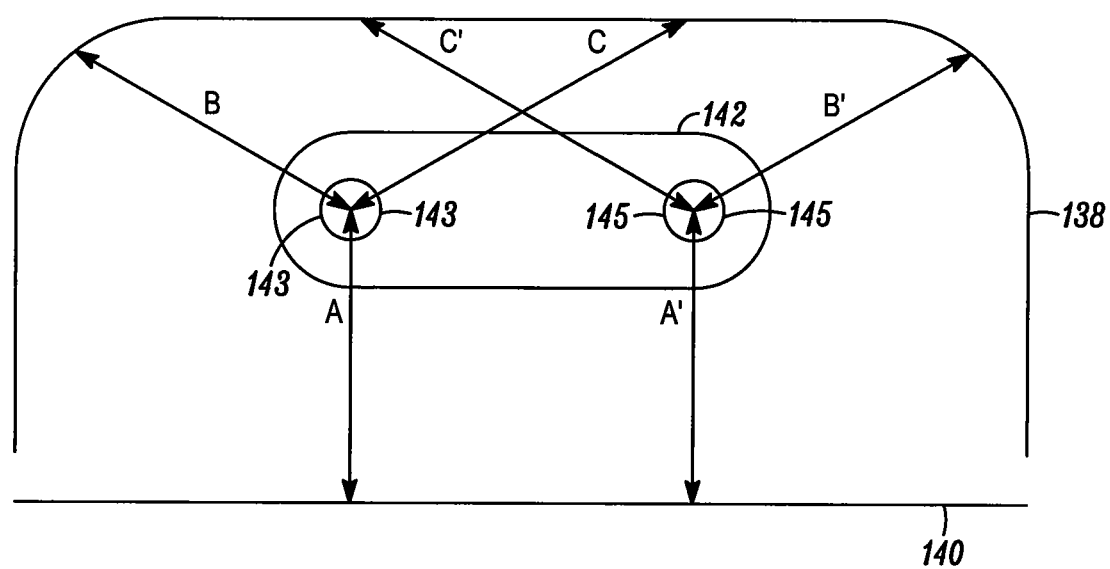
FIG. 18d illustrates a pair of signal pins substantially surrounded by a C-shaped ground shield and a ground tab.

As shown in FIG. 18d, each signal pin pair 142 is positioned on the header module 136 such that a distance between a first signal pin 143 of the signal pin pair and a point on a C-shaped ground shield or ground tab (See distances a, b, and c) is substantially equal to a distance between a second signal pin 145 of the signal pin pair and a corresponding point on the C-shaped ground shield or ground tab (See distances a', b', and c'). This symmetry between the first and second signal pins 143, 145 and the C-shaped ground shield or ground tab provides improved manageability of signals traveling on the signal pin pair 142.

Figure 19C:
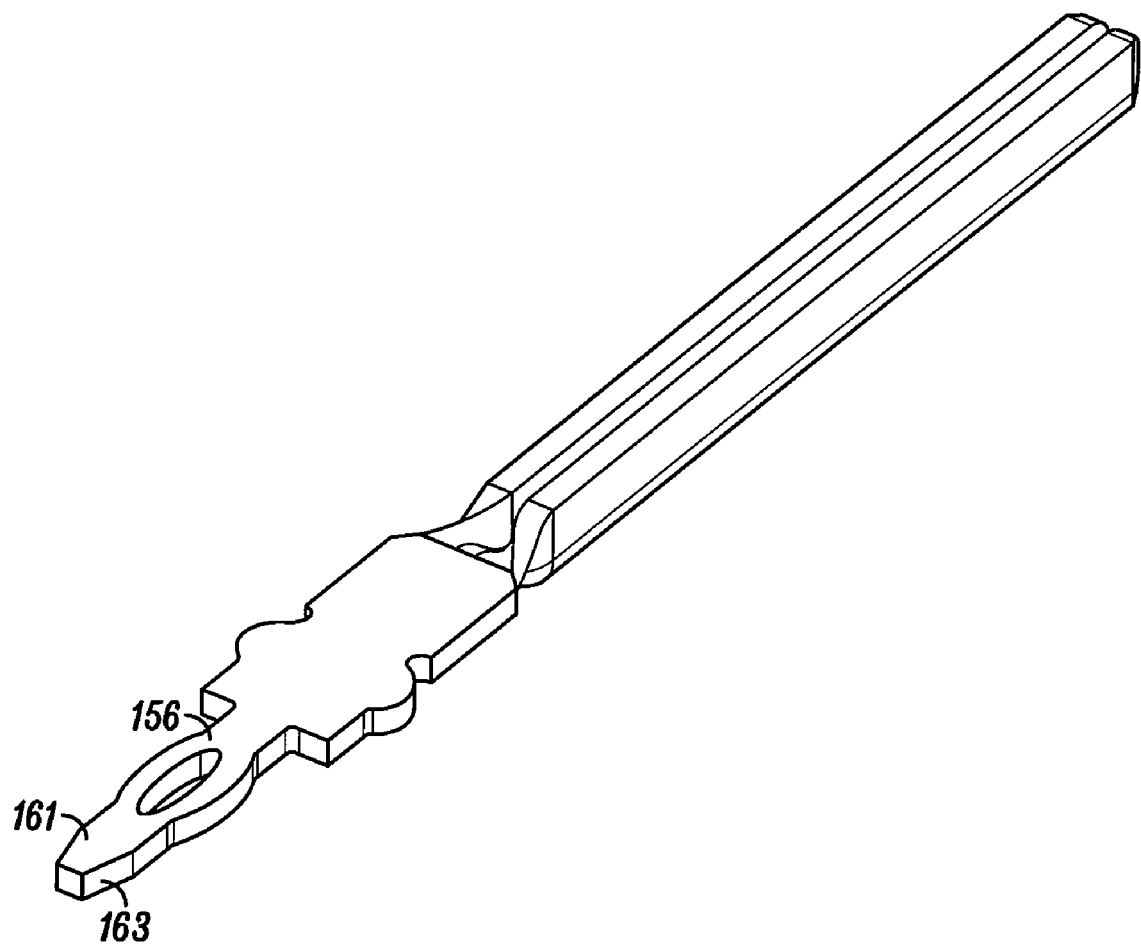
FIG. 19c illustrates yet another implementation of a signal pin of a header unit.

In some implementations, each signal pin of the plurality of signal pin pairs 142 is a vertical rounded pin as shown in FIG. 19a so that as the header module 136 receives the wafer housing 104, the wafer housing 104 receives the plurality of signal pin pairs 142, and the plurality of signal pin pairs 142 are received by, and engage the electrical mating connectors 129 of the first and second arrays of electrical contacts 110, 112 that are extending from the plurality of wafer assemblies 102. However, in other implementations, each signal pin of the plurality of signal pin pairs 142 is a vertical U-shaped pin as shown in FIG. 19b or FIG. 19c. It will be appreciated that the U-shaped pin provides for efficient manufacturing because dual gage material is not required to make a mating end and a mounting end.

Figure 19D:
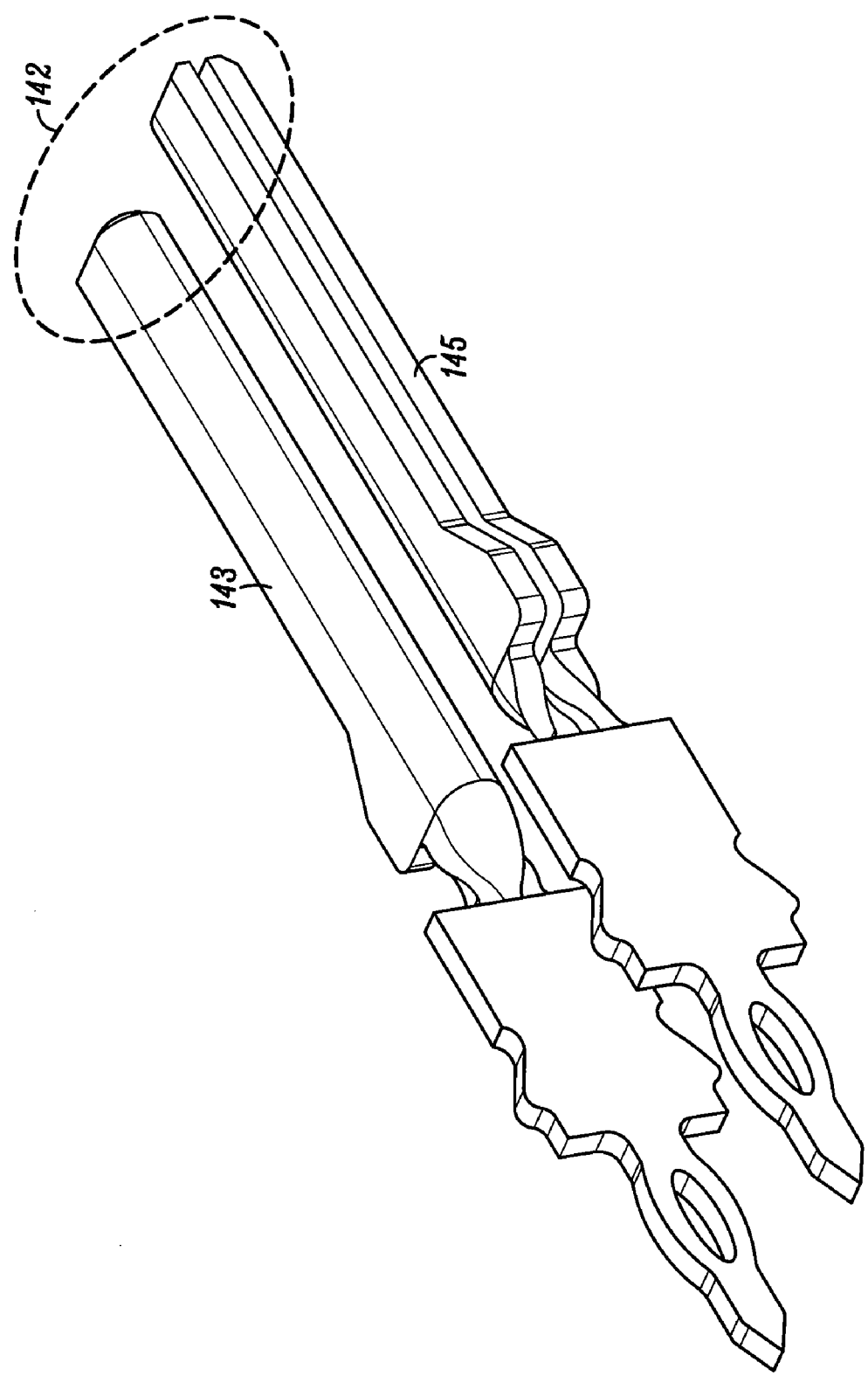
FIG. 19d illustrates a mirrored pair of signal pins of a header unit.
Figure 20A:
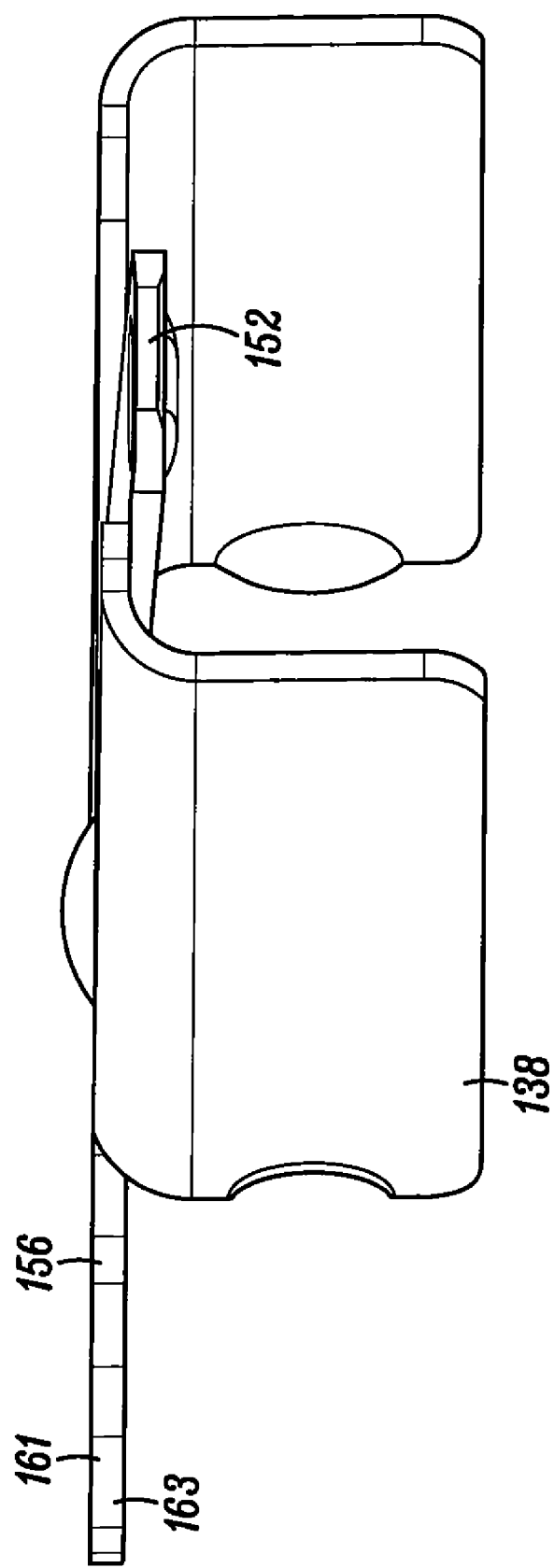
FIG. 20a is a perspective view of a C-shaped ground shield of a header unit.
Figure 20B:
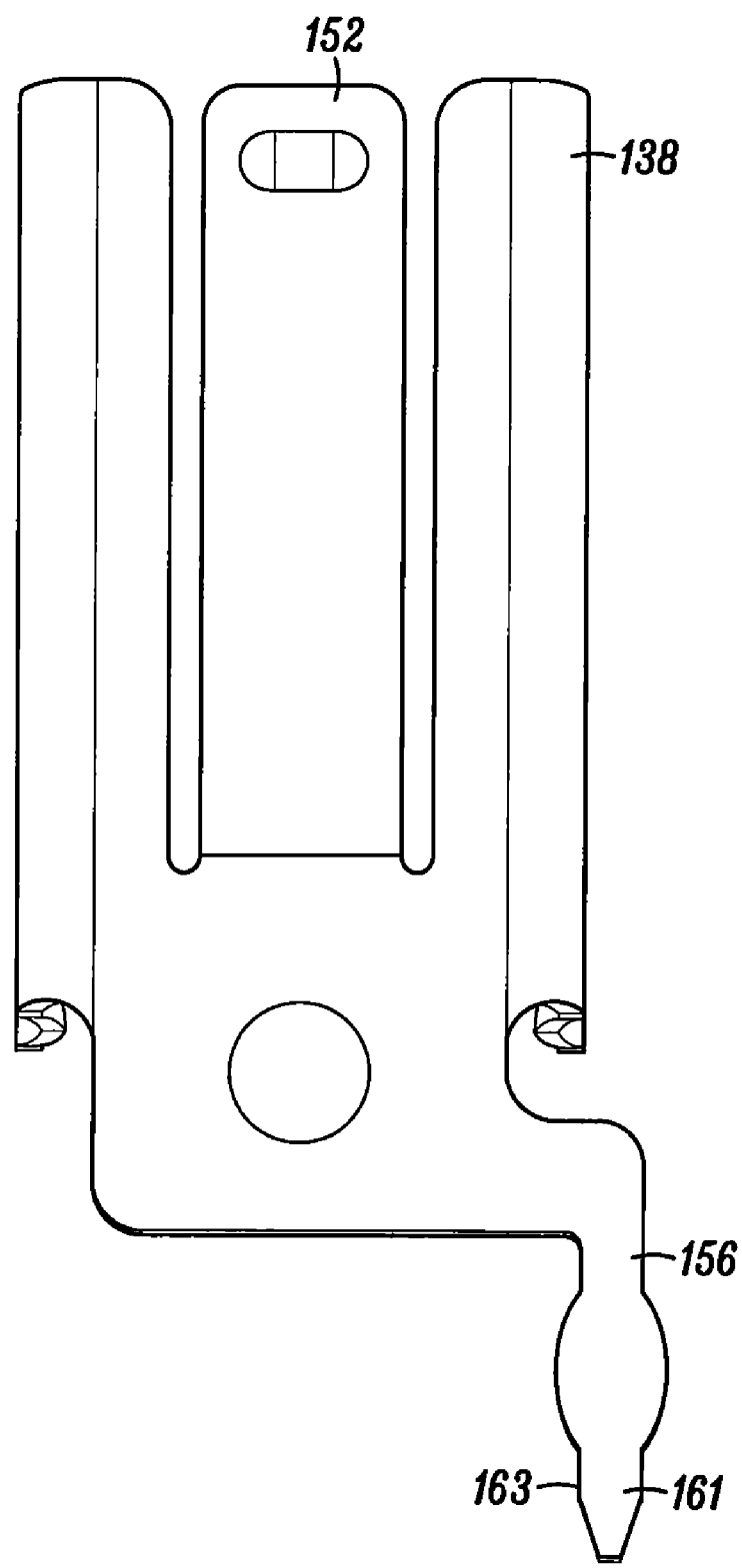
FIG. 20b is another view of the C-shaped ground shield of FIG. 20a of a header unit.
Figure 20C:
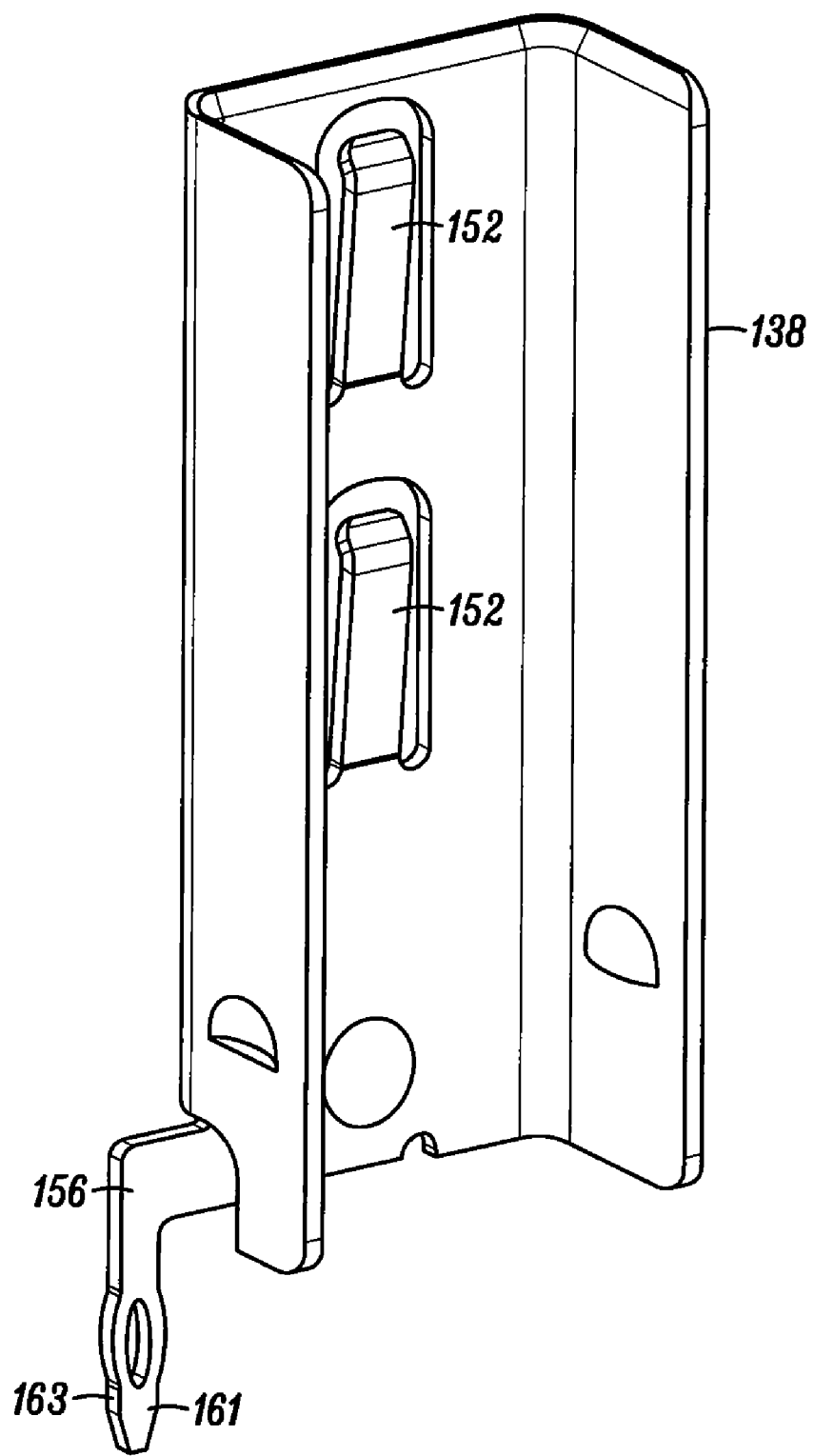
FIG. 20c illustrates another implementation of a C-shaped ground shield of a header unit.
Figure 20D:
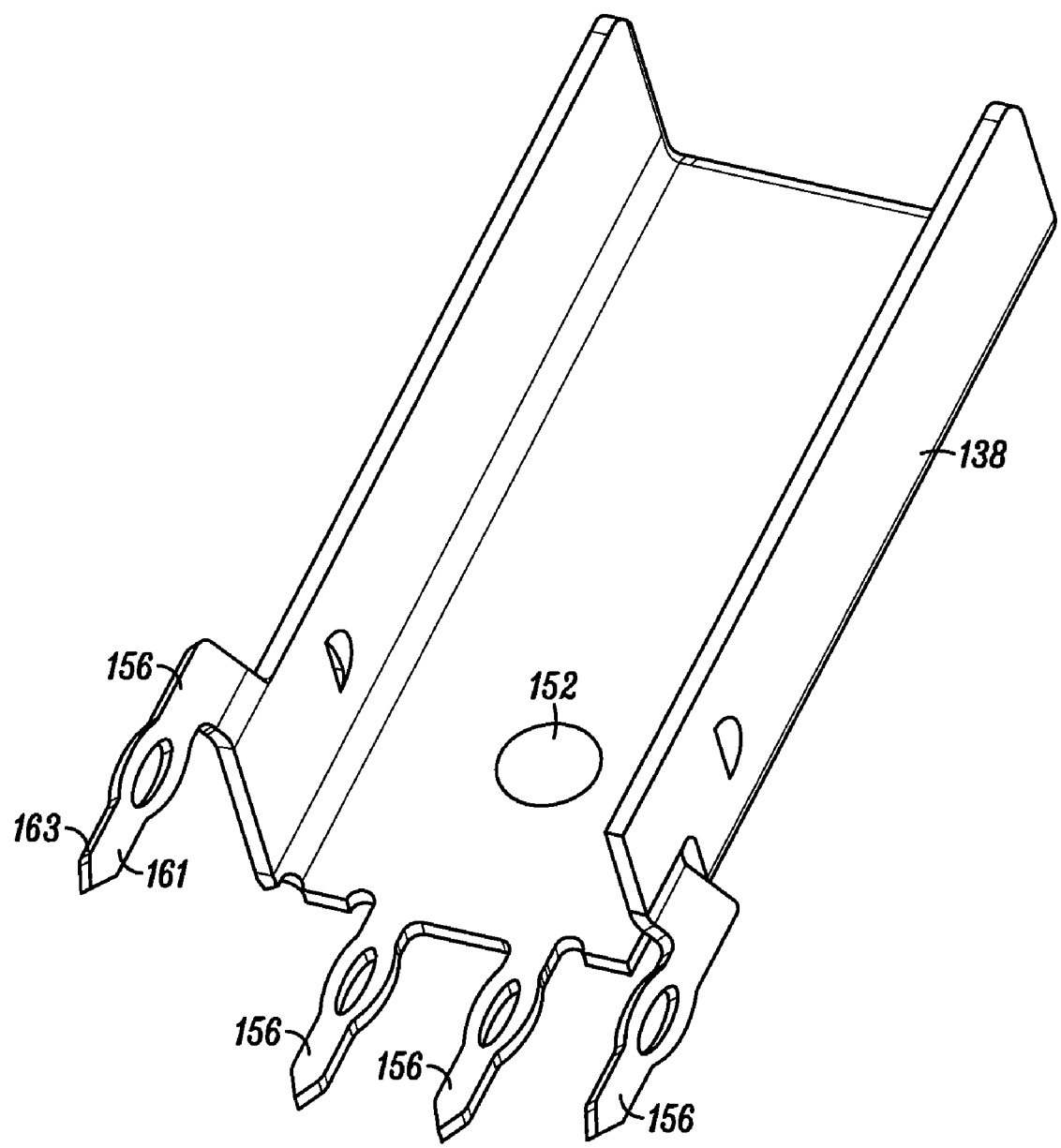
FIG. 20d illustrates yet another implementation of a C-shaped ground shield of a header unit.
Figure 20E:
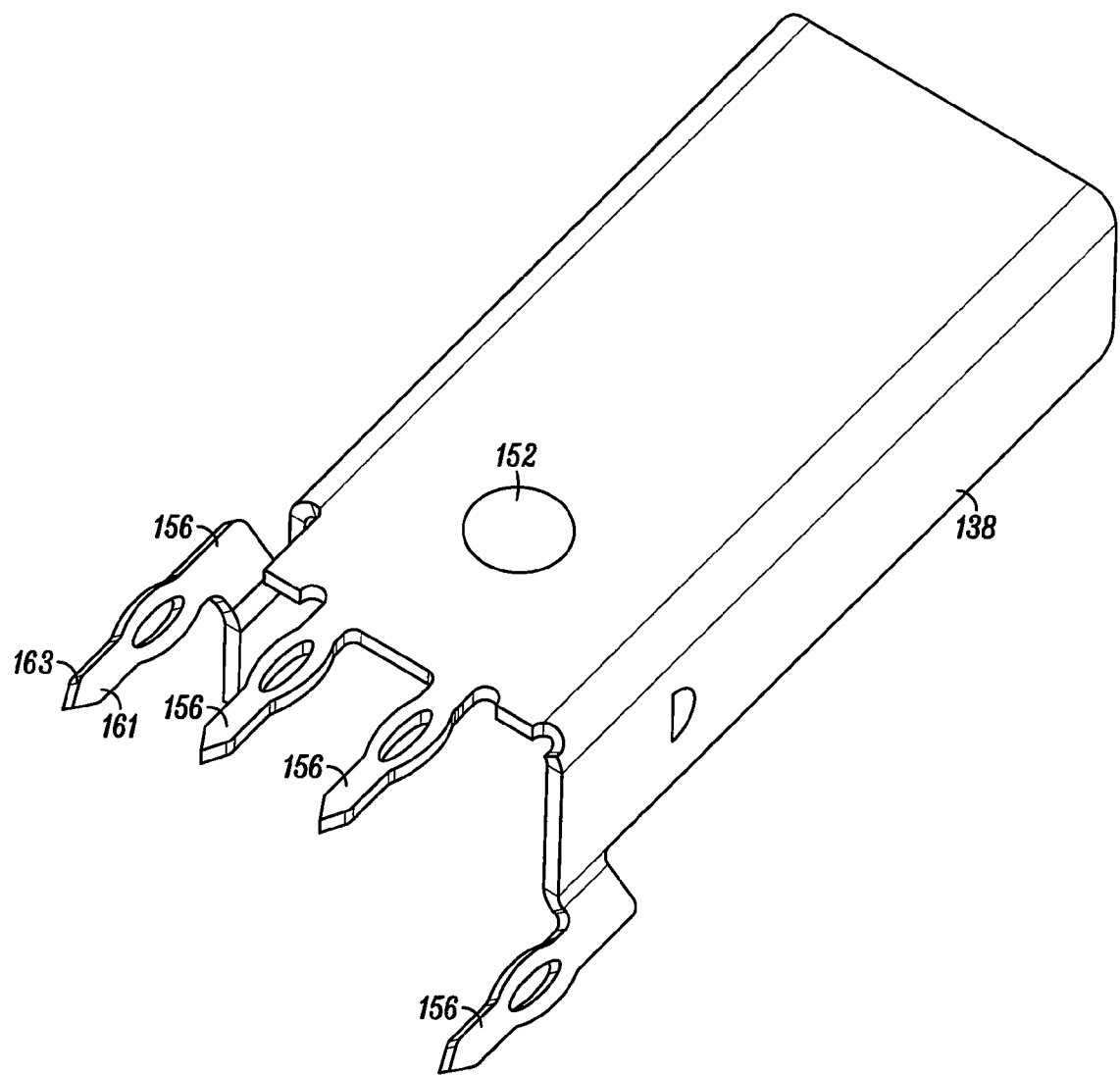
FIG. 20e illustrates another implementation of a C-shaped ground shield of a header unit.

Referring to FIG. 19d, in some implementations, for each signal pin pair 142, the first signal pin 143 of the signal pin pair mirrors the adjacent second signal pin 145 of the signal pin pair. It will be appreciated that mirroring the signal pins of the signal pin pair 142 provides advantages in manufacturing as well in high-speed electrical performance, while still providing a unique structure for the signal pin pairs.

Figure 22:
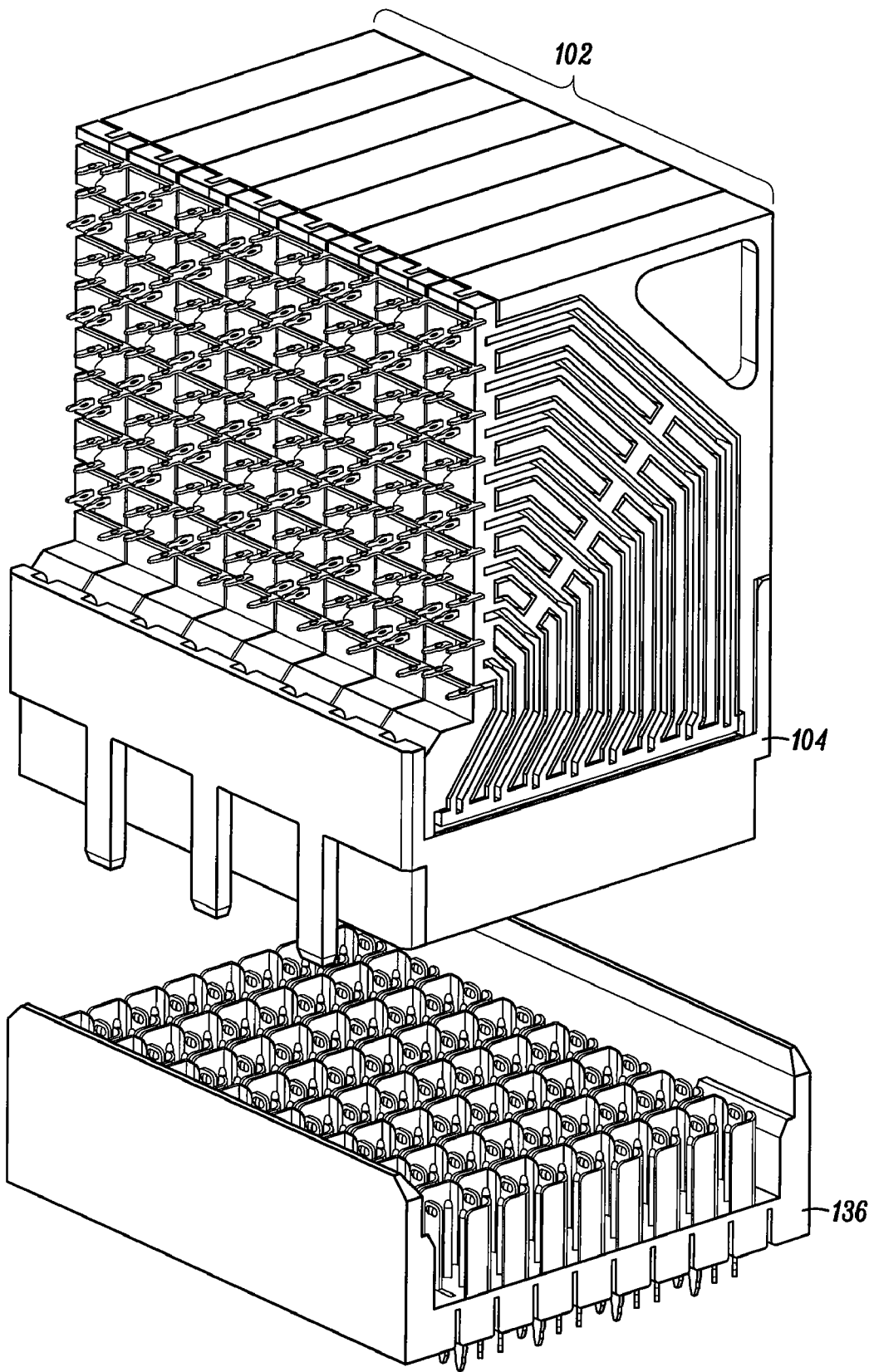
FIG. 22 is a perspective view of a high-speed backplane connector system.
Figure 23:
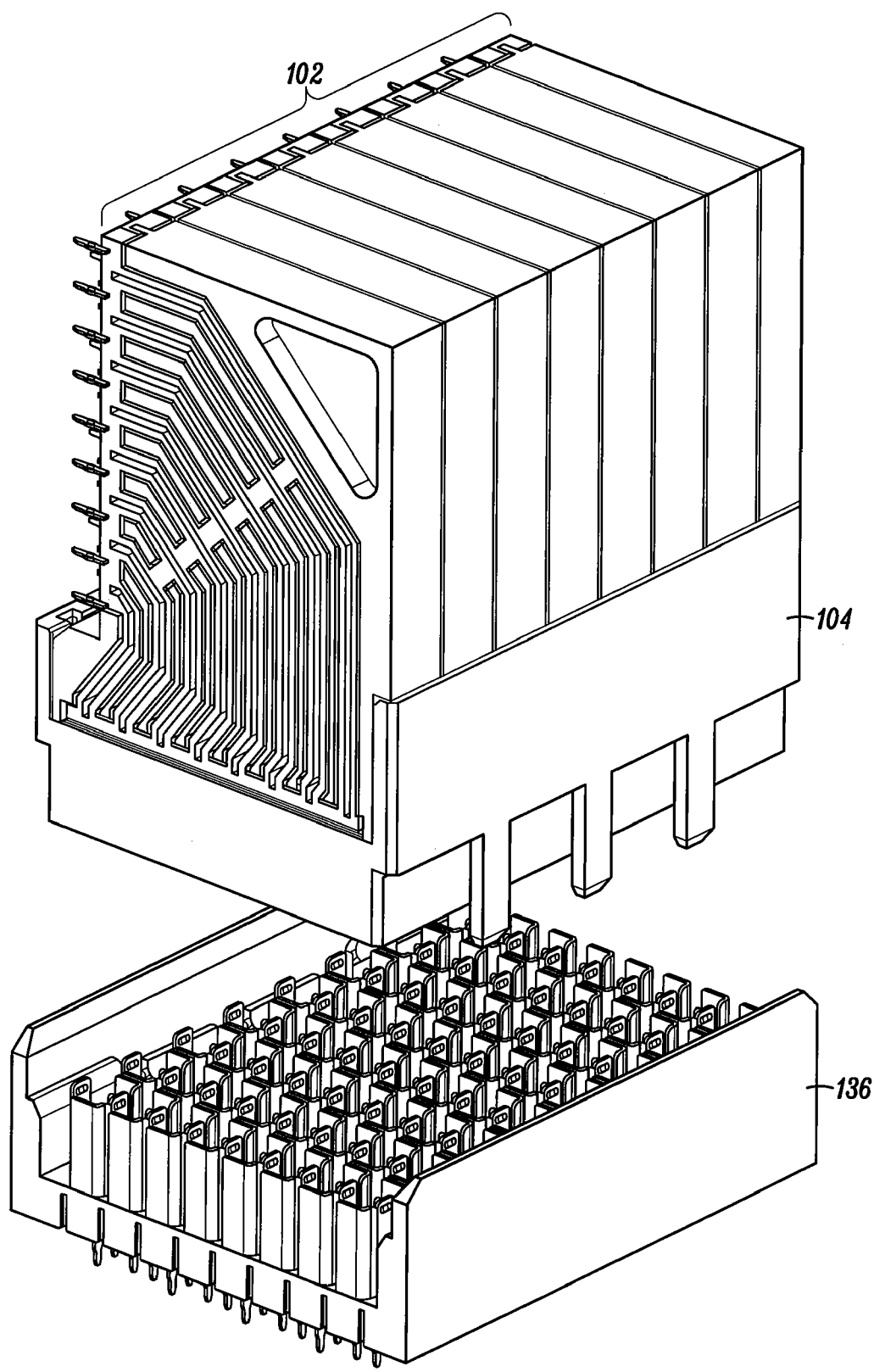
FIG. 23 is another perspective view of the high-speed backplane connector system of FIG. 22.
Figure 24:
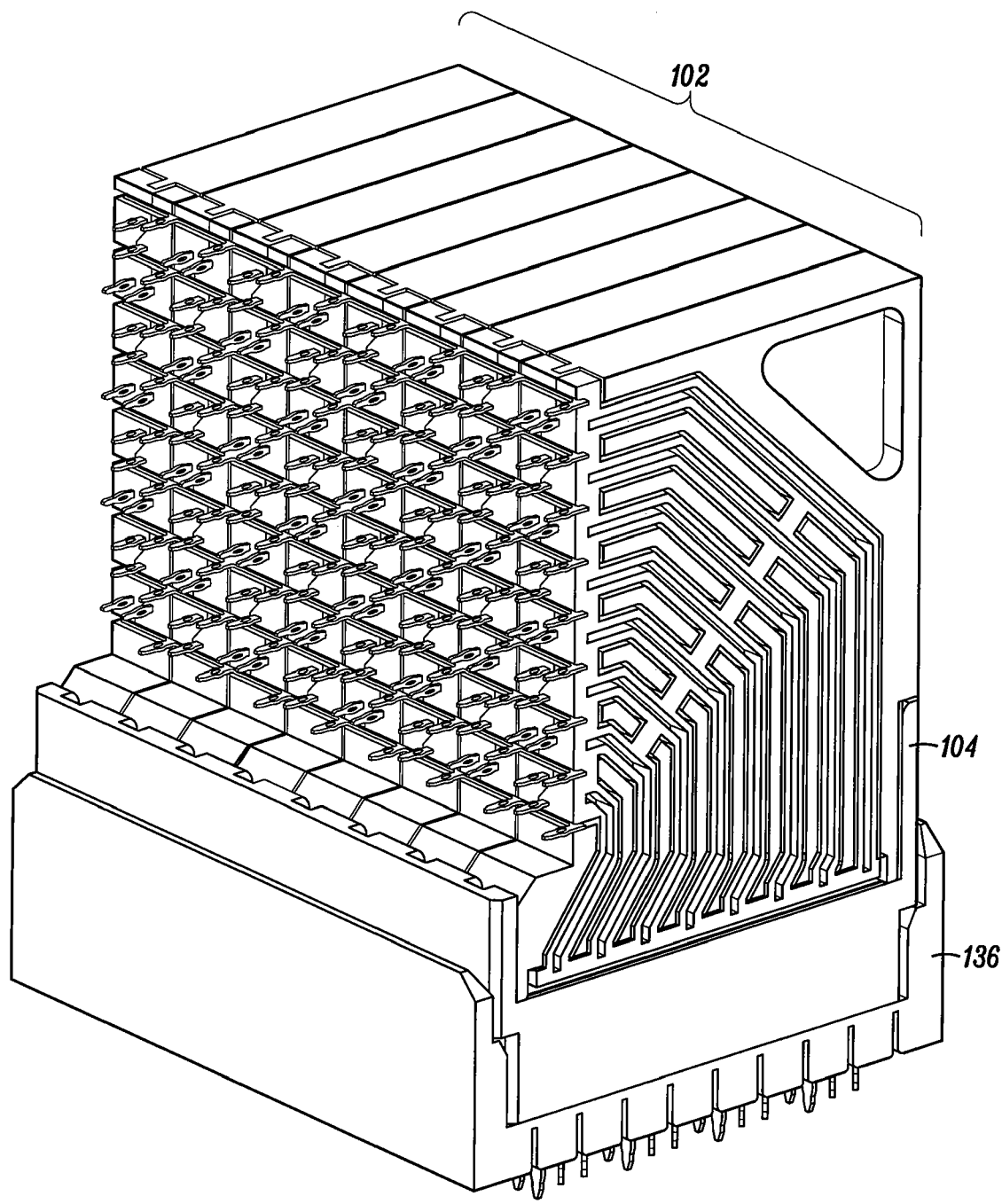
FIG. 24 is yet another perspective view of the high-speed backplane connector system of FIG. 22.

In some implementations, each C-shaped ground shield 138 and each ground tab 140 of the header module 136 may include one or more mating interfaces 152 as shown in FIGS. 20a, 20b, 20c, 20d, 20e, and 21. Accordingly, as the header module 136 receives the wafer housing 104 as shown in FIGS. 22-24, the wafer housing 104 receives the ground shields 138 and ground tabs 140 of the header module 136, and the C-shaped ground shields 138 and ground tabs 140 of the header module 136 engage the ground tabs 132 extending from the plurality of wafer assemblies 102 at at least the one or more mating interfaces 152.

It will be appreciated that when the header module 136 mates with the wafer housing 104 and plurality of wafer assemblies 102, each set of engaged signal pin pair 142 and electrical mating connectors 129 of the first and second arrays of electrical contacts 110, 112 is substantially surrounded by, and electrically isolated by, a ground tab 132 of a wafer assembly 106, a C-shaped ground shield 136 of the header module 136 and one of a ground tab 140 of the header module 136 or a side of another C-shaped ground shield 136 of the header module 136.

Figure 21:
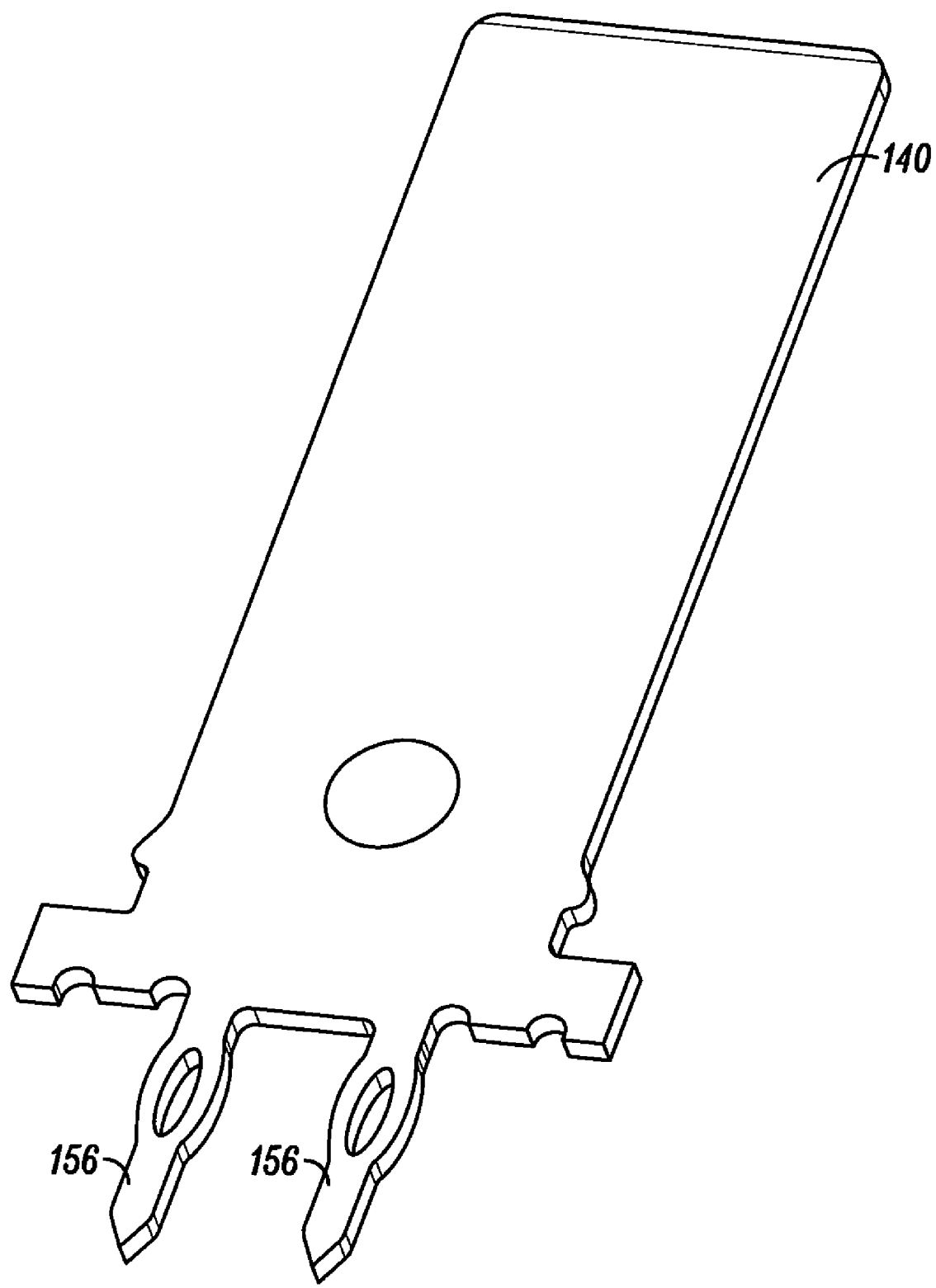
FIG. 21 illustrates one implementation of a ground tab of a header unit.

As shown in FIGS. 19-21, each C-shaped ground shield and ground tab of the header module 136 additionally defines one or more substrate engagement elements 156, such as a ground mounting pin, each of which is configured to engage a substrate at a via of the substrate. Further, each signal pin of the header module 136 additionally defines a substrate engagement element 158, such as a signal mounting pin, that is configured to engage a substrate at a via of the substrate. In some implementations, each ground mounting pin 156 and signal mounting pin 158 defines a broadside 161 and an edge 163 that is smaller than the broadside 161.

The ground mounting pins 156 and signal mounting pins 158 extend through the header module 136, and extend away from a mounting face of the header module 136. The ground mounting pins 156 and signal mounting pins 158 are used to engage a substrate such as a backplane circuit board or a daughtercard circuit board.

In some implementations, each pair of signal mounting pins 158 is positioned in one of two orientations, such as broadside coupled or edge coupled. In other implementations, each pair of signal mounting pins 156 is positioned in one of two orientations where in a first orientation, a pair of signal mounting pins 158 are aligned so that the broadsides 161 of the pair are substantially parallel to a substrate, and in a second orientation, a pair of signal mounting pins 158 are aligned so that the broadsides 161 of the pair are substantially perpendicular to the substrate. As discussed above with respect to FIGS. 9d and 9e, the signal pins of a pair of signal mounting pins 158 may be positioned on the header module 136 such that one signal pin of the pair of signal mounting pins 158 mirrors the adjacent signal pin of the pair of signal mounting pins 158.

Figure 25:
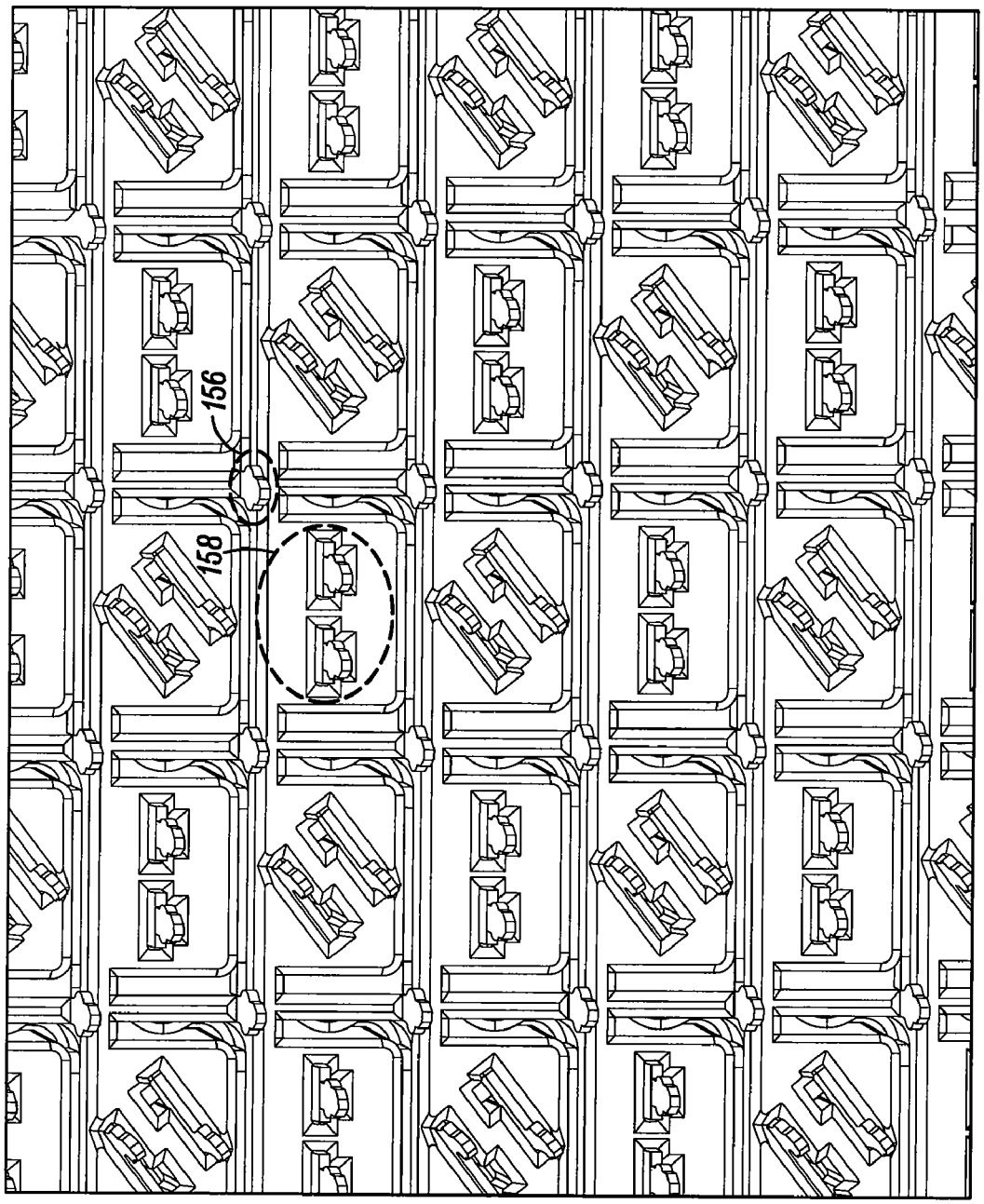
FIG. 25 illustrates one implementation of a mounting face of a header unit.

In some implementations, the ground mounting pins 156 and signal mounting pins 158 may be positioned on the header module 136 as shown in FIGS. 25, 26a and 26b to create a noise-canceling footprint 159. Referring to FIG. 26b, in the noise-canceling footprint 159, an orientation of a pair of signal mounting pins 160 is offset from an orientation of each adjacent pair of signal mounting pins 162 that is not separated from signal mounting pins 160 by a ground mounting pin 163. For example, the orientation of a pair of signal mounting pins 160 may be offset by 90 degrees from the orientation of each pair of signal mounting pins 162 that is not separated from the pair of signal mounting pins 160 by a ground mounting pin 163.

Figure 27A:
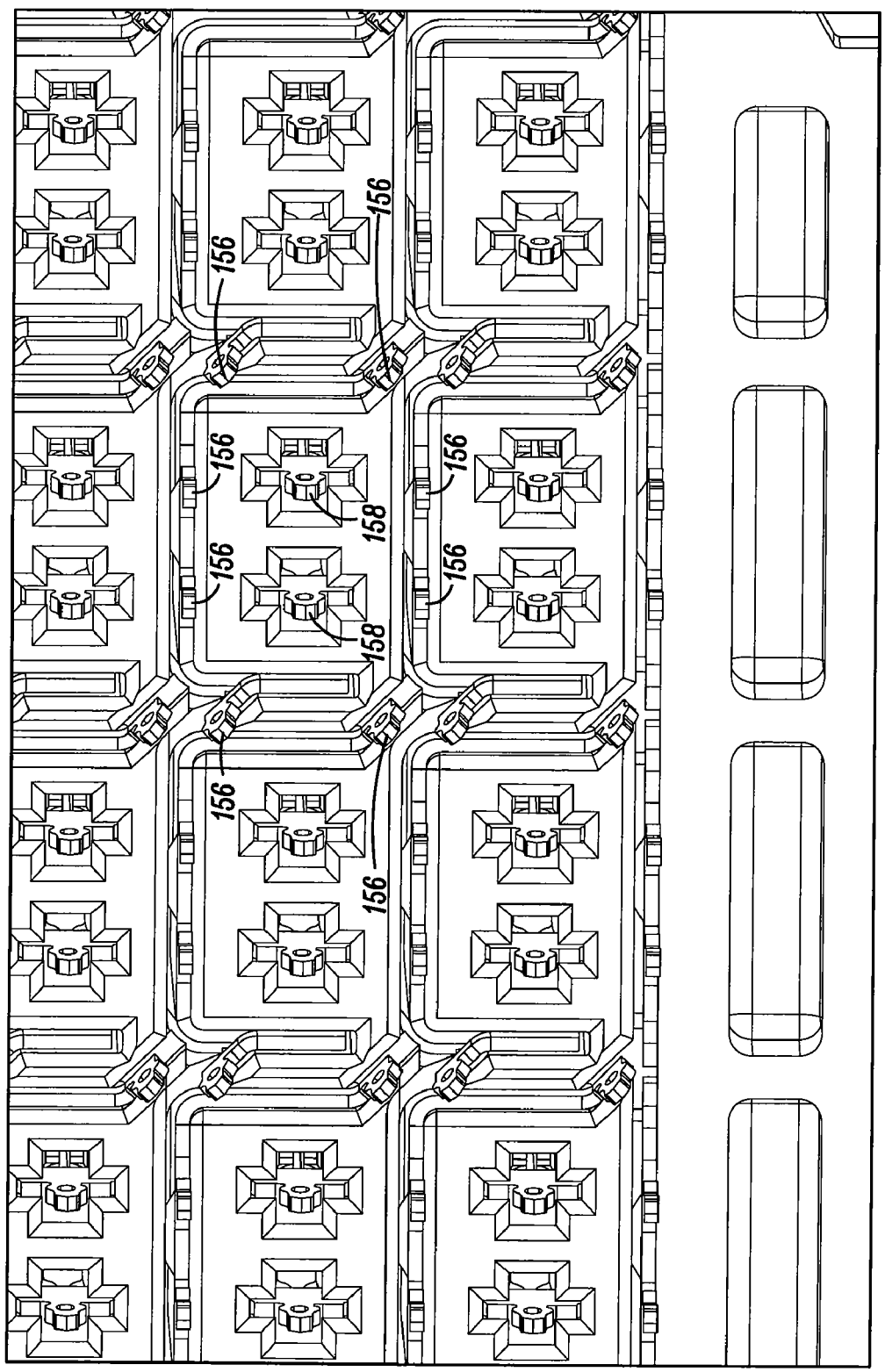
FIG. 27a illustrates another implementation of a mounting face of a header unit.
Figure 27B:
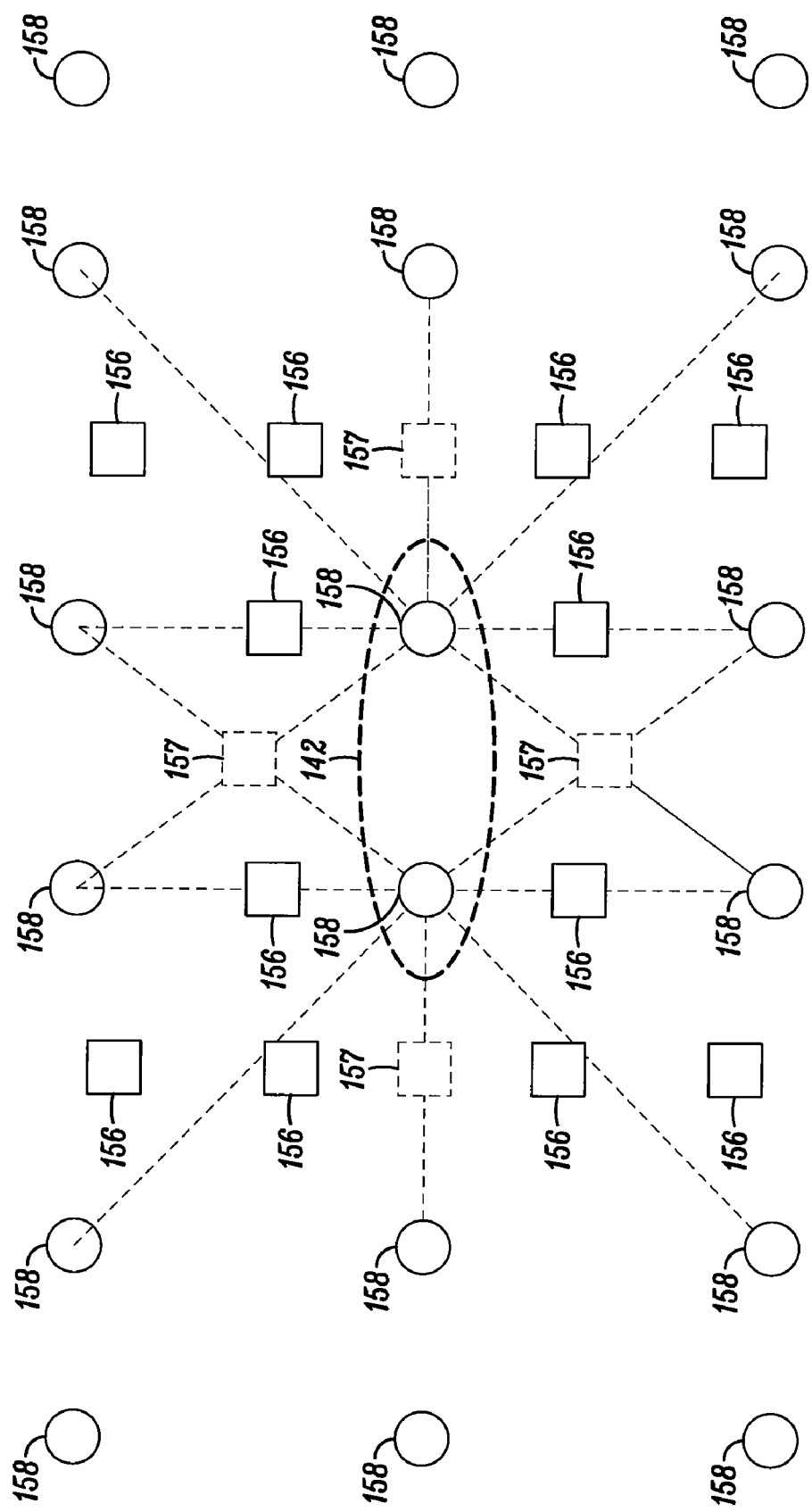

In other implementations of footprints, as shown in FIGS. 27a and 27b, each pair of signal mounting pins 158 is positioned in the same orientation. C-shaped ground shields 138 and ground tabs 140 with multiple ground mounting pins 156 are then positioned around the signal pin pairs 142 as described above. The ground mounting pins 156 of the C-shaped ground shields 138 and ground tabs 140 are positioned such that at least one ground mounting pin 156 is positioned between a signal mounting pin 158 of a first signal pin pair 142 and a signal mounting pin 158 of adjacent signal pin pairs 142. In some implementations, in addition to the ground mounting pins illustrated in FIG. 27a and FIG. 27b, the C-shaped ground shields 138 and ground tabs 140 may include ground mounting pins 156 positioned at locations 157.

Figure 27C:
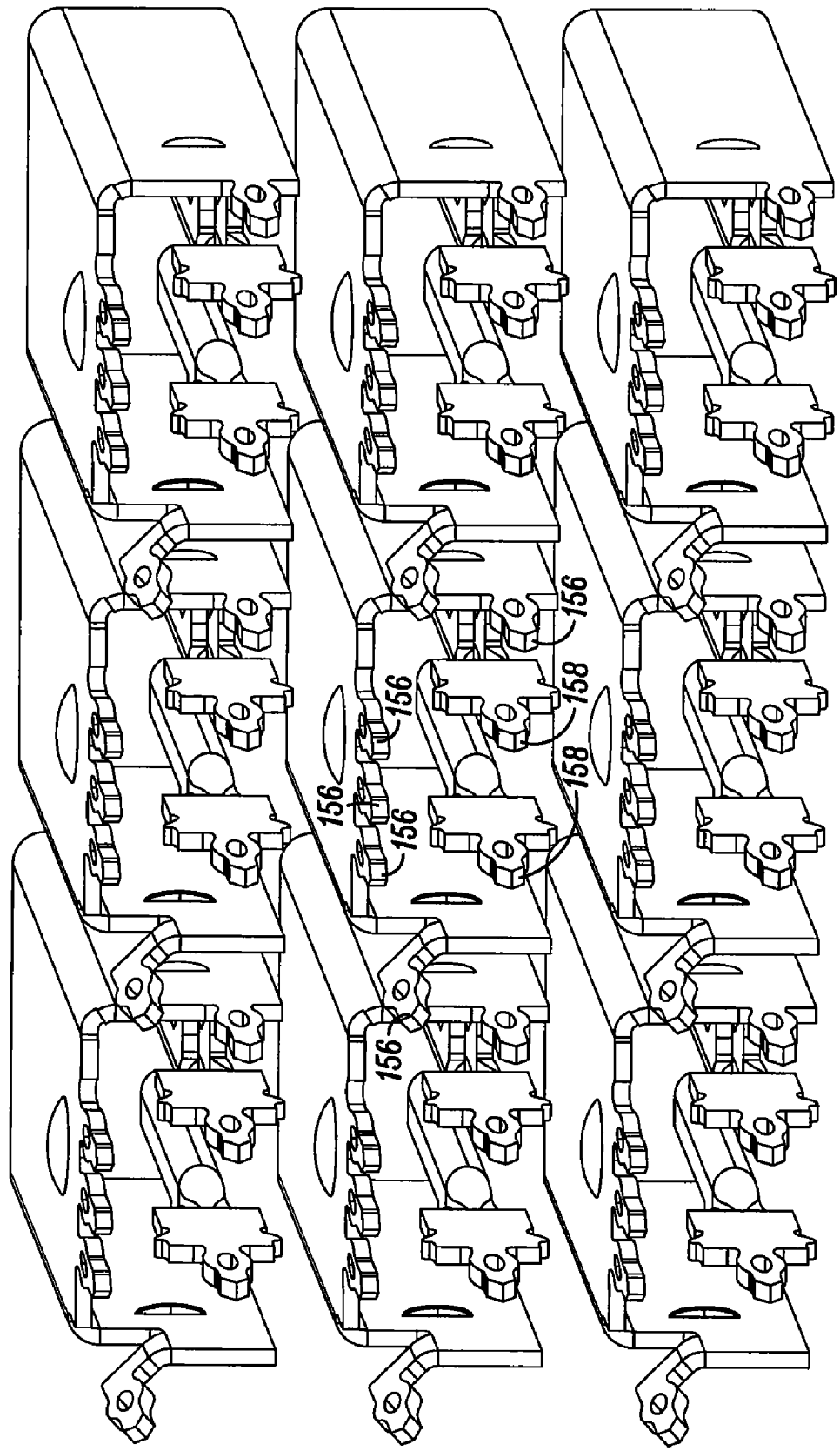
FIG. 27c illustrates yet another implementation of a mounting face of a header unit.
Figure 27D:
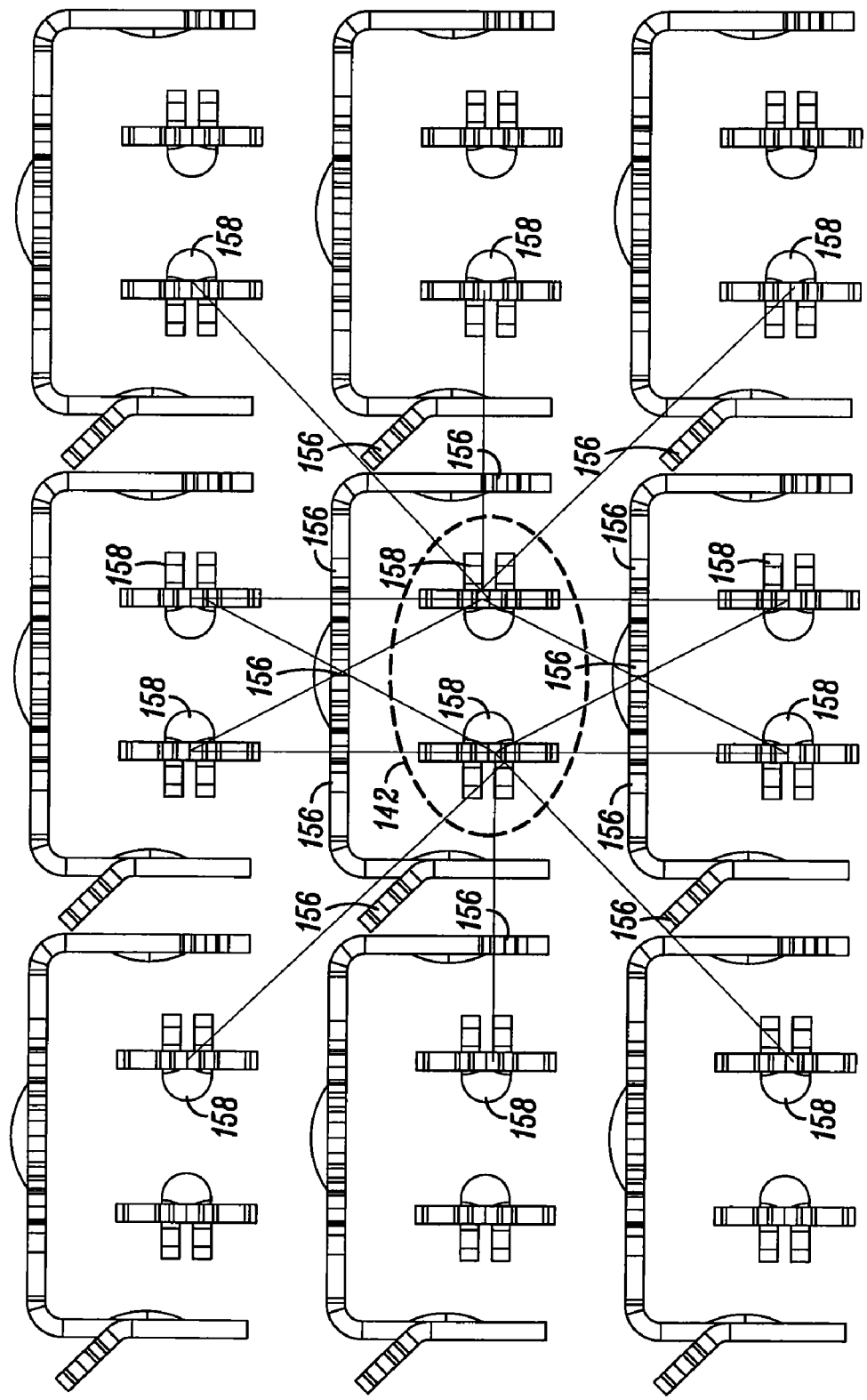
FIG. 27d illustrates a noise-cancelling array of the mounting face of the header unit of FIG. 27c.

In yet other implementations of footprints, as shown in FIGS. 27c and 27d, each pair of signal mounting pins 158 is positioned in the same orientation. C-shaped ground shields 138 and ground tabs 140 with multiple ground mounting pins 156 are then positioned around the signal pin pairs 142 as described above. The ground mounting pins 156 are positioned such that at least one ground mounting pin 156 is positioned between a signal mounting pin 158 of a first signal pin pair 142 and a signal mounting pin 158 of adjacent signal pin pairs 142.

It will be appreciated that positioning ground mounting pins 156 between the signal mounting pins 158 reduces an amount of crosstalk between the signal mounting pins 158. Crosstalk occurs when a signal traveling along a signal pin of a signal pin pair 142 interferes with a signal traveling along a signal pin of another signal pin pair 142.

With respect to the footprints described above, typically, the signal mounting pins 158 of the header module 136 engage a substrate at a plurality of first vias positioned on the substrate, wherein the plurality of first vias are arranged in a matrix of rows and columns and able to provide mounting of the electrical connector. Each first via is associated with one of its closest neighboring first vias to form a pair of first vias. The pair of first vias is configured to receive signal mounting pins 158 of one of the signal pin pairs 142. The ground mounting pins 156 of the C-shaped ground shields 138 and ground tabs 140 of the header module 136 engage a substrate at a plurality of second vias positioned on the substrate. The plurality of second vias are configured to be electrically commoned to one another to provide a common ground, and are positioned amongst the plurality of first vias such that there is at least one second via positioned directly between each first via and any of the closest non-paired first via neighbors.

Examples of substrate footprints that may receive the mounting end of header module 156, or as explained in more detail below the mounting end of the plurality of wafer assemblies 102, are illustrated in FIGS. 28a, 28b, 28c, and 28d. It will be appreciated that substrate footprints should be able to maintain an impedance of a system, such as 100 Ohms differentially, while also minimizing pair-to-pair crosstalk noise. Substrate footprints should also provide adequate routing channels for differential pairs while preserving skew-free routing and connector design. These tasks should be completed for substrate footprints that are highly dense while minding substrate aspect ratio limits where vias must be large enough (given a substrate thickness) in order to ensure reliable manufacturing.

Figure 28A:
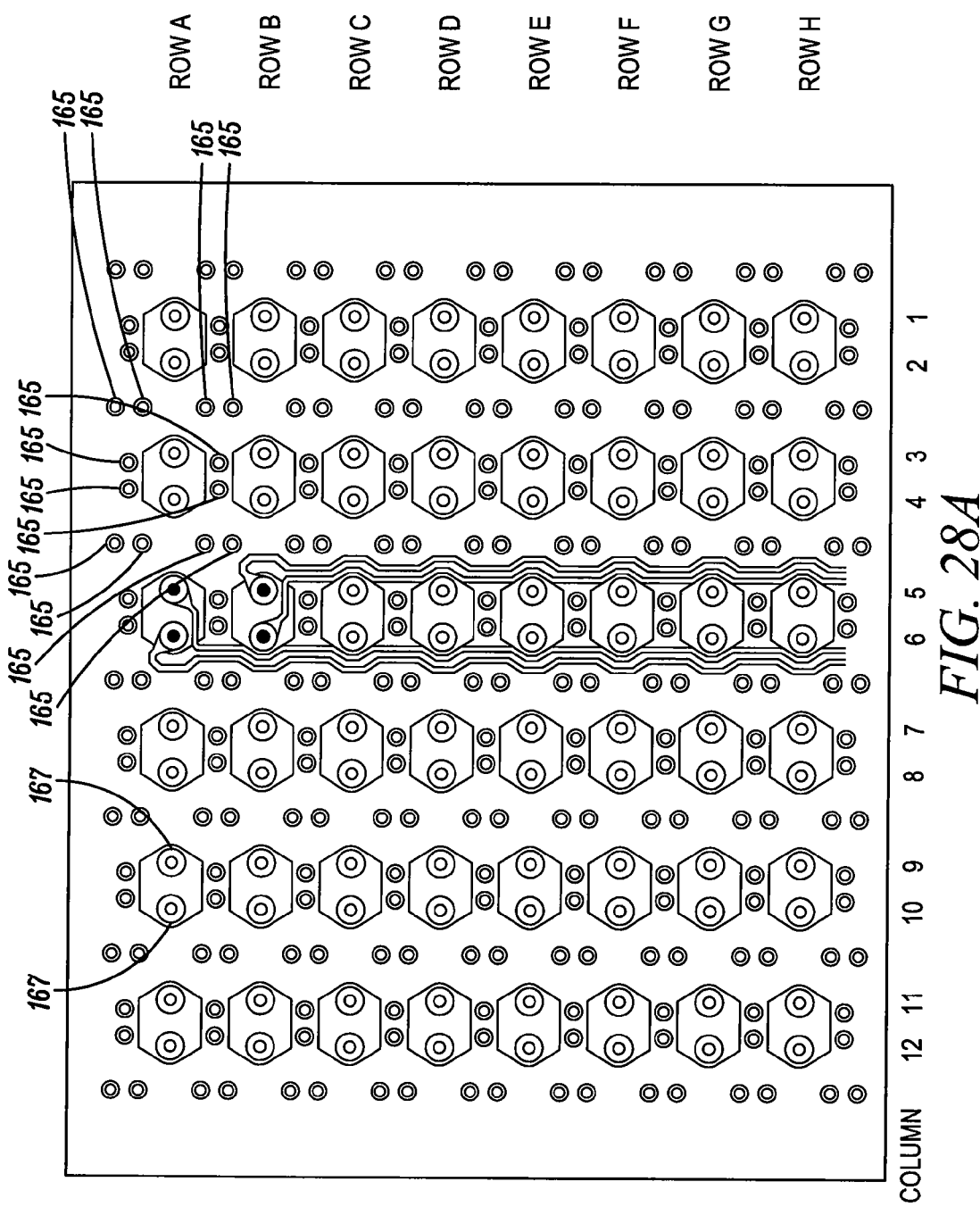
FIG. 28a illustrates a substrate footprint that may be used with high-speed backplane connector systems.
Figure 28B:
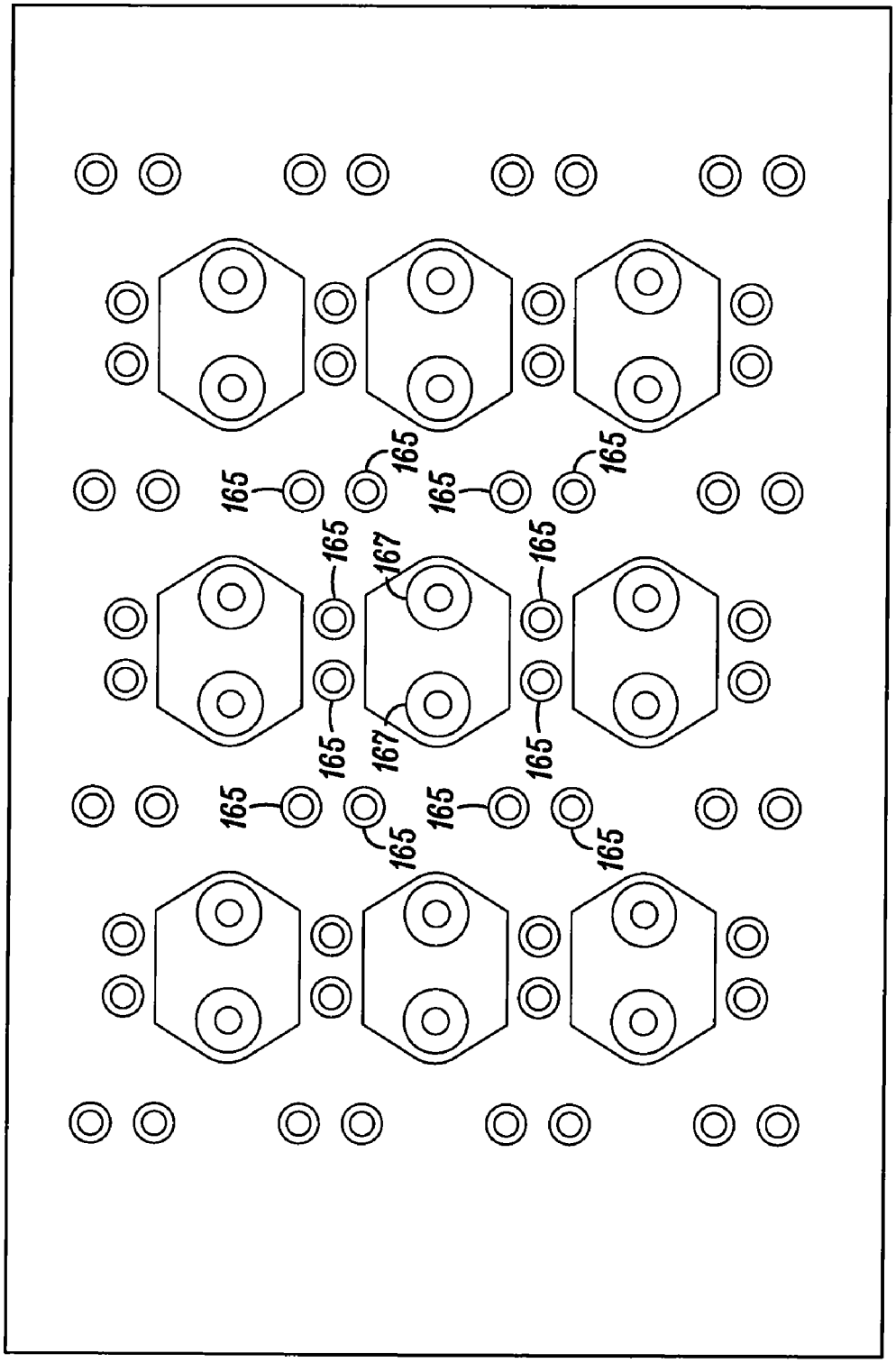

One implementation of an optimized in-row-differential substrate footprint that may accomplish these tasks is illustrated in FIGS. 28a and 28b. This substrate footprint is oriented "in-row" so as to reduce or eliminate routing skew and connector skew. Further, the substrate footprint provides improved performance by providing multiple points of contact 165 for connector grounds shields to the printed circuit board around points of contact 167 for signal pins or electrical contacts. Additionally, the substrate footprint provides the ability to route all differential pairs out of an 8-row footprint in only four layers while minimizing intra-layer, inter-layer, and trace-to-barrel routing noise.

The substrate footprint minimizes pair-to-pair crosstalk in that the total synchronous, multi-aggressor, worst-case crosstalk from a 20 ps (20-80%) edge is approximately 1.90% (far end noise). Further, the footprint is arranged such that a majority of the far end noise comes from "in-row" aggressors, meaning that schemes such as arrayed transmit/receiver pinouts and layer-specific routing can reduce the noise of the footprint to less than 0.50%. In some implementations, at 52.1 pairs of vias per inch, the substrate footprint provides an 8-row footprint with an impedance of over 80 Ohms, thereby providing differential insertion loss magnitude preservation in a 100 Ohm nominal system environment. In this implementation, an 18 mil diameter drill may be used to create the vias of the substrate footprint, keeping an aspect ratio of less than 14:1 for substrates as thick as 0.250 inch.

Figure 28C:
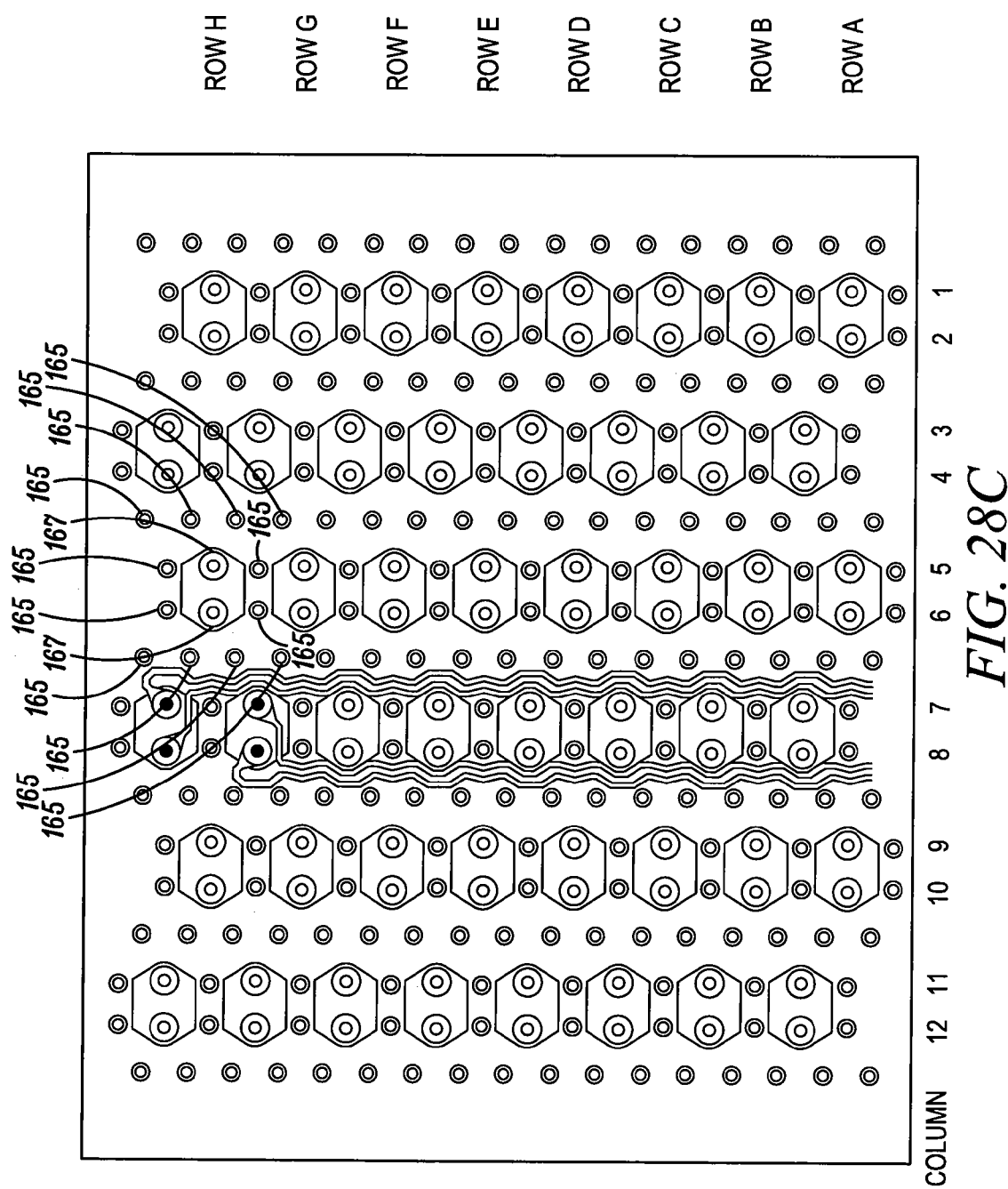
FIG. 28c illustrates a substrate footprint that may be used with high-speed backplane connector systems.
Figure 28D:
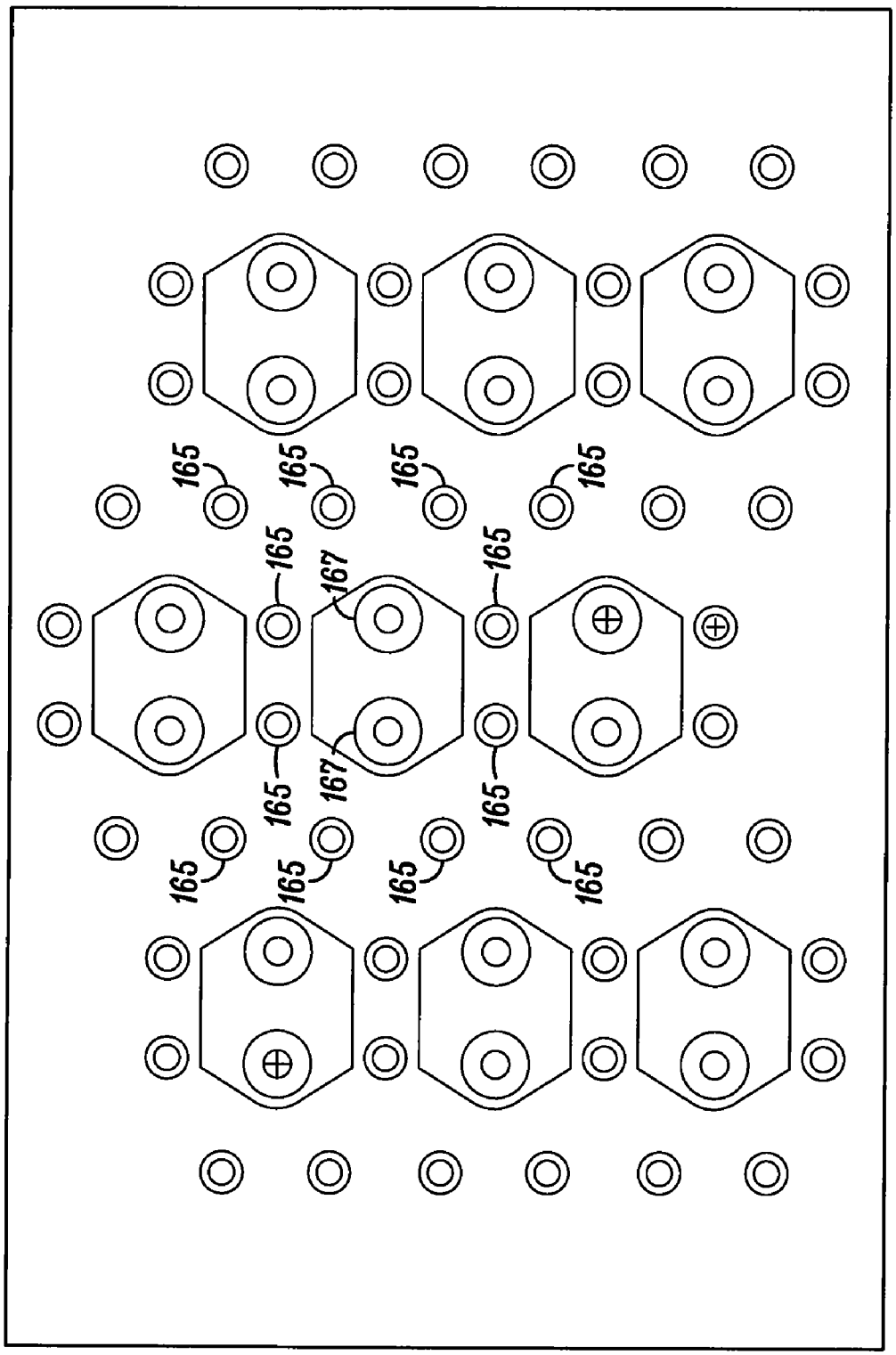
FIG. 28d illustrates an enlarged view of the substrate footprint of FIG. 28c.

Another implementation of an optimized in-row-differential substrate footprint is illustrated in FIGS. 28c and 28d. In contrast to the substrate footprint of FIGS. 28a and 28b, adjacent columns of in the substrate footprint are offset from each other in order to minimize noise. Similar to the substrate footprint described above, this substrate footprint is oriented "in-row" so as to reduce or eliminate routing skew and connector skew; provides improved performance by providing multiple points of contact 165 for connector grounds shields to the printed circuit board around points of contact 167 for signal pins or electrical contacts; and provides the ability to route all differential pairs out of an 8-row footprint in only four layers while minimizing intra-layer, inter-layer, and trace-to-barrel routing noise.

The substrate footprint minimizes pair-to-pair crosstalk in that the total synchronous, multi-aggressor, worst-case crosstalk from a 20 ps (20-80%) edge is approximately 0.34% (far end noise). In some implementations, at 52.1 pairs of vias per inch, the substrate footprint provides an impedance of approximately 95 Ohms. In some implementations, a 13 mil diameter drill may be used to create the vias of the substrate footprint, keeping aspect ratio of less than 12:1 for substrates as thick as 0.150 inch.

It will be appreciated that while the footprints of FIGS. 27a, 27b, 27c, and 27d have been described with respect to the high-speed connector systems described in the present application, these same footprints could be used with other modules that connect to substrates such as printed circuit boards.

Figure 29A:
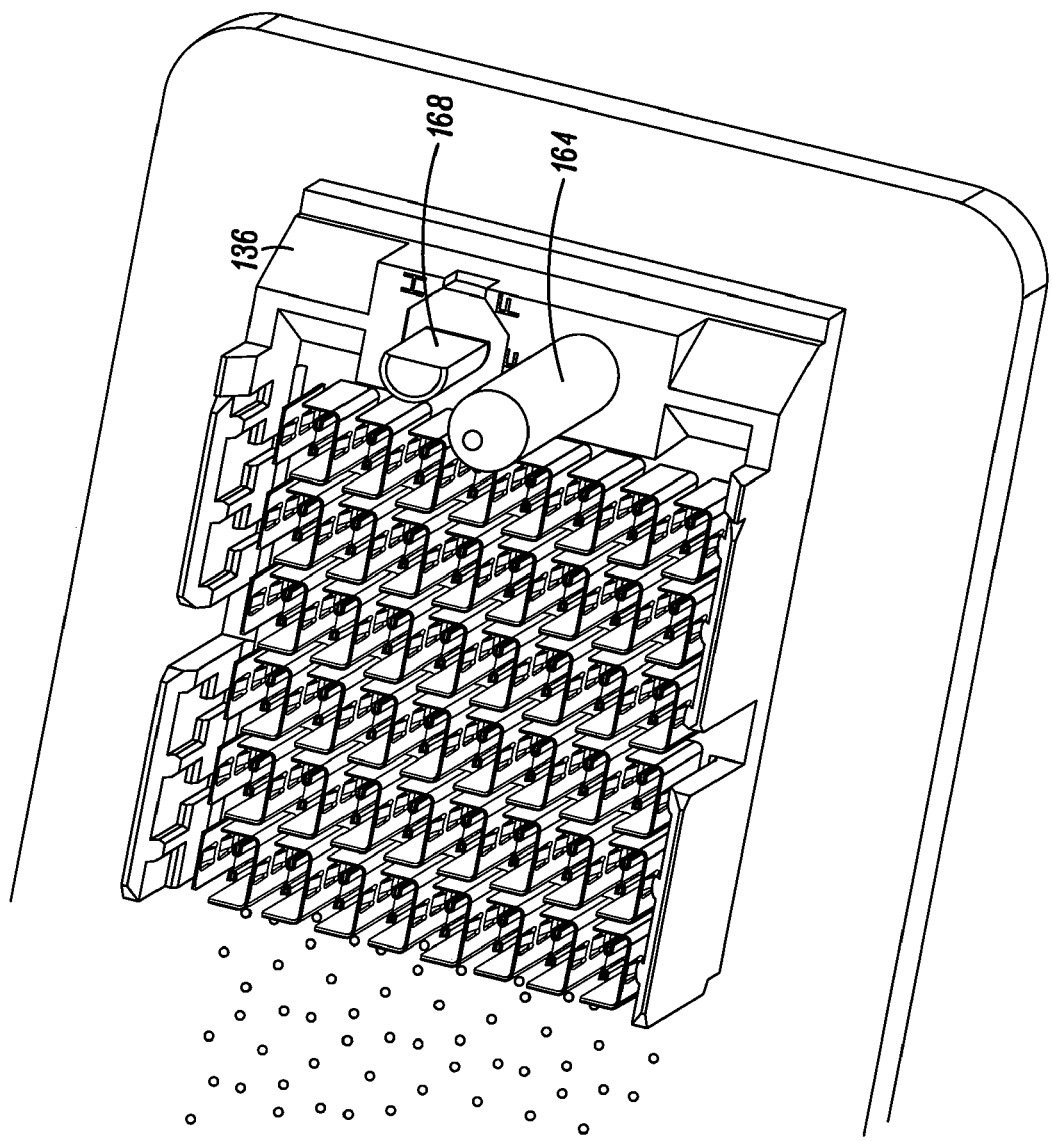
FIG. 29a illustrates a header unit including a guidance post and a mating key.
Figure 29B:
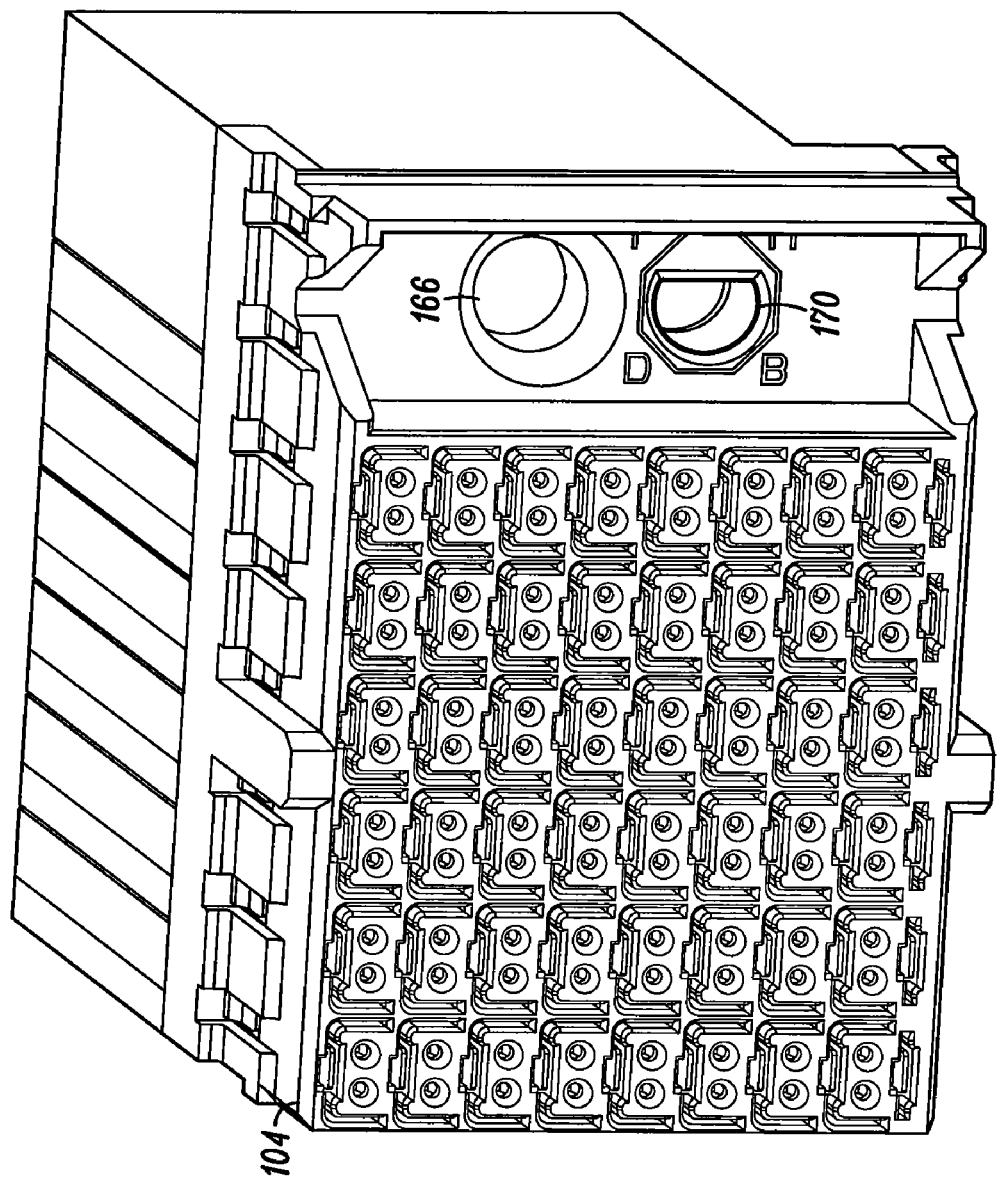

Referring to FIGS. 29a and 29b, in some implementations, to improve mating alignment between the wafer housing 104 and the header module 136, the header module 136 may include a guidance post 164 and the wafer housing 104 may include a guidance cavity 166 that receives the guidance post 164 when the wafer housing 104 mates with the header module 136. Generally, the guidance post 164 and corresponding guidance cavity 166 engage to provide initial positioning before the wafer housing 104 mates with the header module 136.

Further, in some implementations, the header module 136 may additionally include a mating key 168 and the wafer housing 104 may include a complementary keyhole cavity 170 that receives the mating key 168 when the wafer housing 104 mates with the header module 136. Typically, the mating key 168 and complementary keyhole cavity 170 may be rotated to set the complementary keys at different positions. Wafer housings 104 and header modules 136 may include the mating key 168 and complementary keyhole cavity 170 to control which wafer housing 104 mates with which header module 136.

Figure 30A:
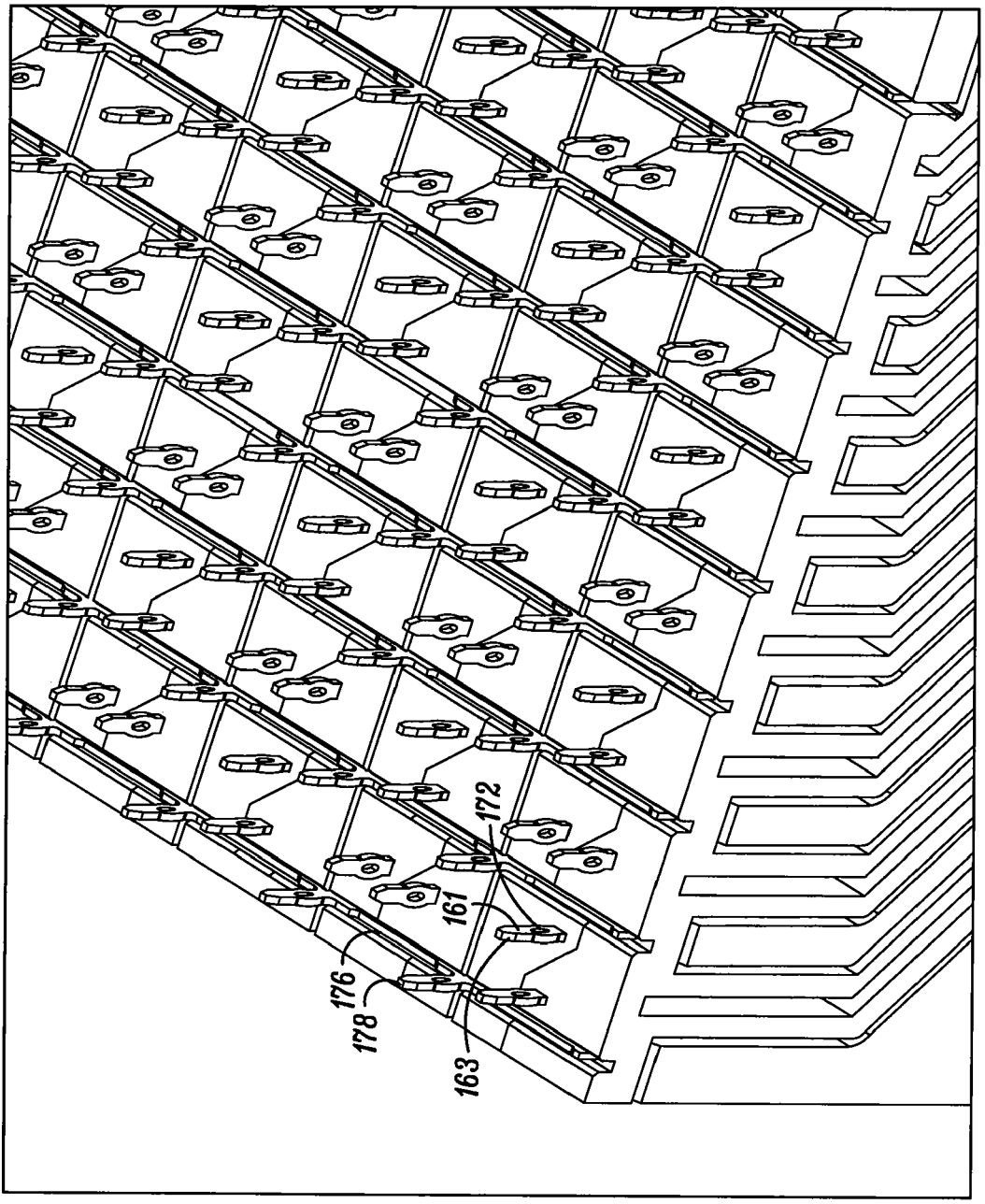
FIG. 30a illustrates a mounting end of a plurality of wafer assemblies.
Figure 30B:
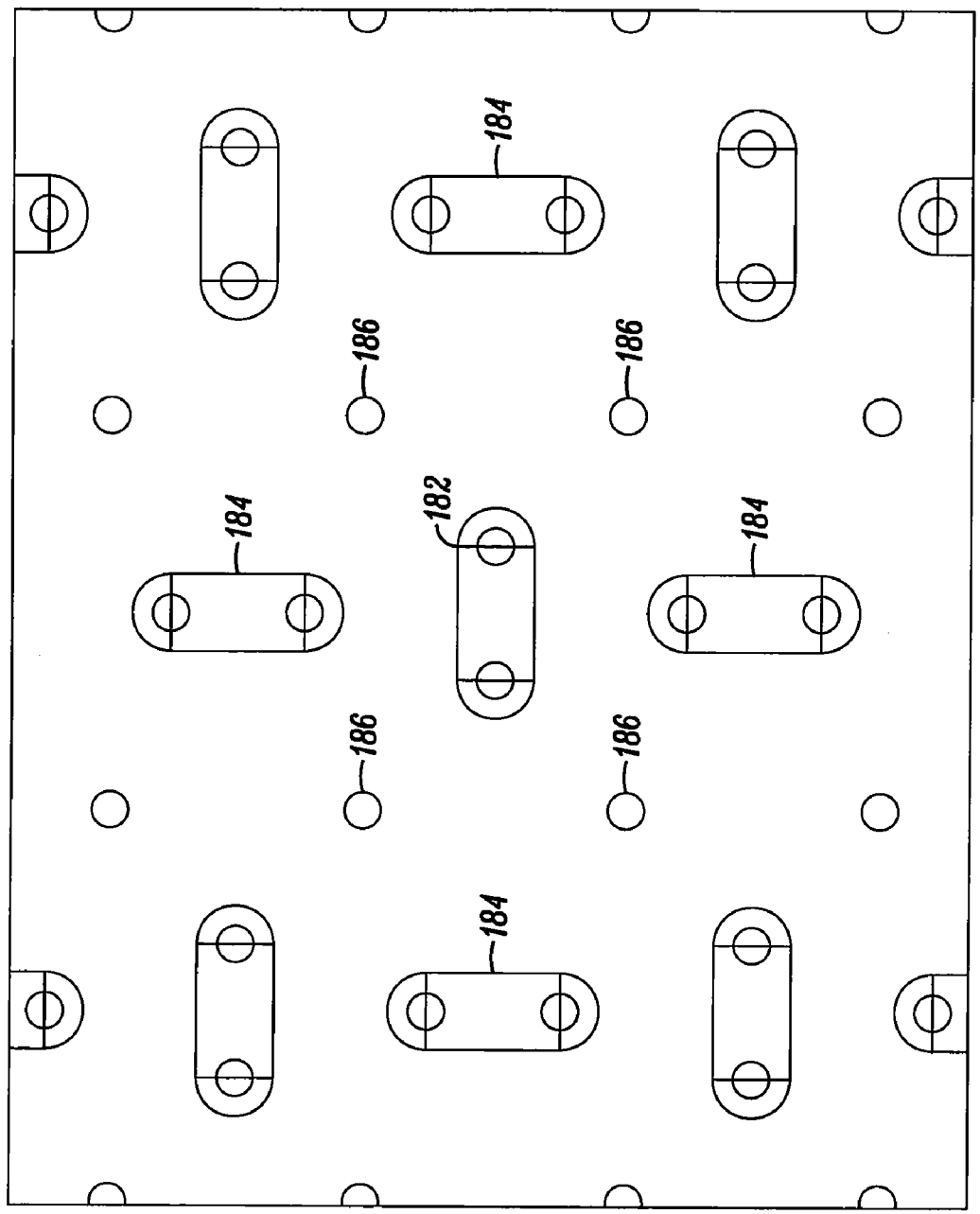

Referring to the mounting end 170 of the plurality of wafer assemblies 102, as shown in the FIG. 30a, electrical contact mounting pins 172 of the first and second arrays of electrical contacts 110, 112 extend from the wafer assemblies 102. A plurality of tie bars 174 is additionally positioned at the mounting end 170 of the plurality of wafer assemblies 102.

Figure 31A:
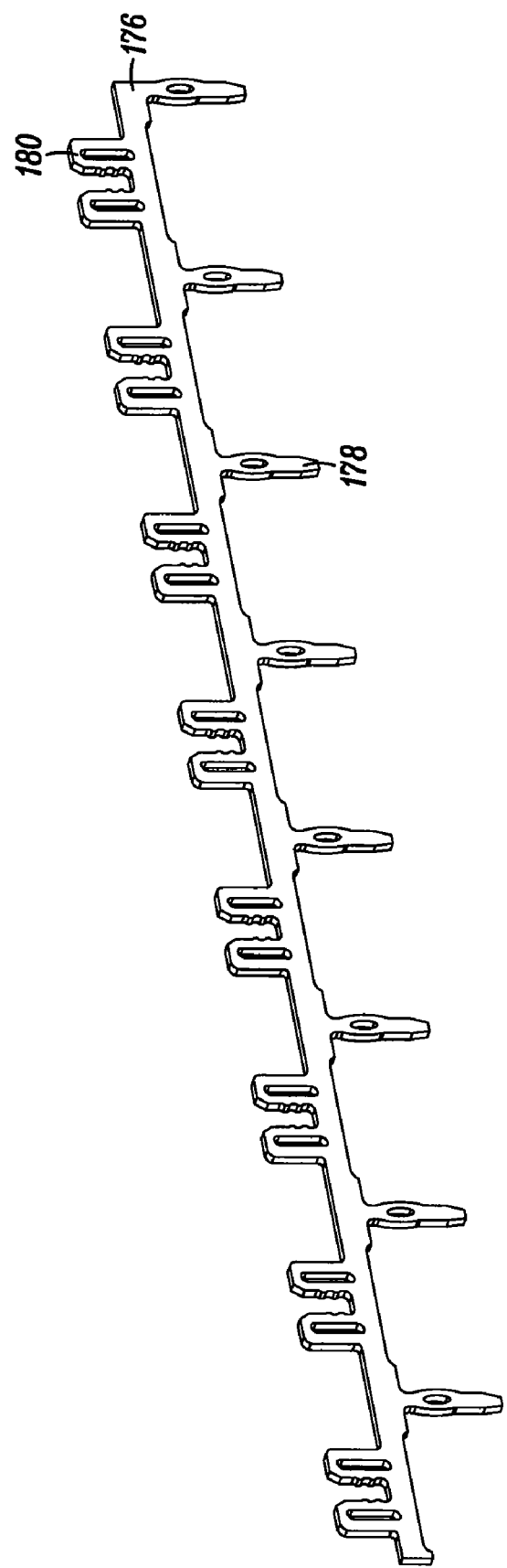
FIG. 31a is a perspective view of a tie bar.
Figure 31B:
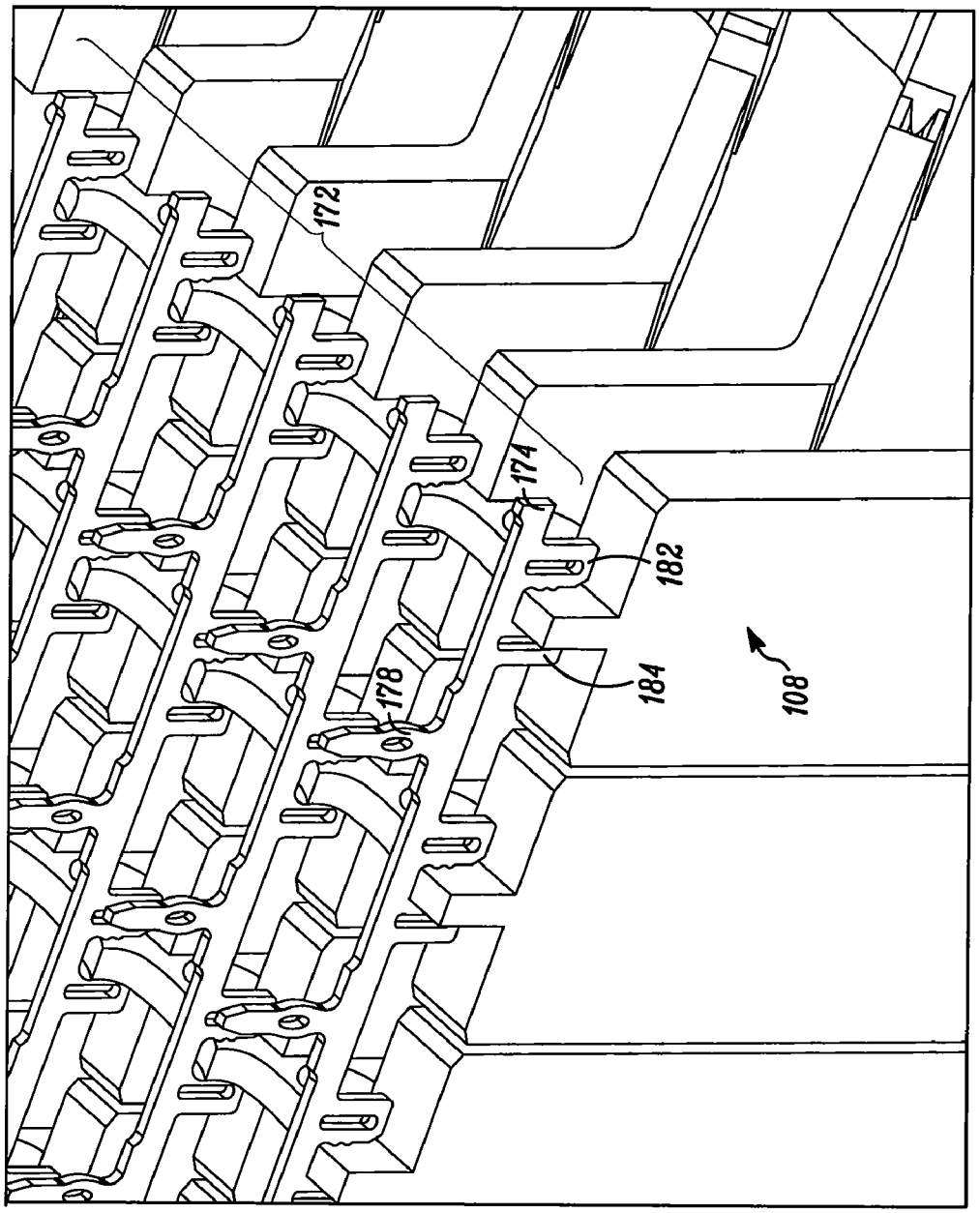
FIG. 31b illustrates a tie bar engaging a plurality of wafer assemblies.

Each tie bar 176, shown in detail in FIG. 31a, includes a plurality of substrate engagement elements 178, such as ground mounting pins, and a plurality of pairs of engagement tabs 180. Each tie bar 174 is positioned across the plurality of wafer assemblies 102 so that the tie bar 174 engages each wafer assembly. Specifically, as shown in FIG. 31b, each pair of engagement tabs 180 engages a different wafer assembly 106 with a first tab 182 of a pair of engagement tabs 174 positioned on one side of the center frame 108 and a second tab 184 of the pair of engagement tabs 174 positioned on the other side of the center frame 108.

The electrical contact mounting pins 172 extend from the plurality of wafer assemblies 102, and the ground mounting pins 178 extend from the plurality of tie bars 174, to engage a substrate such as a backplane circuit board or a daughtercard circuit board, as known in the art. As discussed above, each electrical contact mounting pin 172 and each ground mounting pin may define a broadside 161 and an edge 163 that is smaller than the broadside 161.

In some implementations, each pair of electrical contact mounting pins 172 corresponding to an electrical contact pair 130 is positioned in one of two orientations, such as broadside coupled or edge coupled. In other implementations, each pair of electrical contact mounting pins 172 corresponding to an electrical contact pair 130 is positioned in one of two orientations, wherein in a first orientation, a pair of electrical contact mounting pins 172 is aligned so that the broadsides 161 of the pins are substantially parallel to a substrate, and in a second orientation, a pair of electrical contact mounting pins 172 are aligned so that the broadsides 161 are substantially perpendicular to the substrate.

The electrical contact mounting pins 172 and the ground mounting pins 178 may additionally be positioned at the mounting end 170 of the plurality of wafer assemblies 102 as shown in FIG. 29 to create a noise-canceling footprint. Similar to the noise-canceling footprint discussed above with the respect to the header module 136, in the noise-cancelling footprint at the mounting end 170 of the plurality of wafer assemblies 102, an orientation of a pair of electrical contact mounting pins 182 is offset from an orientation of each adjacent pair of electrical contact mounting pins 184 that is not separated from the pair of electrical contact mounting pins 182 by a ground mounting pin 186.

Figure 32A:
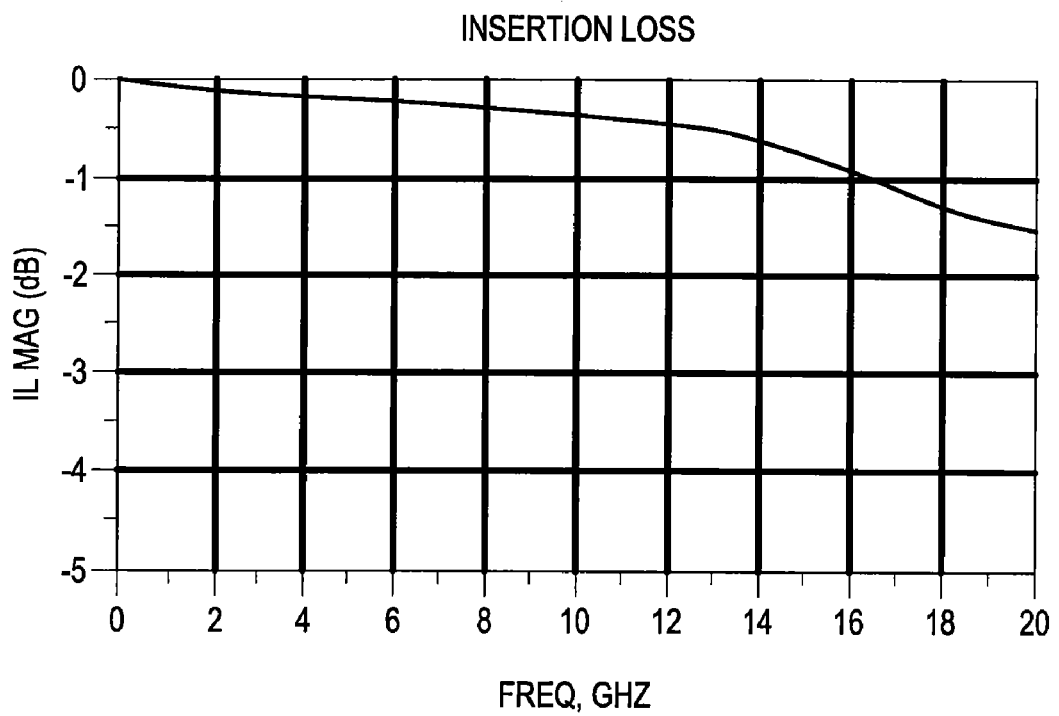
FIG. 32a is a performance plot illustrating insertion loss vs. frequency for the high-speed backplane connector system of FIG. 2.
Figure 32B:
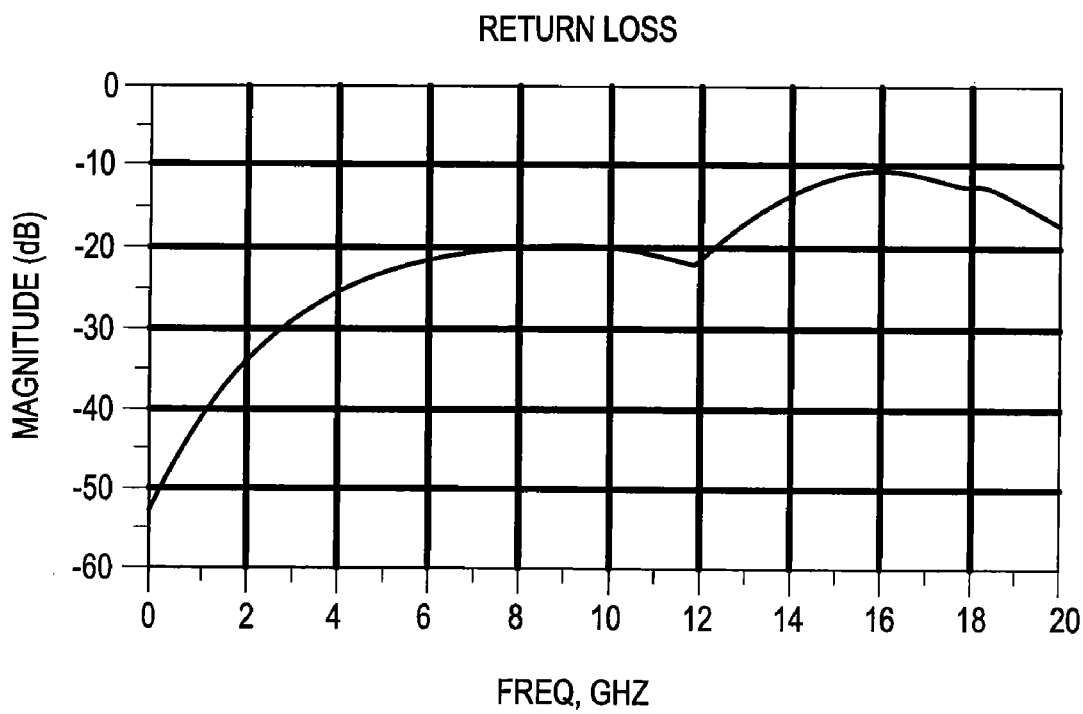
FIG. 32b is a performance plot illustrating return loss vs. frequency for the high-speed backplane connector system of FIG. 2.
Figure 32C:
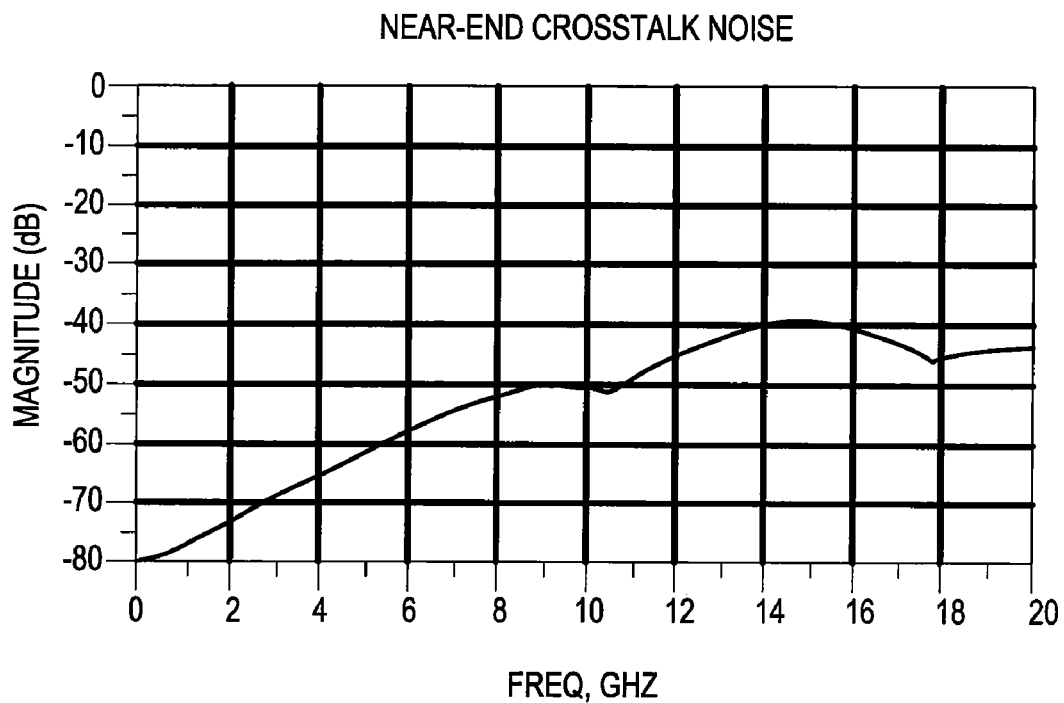
FIG. 32c is a performance plot illustrating near-end crosstalk noise vs. frequency for the high-speed backplane connector system of FIG. 2.
Figure 32D:
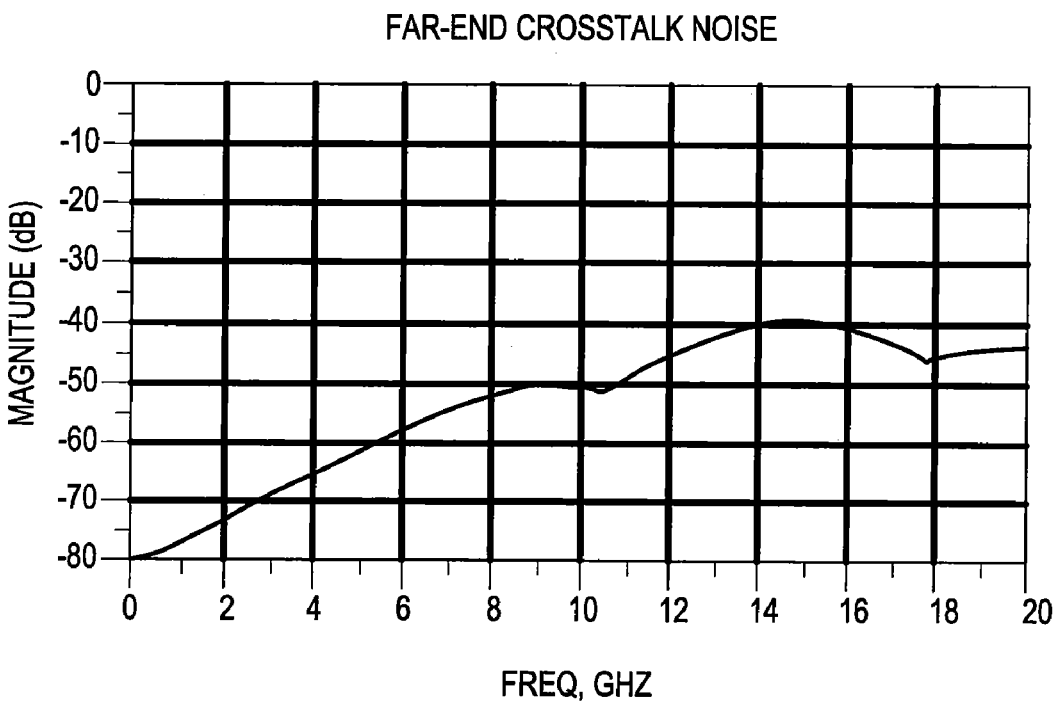
FIG. 32d is a performance plot illustrating far-end crosstalk noise vs. frequency for the high-speed connector system of FIG. 2.
Figure 33:
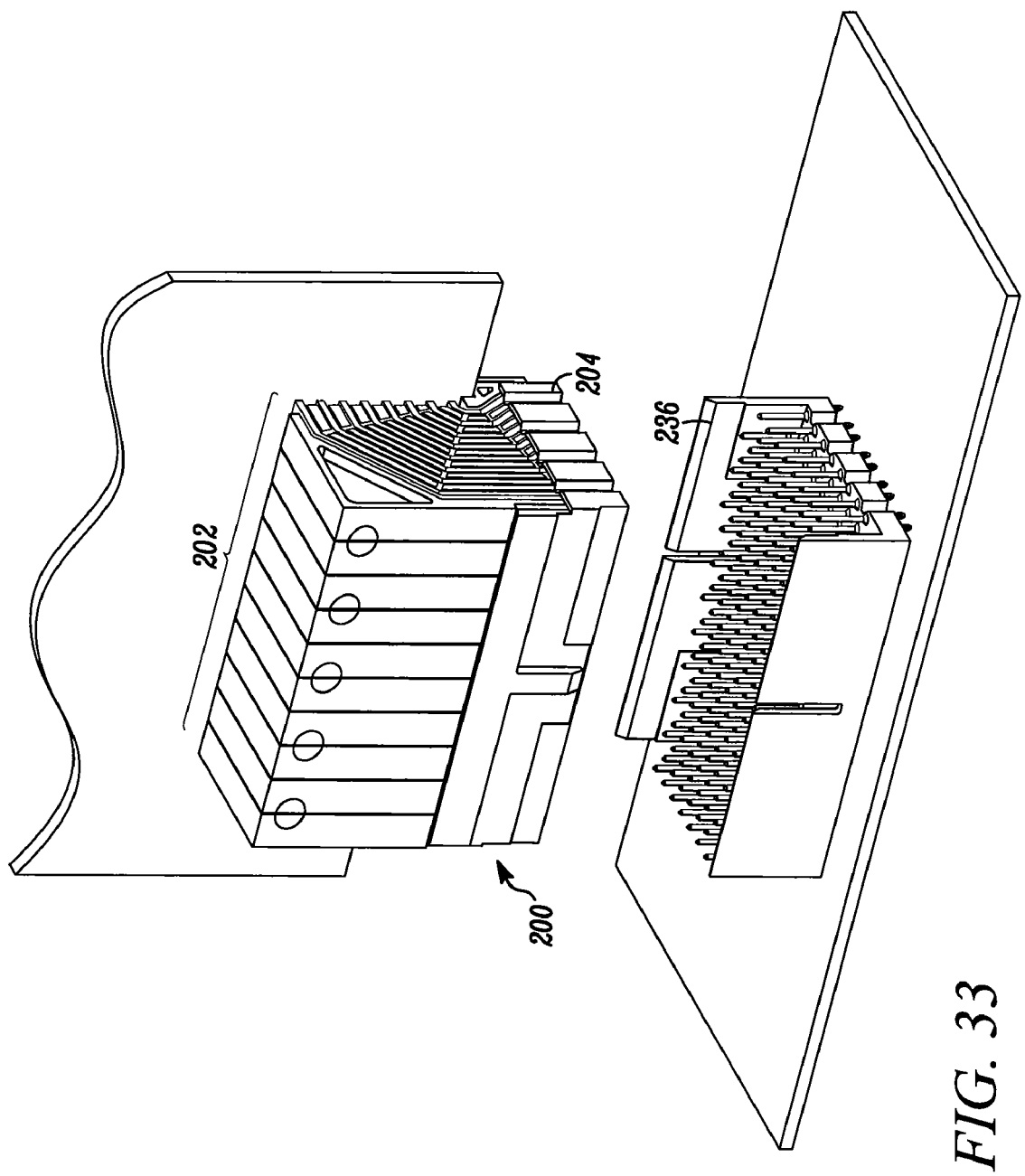
FIG. 33 is a perspective view of another implementation of a high-speed backplane connector system.

FIGS. 32a, 32b, 32c, and 32d are graphs illustrating an approximate performance of the electrical connector system described above with respect to FIGS. 2-31. FIG. 32a is a performance plot illustrating insertion loss vs. frequency for the electrical connector system; FIG. 32b is a performance plot illustrating return loss vs. frequency for the electrical connector system; FIG. 32c is a performance plot illustrating near-end crosstalk noise vs. frequency for the electrical connector system; FIG. 32d is a performance plot illustrating far-end crosstalk noise vs. frequency for the electrical connector system. As shown in FIGS. 32a, 32b, 32c, and 32d, the electrical connector system provides a substantially uniform impedance profile to electrical signals carried on the electrical contacts of the first and second arrays of electrical contacts 110, 112 operating at speeds of up to at least 25 Gbps.

Another implementation of a high-speed backplane connector system 200 is described with respect to FIGS. 33-40. Similar to the connector system 100 described above with respect to FIGS. 2-32, the high-speed backplane connector 200 includes a plurality of wafer assemblies 202 that are positioned adjacent to one another within the connector system 200 by a wafer housing 204.

Each wafer assembly 206 of the plurality of wafer assemblies 202 includes a center frame 208, a first array of electrical contacts 210, a second array of electrical contacts 212, a first ground shield lead frame 214, and a second ground shield lead frame 216. In some implementations, the center frame 208 may comprise a liquid crystal polymer (LCP); the first and second arrays of electrical contacts 210, 212 may comprise phosphor bronze and gold (Au) or tin (Sn) over nickel (Ni) plating; and the first and second ground shield lead frames 214, 216 may comprise brass or phosphor bronze and gold (Au) or tin (Sn) over nickel (Ni) plating. However, in other implementations, the center frame 208 may comprise other polymers; the first and second arrays of electrical contacts 210, 212 may comprise other electrical conductive base materials and platings (noble or non-noble); and the first and second ground shield lead frames 214, 216 may comprise other electrical conductive base materials and platings (noble or non-noble).

Figure 34:
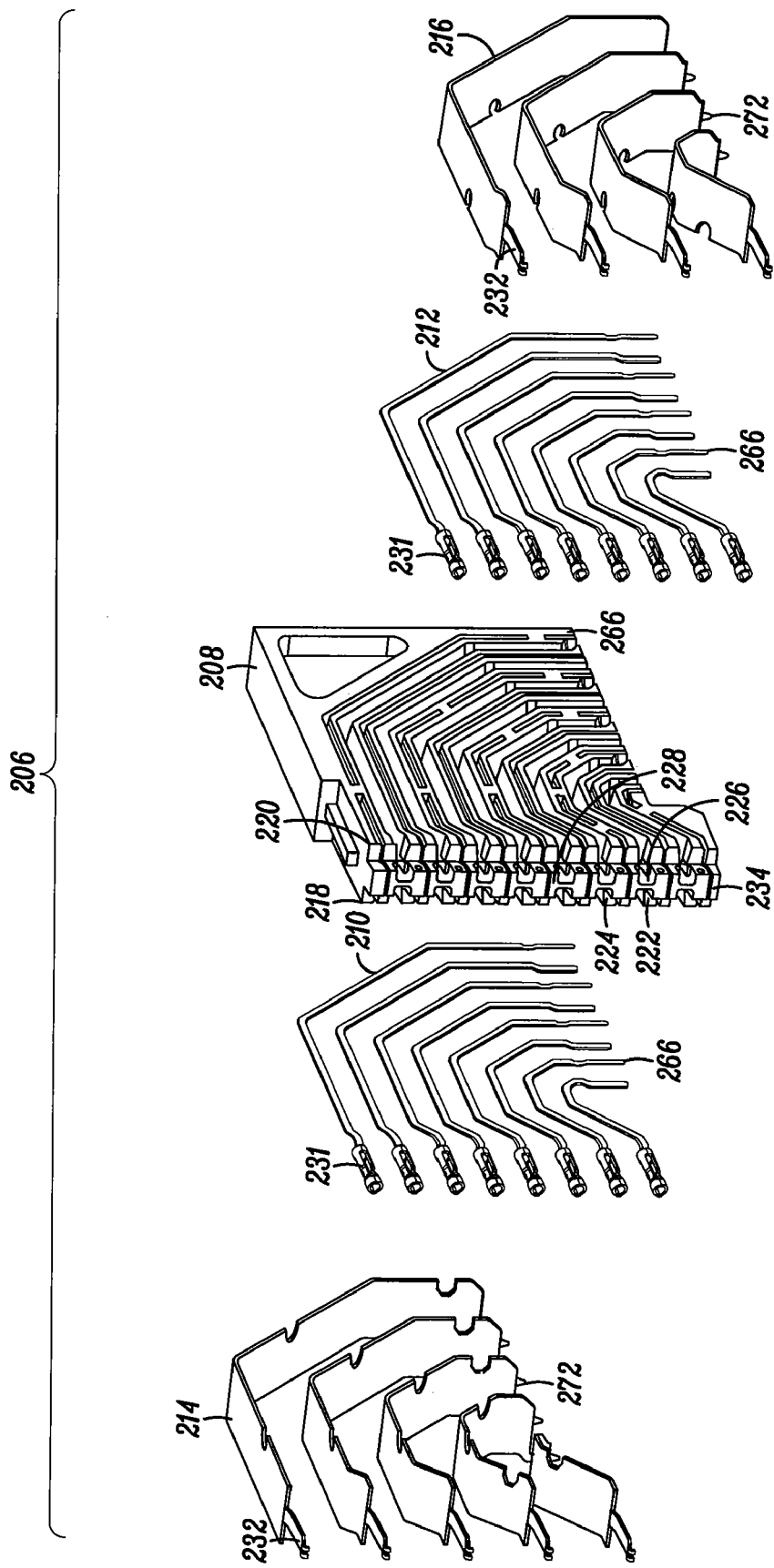
FIG. 34 is an exploded view of a wafer assembly.
Figure 35A:
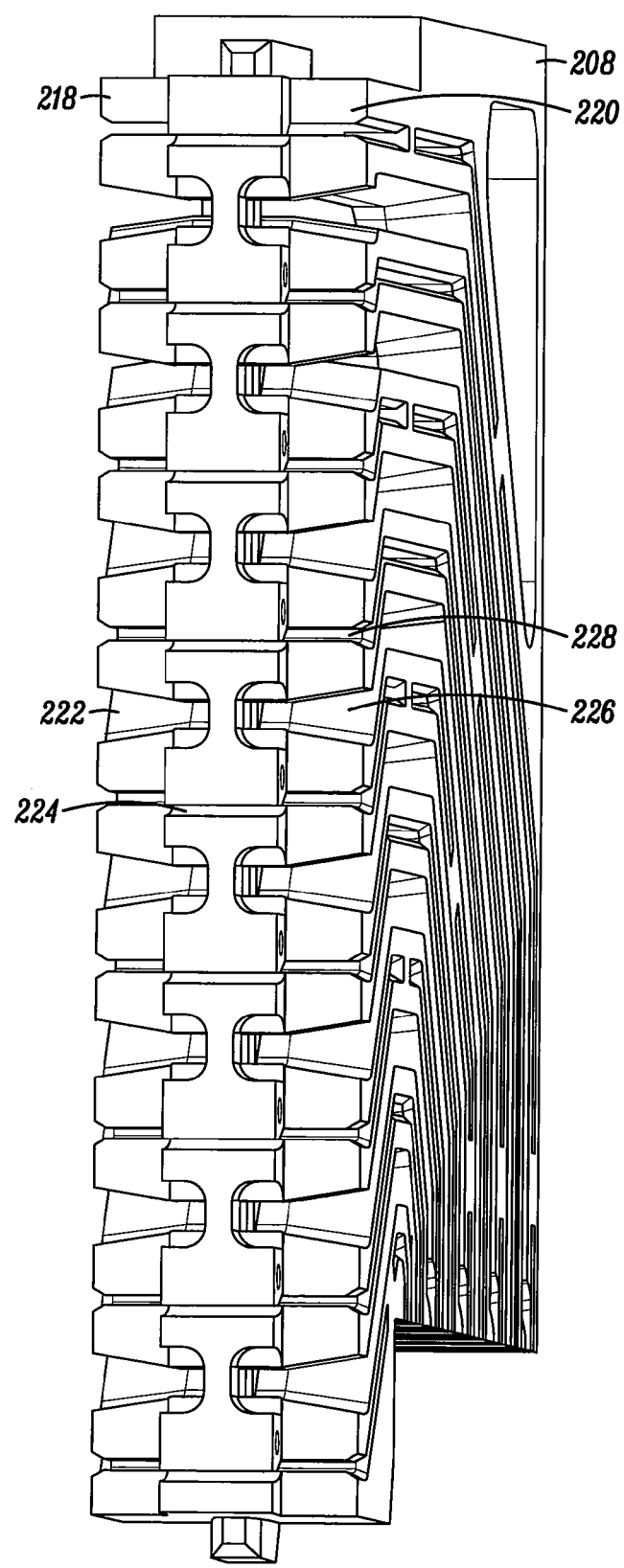
FIG. 35a is a front perspective view of a center frame.
Figure 35B:
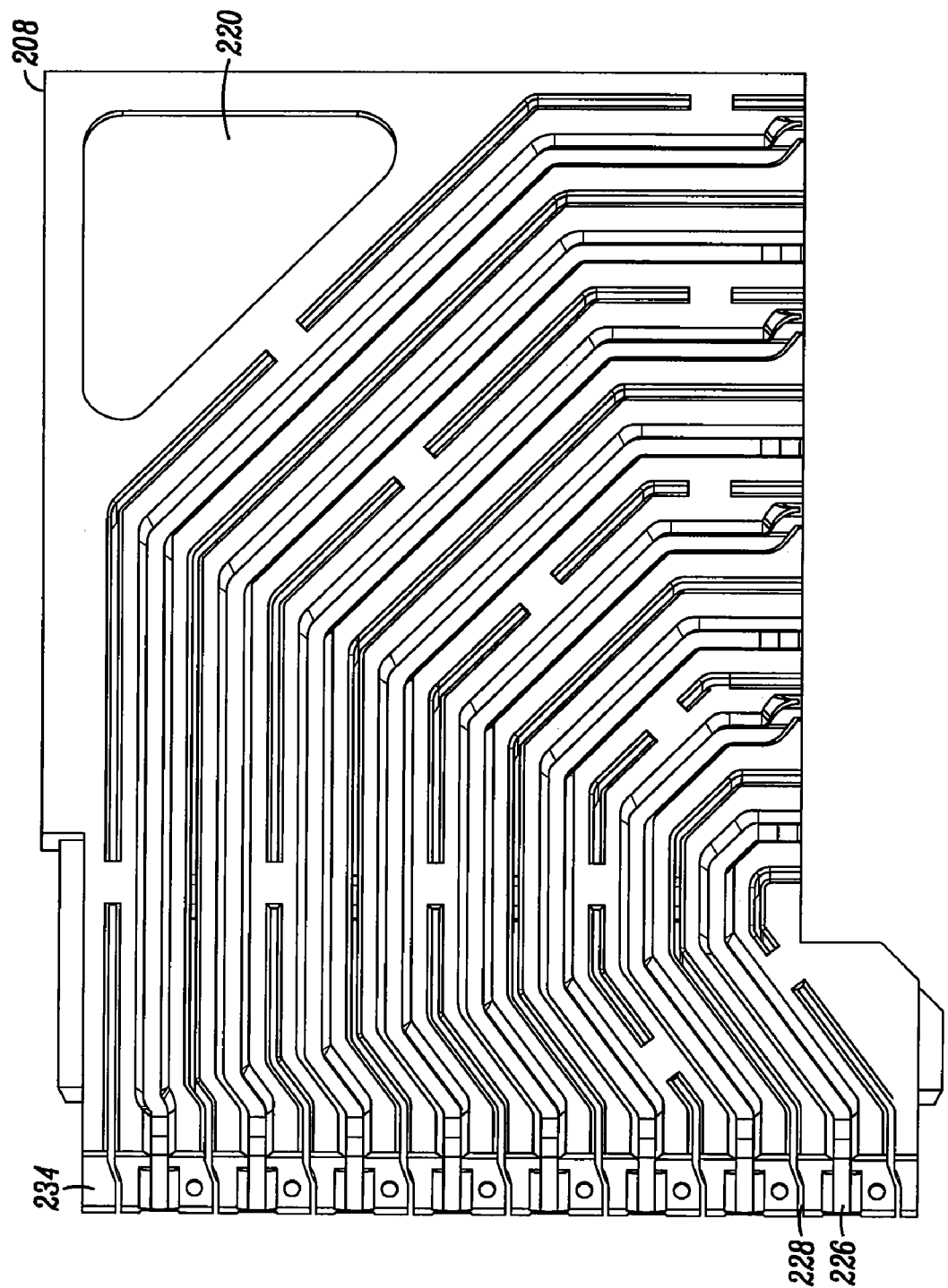
FIG. 35b is a side view of a center frame.
Figure 35C:
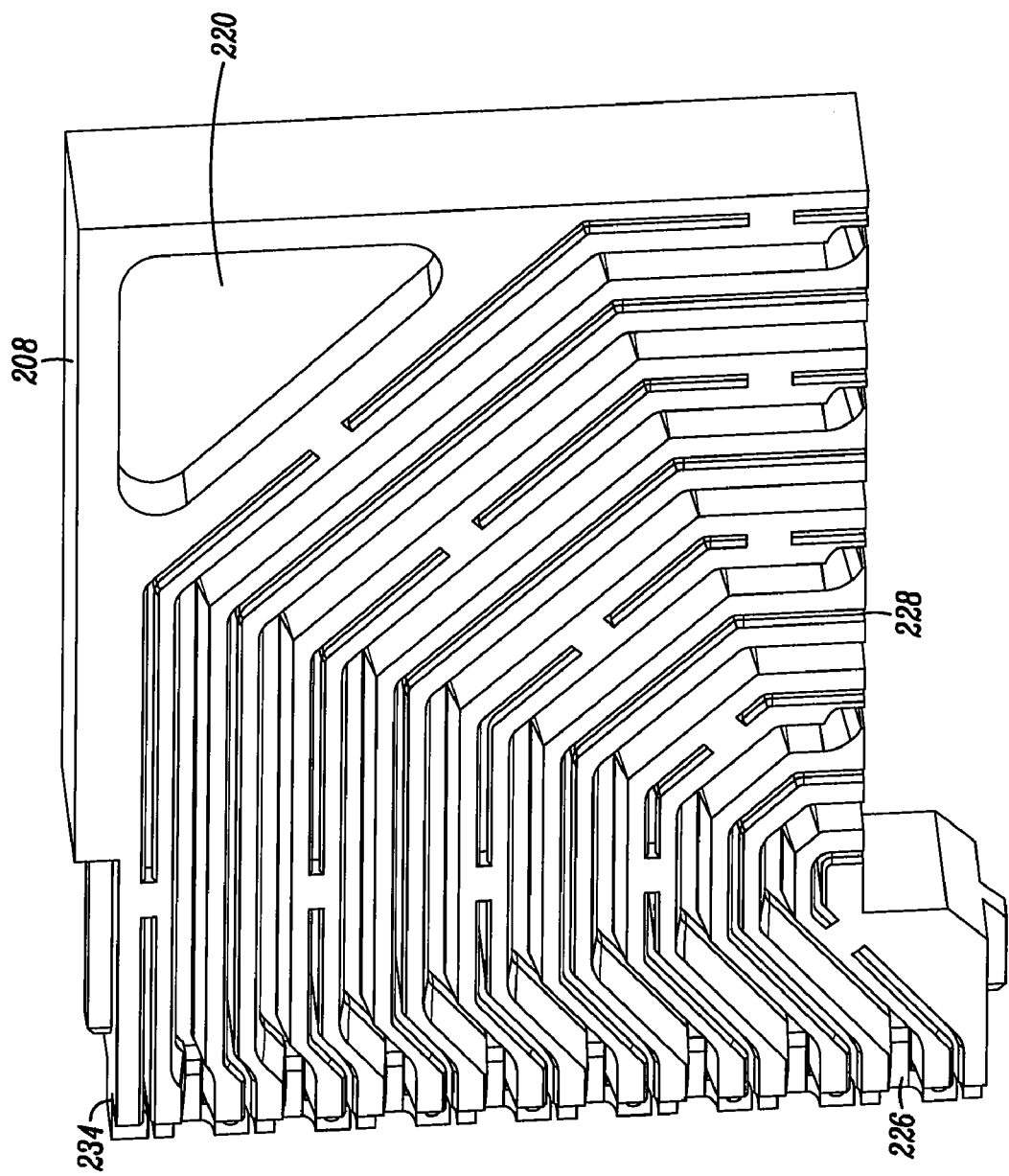
FIG. 35c is a rear perspective view of a center frame.

As shown in FIGS. 34, 35a and 35b, the center frame 208 defines a first side 218 and a second side 220 opposing the first side 218. The first side 218 comprises a conductive surface that defines a plurality of first electrical contact channels 222 and a plurality of first ground shield channels 224. The second side 220 also comprises a conductive surface that defines a plurality of second electrical contact channels 226 and a plurality of second ground shield channels 228.

In some implementations, the first side 218 of the center frame 208 may additionally define a plurality of mating ridges (not shown) and a plurality of mating recesses (not shown), and the second side 220 of the center frame 208 may additionally define a plurality of mating ridges (not shown) and a plurality of mating recesses (not shown), as discussed above with respect to FIGS. 17a and 17b. Typically at least one mating ridge and mating recess is positioned between two adjacent electrical contact channels of the plurality of first electrical contact channels 222 and at least one mating ridge and mating recess is positioned between two adjacent electric contact channels of the plurality of second electrical contact channels 226.

When each wafer assembly 206 is assembled, the first array of electrical contacts 210 is positioned substantially within the plurality of first electrical contact channels 222 of the first side 218 and the second array of electrical contacts 212 is positioned substantially within the plurality of second electrical contact channels 226 of the second side 220. In some implementations, the electrical contact channels 222, 226 are lined with an insulation layer to electrically isolate the electrical contacts 210, 212 positioned in the electrical contact channels 222, 226.

When positioned within the electrical contact channels, each electrical contact of the first array of electrical contacts 210 is positioned adjacent to an electrical contact of the second array of electrical contacts 212. In some implementations, the first and second arrays of electrical contacts 210, 212 are positioned in the plurality of channels 222, 226 such that a distance between adjacent electrical contacts is substantially the same throughout the wafer assembly 206. Together, the adjacent electrical contacts of the first and second arrays of electrical contacts 210, 212 form an electrical contact pair 230. In some implementations, the electrical contact pair 230 is an electrical differential pair.

As shown in FIG. 34, each electrical contact of the first and second arrays of electrical contacts 210, 212 defines an electrical mating connector 231 that extends away from a mating end 234 of the wafer assembly 206 when the first and second arrays of electrical contacts 210, 212 are positioned substantially within the electrical contact channels 222, 226. In some implementations, the electrical mating connectors 231 are closed-band shaped as shown in FIG. 8, where in other implementations, the electrical mating connectors 231 are tri-beam shaped as shown in FIG. 9a or dual-beam shaped as shown in FIG. 9b. Other mating connector styles could have a multiplicity of beams.

Figure 36:
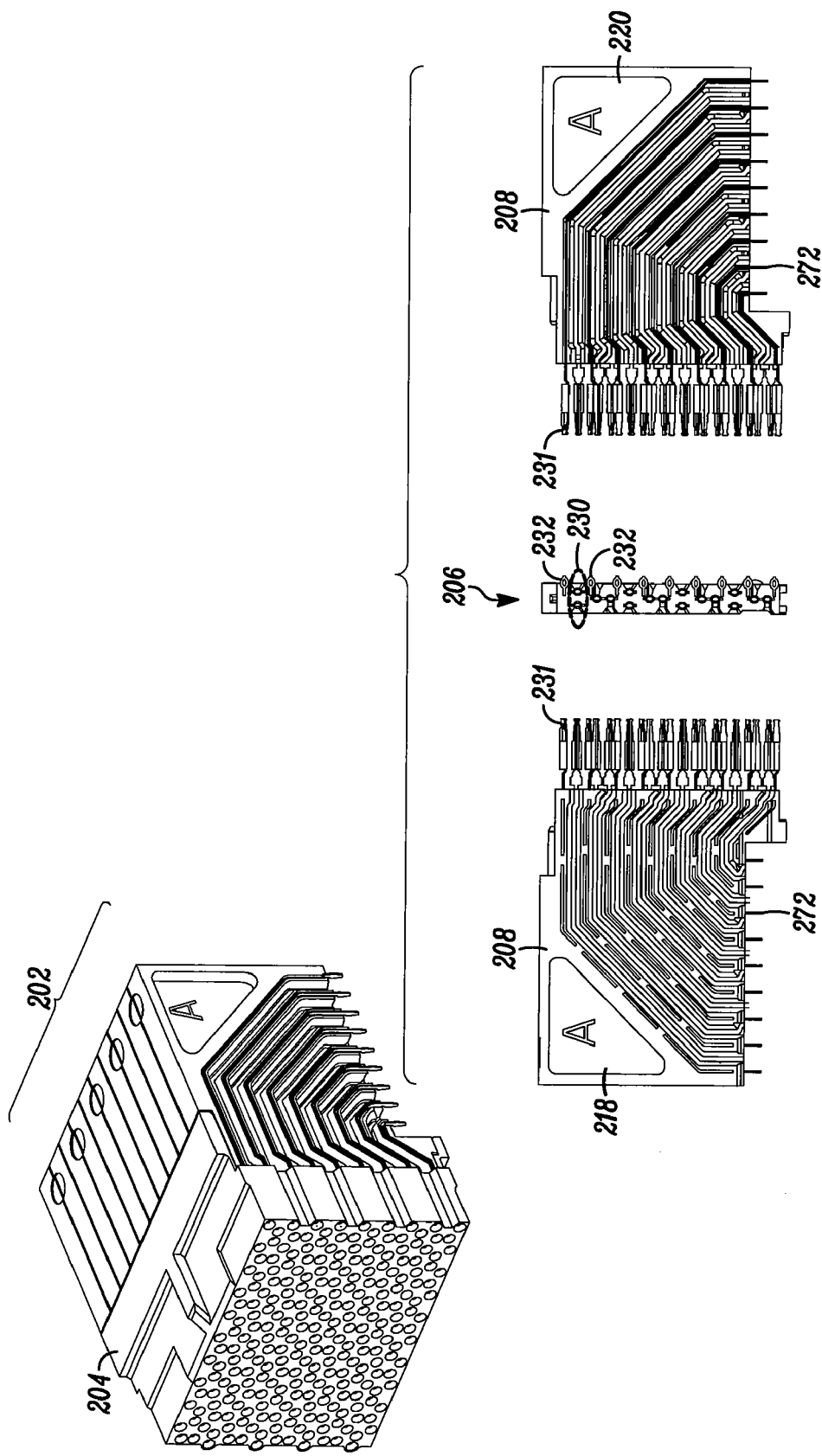
FIG. 36 illustrates front and side views of a wafer assembly.
Figure 37A:
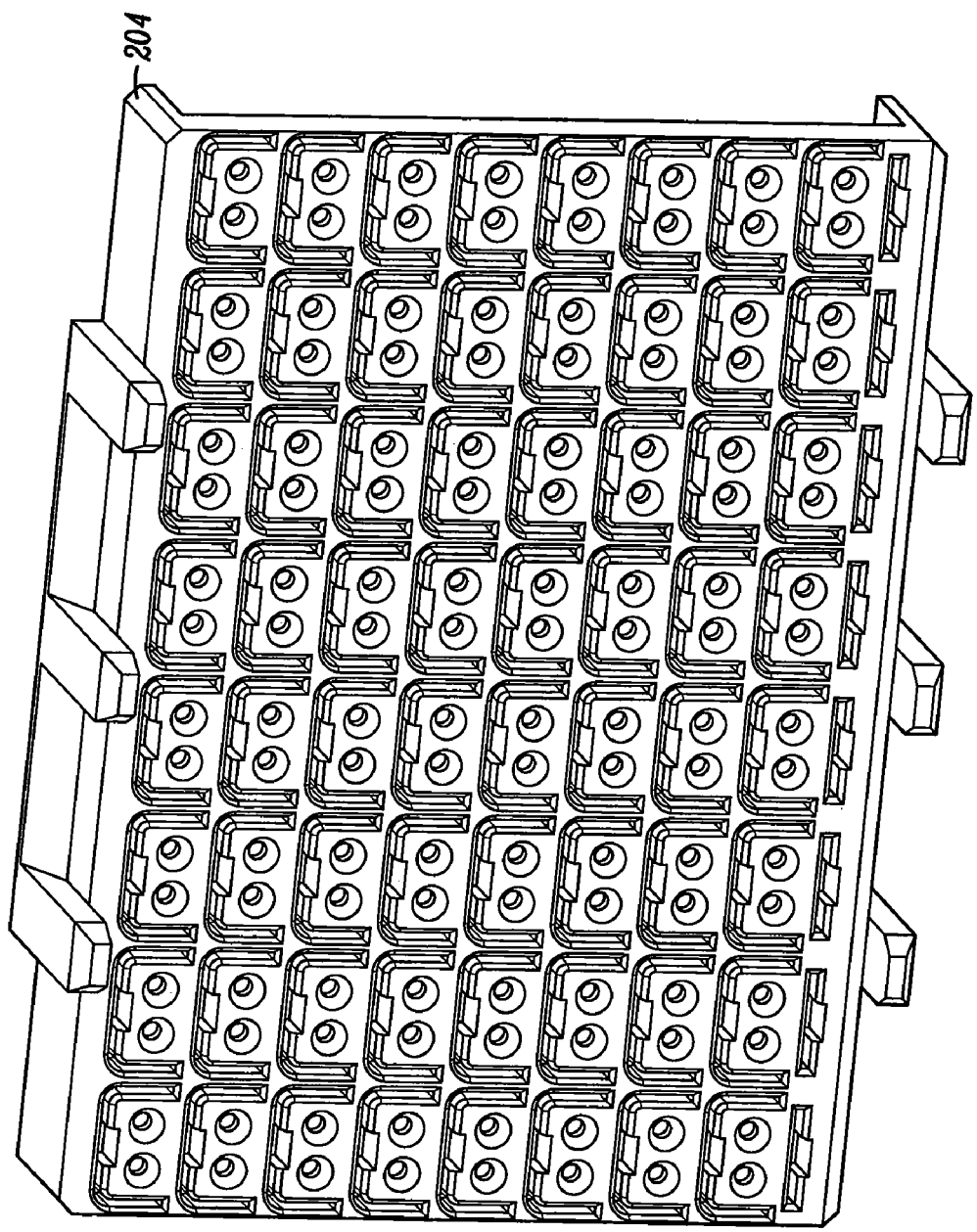
FIG. 37a is a front view of a wafer housing.
Figure 37B:
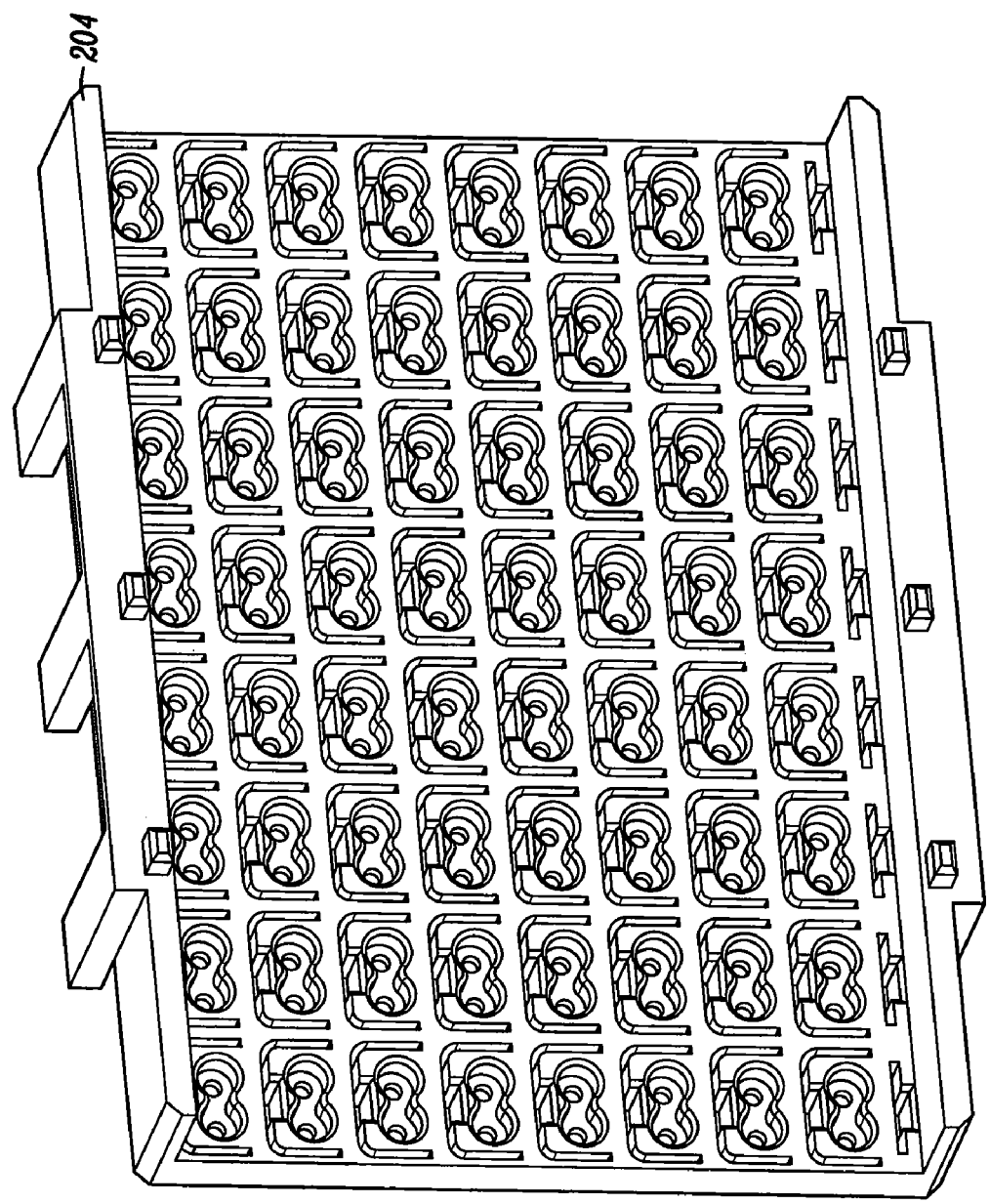
FIG. 37b is a rear view of a wafer housing.

When each wafer assembly 206 is assembled, the first ground shield lead frame 214 is positioned substantially within the plurality of first ground shield channels 224 of the first side 218 and the second ground shield lead frame 216 is positioned substantially within the plurality of second ground shield channels 228 of the second side 220. Each ground shield lead frame of the first and second ground shield lead frames 214, 216 defines a ground mating tab 232 that extends away from the mating end 234 of the wafer assembly 206 when the ground shield lead frames 214, 216 are positioned substantially within the ground shield channels 224, 228. As shown in FIG. 36, one of the ground shield lead frames 214, 216 is typically positioned above and below each pair of electrical mating connectors 231 associated with an electrical contact pair 230.

Figure 38:
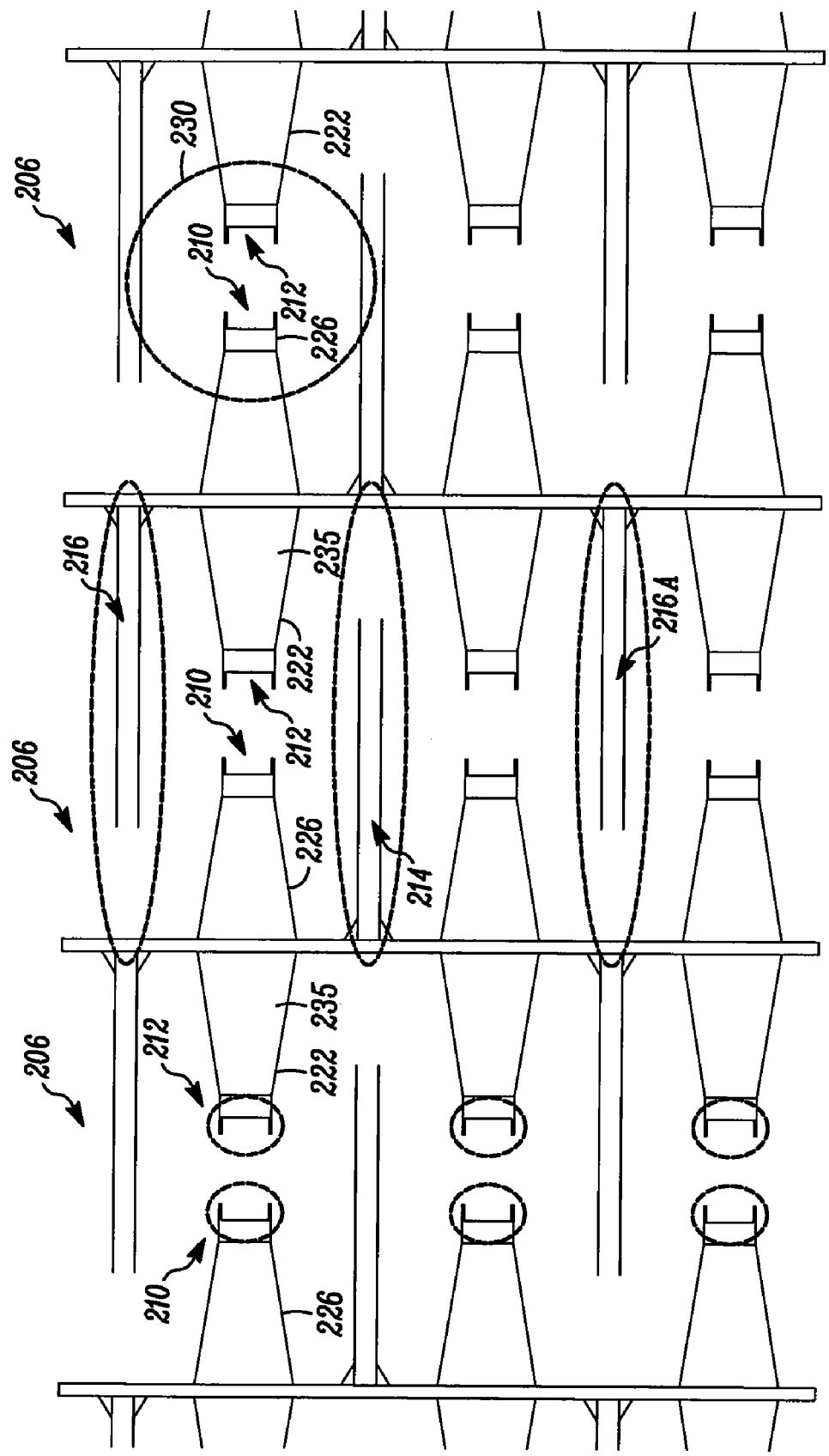
FIG. 38 is a cross-sectional view of a plurality of wafer assemblies.

The wafer housing 204 receives the electrical mating connectors 231 and ground tabs 232 extending from the mating end 234 of the plurality of wafer assemblies 202, and positions each wafer assembly 206 adjacent to another wafer assembly of the plurality of wafer assemblies 202. As shown in FIG. 38, when positioned adjacent to one another, two wafer assemblies 206 define a plurality of air gaps 235 substantially between a length of an electrical contact of one wafer assembly and a length of an electrical contact of the other wafer assembly. As discussed above, the air gaps 235 electrically isolate the electrical contacts positioned within the air gaps.

Referring to FIGS. 39a, 39b, 39c, and 39d, in some implementations, the wafer housing 204 defines a space 233 between a mating face of the wafer housing 204 and the center frame 208. The space 233 creates an air gap that electrically isolates at least the electrical mating connectors 231 of the first and second array of electrical contacts 210, 212. It will be appreciated that any of the wafer housings described in the present application may utilize an air gap between a mating face of the wafer housing and the center frames of a plurality of wafer assemblies to electrically isolate electrical mating connectors extending from the plurality of wafer assemblies into the wafer housing.

A header module 236 of the connector system 200, such as the header module 136 described above with respect to FIGS. 18-28, is adapted to mate with the wafer housing 204 and plurality of wafer assemblies 202. As shown in FIGS. 39a, 39b, 39c, and 39d, as the header module 236 receives the wafer housing 204, the wafer housing 204 receives a plurality of signal pin pairs 242, a plurality of C-shaped ground shields 238, and a row of ground tabs 240 extending from a mating face of the header module 236. As the plurality of signal pin pairs 242 are received by the wafer housing 204, the signal pin pairs 242 engage the electrical mating connectors 231 extending from the first and second arrays of electrical contacts 210, 212. Additionally, as the plurality of C-shaped ground shields 238 and row of ground tabs 240 are received by the wafer housing 204, the C-shaped ground shields 238 and ground tabs 240 engage the ground tabs 232 extending from the plurality of wafer assemblies 202.

Figure 39A:
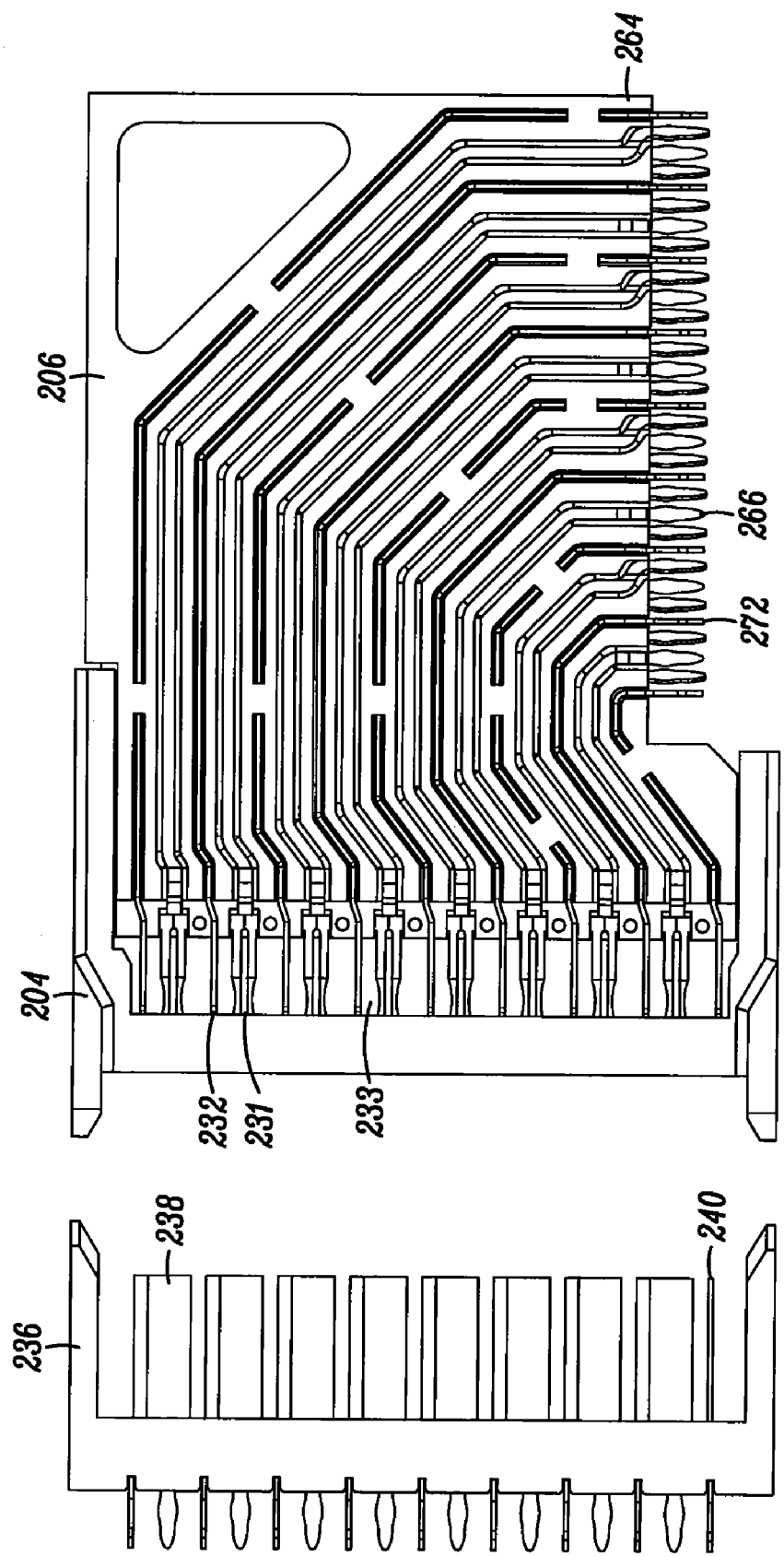
FIG. 39a illustrates an unmated header unit, wafer housing, and plurality of wafer assemblies.
Figure 39B:
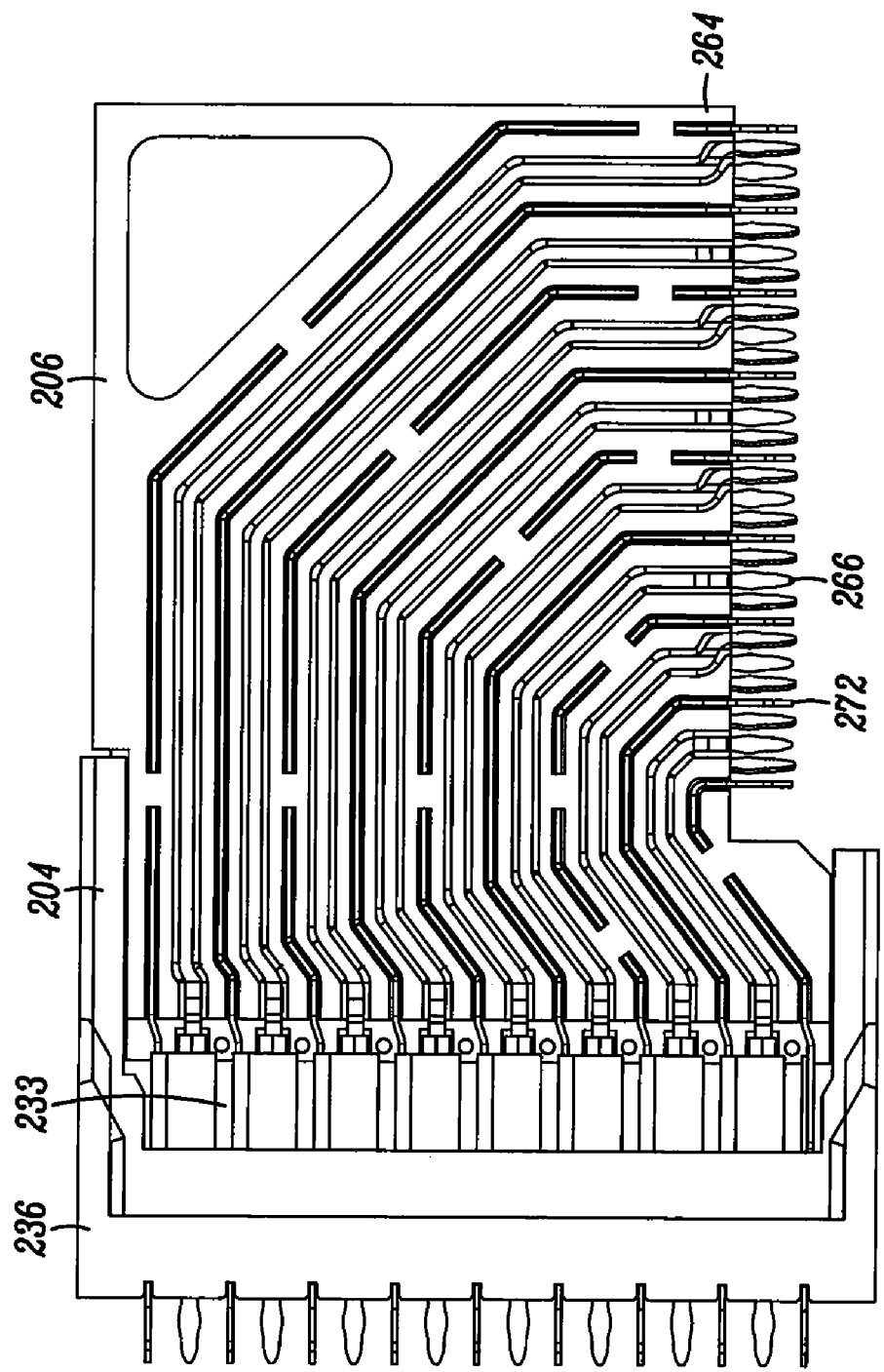
FIG. 39b illustrates a mated header unit, wafer housing, and plurality of wafer assemblies.
Figure 39C:
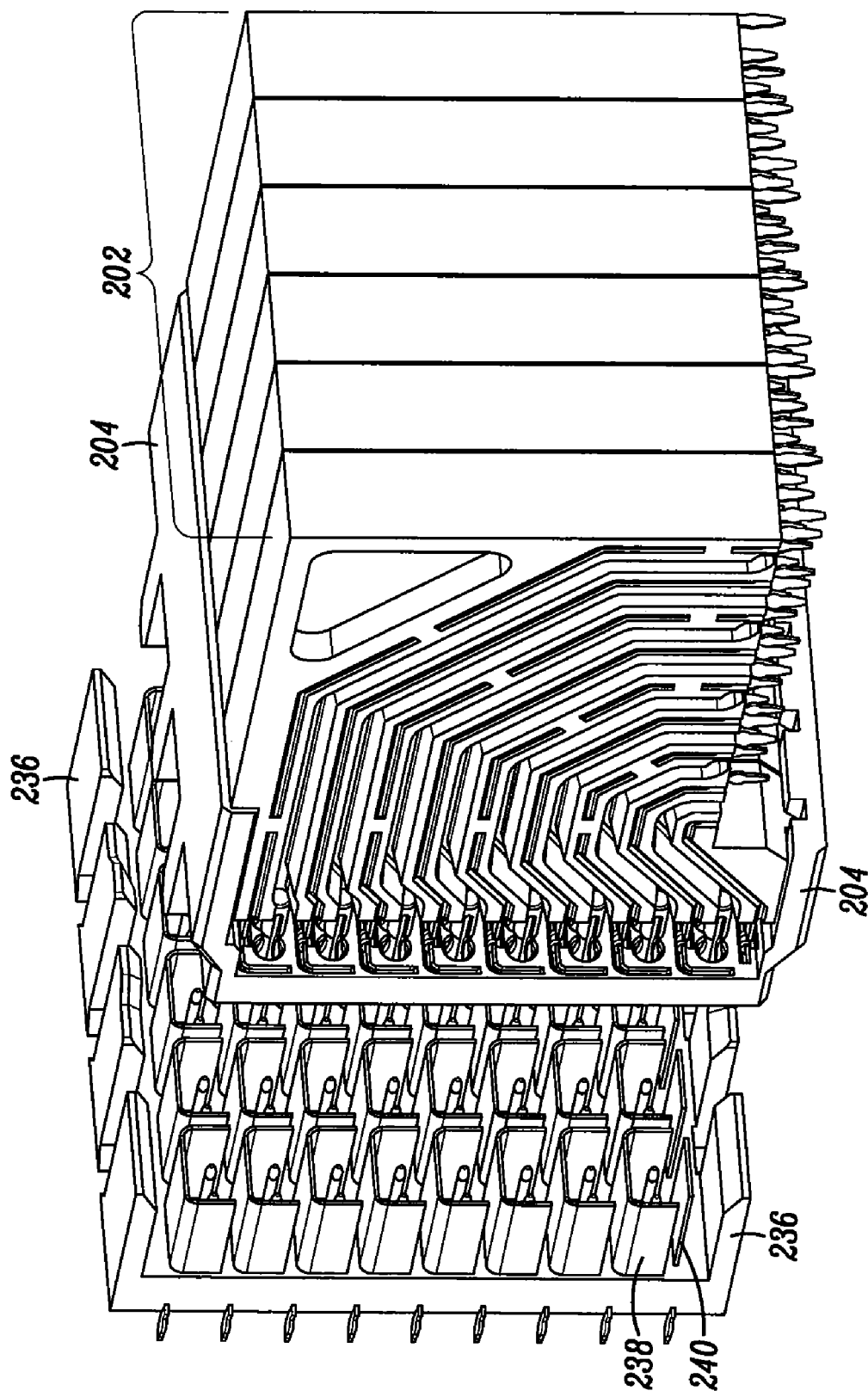
FIG. 39c illustrates a rear perspective view of an unmated header unit, wafer housing, and plurality of wafer assemblies.
Figure 39D:
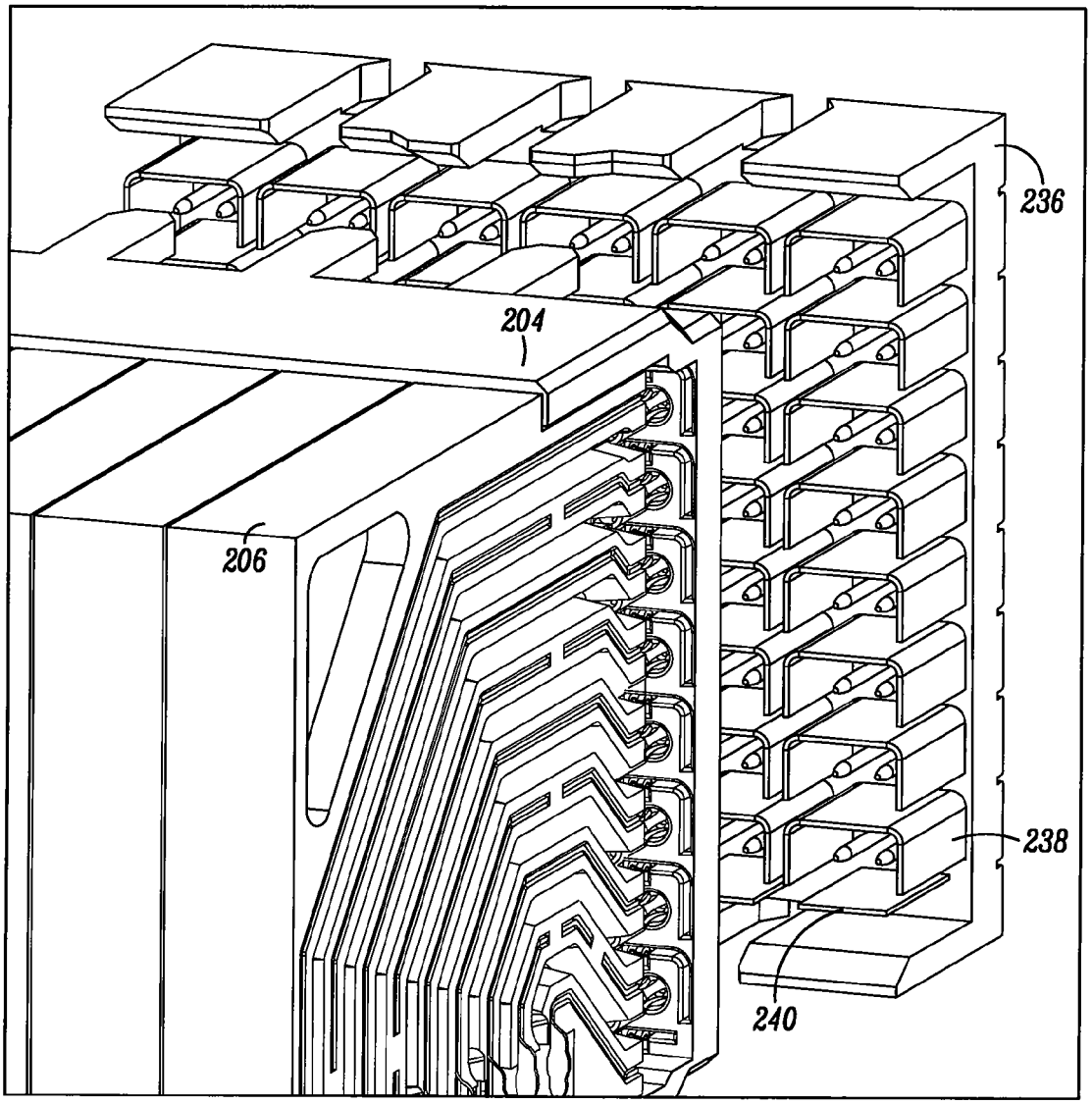
FIG. 39d illustrates an enlarged rear perspective view of an unmated header unit, wafer housing, and plurality of wafer assemblies.

As shown in FIG. 39b, the signal pin pairs 242 engage the electrical mating connectors 231 and the plurality of C-shaped ground shields 238 and row of ground tabs 240 engage the ground tabs 232 in the air gap 233 of the wafer housing 204. Accordingly, the air gap 233 electrically isolates the electrical mating connectors 231 of the first and second array of electrical contacts 210, 212; the ground tabs 232 extending from the plurality of wafer assemblies 202; and the C-shaped ground shields 238, ground tabs 240, and signal pin pairs extending from the header module 236.

Referring to a mounting end 264 of the plurality of wafer assemblies 202, each electrical contact of the first and second arrays of electrical contacts 210, 212 defines a substrate engagement element 266, such as an electrical contact mounting pin, that extends away from the mounting end 264 of the plurality of wafer assemblies 202. Additionally, each ground shield of the first and second ground shield lead frames 214, 216 define one or more substrate engagement elements 272, such as ground contact mounting pins, that extend away from the mounting end 264 of the plurality of wafer assemblies 202. As discussed above, in some implementations, each electrical contact mounting pin 266 and ground contact mounting pin 272 defines a broadside and an edge that is smaller than the broadside. The electrical contact mounting pins 266 and ground contact mounting pins 272 extend away from the mounting end 264 to engage a substrate, such as a backplane circuit board or a daughtercard circuit board.

In some implementations, each pair of electrical contact mounting pins 266 corresponding to an electrical contact pair 230 is positioned in one of two orientations, such as broadside coupled or edge coupled. In other implementations, each pair of electrical contact mounting pins 266 corresponding to an electrical contact pair 230 is positioned in one of two orientations, where in a first orientation, a pair of electrical contact mounting pins 266 is aligned so that the broadsides of the pins are substantially parallel to a substrate, and in a second orientation, a pair of electrical contact mounting pins 266 are aligned so that the broadsides are substantially perpendicular to the substrate. Further, the electrical contact mounting pins 266 and the ground mounting pins 272 may be positioned at the mounting end 264 of the plurality of wafer assemblies 102 to create a noise-canceling footprint, as discussed above with respect to FIGS. 26 and 27.

Figure 40A:
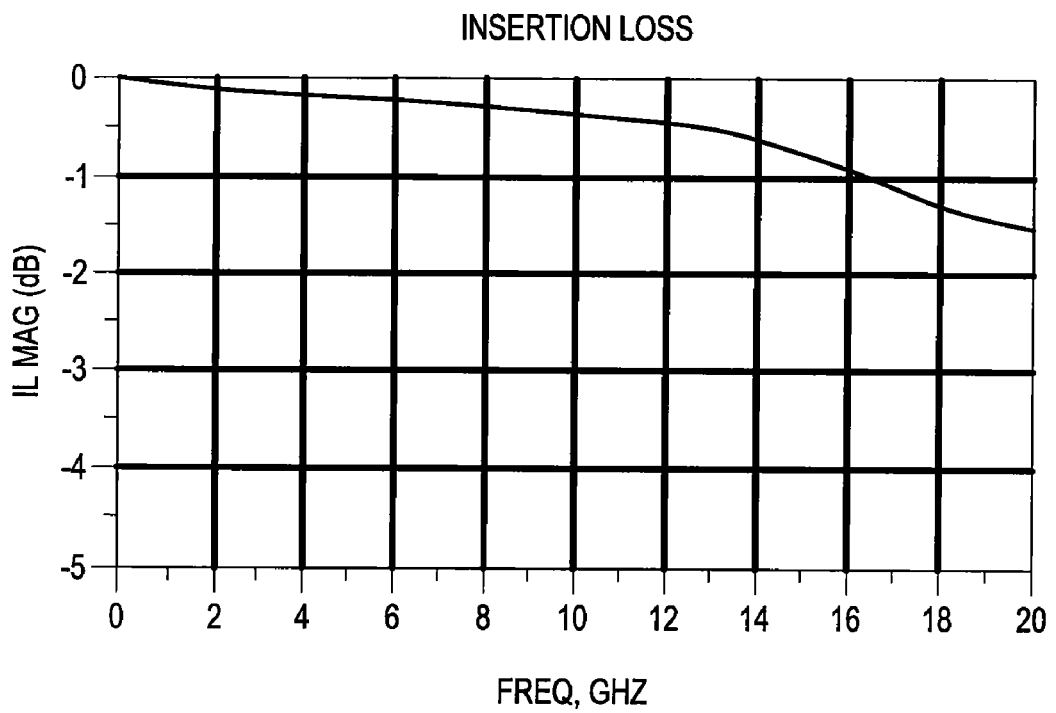
FIG. 40a is a performance plot illustrating insertion loss vs. frequency for the high-speed backplane connector system of FIG. 33.
Figure 40B:
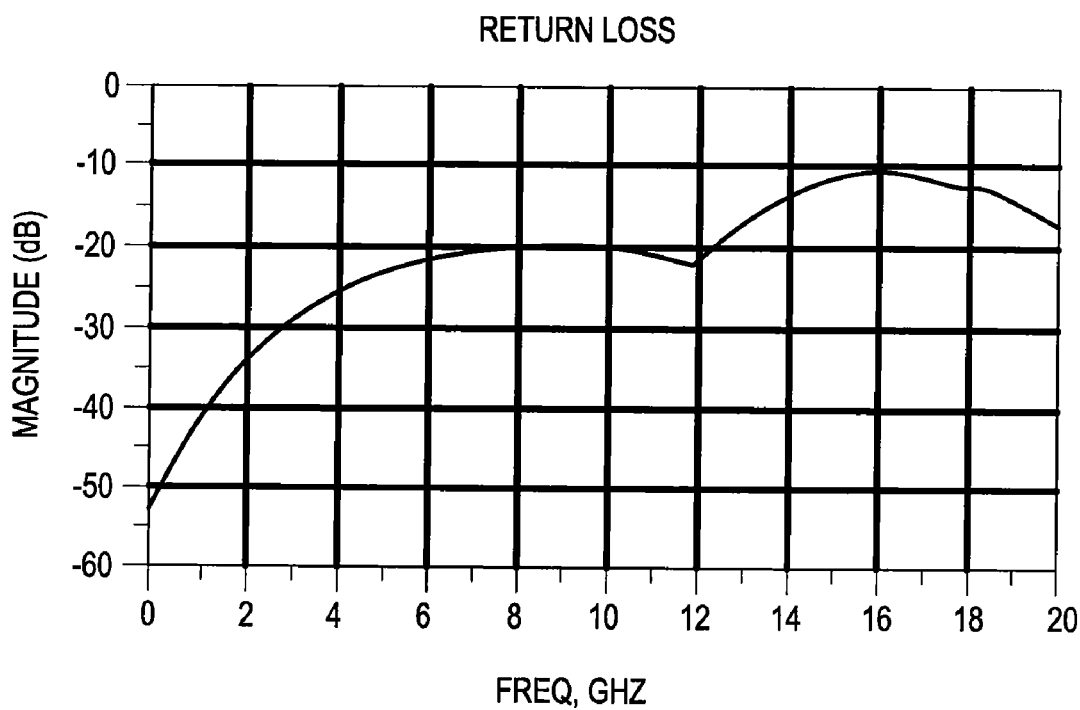
FIG. 40b is a performance plot illustrating return loss vs. frequency for the high-speed backplane connector system of FIG. 33.
Figure 40C:
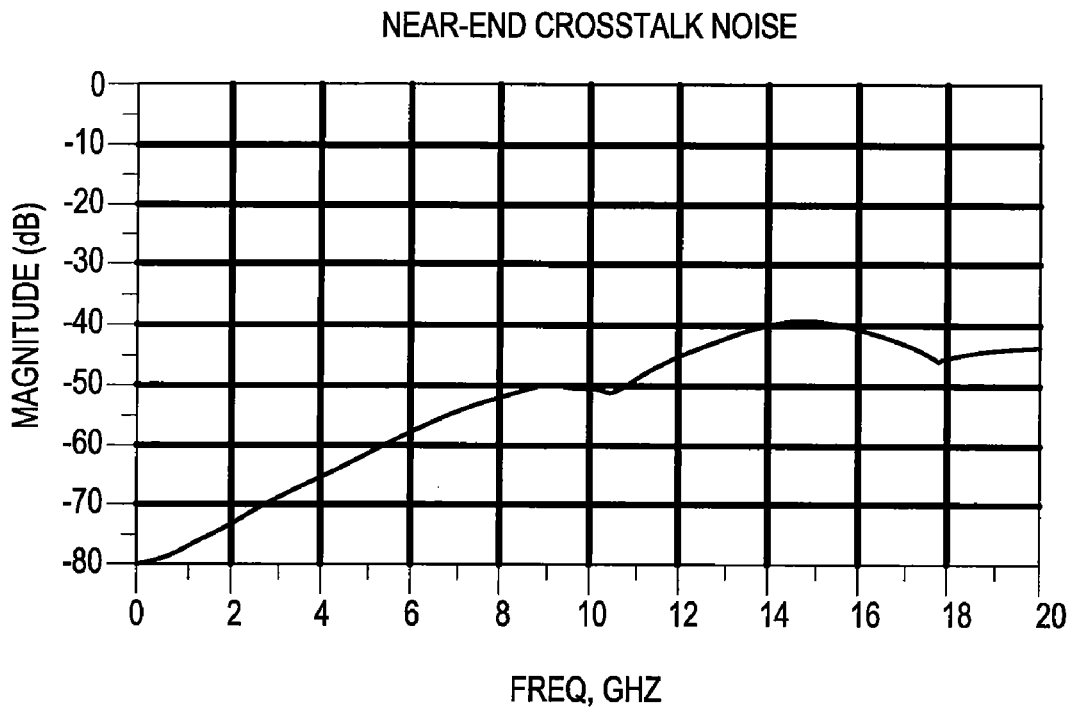
FIG. 40c is a performance plot illustrating near-end crosstalk noise vs. frequency for the high-speed backplane connector system of FIG. 33.
Figure 40D:
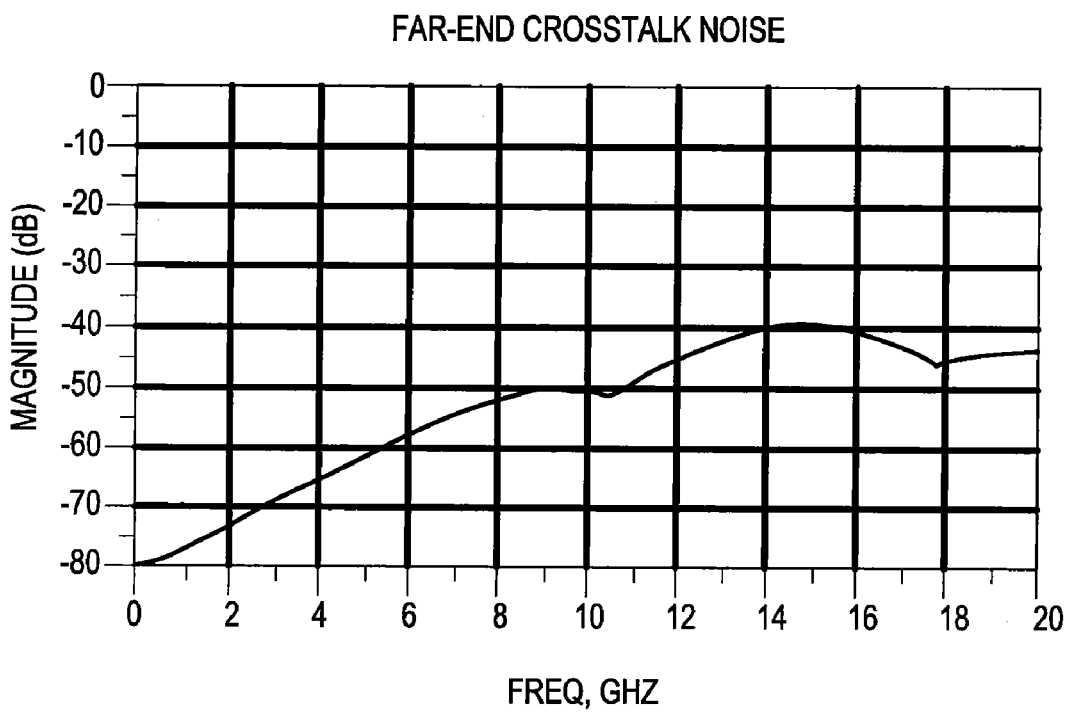
FIG. 40d is a performance plot illustrating far-end crosstalk noise vs. frequency for the high-speed connector system of FIG. 33.

FIGS. 40a, 40b, 40c, and 40d are graphs illustrating an approximate performance of the electrical connector system described above with respect to FIGS. 33-39. FIG. 40a is a performance plot illustrating insertion loss vs. frequency for the electrical connector system; FIG. 40b is a performance plot illustrating return loss vs. frequency for the electrical connector system; FIG. 40c is a performance plot illustrating near-end crosstalk noise vs. frequency for the electrical connector system; and FIG. 40d is a performance plot illustrating far-end crosstalk noise vs. frequency for the electrical connector system. As shown in FIGS. 40a, 40b, 40c, and 40d, the electrical connector system provides a substantially uniform impedance profile to electrical signals carried on the electrical contacts of the first and second arrays of electrical contacts 210, 212 operating at speeds of up to at least 25 Gbps.

Another implementation of a high-speed backplane connector system 300 is described with respect to FIGS. 41-54. Similar to the connector systems 100, 200 described above with respect to FIGS. 2-40, the high-speed backplane connector 300 includes a plurality of wafer assemblies 302 that are positioned adjacent to one another within the connector system 300 by a wafer housing 304. Each wafer assembly 306 of the plurality of wafer assemblies 302 includes a first housing 308, a first array of overmolded electrical contacts 310, a second array of overmolded electrical contacts 312, and a second housing 314.

In some implementations, the first and second housings 308, 314 may comprise a liquid crystal polymer (LCP) and the first and second arrays of electrical contacts 310, 312 may comprise phosphor bronze and gold (Au) or tin (Sn) over nickel (Ni) plating. However in other implementations, the first and second housings 308, 314 may comprise other polymers or tin (Sn), zinc (Zn), or aluminum (Al) with platings such as copper (Cu), and the first and second arrays of electrical contacts 310, 312 may comprise other electrical conductive base materials and platings (noble or non-noble).

Figure 41:
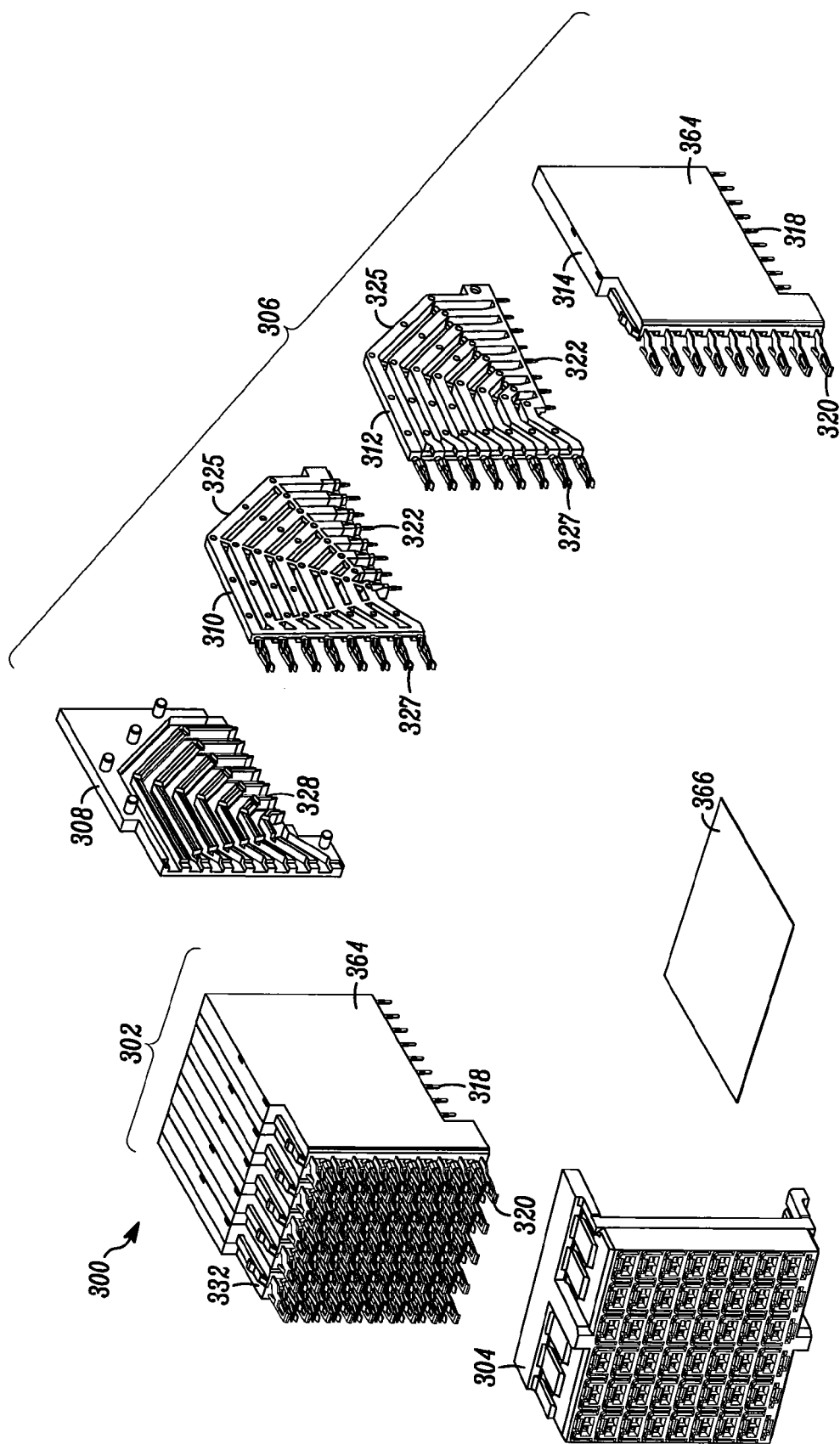
FIG. 41 is a perspective view, and a partially exploded view, of another implementation of a high-speed backplane connector.
Figure 42:
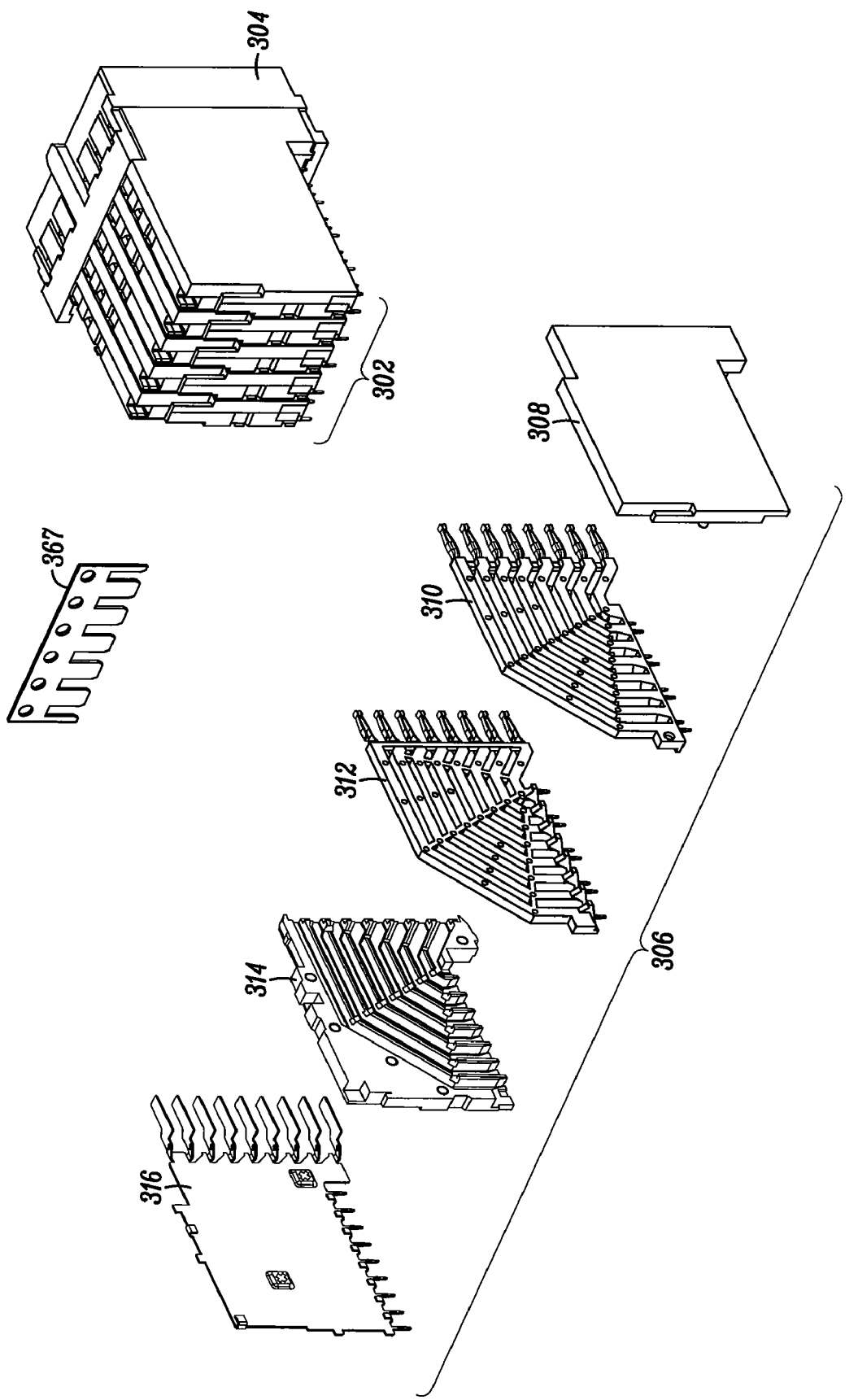
FIG. 42 is another perspective view, and partially exploded view, of the high-speed backplane connector of FIG. 41.
Figure 43A:
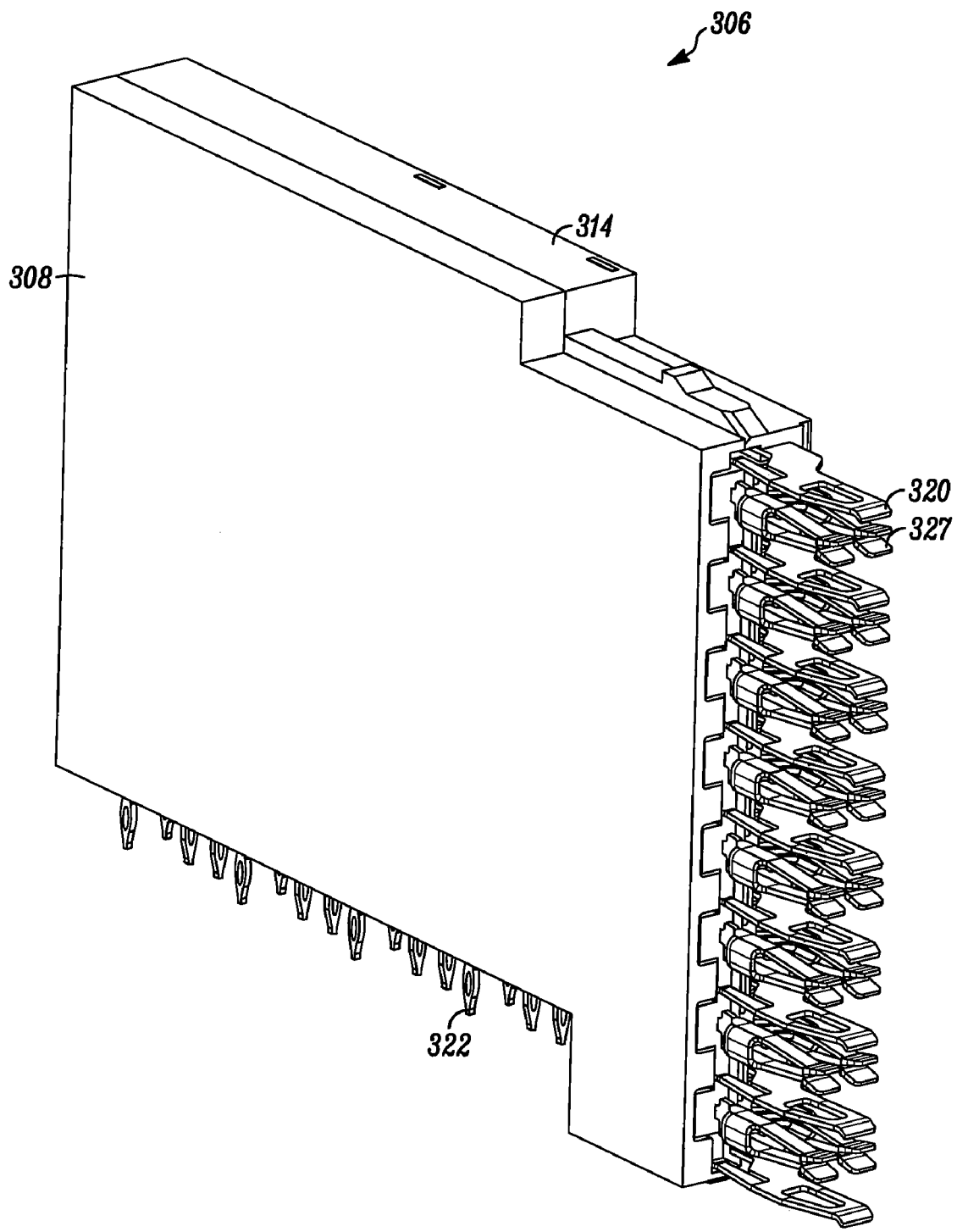
FIG. 43a is a perspective view of a wafer assembly.
Figure 43B:
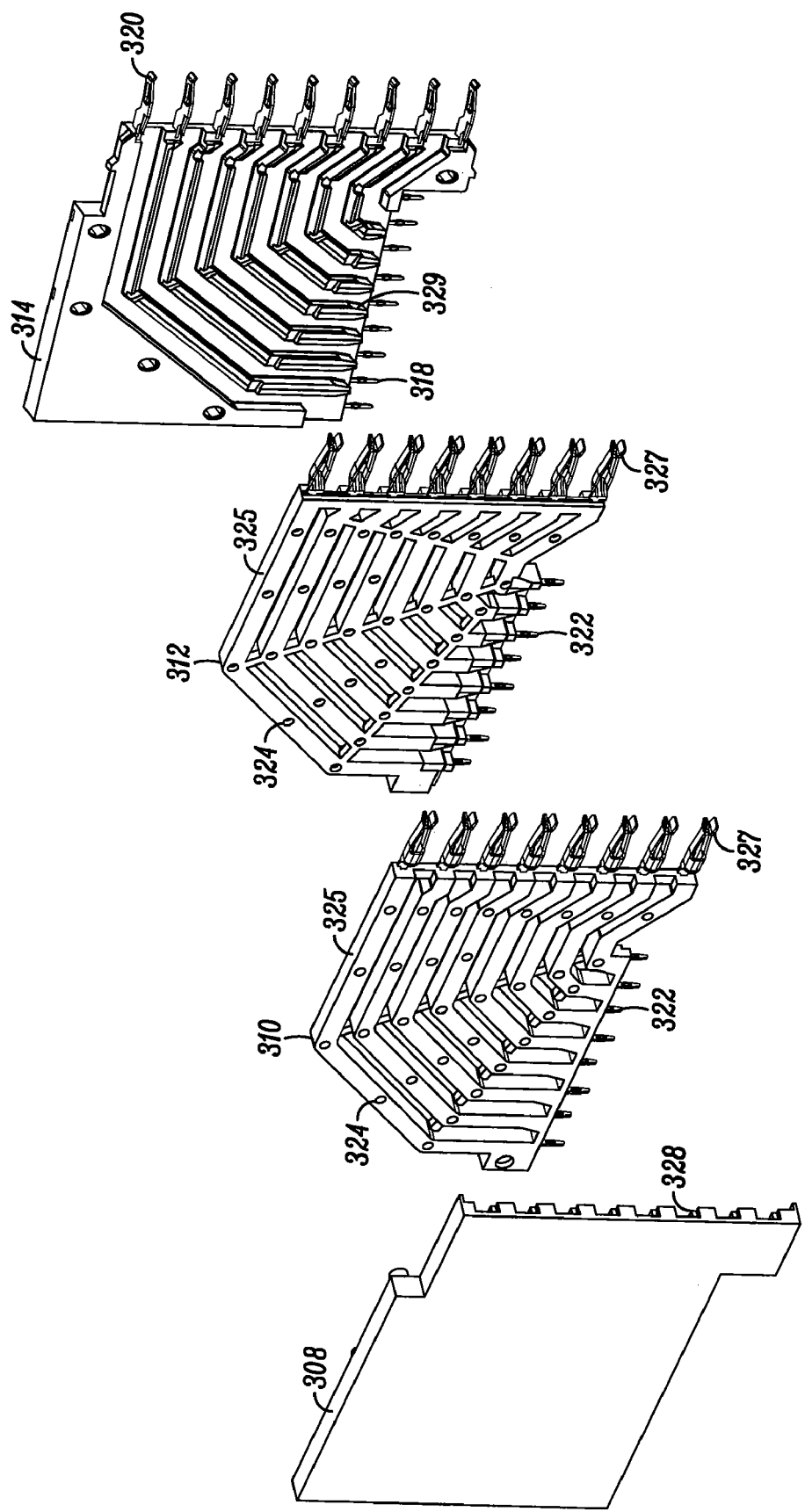
FIG. 43b is a partially exploded view of a wafer assembly.
Figure 44A:
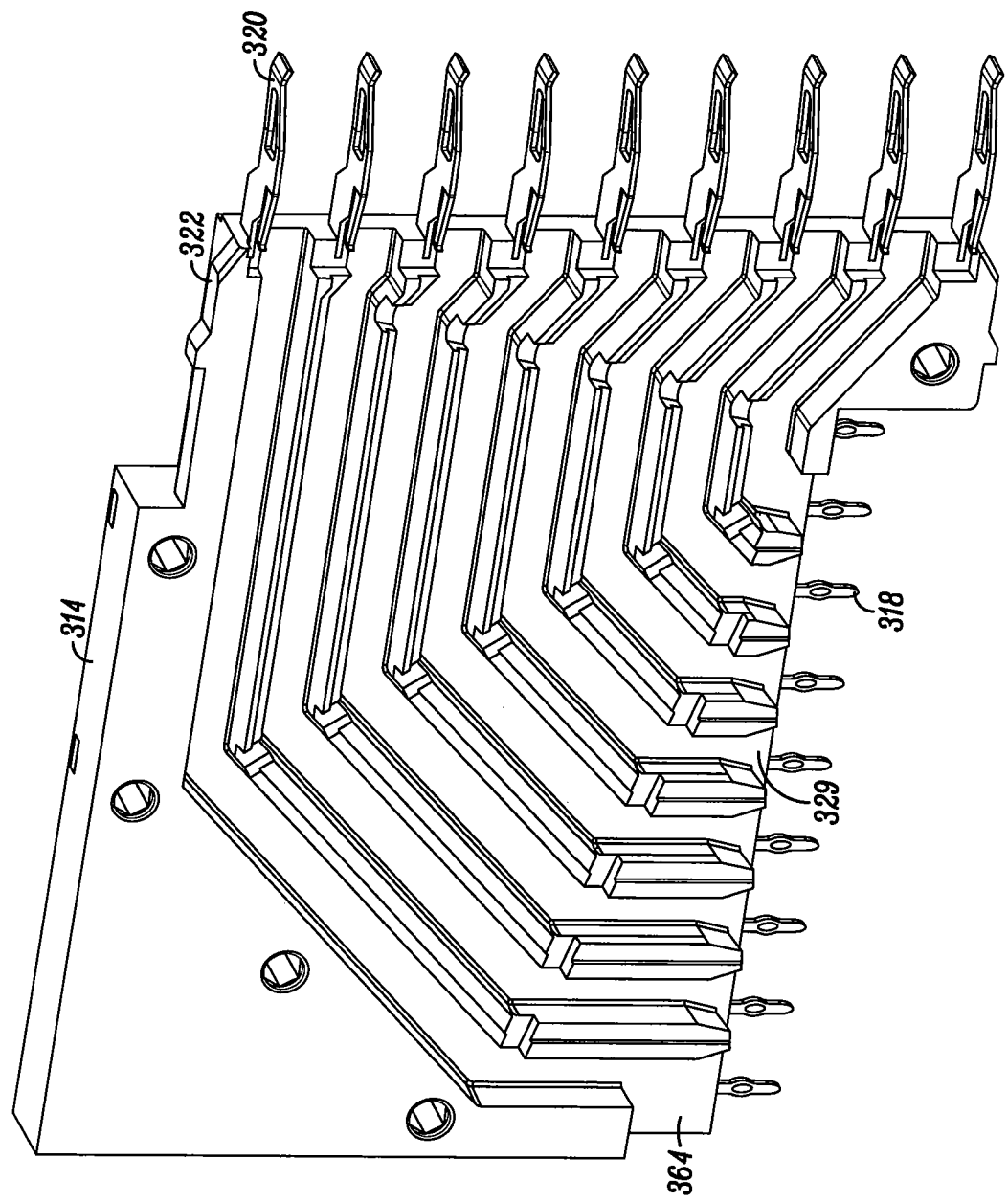
FIG. 44a is a perspective view of a housing and an embedded ground frame.
Figure 44B:
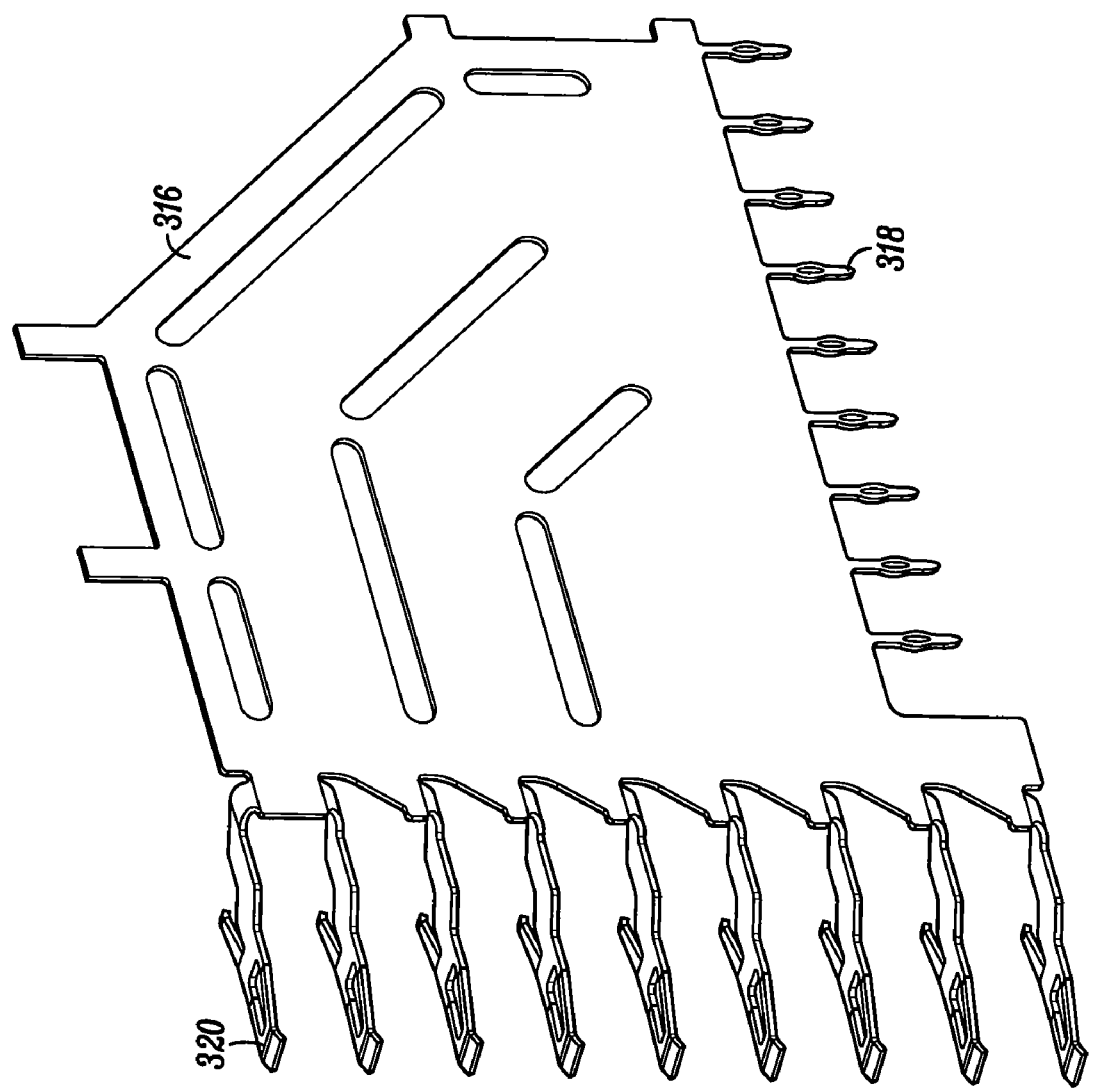
FIG. 44b is a perspective view of a ground frame that may be positioned at a side of a housing.
Figure 44C:
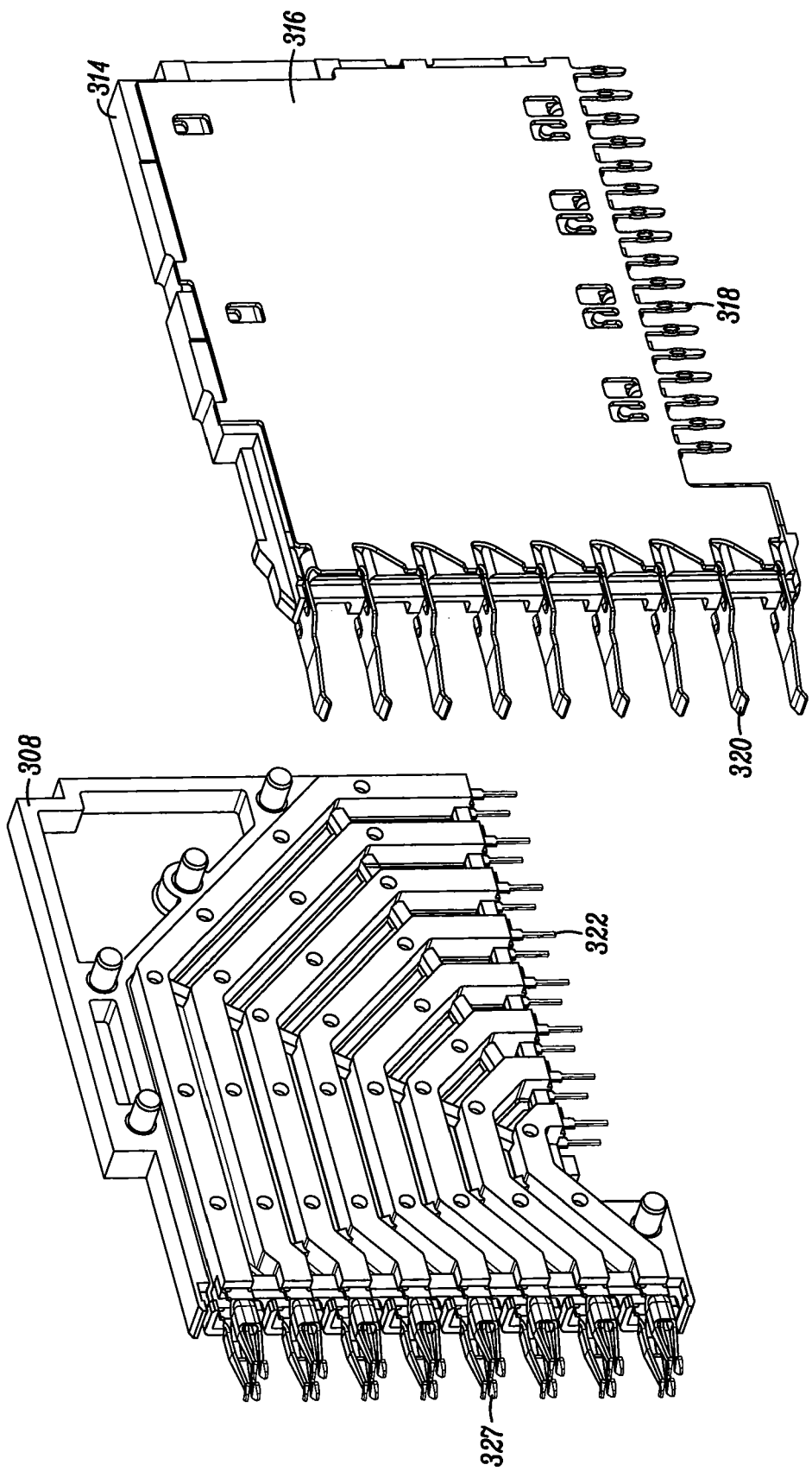
FIG. 44c is a perspective view of a wafer assembly with a ground frame positioned at a side of a housing.

As shown in FIGS. 41, 43, and 44a, in some implementations, the second housing 314 comprises an embedded ground frame 316 at a side of the second housing 324 that defines a plurality of substrate engagement elements 318, such as ground mounting pins, and a plurality of ground mating tabs 320. The ground mounting pins 318 extend away from a mounting end 364 of the wafer assembly 306 and the ground mating tabs 320 extend away from a mating end 332 of the wafer assembly 306. However in other implementations, as shown in FIGS. 42, 44b, and 44c the ground frame 316 is positioned at a side of the second housing 314 and is not embedded in the second housing 314. In some implementations, the ground frame 316 may comprise a brass base material with tin (Sn) or nickel (Ni) plating. However, in other implementations, the ground frame 316 may comprise other electrical conductive base materials and platings (noble or non-noble).

Each electrical contact of the first and second arrays of electrical contacts 310, 312 defines a substrate engagement element 322, such as an electrical contact mounting pin; a lead 324 that may be at least partially surrounded by an insulating overmold 325; and an electrical mating connector 327. In some implementations, the electrical mating connectors 327 are closed-band shaped as shown in FIG. 8, where in other implementations, the electrical mating connectors 327 are tri-beam shaped as shown in FIG. 9a or dual-beam shaped as shown in FIG. 9b. Other mating connector styles could have a multiplicity of beams.

The first housing 308 comprises a conductive surface that defines a plurality of first electrical contact channels 328 and the second housing 314 comprises a conductive surface that defines a plurality of second electrical contact channels 329. In some implementations, the first housing 308 may additionally define a plurality of mating ridges (not shown) and a plurality of mating recesses (not shown), and second housing 314 may additionally define a plurality of mating ridges (not shown) and a plurality of mating recesses (not shown), as discussed above with respect to FIGS. 17a and 17b. Typically at least one mating ridge and mating recess is positioned between two adjacent electrical contact channels of the plurality of first electrical contact channels 328 and at least one mating ridge and mating recess is positioned between two adjacent electric contact channels of the plurality of second electrical contact channels 329.

When the wafer assembly 306 is assembled, the first array of electrical contacts 310 is positioned within the plurality of first electrical contact channels 328; the second array of electrical contacts 312 is positioned within the plurality of second electrical contact channels 329; and the first housing 308 mates with the second housing 314 to form the wafer assembly 306. Further, in implementations including mating ridges and mating recesses, the mating ridges of the first housing 308 engage and mate with the complementary mating recesses of the second housing 314 and the mating ridges of the second housing 314 mate with the complementary mating recesses of the first housing 308.

In implementations where at least a portion of the first array of electrical contacts 310 is surrounded by an insulating overmold 325, the insulating overmold 325 associated with the first array of electrical contacts 310 is additionally positioned in the plurality of first electrical contact channels 328. Similarly, in implementations where at least a portion of the second array of electrical contacts 312 is surrounded by an insulating overmold 325, the insulating overmold 325 associated with the second array of electrical contacts 310 is additionally positioned in the plurality of second electrical contact channels 329. The insulating overmolds 325 serve to electrically isolate the electrical contacts of the first and second array of electrical contacts 310, 312 from the conductive surfaces of the first and second housings 308, 314.

Figure 45:
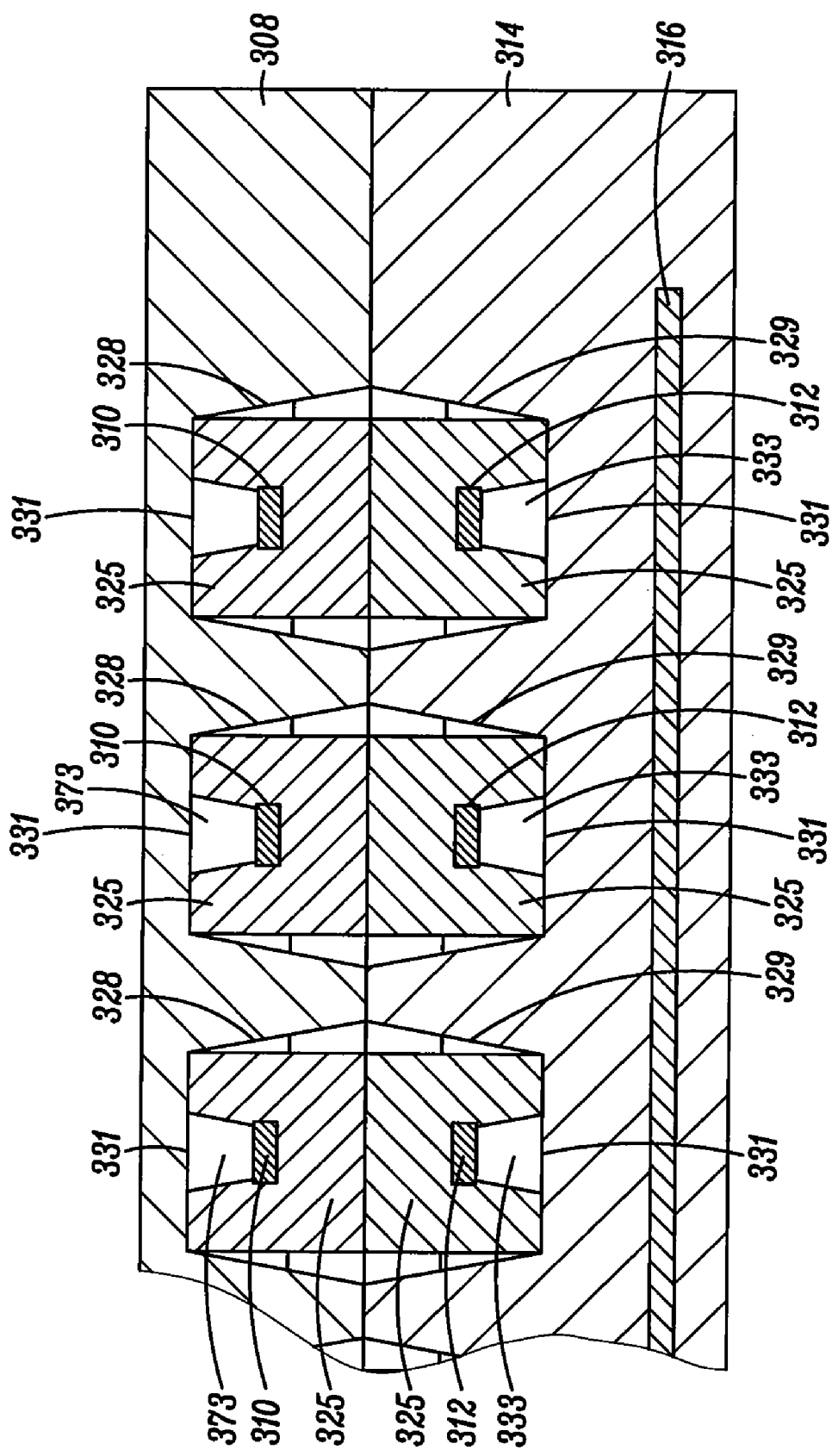
FIG. 45 is a cross-sectional view of a wafer assembly.

Referring to FIG. 45, in some implementations, each insulating overmold 325 defines a recess 331 such that when the insulating overmold is positioned in an electrical contact channel 328, 329, an air gap 333 is formed between the recess 331 of the insulating overmold 325 and a wall of the electrical contact channel 328, 329. The electrical contacts of the first and second arrays of electrical contacts 310, 312 are then positioned in the air gap 333 to electrically isolate the electrical contacts from the conductive surfaces of the electrical contact channels 328, 329.

Figure 46:
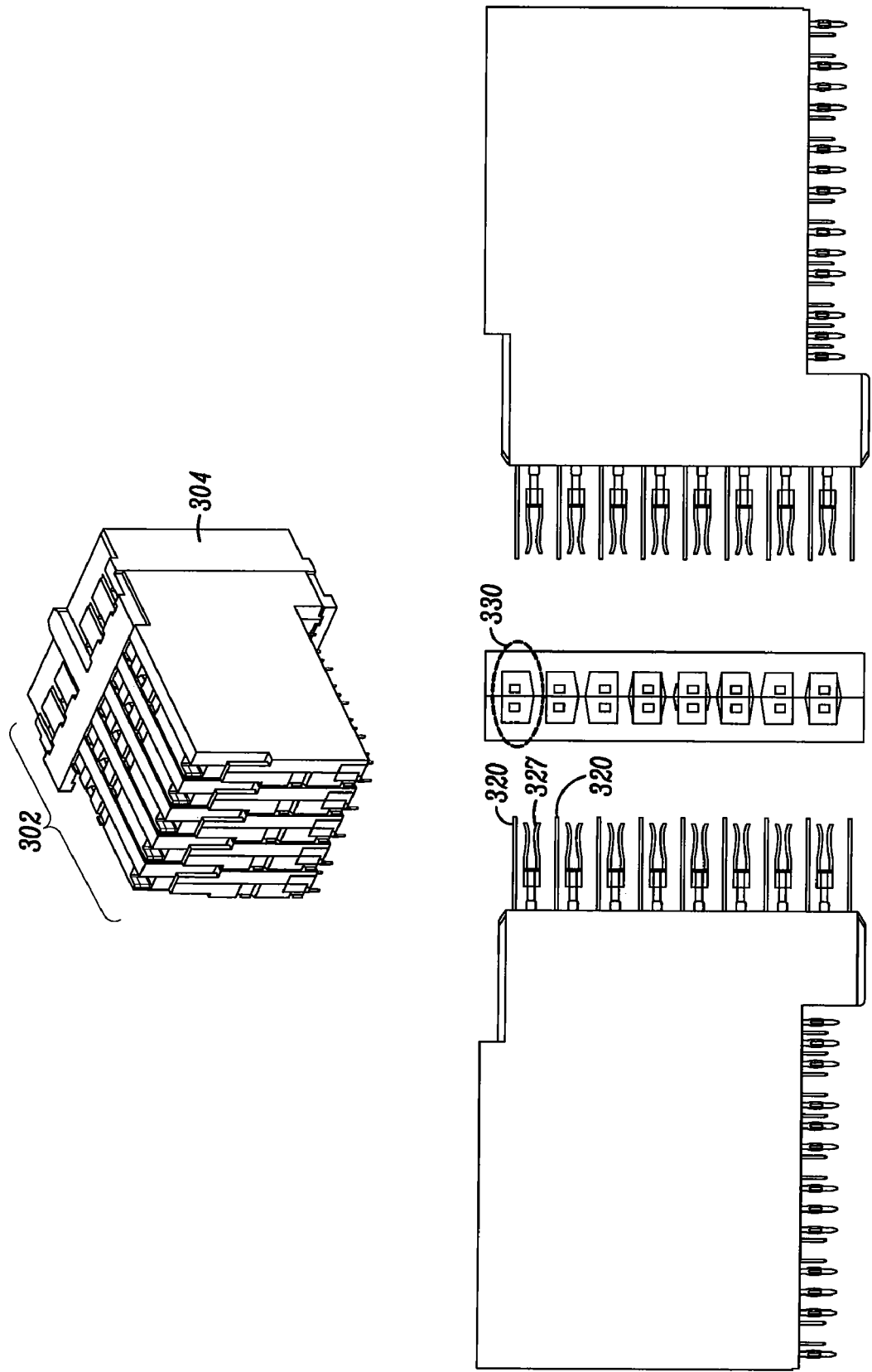
FIG. 46 illustrates front and side views of a wafer assembly.
Figure 47A:
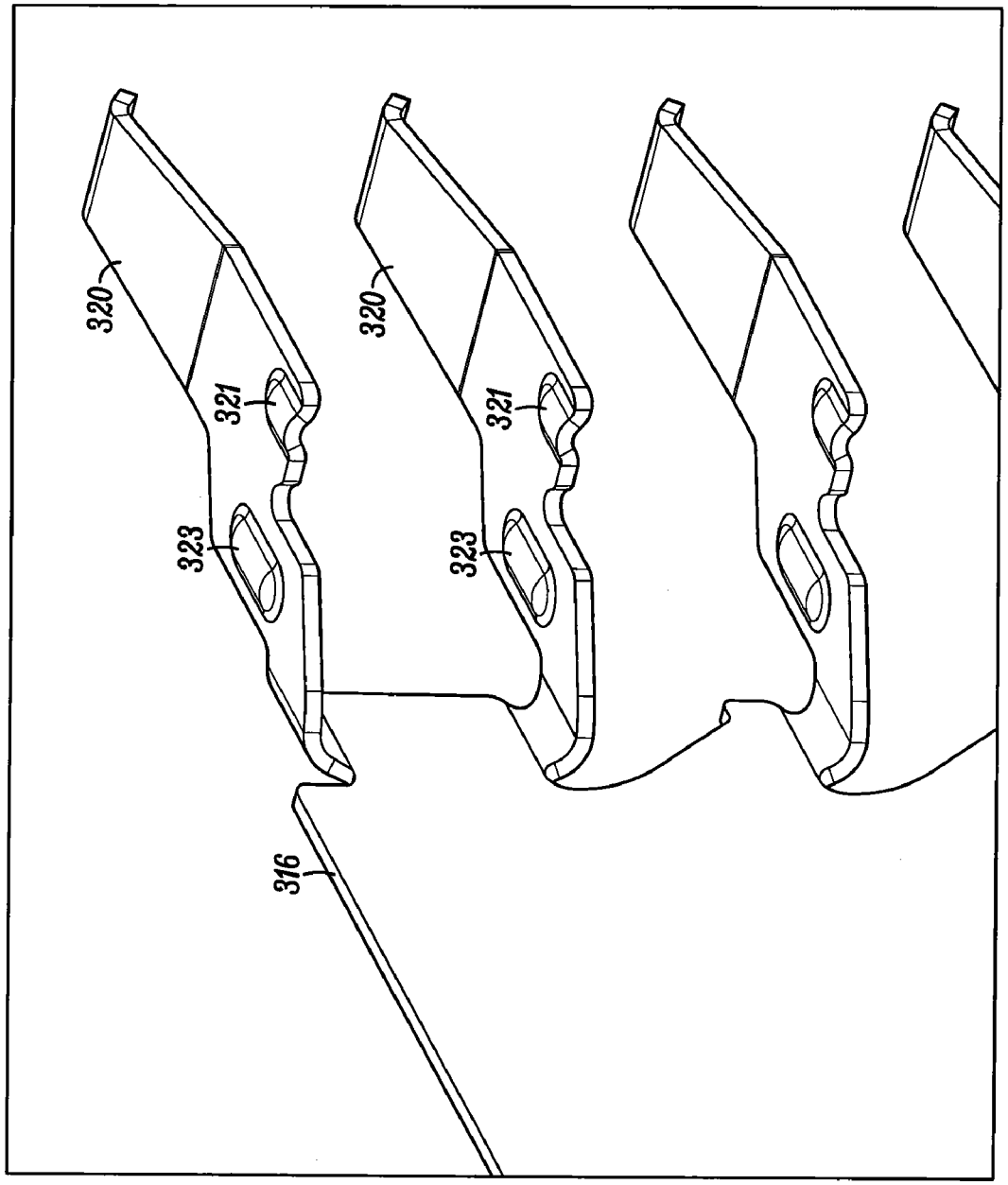
FIG. 47a illustrates one implementation of a ground shield.
Figure 47B:
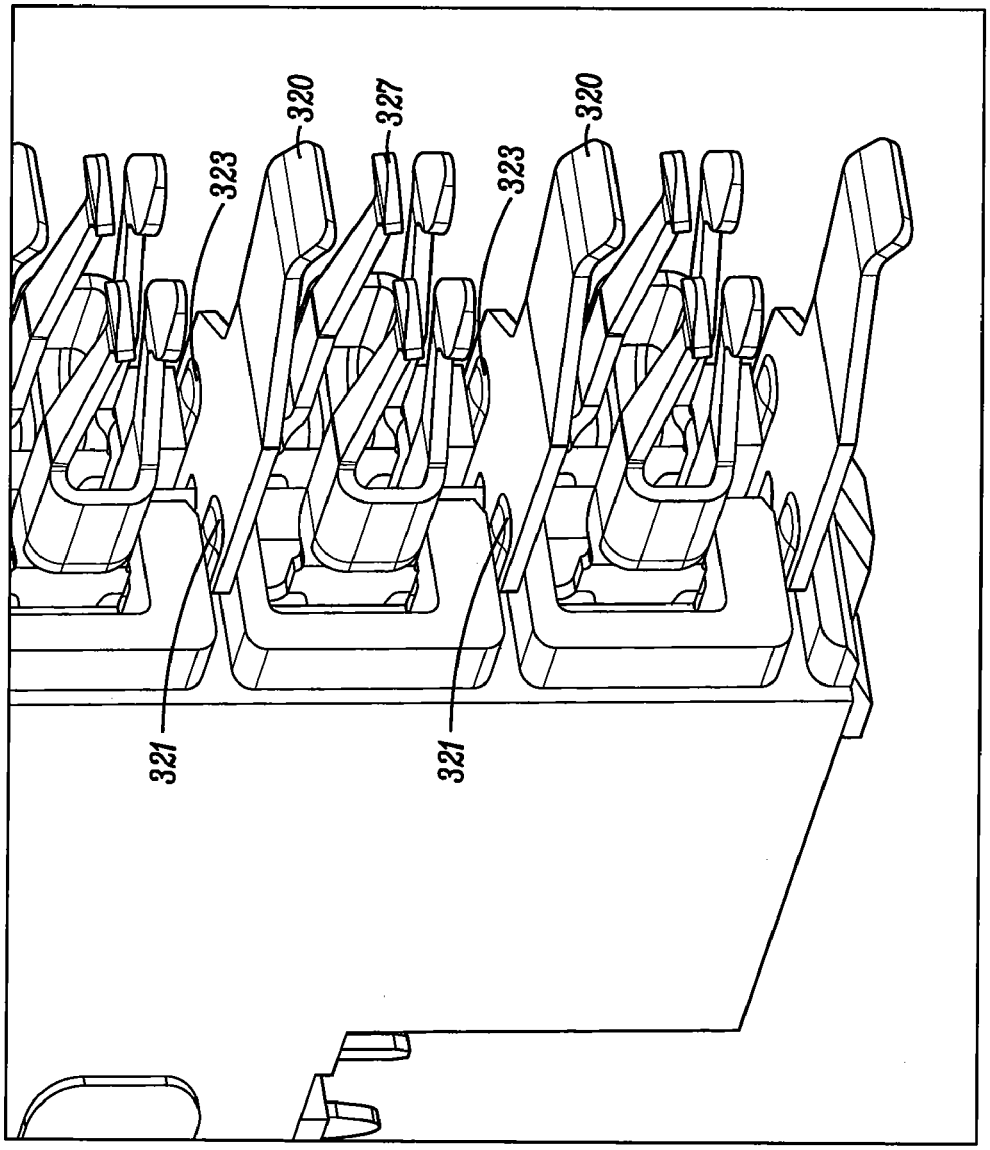
FIG. 47b illustrates an assembled wafer assembly with a ground shield spanning two electrical mating connectors and electrically commoned to the first and second housings.
Figure 47C:
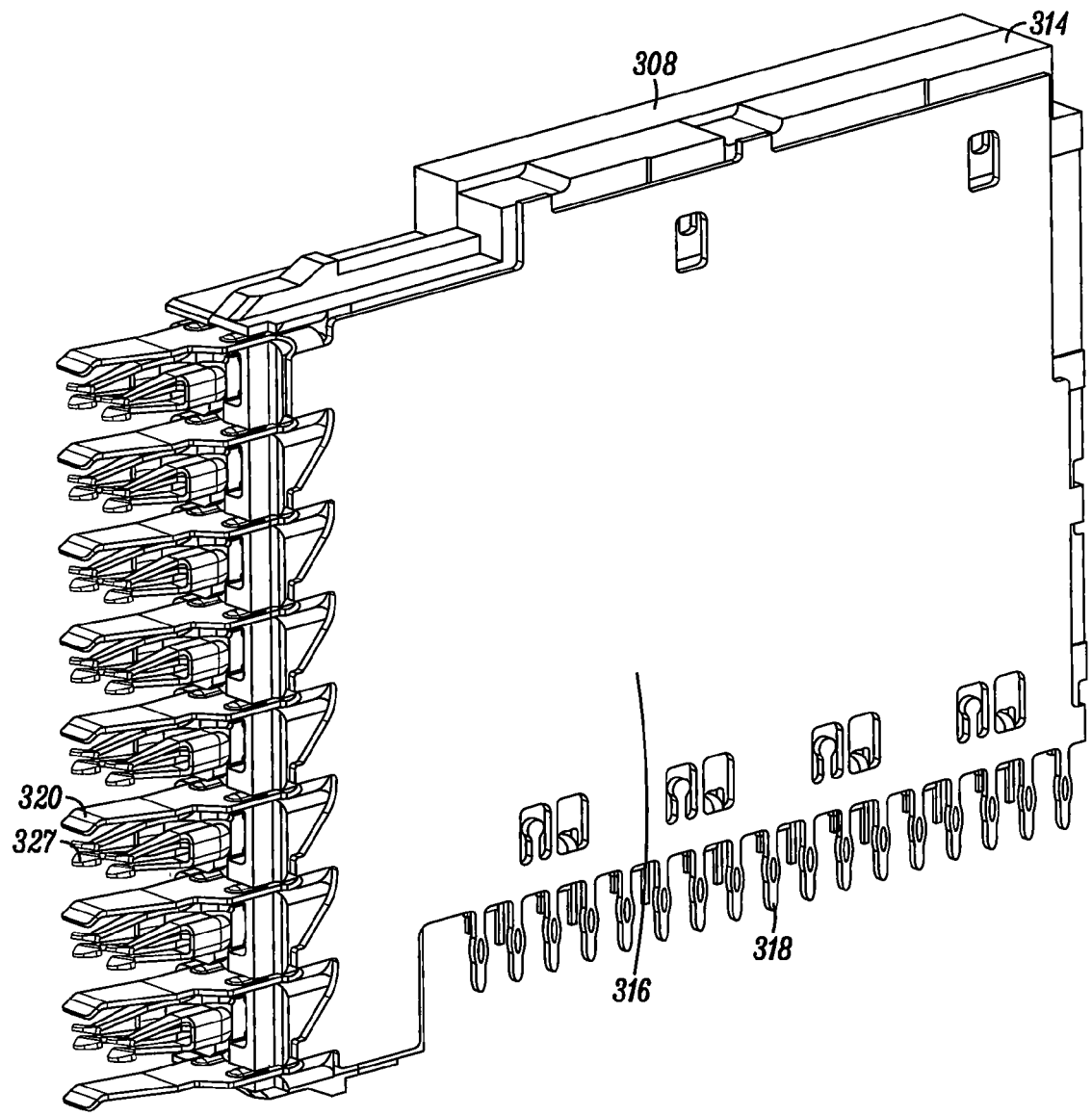
FIGS. 47c and 47d are additional illustrations of an assembled wafer assembly with a ground shield spanning two electrical mating connectors and electrically commoned to the first and second housings.
Figure 47D:
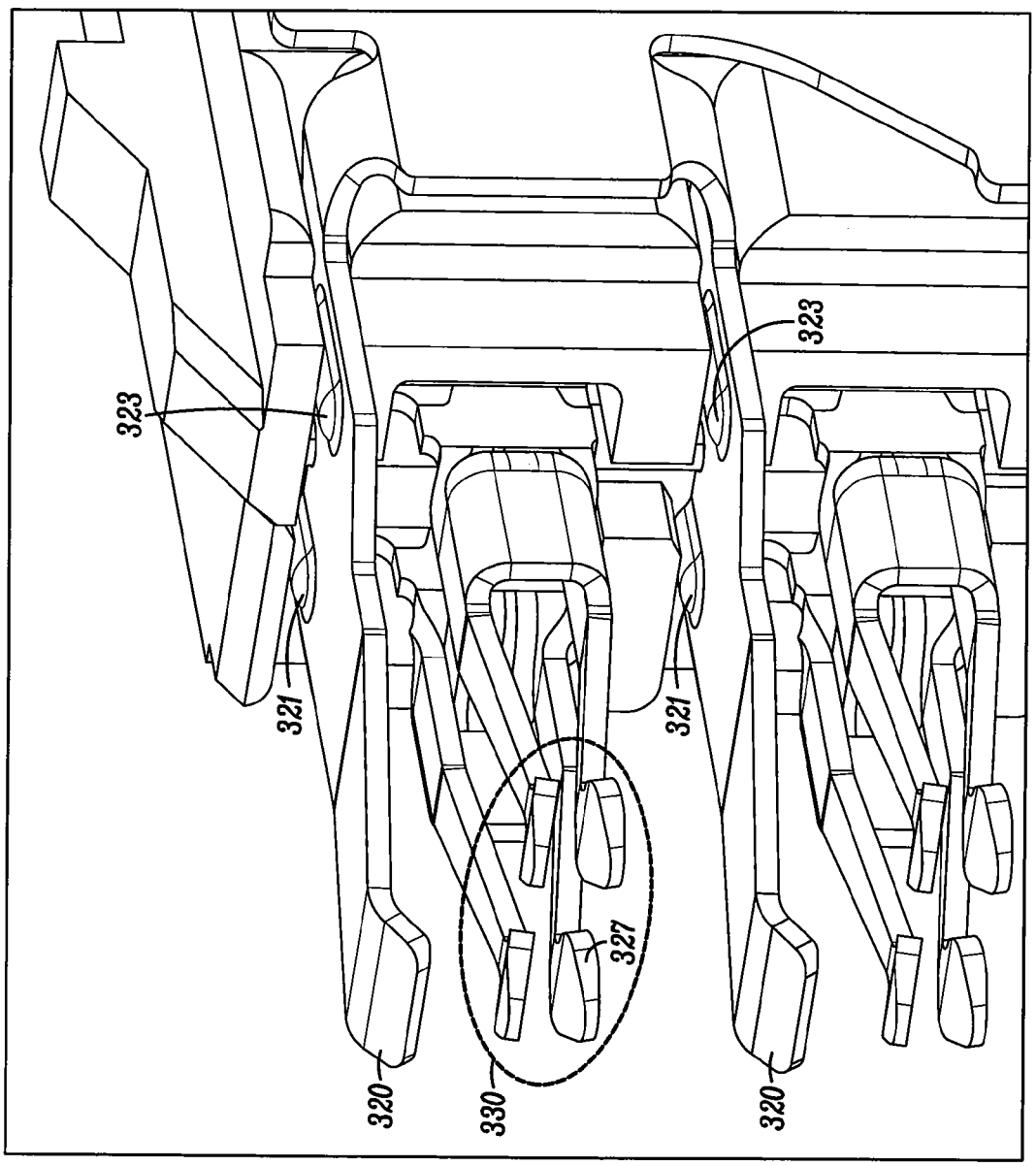

Referring to FIG. 46, when positioned within the first and second electrical contact channels 328, 329, each electrical contact of the first array of electrical contacts 310 is positioned adjacent to an electrical contact of the second array of electrical contacts 312. In some implementations, the first and second arrays of electrical contacts 310, 312 are positioned in the electrical contact channels 328, 329 such that a distance between adjacent electrical contacts is substantially the same throughout the wafer assembly 306. Together, the adjacent electrical contacts form an electrical contact pair 330, which in some implementations is also a differential pair. Typically, one of the ground mating tabs 320 is positioned above and below the electrical mating connectors 327 associated with each electrical contact pair 330.

Referring to FIGS. 47a, 47b, 47c, and 47d, in some implementations each ground mating tab 320 of the ground frame 316 includes at least a first mating rib 321 and a second mating rib 323. When the wafer assembly 306 is assembled, each ground mating 320 extends across an electrical contact pair 330, the first mating rib 321 contacts the first housing 308 and the second mating rib 323 contacts the second housing 314. Due to the contact between the first housing 308, second housing 314, and ground frame 316, the first housing 308, second housing 314, and ground frame 316 are electrically commoned to each other.

Figure 48A:
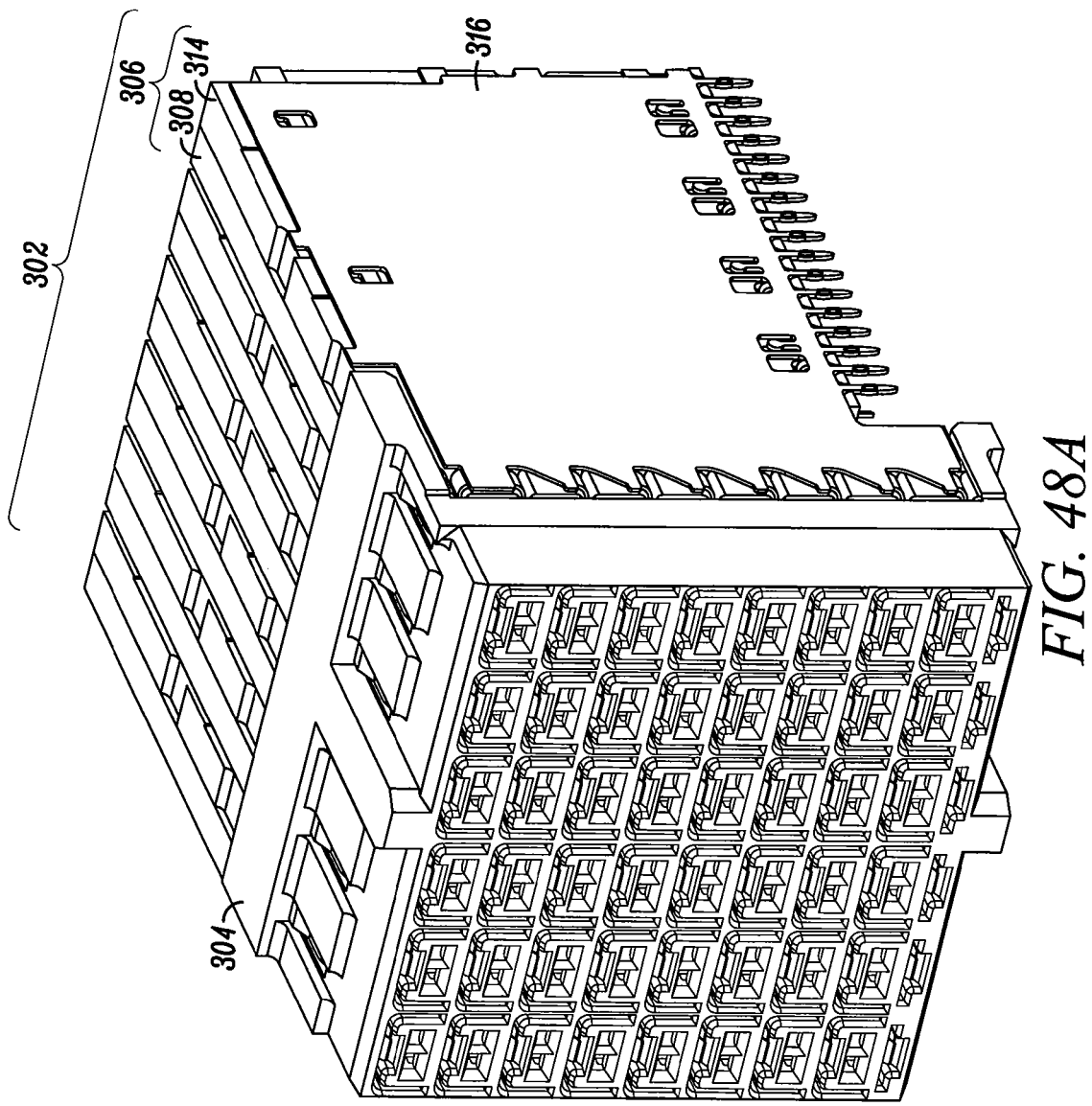
FIG. 48a is a perspective view of a mating face of a header unit.
Figure 48B:
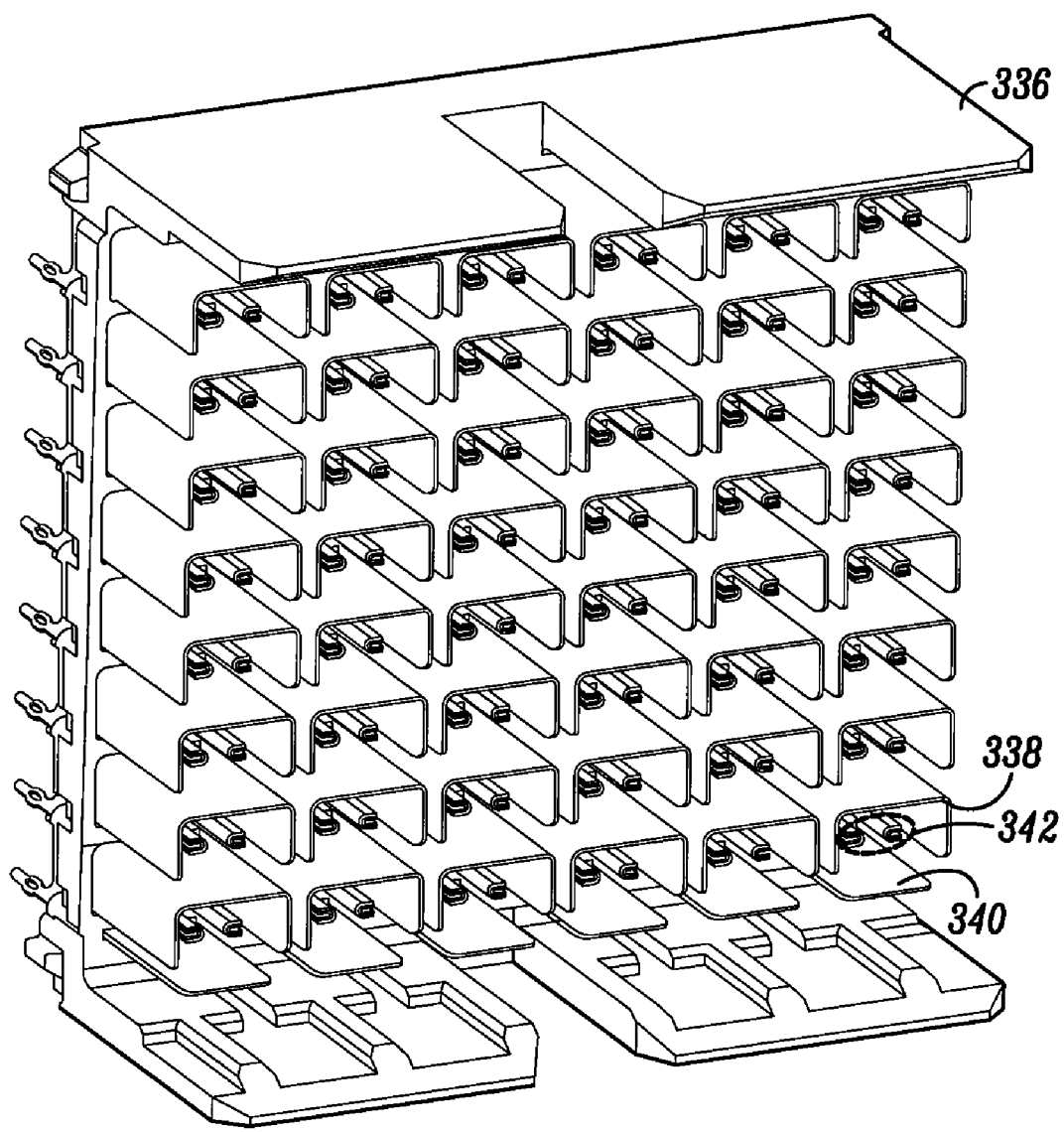
FIG. 48b is a perspective view of a mating face of a wafer housing.
Figure 49:
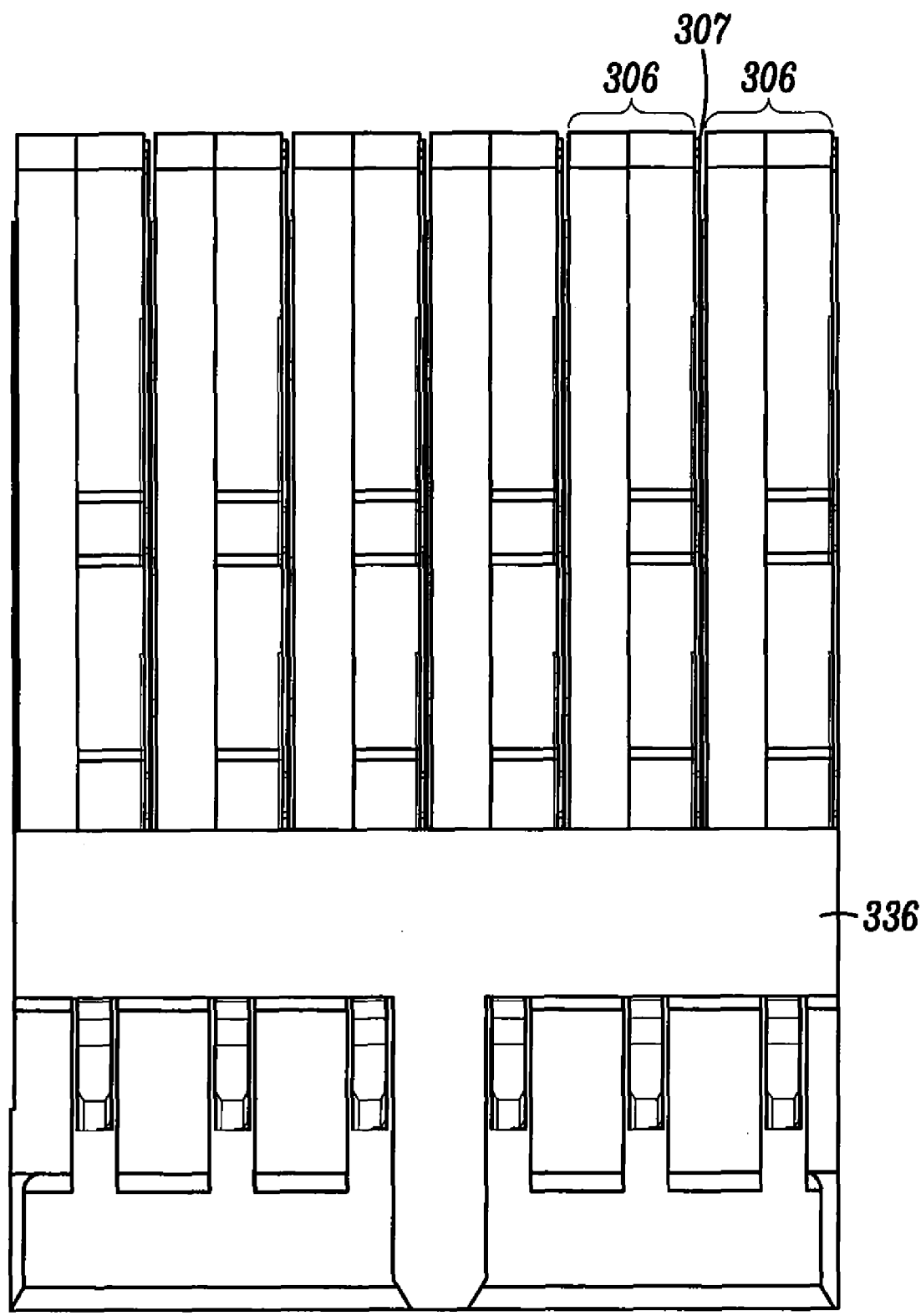
FIG. 49 illustrates an air gap between two adjacent wafer assemblies.

Referring to FIGS. 48a and 48b, the wafer housing 304 receives the electrical mating connectors 327 and ground tabs 320 extending from the mating end 332 of the wafer assemblies 302 and positions each wafer assembly 306 adjacent to another wafer assembly 306 of the plurality of wafer assemblies 302. As shown in FIG. 49, in some implementations the wafer housing 304 positions two wafer assemblies 306 adjacent to each other such that an air gap 307 exists between the two adjacent wafer assemblies 306. The air gap 307 assists in creating a continuous reference structure including at least the first housing 308, second housing 314, and ground frame 316 of each wafer assembly 306. In some implementations, a distance between two adjacent wafer assemblies 306 (the air gap 307) may be greater than zero but less than or equal to substantially 0.5 mm.

Figure 50A:
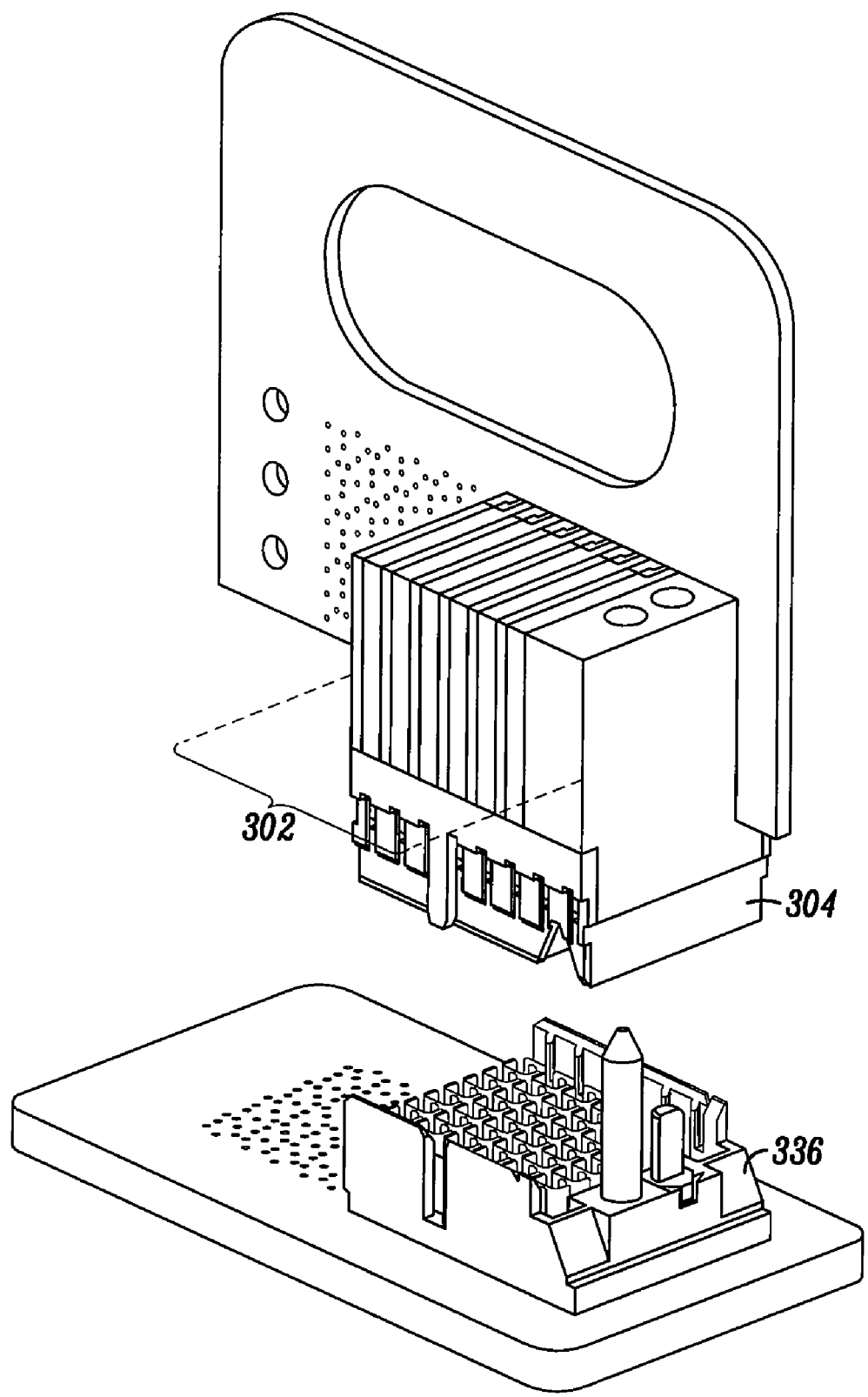
FIG. 50a is a perspective view of an unmated high-speed backplane connector system.
Figure 50B:
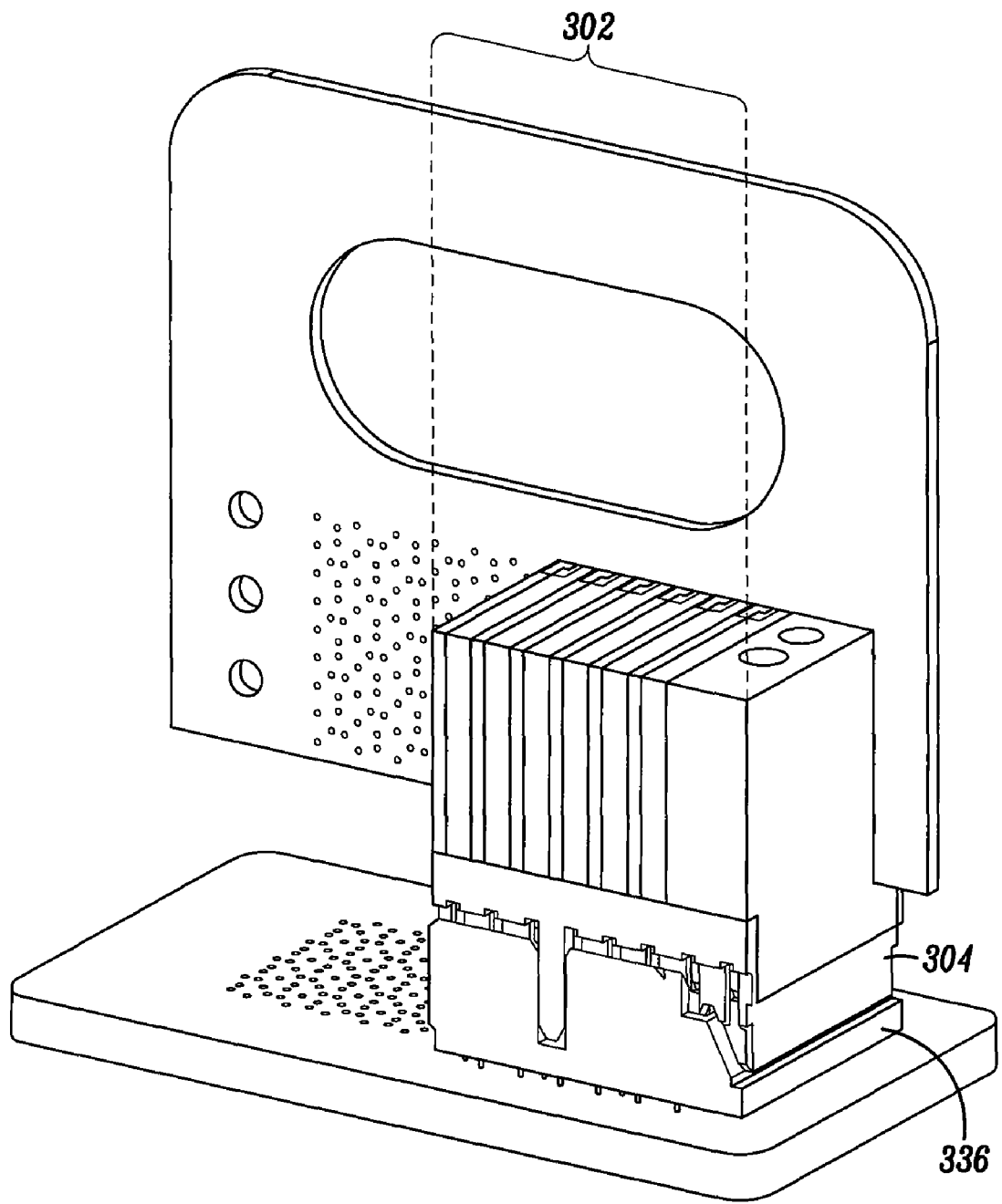
FIG. 50b is a perspective view of a mated high-speed backplane connector system.

Referring to FIGS. 48a and 48b, the connector system 300 includes a header module 336, such as the header modules 136, 236 described above, adapted to mate with the wafer housing 304 and plurality of wafer assemblies 302. As shown in FIGS. 48 and 50, as the header module 336 mates with the wafer housing 304, the wafer housing 304 receives a plurality of signal pin pairs 342, a plurality of C-shaped ground shields 338, and a row of ground tabs 340 extending from a mating face of the header module 336. As the plurality of signal pin pairs 342 are received by the wafer housing 304, the signal pin pairs 342 engage the electrical mating connectors 327 extending from the first and second arrays of electrical contacts 310, 312. Additionally, as the plurality of C-shaped ground shields 338 and row of ground tabs 340 are received by the wafer housing 304, the C-shaped ground shields 338 and ground tabs 340 engage the ground tabs 320 extending from the plurality of wafer assemblies 202.

Figure 51A:
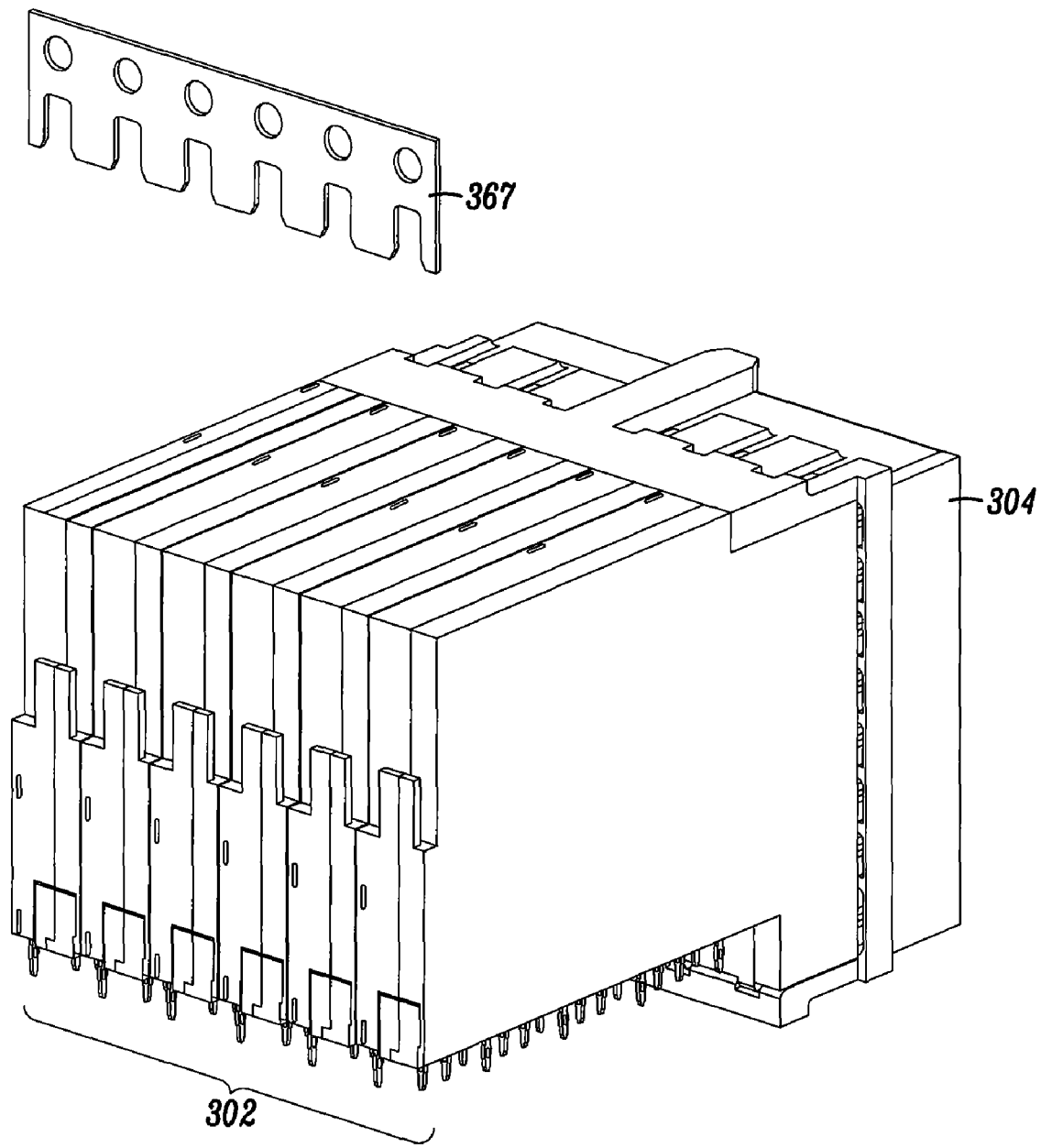
FIG. 51a is a perspective view of a plurality of wafer assemblies and an organizer.
Figure 51B:
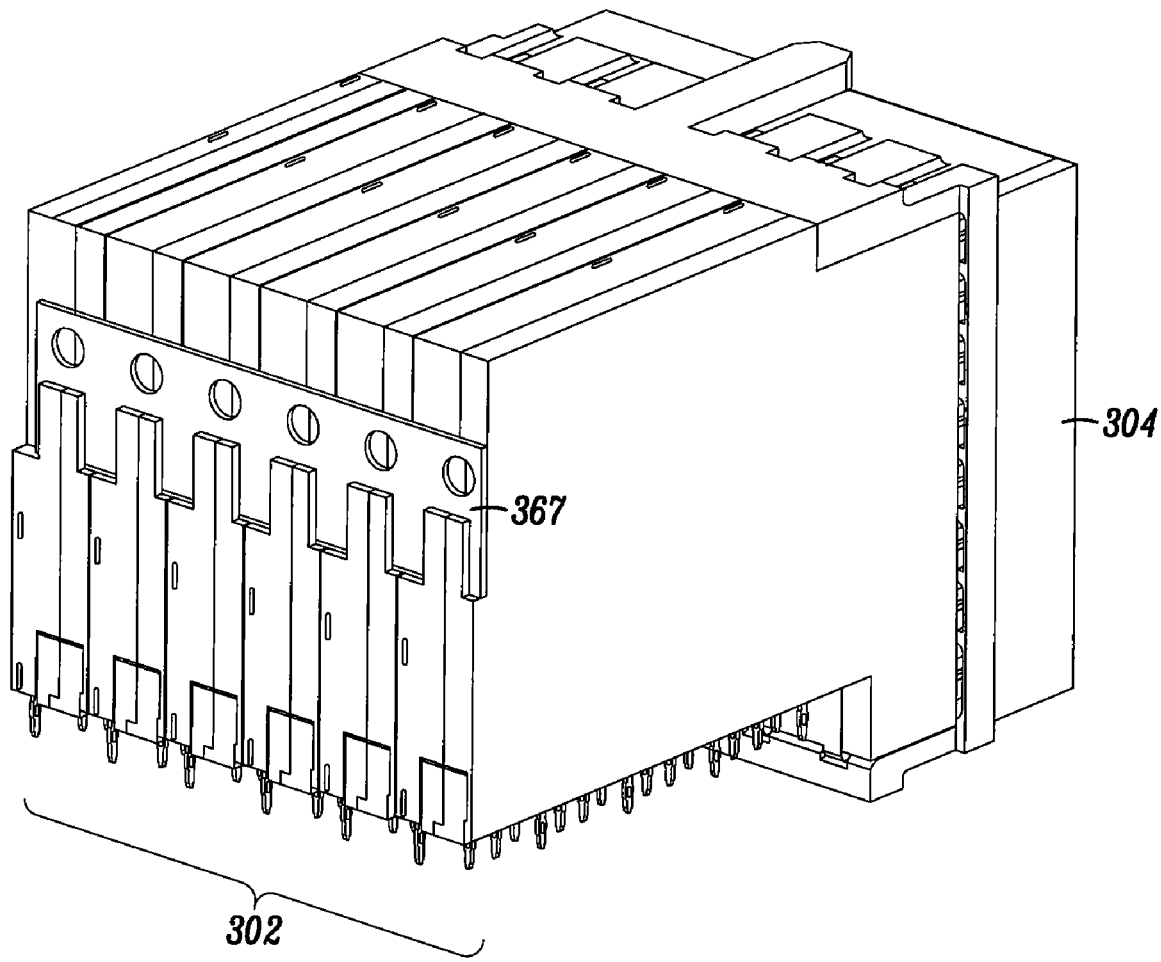
FIG. 51b is another perspective view of a plurality of wafer assemblies and an organizer.

Referring to FIGS. 51-53, in some implementations, the connector system 300 includes one or more organizers. In one implementation, as shown in FIGS. 51a and 51b, an organizer 367 is positioned along a backside of the plurality of wafer assemblies 302 to lock the plurality of wafer assemblies 302 together. In some implementations, the organizer 367 may comprise a brass base material with tin (Sn) over nickel (Ni) plating. However, in other implementations, the organizer 367 may be stamped or molded from any thin material that is mechanically stiff.

Figure 52A:
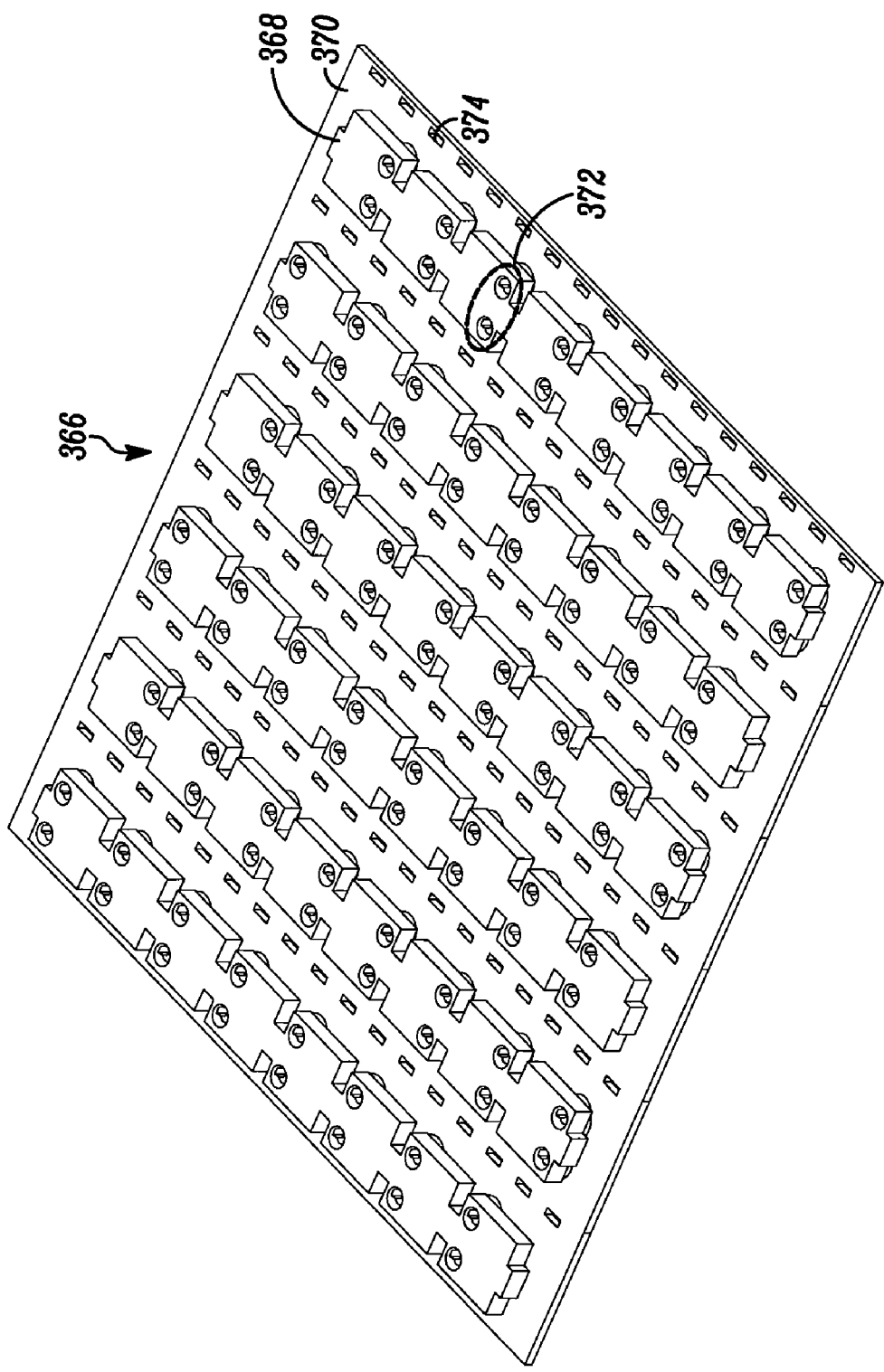
FIG. 52a is a perspective view of one implementation of a mounting-face organizer.
Figure 52B:
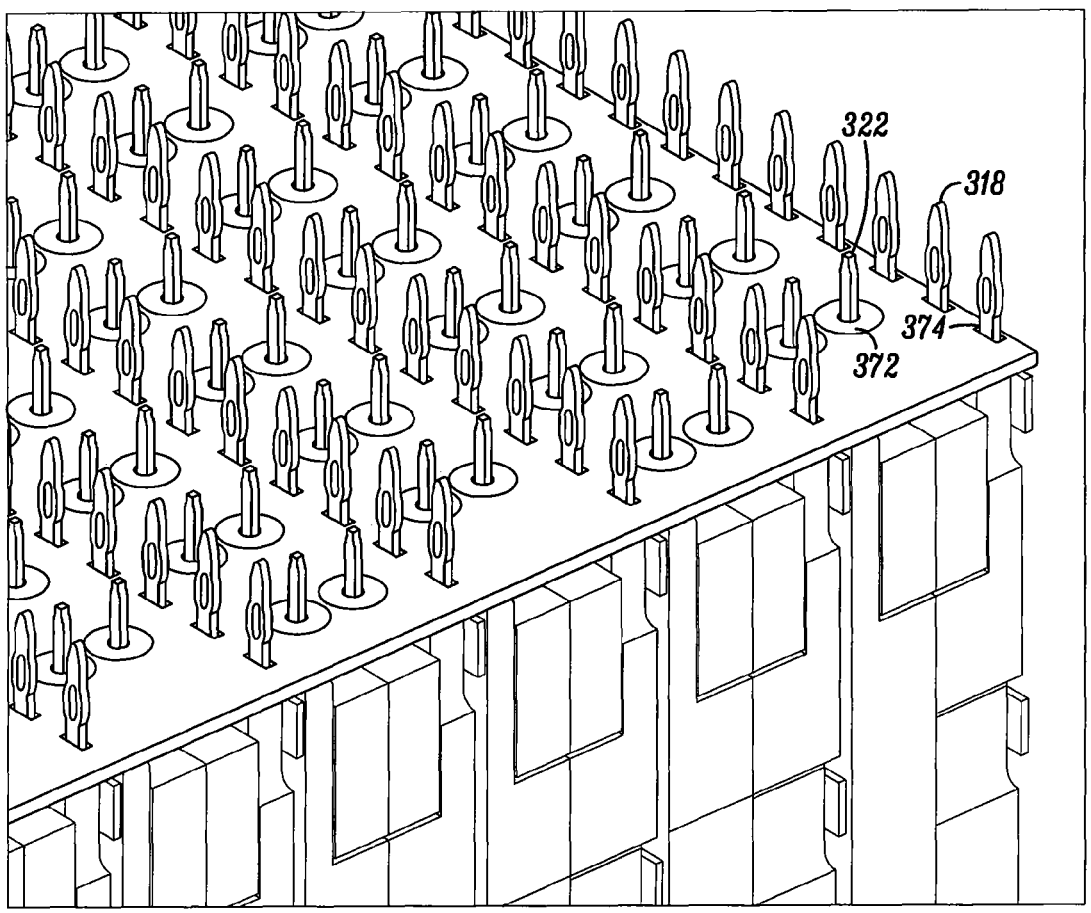
FIG. 52b is an enlarged view of the mounting-face organizer of FIG. 52a positioned at a mounting face of a plurality of wafer assemblies.
Figure 52C:
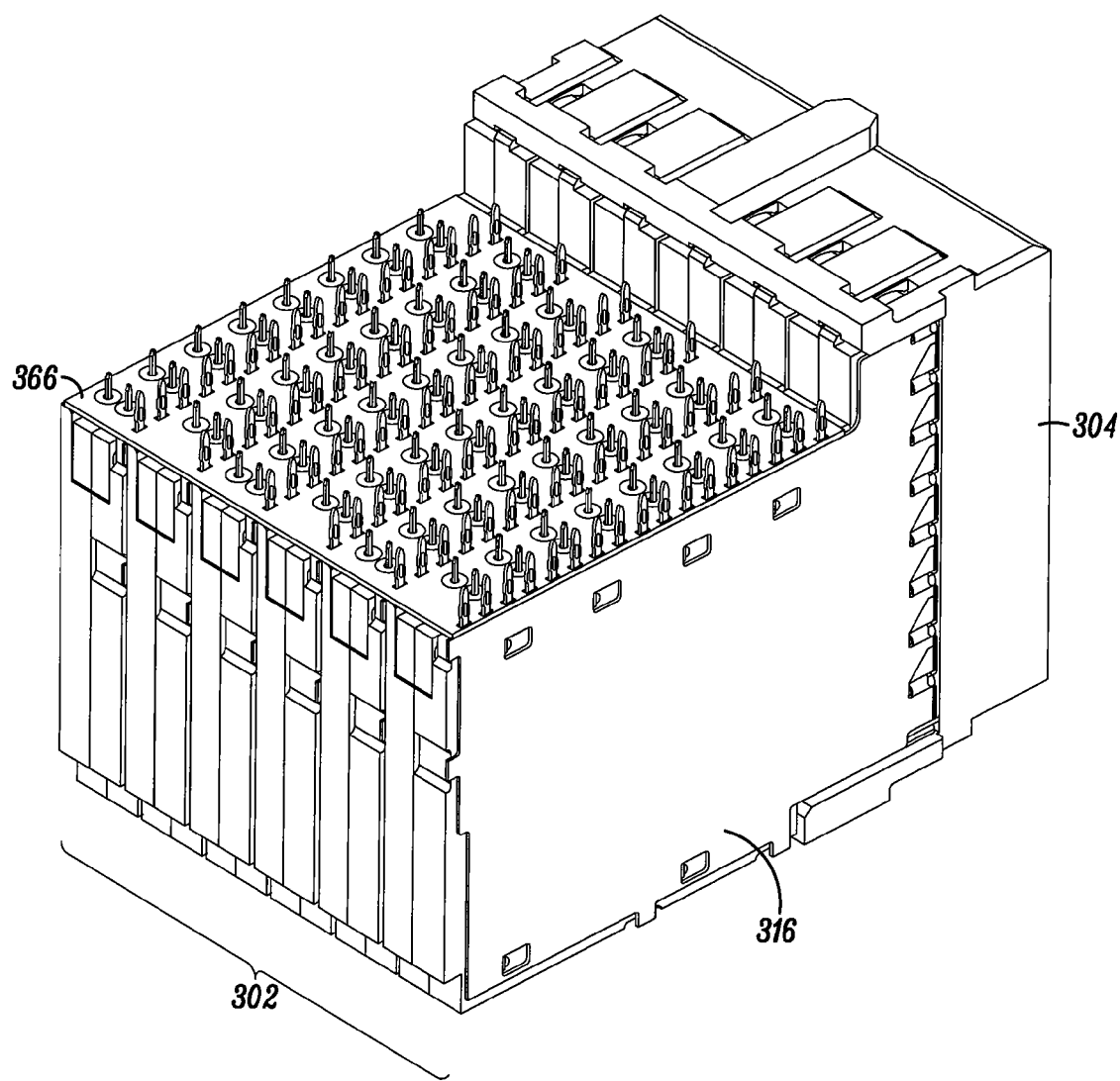

In other implementations, as shown in FIGS. 52a, 52b, and 52c, an organizer 366 is positioned at the mounting end 364 of the plurality of wafer assemblies 302. Typically, the organizer 366 comprises columns of overmolded plastic insulators 368 positioned on an etched metal plate 370. In some implementations, the insulator 368 may comprise a liquid crystal polymer (LCP) and the metal plate may comprise a brass or phosphor bronze base with tin (Sn) over nickel (Ni) plating. However, in other implementations, the insulator 368 may comprise other polymers and the metal plate may comprise other electrically conductive base materials and platings (noble or non-noble).

The plastic insulators 368 and metal plate 370 include complementary apertures 372 dimensioned to allow the electrical contact mounting pins 322 of the first and second array of electrical contacts 310, 312 to extend through the organizer 366 and away from the wafer assemblies 302 as shown in FIG. 51 to engage a substrate such as a backplane circuit board or a daughtercard circuit board. Similarly, the metal plate 370 includes apertures 372 dimensioned to allow the mounting pins 318 of the ground frames 316 to extend through the organizer 366 and away from the wafer assemblies 302, as shown in FIGS. 52b and 52c, to engage a substrate such as a backplane circuit board or a daughtercard circuit board.

Yet another implementation of an organizer 366 positioned at the mounting end 364 of the plurality of wafer assemblies 302 is illustrated in FIGS. 53a, 53b, 53c, and 53d. In this implementation, in addition to apertures 372 that allow the electrical contact mounting pins 322 of the first and second arrays of electrical contacts 310, 312 to extend through the organizer 366 and away from the wafer assemblies 302, and apertures 374 that allow the mounting pins 318 of the ground frame 316 to extend through the organizer 366 and away from the wafer assemblies 302, the organizer 366 additionally includes a plurality of apertures 375 that allow projections 376 extending from the first and/or second housings 308, 314 to pass through the organizer 366. When the plurality of wafer assemblies 302 is mounted to a substrate, such as a printed circuit board, the projections 376 extend through the organizer 366 and contact the substrate. By extending projections 376 from the first or second housings 308, 314 to the substrate, the projections 376 may provide shielding to the electrical contact mounting pins 322 of the first and second arrays of electrical contacts 310, 312 as they pass through the organizer 366.

Figure 53A:
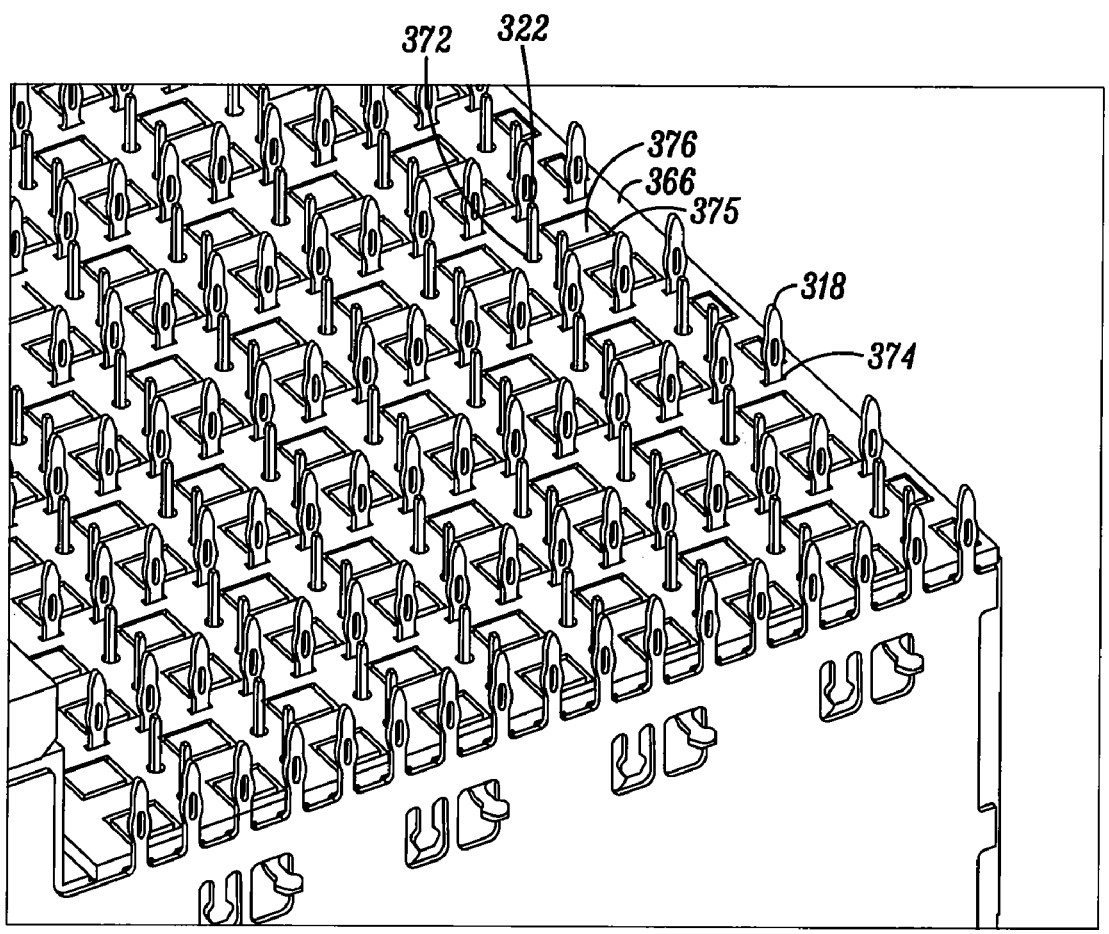
FIG. 53a is a perspective view of another implementation of a mounting-face organizer.
Figure 53B:
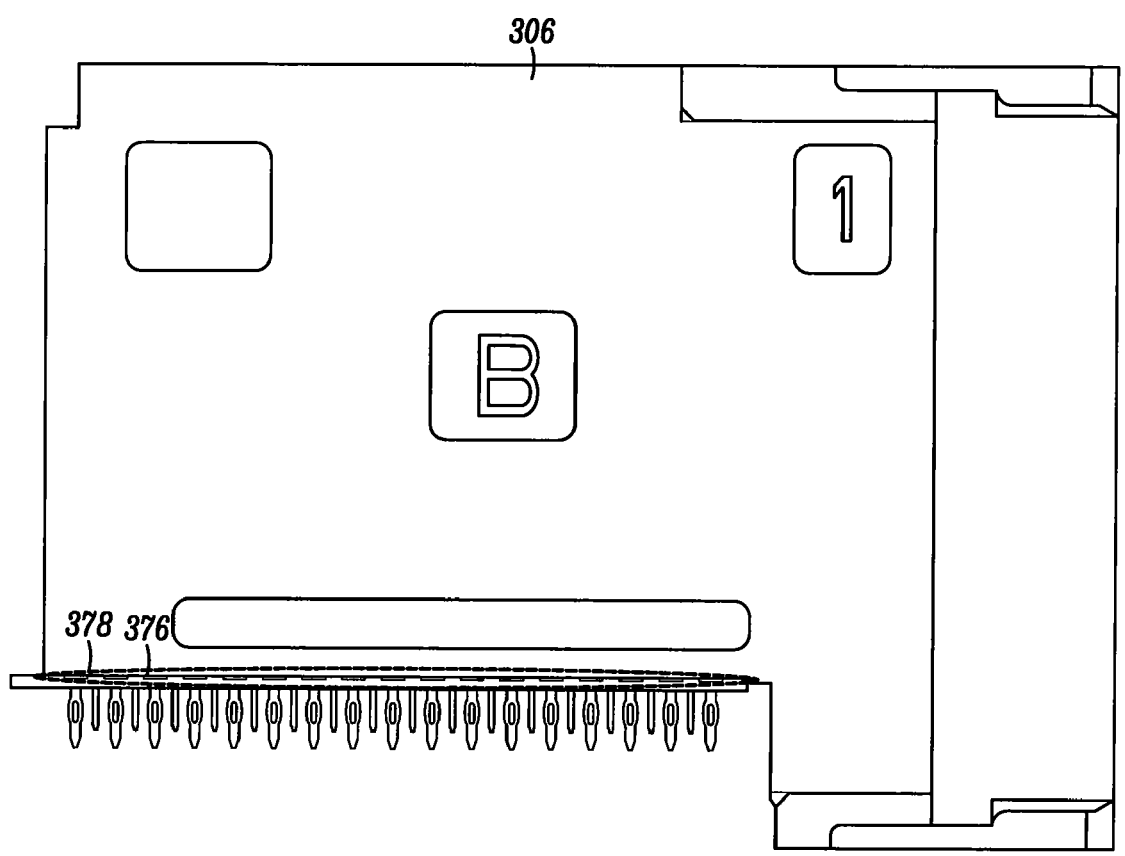
Figure 53C:
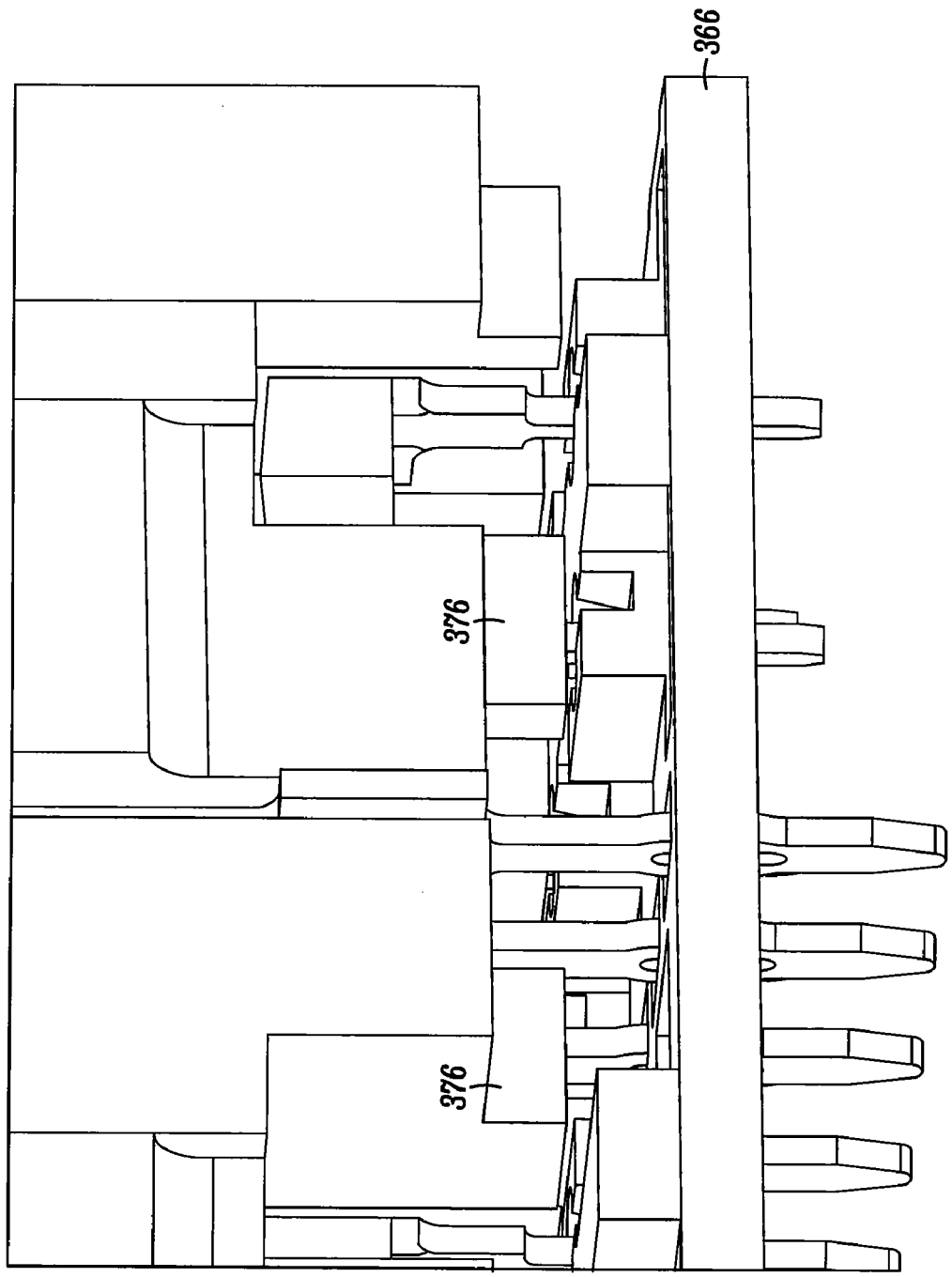
Figure 53D:
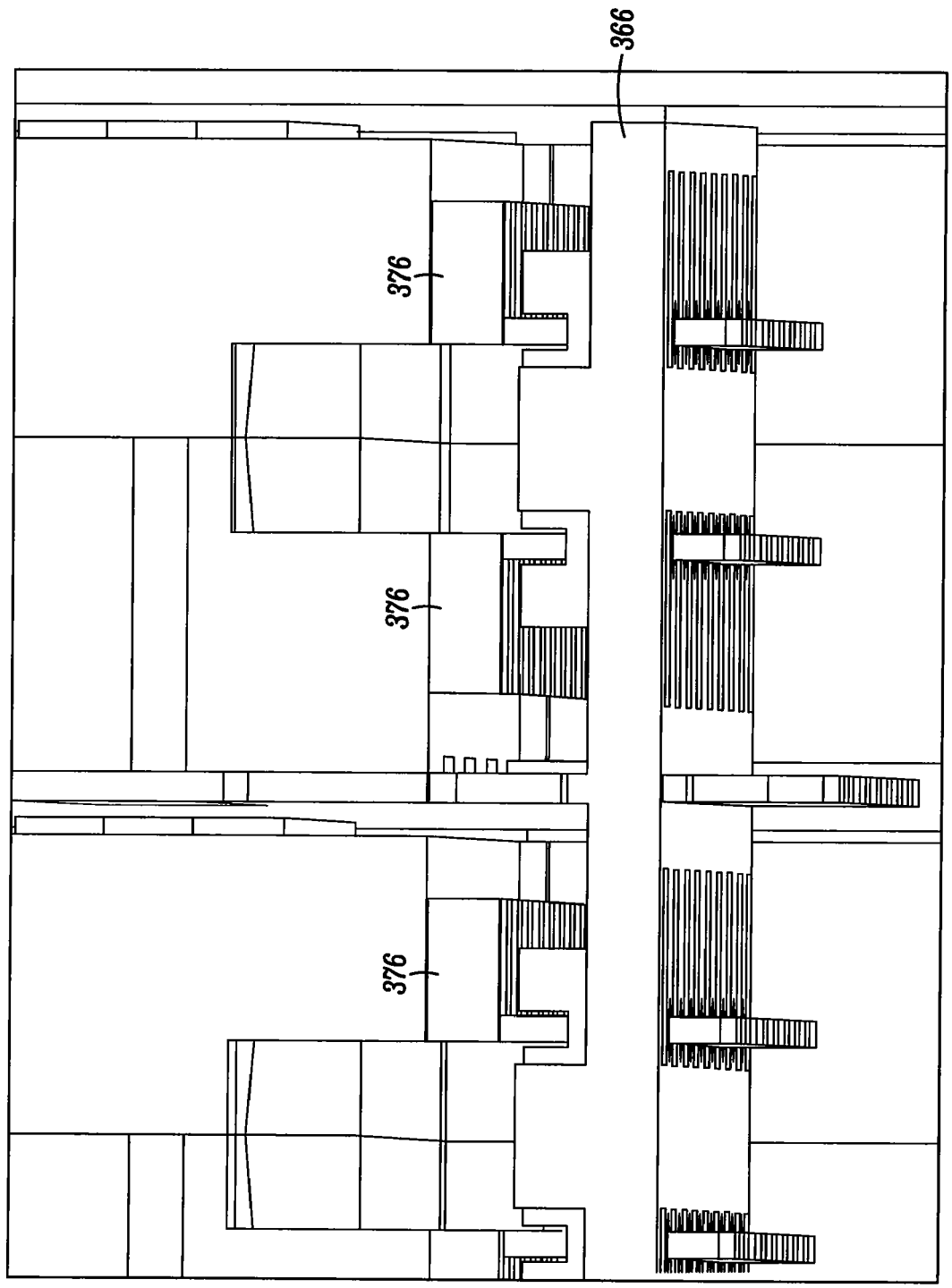

In some implementations, the projections 376 extending from the first and/or second housings 308, 314 are flush with the organizer 366 as shown in FIG. 53a so that when the plurality of wafer assemblies 302 is mounted to the substrate, both the projections 376 and the organizer 366 contact the substrate. However in other implementations, as shown in FIGS. 53b, 53c, and 53d, the projections 376 extending from the first and/or second housings 308, 314 extend away from the organizer 366. Because the projections 376 extend away from the organizer 366, when the plurality of wafer assemblies 302 is mounted to a substrate, an air gap 378 is created between the organizer 366 and the substrate that assists in electrically isolating electrical contact mounting pins 322 of the first and second arrays of electrical contacts 310, 312 extending away from the organizer 366. The air gap 378 additionally assists in creating a continuous references structure including at least the first wafer housing 308, second wafer housing 314, and ground shield 316 of each wafer assembly 306. In some implementations, a distance between the organizer 366 and the substrate (the air gap 378) may be greater than zero but less than or equal to substantially 0.5 mm.

In some implementations, each pair of electrical contact mounting pins 332 corresponding to an electrical contact pair 330 is positioned in one of two orientations, such as broadside coupled or edge coupled. In other implementations, each pair of electrical contact mounting pins 332 corresponding to an electrical contact pair 330 is positioned in one of two orientations, where in a first orientation, a pair of electrical contact mounting pins 332 is aligned so that the broadsides of the pins are substantially parallel to a substrate, and in a second orientation, a pair of electrical contact mounting pins 332 are aligned so that the broadsides are substantially perpendicular to the substrate. Further, the electrical contact mounting pins 332 and the ground mounting pins 318 may be positioned at the mounting end 364 of the plurality of wafer assemblies 332 to create a noise-canceling footprint, as discussed above with respect to FIGS. 26, 27, and 28.

Figure 54A:
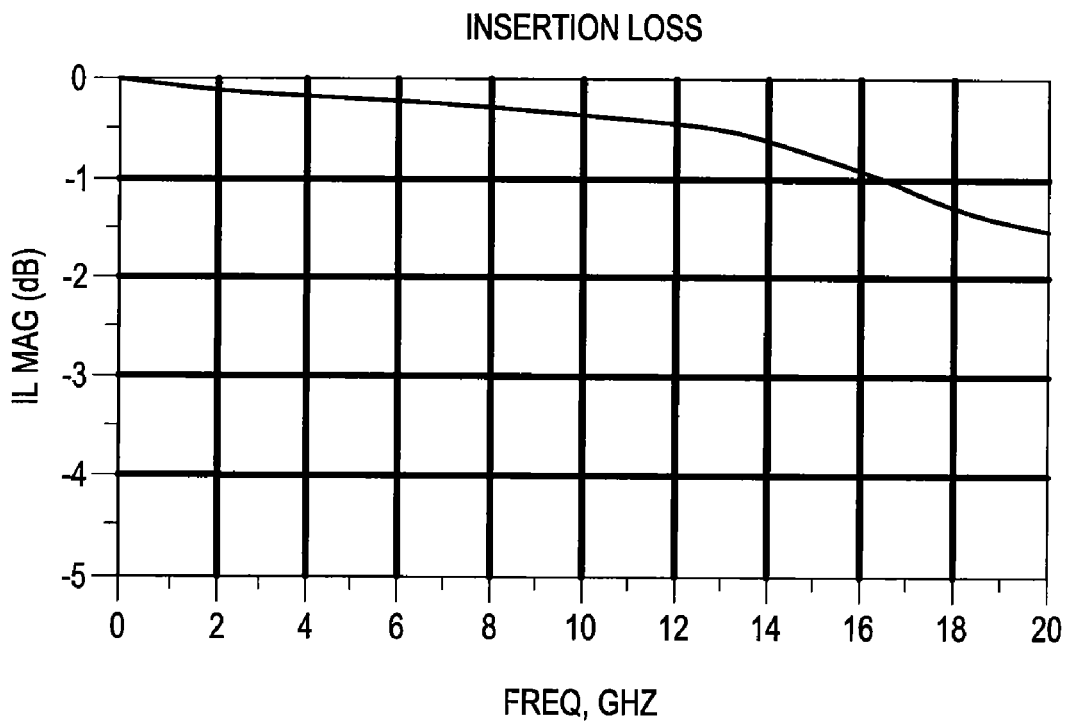
FIG. 54a is a performance plot illustrating insertion loss vs. frequency for the high-speed backplane connector system of FIG. 41.
Figure 54B:
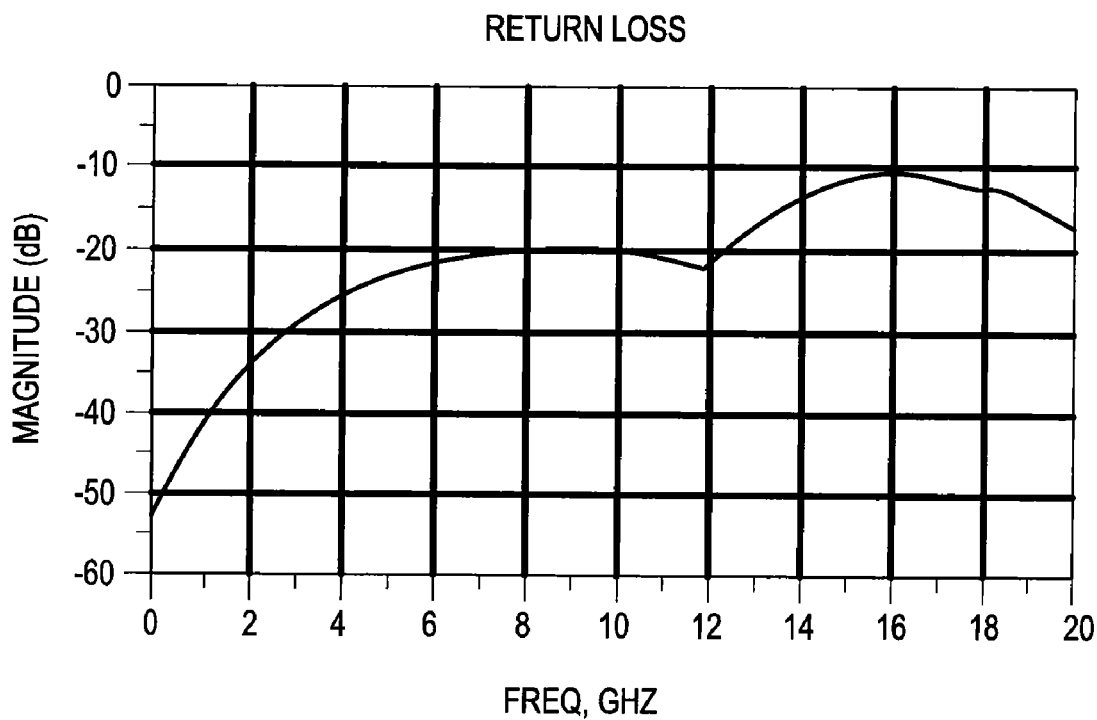
FIG. 54b is a performance plot illustrating return loss vs. frequency for the high-speed backplane connector system of FIG. 41.
Figure 54C:
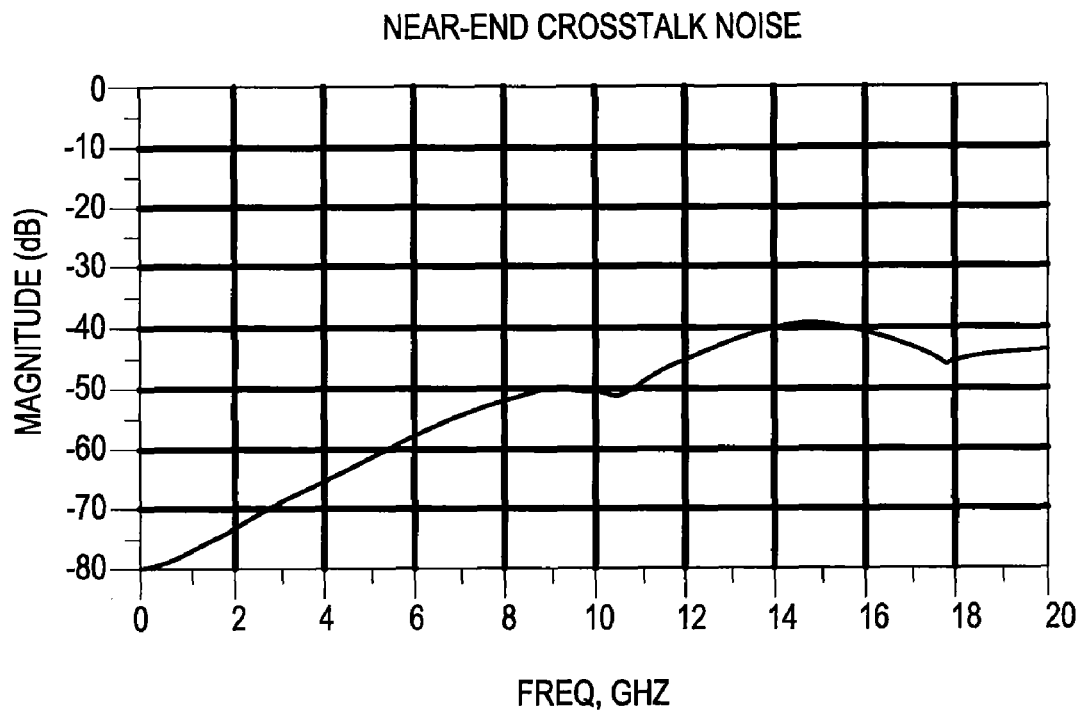
FIG. 54c is a performance plot illustrating near-end crosstalk noise vs. frequency for the high-speed backplane connector system of FIG. 41.
Figure 54D:
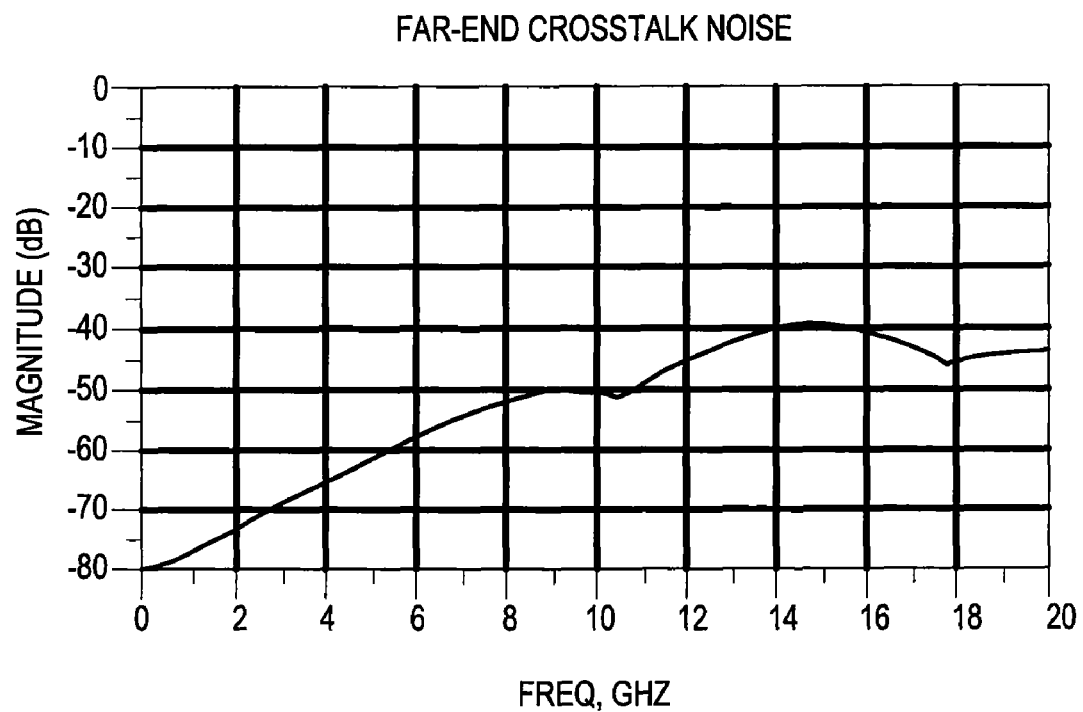
FIG. 54d is a performance plot illustrating far-end crosstalk noise vs. frequency for the high-speed connector system of FIG. 41.

FIGS. 54a, 54b, 54c, and 54d are graphs illustrating an approximate performance of the electrical connector system described above with respect to FIGS. 41-53. FIG. 54a is a performance plot illustrating insertion loss vs. frequency for the electrical connector system; FIG. 54b is a performance plot illustrating return loss vs. frequency for the electrical connector system; FIG. 54c is a performance plot illustrating near-end crosstalk noise vs. frequency for the electrical connector system; and FIG. 54d is a performance plot illustrating far-end crosstalk noise vs. frequency for the electrical connector system. As shown in FIGS. 54a, 54b, 54c, and 54d, the electrical connector system provides a substantially uniform impedance profile to electrical signals carried on the electrical contacts of the first and second arrays of electrical contacts 310, 312 operating at speeds of up to at least 25 Gbps.

Yet another implementation of a high-speed backplane connector system 400 is described with respect to FIGS. 55-63. Generally, the connector system 400 includes a ground shield 402, a plurality of housing segments 404, and a plurality of electrical contact assemblies 406. In some implementations, the ground shield 402 may comprise a liquid crystal polymer, tin (Sn) plating and copper (Cu) plating. However, in other implementations, the ground shield 402 may comprise other materials such as zinc (Zn), aluminum (Al), or a conductive polymer.

Figure 57A:
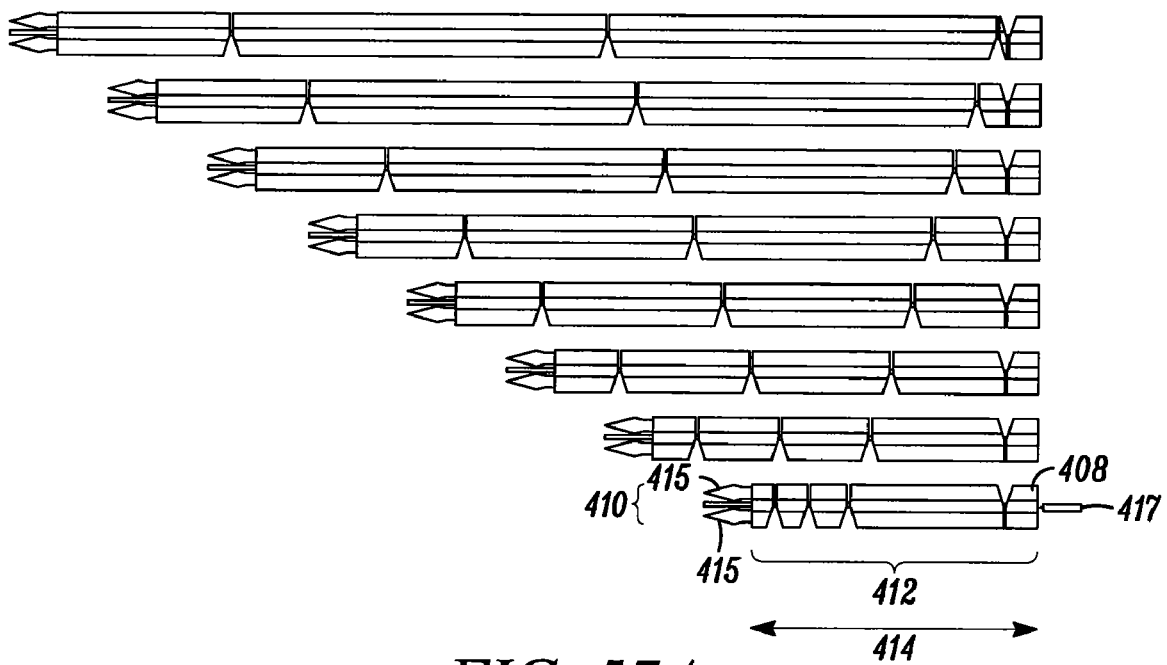
FIG. 57a illustrates a plurality of unbent electrical contact assemblies.
Figure 57B:
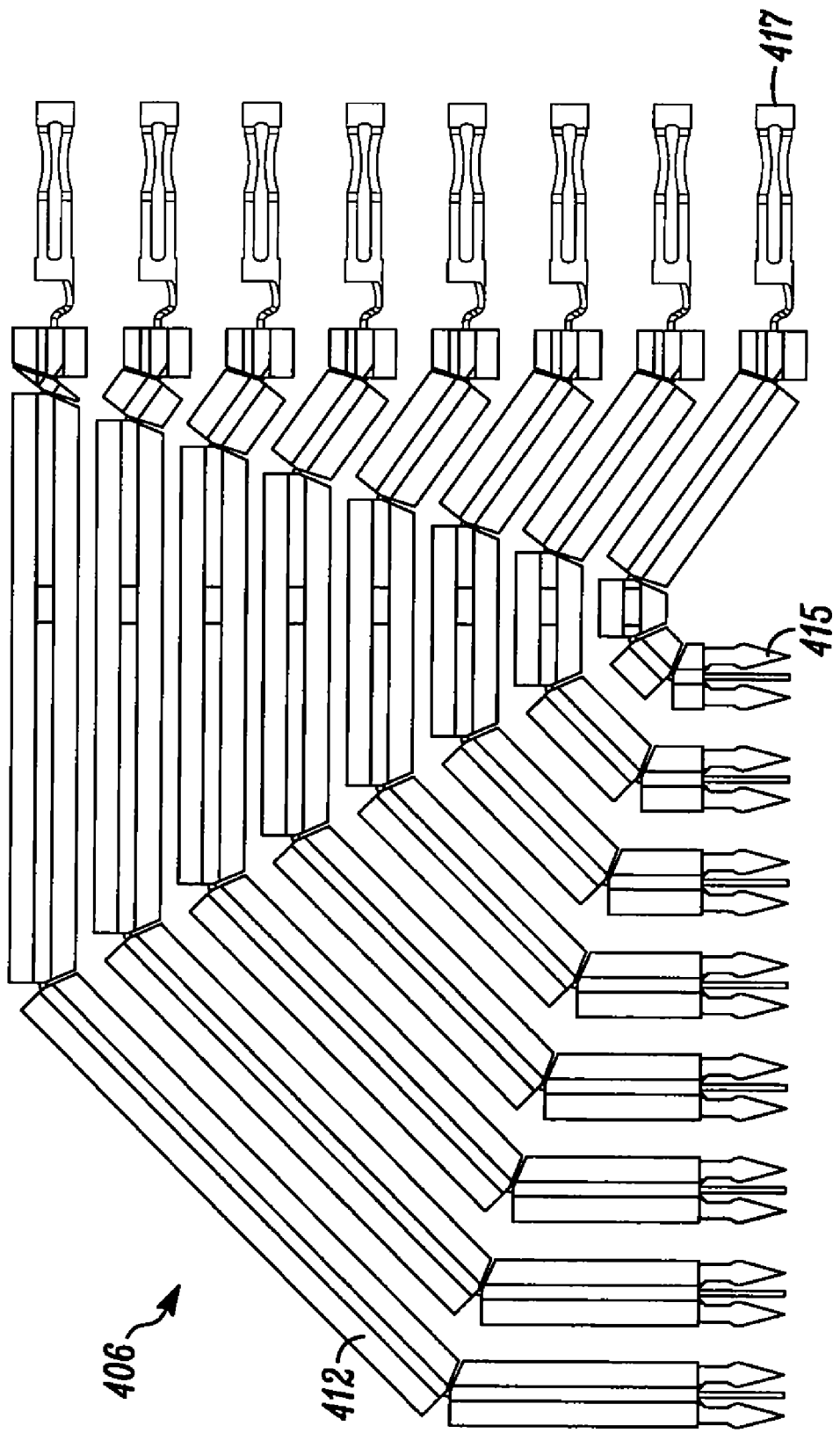
FIG. 57b illustrates a plurality of bent electrical contact assemblies.
Figure 58:
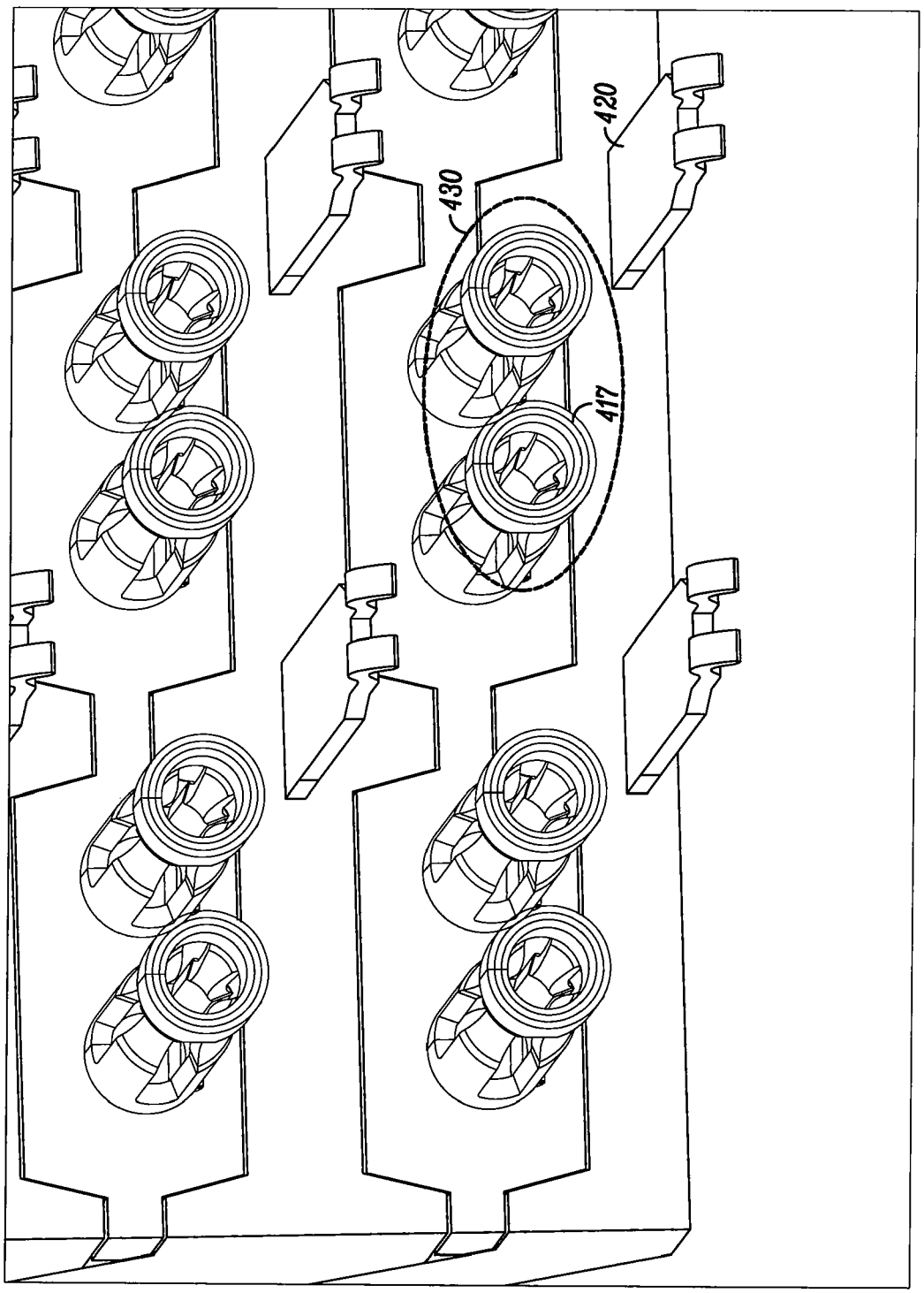
FIG. 58 is an enlarged view of a differential pair of electrical mating connectors.
Figure 59:
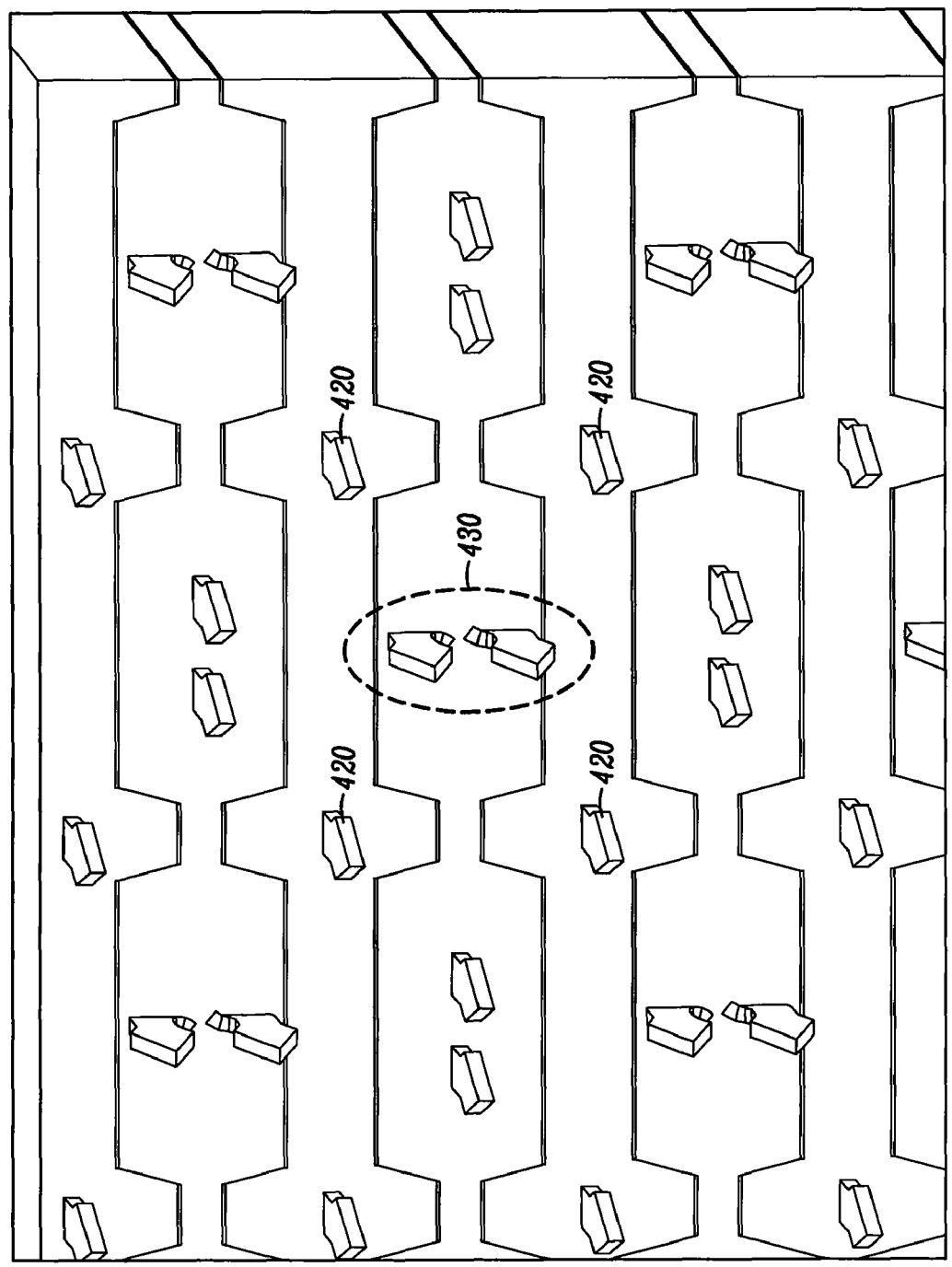
FIG. 59 illustrates a noise-canceling footprint of a mounting end of a ground shield and a matrix of electrical contact assemblies.
Figure 60:
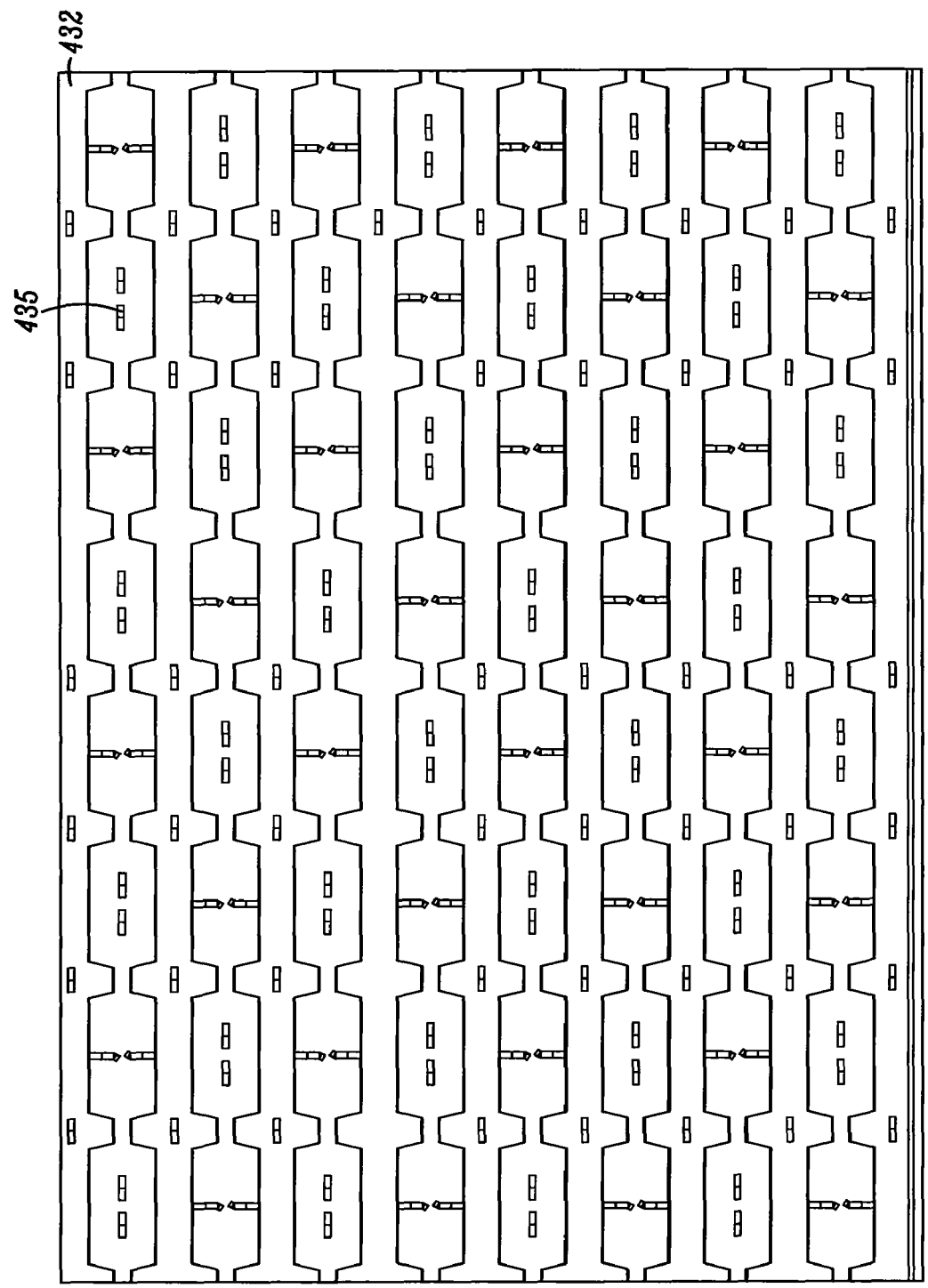
FIG. 60 is a front view of a mounting end organizer.
Figure 61A:
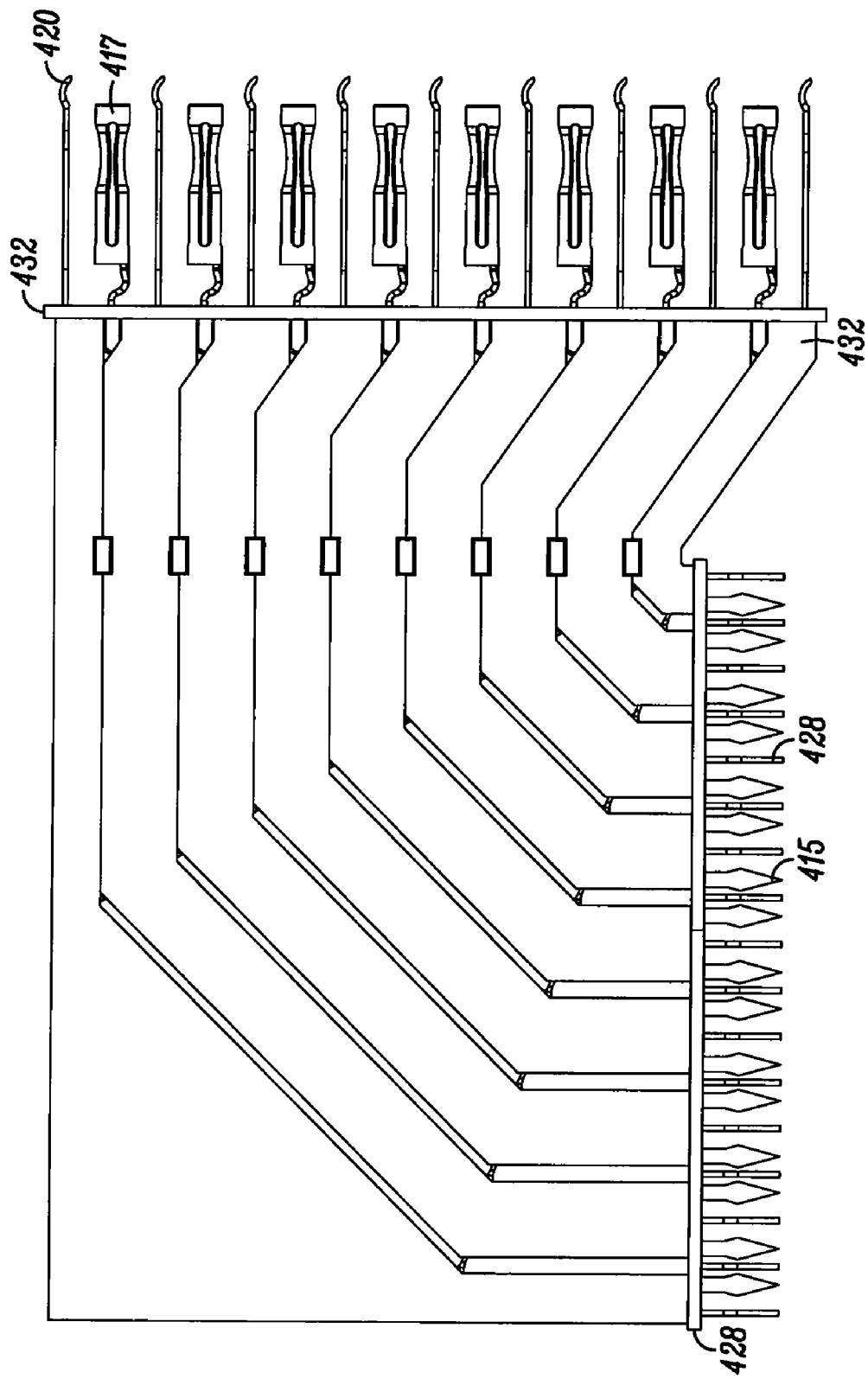
FIG. 61a is a side view of a portion of a high-speed backplane connector system.
Figure 61B:
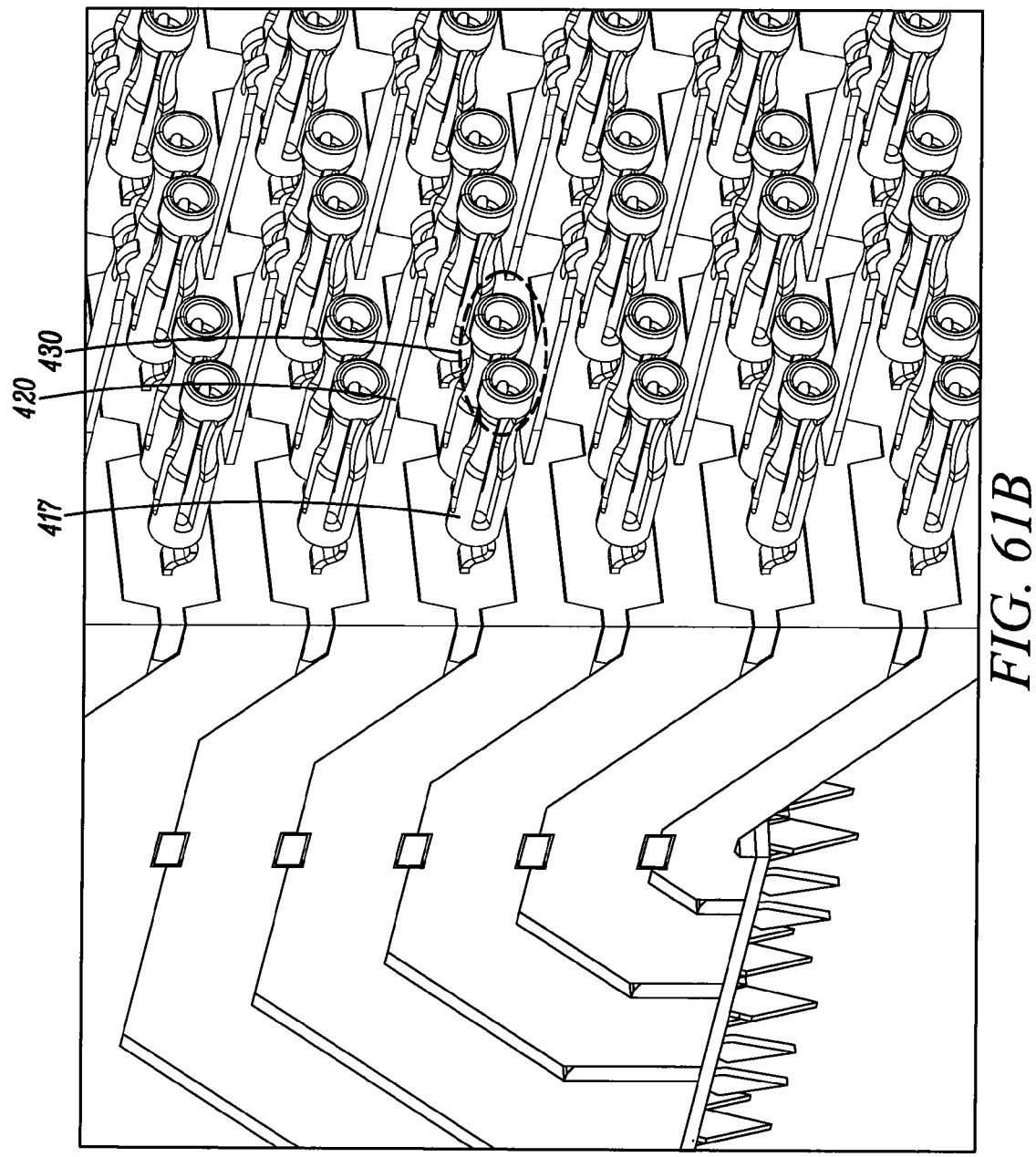
FIG. 61b is a perspective view of a portion of a high-speed backplane connector system.

Referring to FIGS. 57a and 57b, each electrical contact assembly 408 of the plurality of electrical contact assemblies 406 includes a plurality of electrical contacts 410 and a plurality of substantially rigid insulated sections 412. In some implementations, the electrical contacts 410 may comprise a phosphor bronze base material and gold plating and tin plating over nickel plating, and the insulating sections 412 may comprise a liquid crystal polymer (LCP). However, in other implementations, the electrical contacts 410 may comprise other electrically conductive base materials and platings (noble or non-noble) and the insulating sections 412 may comprise other polymers.

Each electrical contact of the plurality of electrical contacts 410 defines a length direction 414 with one or more substrate engagement elements 415, such as electrical contact mounting pins, at a mounting end 426 of the electrical contact and defines an electrical mating connector 417 at a mating end 422 of the electrical contact. In some implementations, the electrical mating connectors 417 are closed-band shaped as shown in FIG. 8, where in other implementations, the electrical mating connectors 417 are tri-beam shaped as shown in FIG. 9a or dual-beam shaped as shown in FIG. 9b. Other mating connector styles could have a multiplicity of beams.

The electrical contacts 410 are positioned within the electrical contact assembly 408 such that each electrical contact is substantially parallel to the other electrical contacts. Typically, two electrical contacts of the plurality of electrical contacts 410 form an electrical contact pair 430, which in some implementations may be a differential pair.

The plurality of insulated sections 412 is positioned along the length direction of the plurality of electrical contacts 410 to position the electrical contacts 410 in the substantially parallel relationship. The plurality of insulated sections 412 are spaced apart from one another along the length of the plurality of electrical contacts 410. Due to the spaces 416 between the insulated sections, the electrical contact assembly 408 may be bent between the insulated sections 412, as shown in FIG. 55b, while still maintaining the substantially parallel relationship between the electrical contacts of the plurality of electrical contacts 410. Parallel contact pairs could be positioned in a helical configuration (like twisted pairs of wires) within each insulated section, and oriented favorably for bending at the spaces between insulated sections.

Each housing segment of the plurality of housing segments 404 defines a plurality of electrical contact channels 418. The electric contact channels 418 may comprise a conductive surface to create a conductive pathway. Each electric contact channel 418 is adapted to receive one of the electrical contact assemblies 408 and to electrically isolate the electrical contacts 410 of the electrical contact assembly positioned within the electric contact channel from the conductive surfaces of the electric contact channel and from electrical contacts 410 positioned in other electric contact channels.

Figure 55:
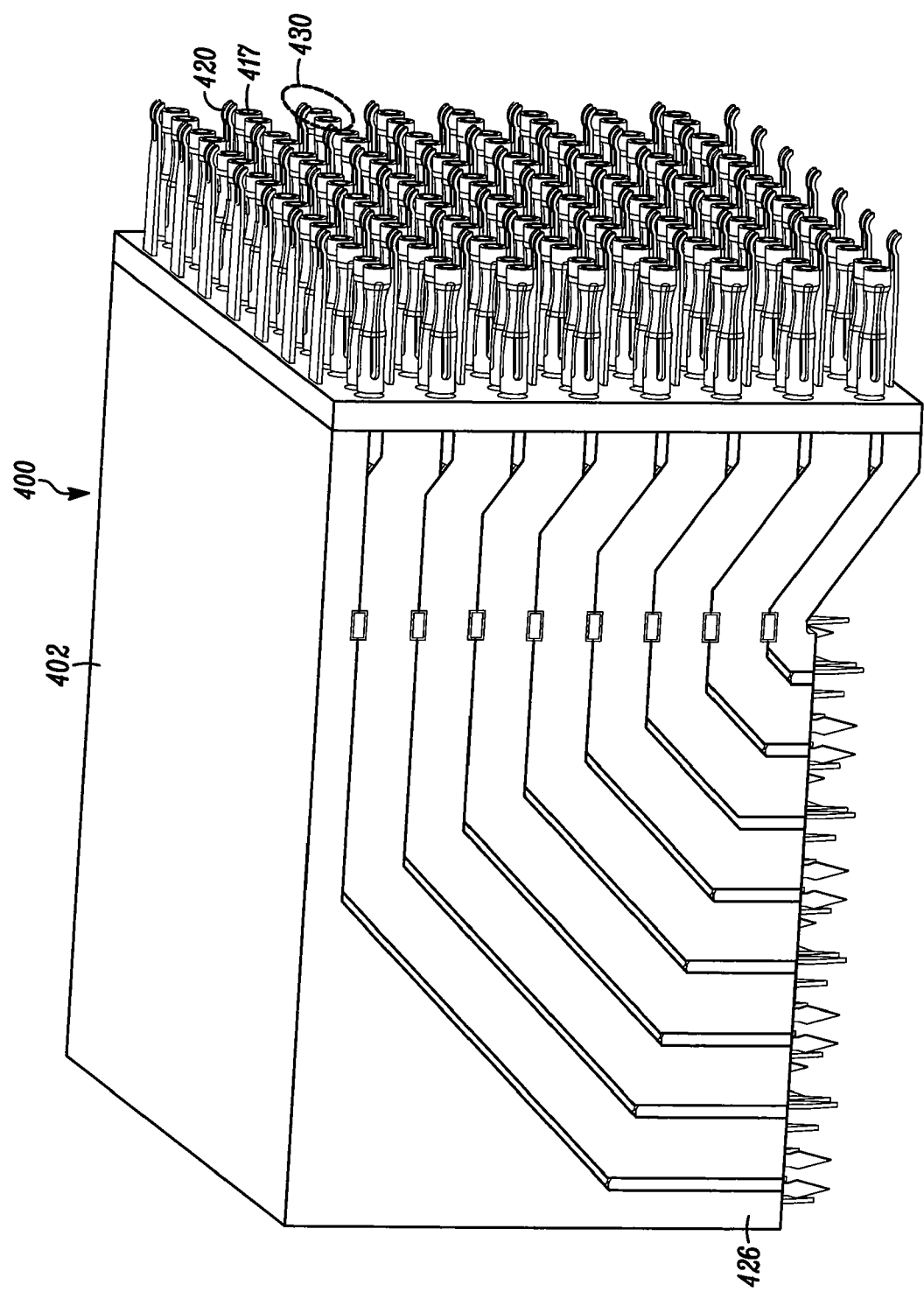
FIG. 55 is a perspective view of a portion of yet another implementation of a high-speed backplane connector system.
Figure 56A:
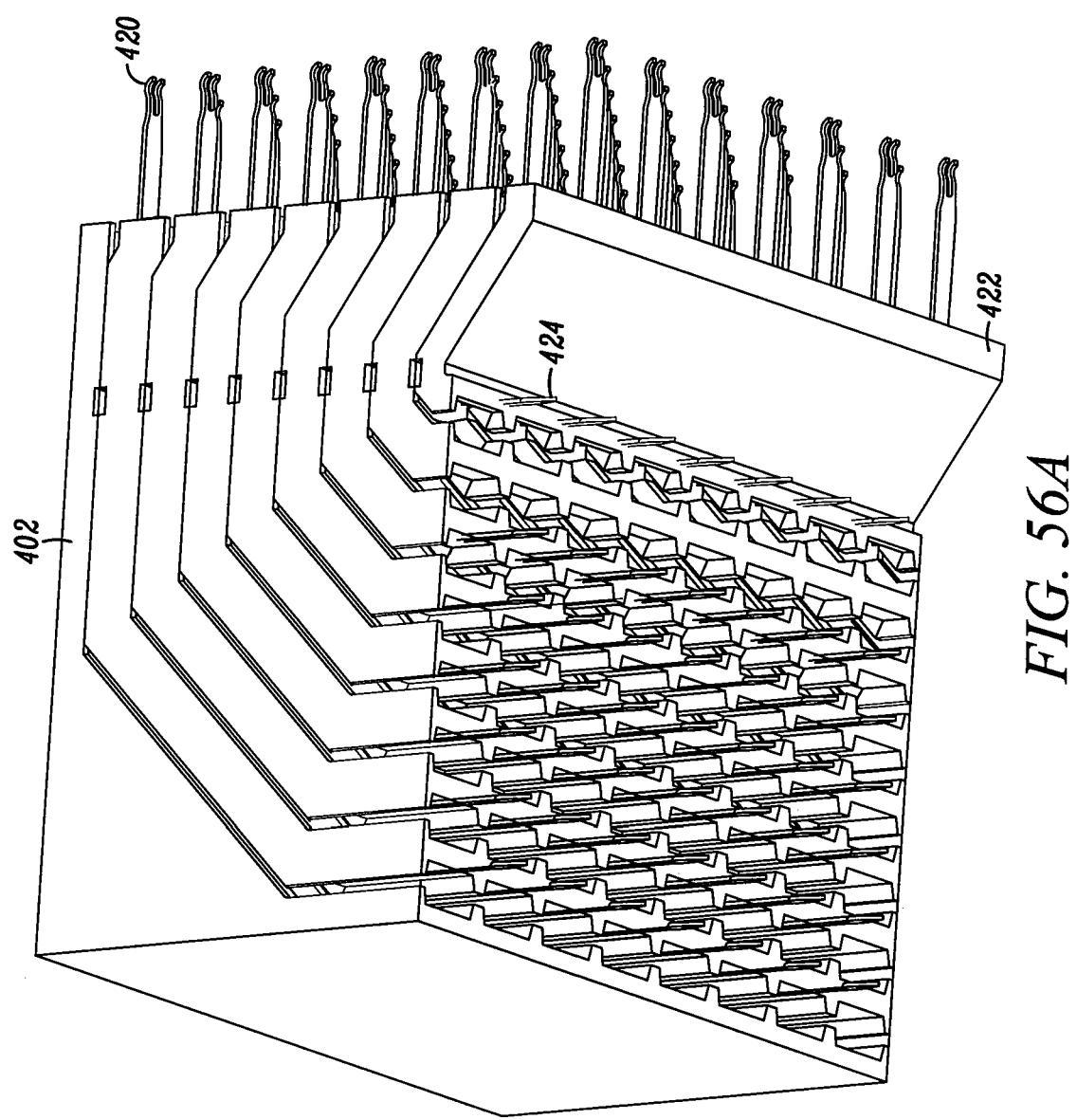
FIG. 56a is a perspective view of a ground shield.
Figure 56B:
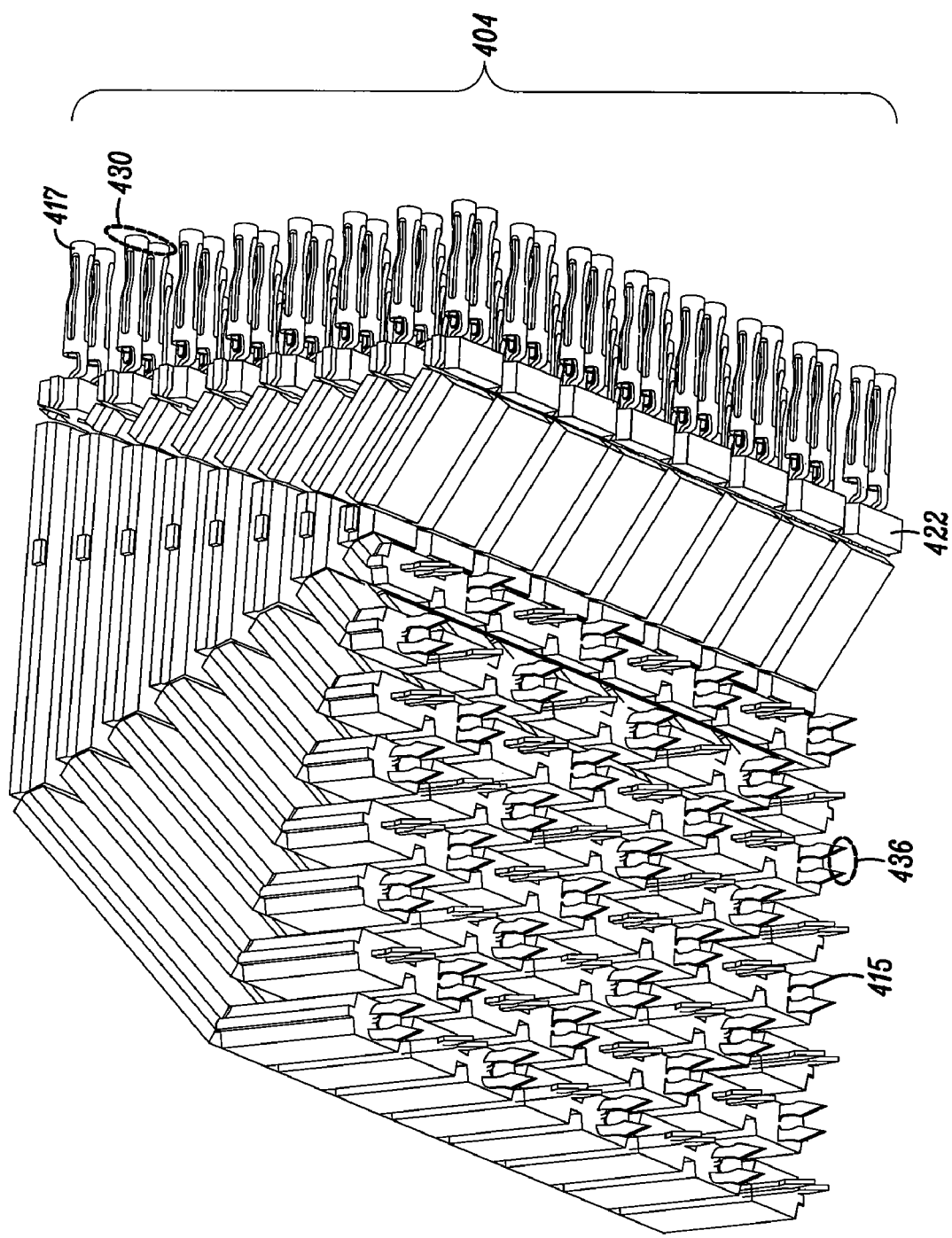
FIG. 56b is a perspective view of a plurality of housing assemblies.
Figure 56C:
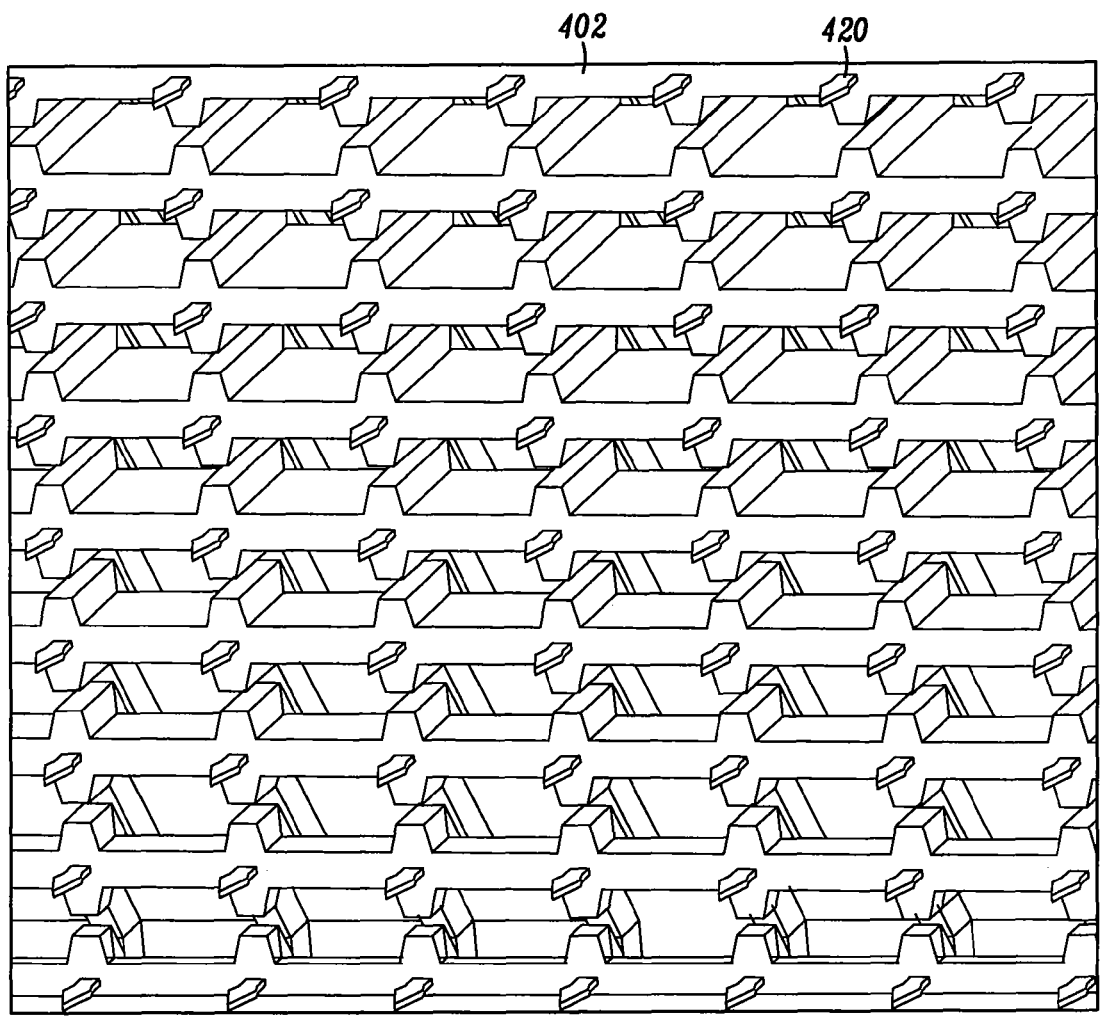
FIG. 56c is another perspective view of the ground shield.

As shown in FIGS. 56a and 56c, the ground shield 402 defines a plurality of segment channels 425, each of which is adapted to receive a housing segment of the plurality of housing segments 404. The ground shield 402 positions the plurality of housing segments 404 as shown in FIG. 55 so that the electrical mating connectors 417 of the electrical contact assemblies 406 extending from the housing segments 404 form a matrix of rows and columns. It should be appreciated that each housing segment of the plurality of housing segments 404 and associated electrical contact assemblies 406 form a row of the matrix so that when the plurality of housing segments 404 are positioned adjacent to one another as shown in FIG. 54b, the matrix is formed.

The ground shield 402 defines a plurality of ground mating tabs 420 extending from a mating end 422 of the ground shield 402 and defines a plurality of substrate engagement elements 424, such as ground mounting pins, extending from a mounting end 426 of the ground shield 402. The ground mounting pins may define a broadside and an edge that is smaller than the broadside.

In some implementations, each pair of electrical contact mounting pins 415 corresponding to an electrical contact pair 430 is positioned in one of two orientations, such as broadside coupled or edge coupled. In other implementations, each pair of electrical contact mounting pins 415 corresponding to an electrical contact pair 430 is positioned in one of two orientations, wherein in a first orientation, a pair of electrical contact mounting pins 415 is aligned so that the broadsides of the pins are substantially parallel to a substrate, and in a second orientation, a pair of electrical contact mounting pins 415 are aligned so that the broadsides are substantially perpendicular to the substrate. Other mounting pin orientations from 0 degrees to 90 degrees between broadside and edge are possible. Further, the electrical contact mounting pins 415 and the ground mounting pins 424 may be positioned to create a noise-canceling footprint, as discussed above with respect to FIGS. 26, 27, and 28.

The connector system 400 may include a mounting-end organizer 428 and/or a mating-end organizer 432. In some implementations the mounting-end and mating-end organizers 428, 432 may comprise a liquid crystal polymer (LCP). However, in other implementations, the mounting-end and mating-end organizers 428, 432 may comprise other polymers. The mounting-end organizer 428 defines a plurality of apertures 434 so that when the mounting-end organizer 428 is positioned at the mounting end 426 of the ground shield 402, the ground mounting pins 424 extending from the ground shield 402 and the electrical contact mounting pins 415 extending from the plurality of electrical contact assemblies 406 pass through the plurality of apertures 434, and extend away from the mounting-end organizer 428 to engage one of a backplane circuit board or a daughtercard circuit board, as explained above.

Similarly, the mating-end organizer 432 defines a plurality of apertures 435 so that when the mating-end organizer 432 is positioned at the mating end 426 of the ground shield 402, the ground mating tabs 420 extending from the ground shield 402 and the electrical mating connectors 417 extending from the plurality of electrical contact assemblies 406 pass through the plurality of apertures 434, and extend away from the mating-end organizer 432.

Figure 62:
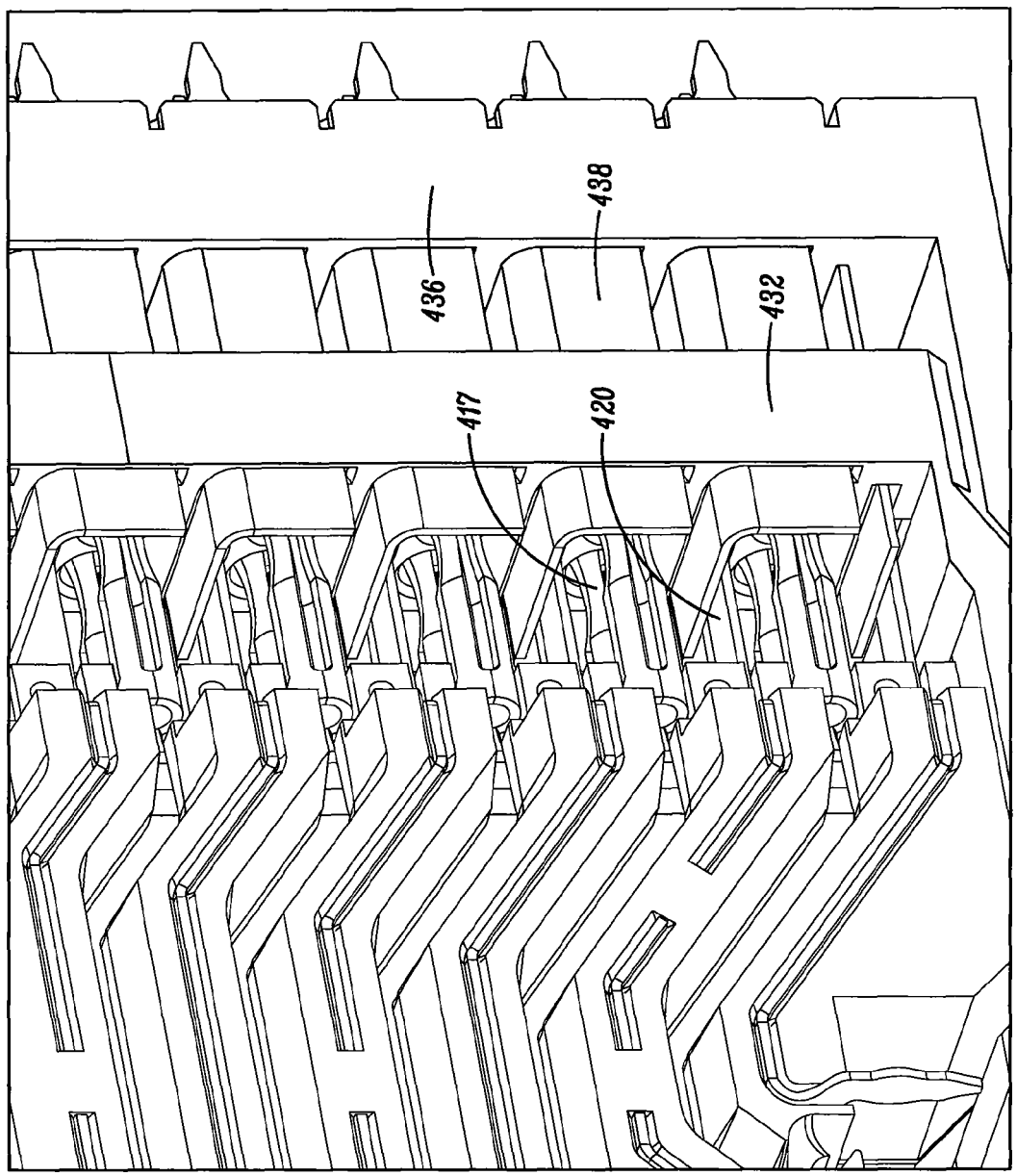

Referring to FIG. 62, the connector system 400 includes a header module 436, such as the header modules 136, 236, 336 described above, adapted to receive the ground mating tabs 420 and electrical mating connectors 417 extending away from the mating-end organizer 432. As the header module 436 receives the electrical mating connectors 417, a plurality of signal pin pairs 442 extending from a mating face of header module 436 engages the electrical mating connectors 417. Similarly, as the header module 436 receives the ground mating tabs 420, a plurality of C-shaped ground shields 438 and row of ground tabs 440 extending from the mating face of the header module 436 engage the ground mating tabs 420.

Figure 63A:
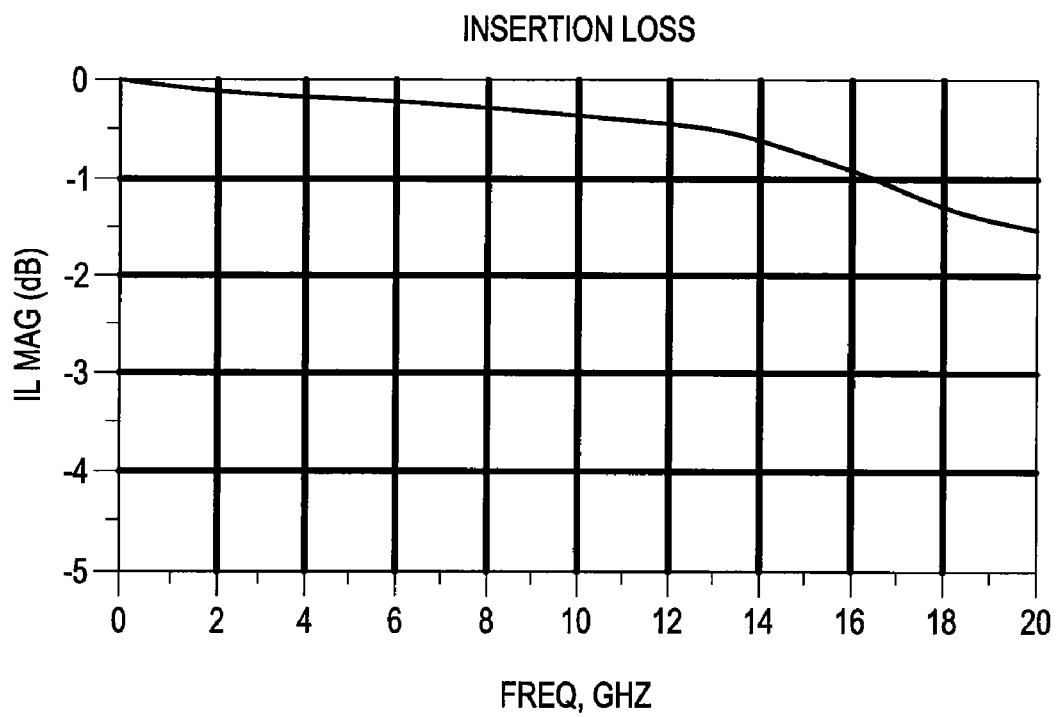
Figure 63B:
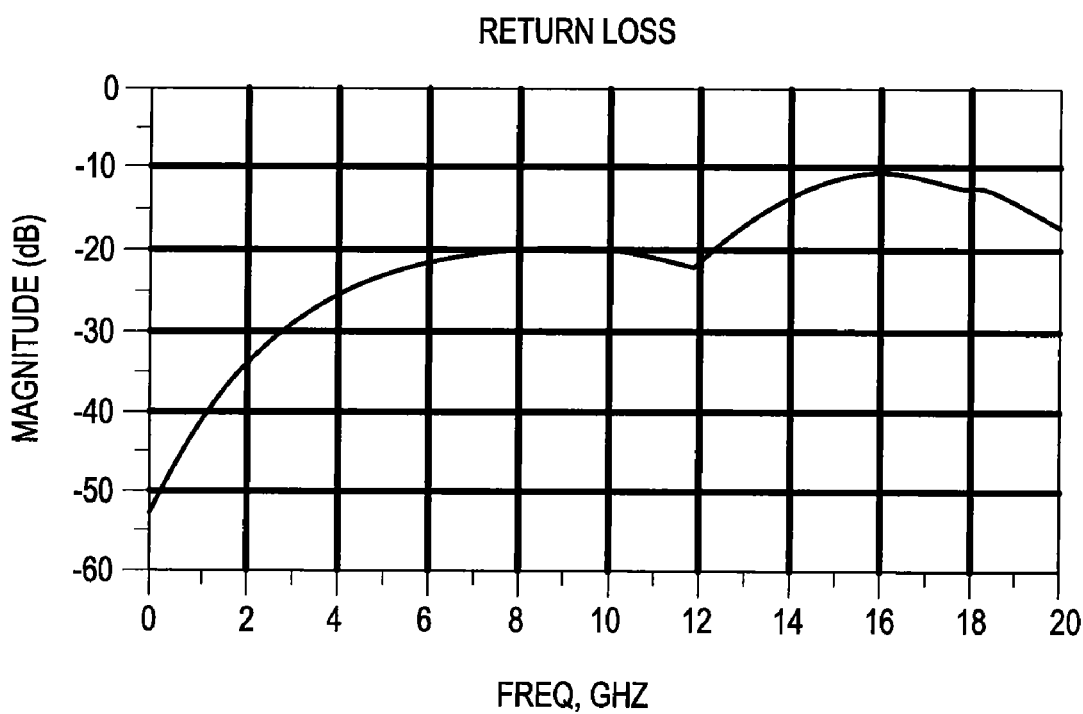
Figure 63C:
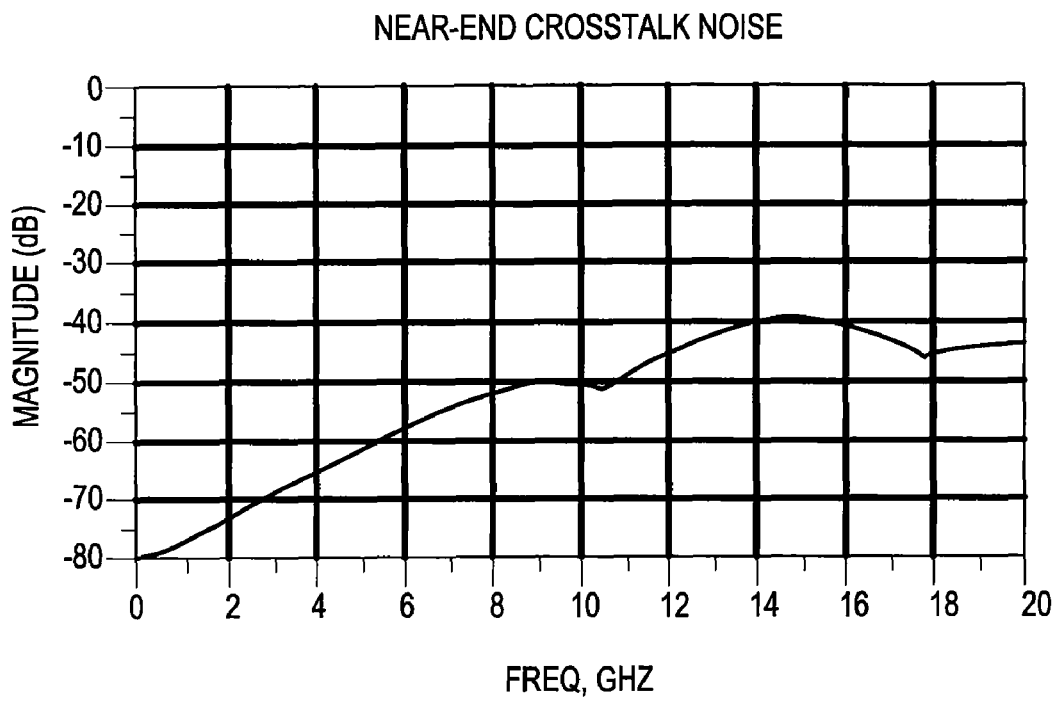
Figure 63D:
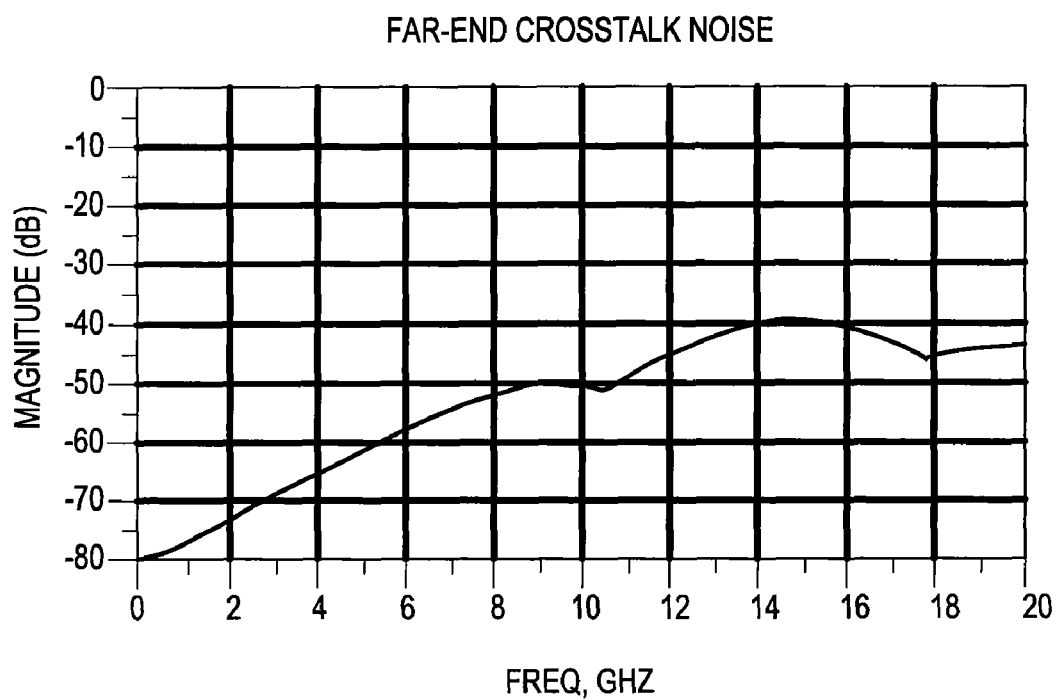

FIGS. 63a, 63b, 63c, and 63d are graphs illustrating an approximate performance of the electrical connector system described above with respect to FIGS. 55-62. FIG. 63a is a performance plot illustrating insertion loss vs. frequency for the electrical connector system; FIG. 63b is a performance plot illustrating return loss vs. frequency for the electrical connector system; FIG. 63c is a performance plot illustrating near-end crosstalk noise vs. frequency for the electrical connector system; and FIG. 63d is a performance plot illustrating far-end crosstalk noise vs. frequency for the electrical connector system. As shown in FIGS. 63a, 63b, 63c, and 63d, the electrical connector system provides a substantially uniform impedance profile to electrical signals carried on the electrical contacts of the first and second arrays of electrical contacts 410 operating at speeds of up to at least 25 Gbps.

Additional implementations of wafer assemblies used in a high-speed backplane connector system is described below respect to FIGS. 64-71. Similar to the connector systems 100, 200, 300 described above with respect to FIGS. 2-54, a high-speed backplane connector system may includes a plurality of wafer assemblies 502 that are positioned adjacent to one another within the connector system 500 by a wafer housing, as described above.

Figure 64:
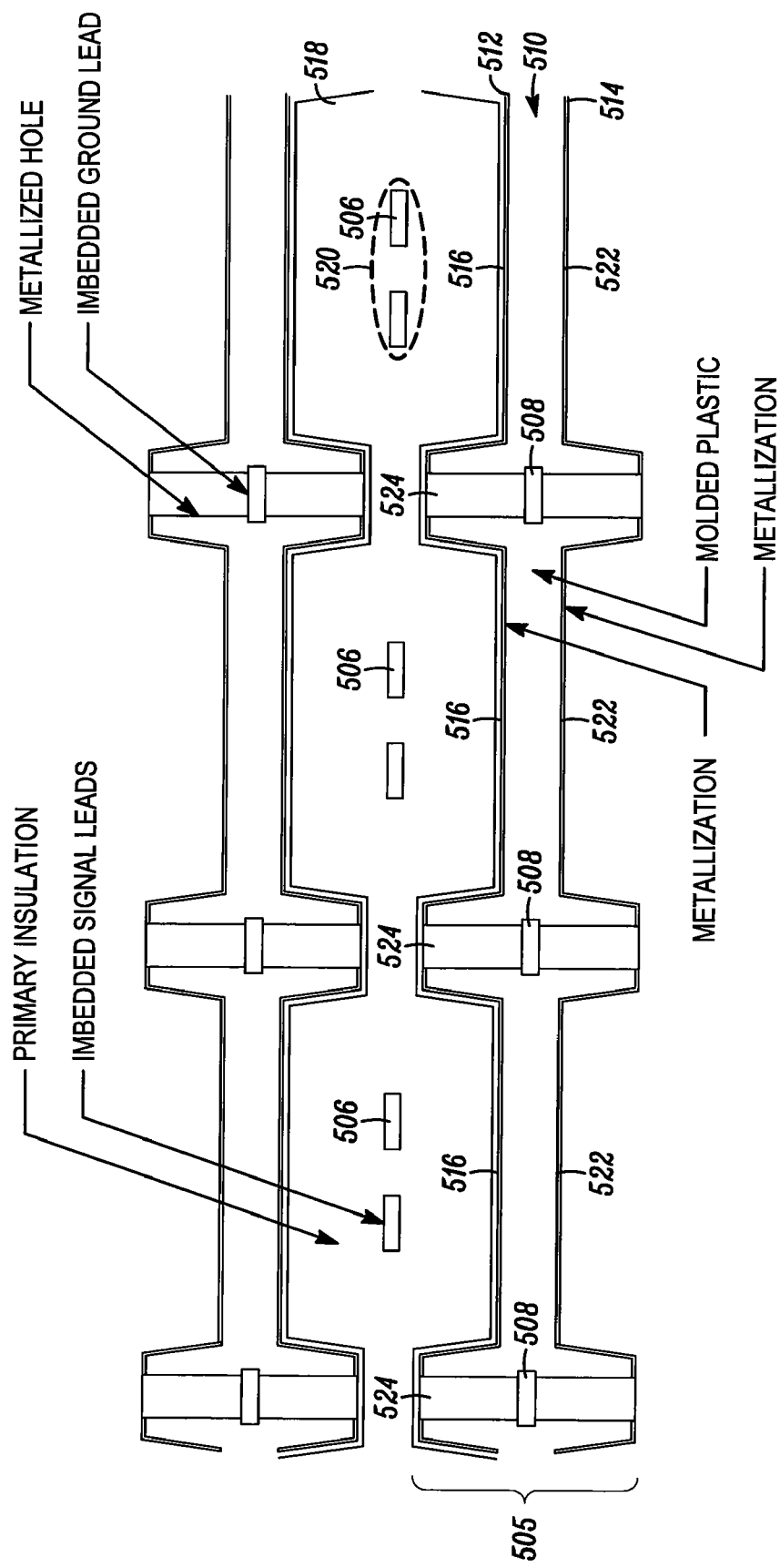
Figure 65:
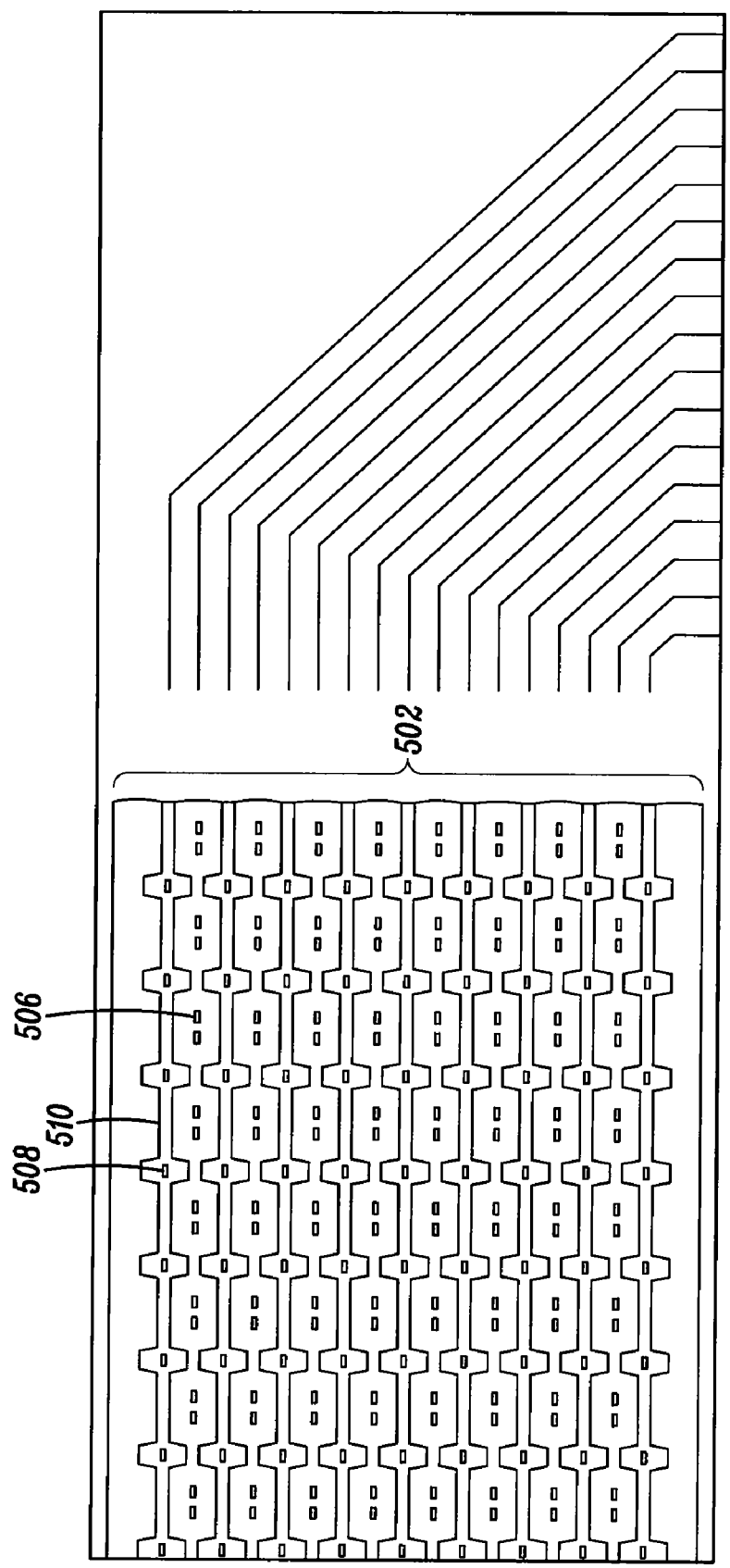

Referring to FIGS. 64 and 65, in one implementation, each wafer assembly 505 of the plurality of wafer assemblies 502 includes a plurality of electrical signal contacts 506, a plurality of groundable electric contacts 508, and a frame 510. The frame 510 defines a first side 512 and a second side 514. The first side 512 further defines a plurality of first channels 516, each of which comprises a conductive surface and is adapted to receive one or more electrical signal contacts of the plurality of electrical signal contacts 506. In some implementations, the plurality of electrical signal contacts 506 is positioned within a signal lead shell 518 that is sized to be received by the plurality of first channels 516 as shown in FIG. 64. It will be appreciated that in some implementations, two electrical signal contacts of the plurality of electrical signal contacts 506 are positioned within the signal lead shell 518 to form an electrical contact pair 520, which may additionally be a differential pair.

The second side 514 of the frame 510 may also define a plurality of second channels 522. Each channel of the plurality of second channels 522 includes a conductive surface and is adapted to receive one or more electrical signal contacts, as explained in more detail below.

The frame 510 further includes a plurality of apertures 524 extending into the conductive surface of the plurality of first channels 516. In some implementations, the plurality of apertures 524 may also extend into the conductive surface of the plurality of second channels 522.

As shown in FIG. 64, each aperture of the plurality of apertures 524 is spaced apart from another aperture of the plurality of apertures along the frame 510, and is positioned on the frame 510 between channels of the plurality of first channels 516. Each aperture of the plurality of apertures 524 is adapted to receive a groundable electric contact of the plurality of groundable electric contacts 508. In some implementations, the plurality of gorundable electric contacts 508 are electrically connected to the conductive surfaces of the first and second sides 512, 514.

A wafer housing, such as the wafer housing described above 104, 204, and 304, receives a mating end 526 of the plurality of wafer assemblies 502 and positions each wafer assembly adjacent to another wafer assembly of the plurality of wafer assemblies 502. When positioned in the wafer housing 504, the signal lead shell 518 engaging the first side 514 of the frame 510 also engages the second side 514 of the frame 510 of an adjacent wafer assembly.

Figure 66A:
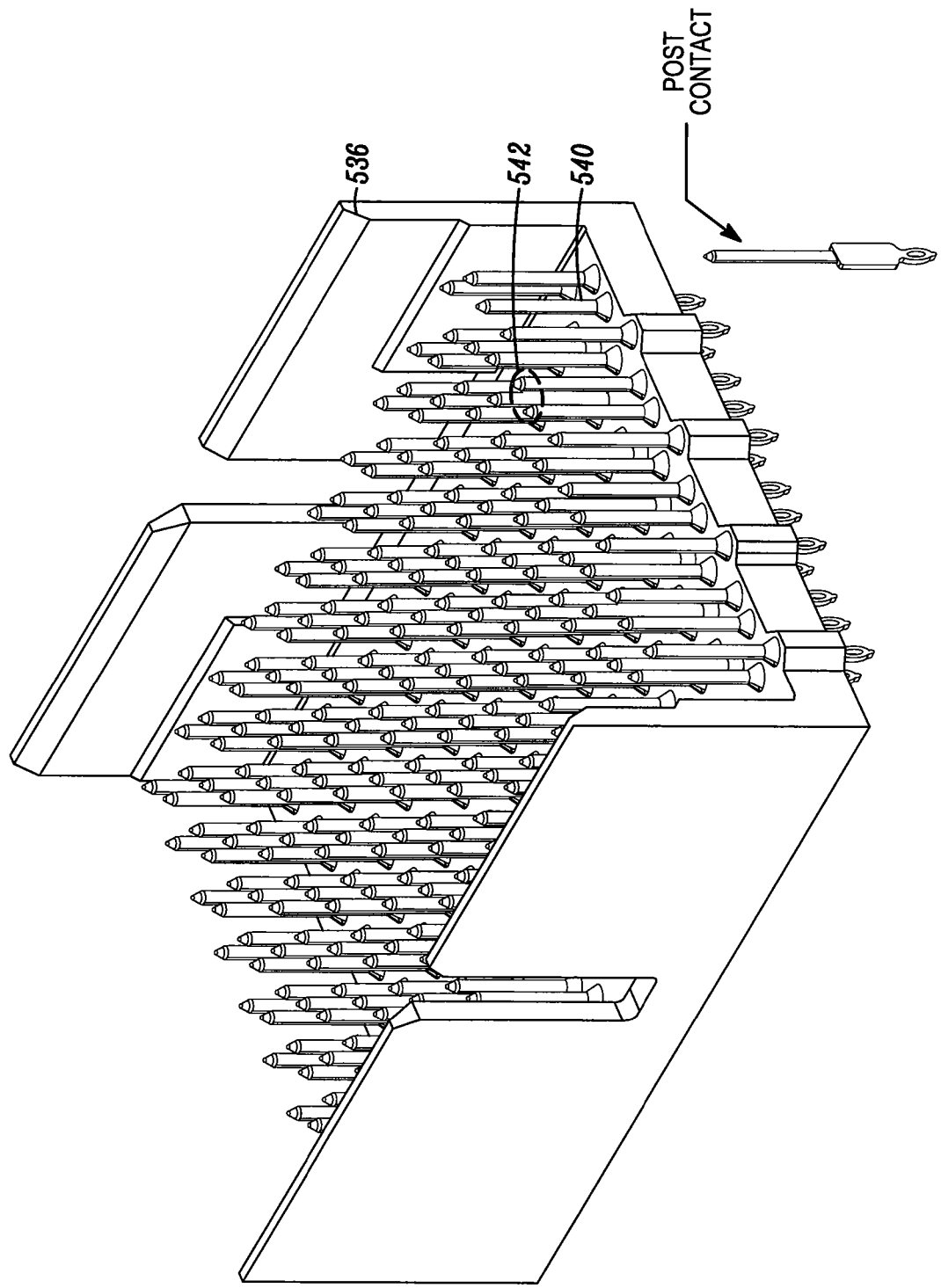
Figure 66B:
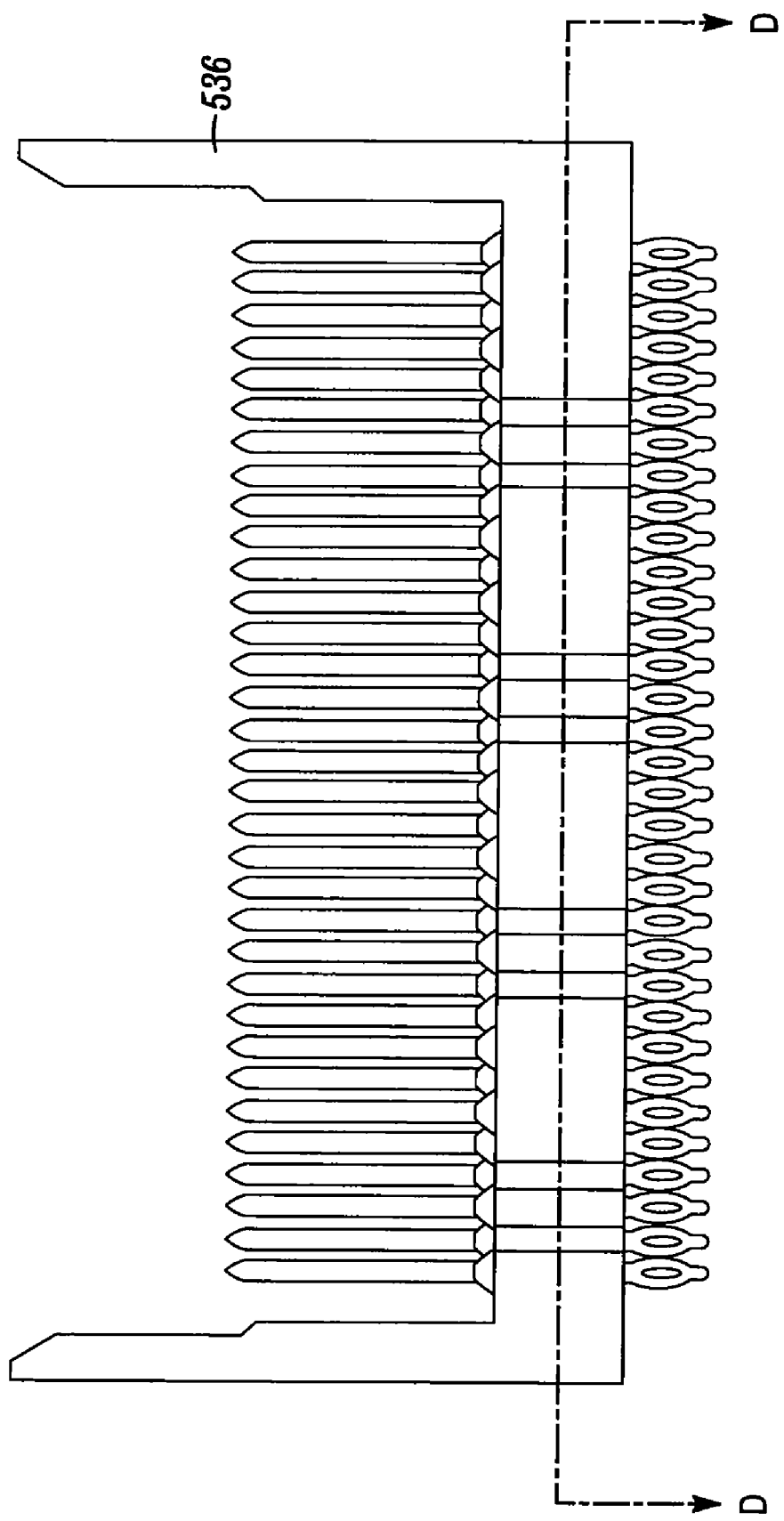
Figure 67:
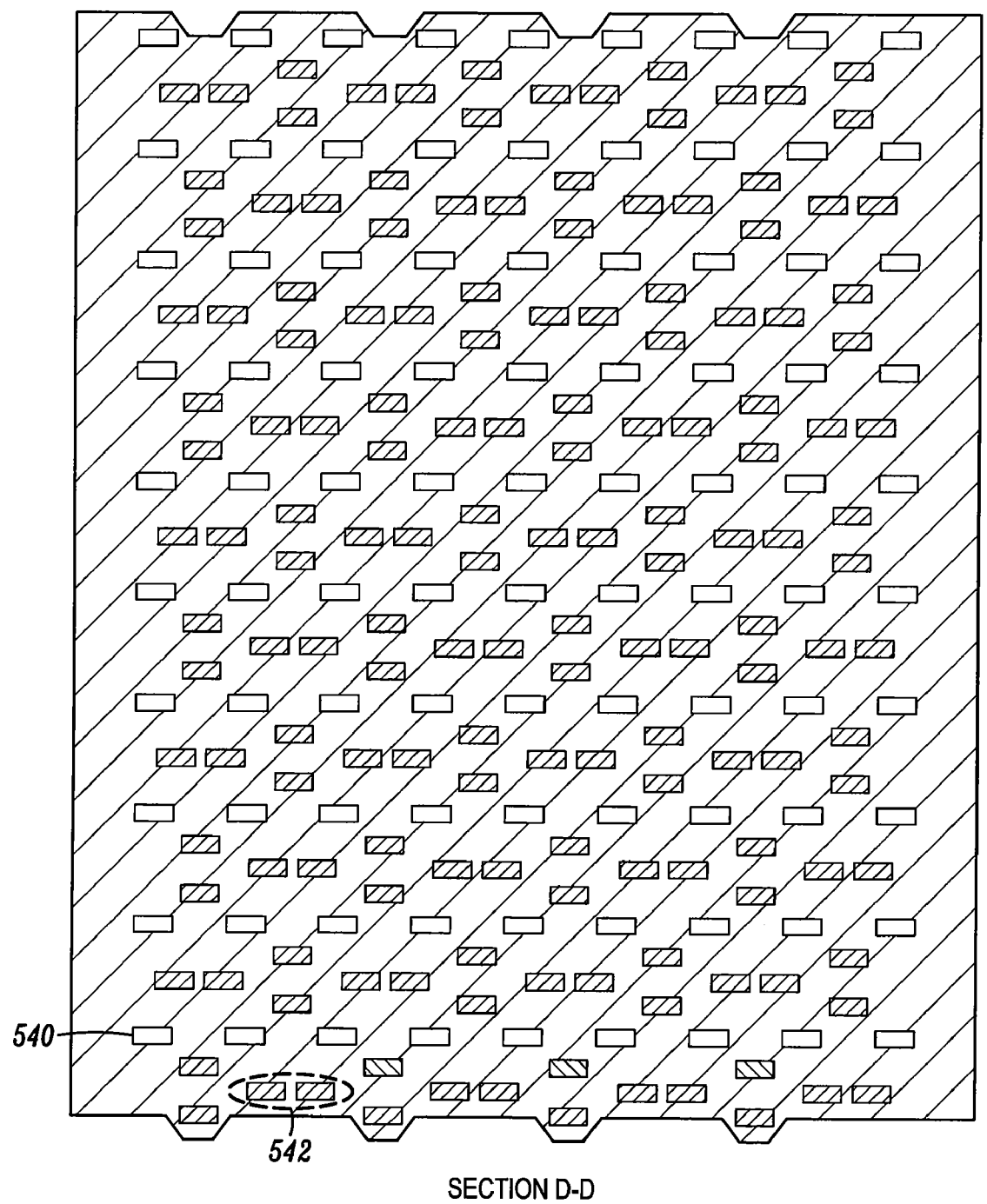

As shown in FIGS. 66a, 66b, and 67, the connector system 500 includes a header unit 536 adapted to mate with a wafer housing and the plurality of wafer assemblies 502. When the header unit 536 mates with the wafer housing and plurality of wafer assemblies 502, the electrical signal contacts 506 of the wafer assemblies 502 receive a plurality of signal pin pairs 542 extending from a mating face of the header module 536. Similarly, when the header unit 536 mates with the wafer housing and plurality of wafer assemblies 502, the ground-able electric contacts 508 receive a plurality of ground pins or ground shields 540 extending from the mating face of the header module 536.

Each signal pin of the signal pin pairs 542 defines a substrate engagement element such as a signal mounting pin 544 and each ground pin 540 defines a substrate engagement element such as a ground mounting pin 546. The signal pins 542 and ground pins 540 extend through the header unit 536 so that the signal mounting pins 544 and ground mounting pins 546 extend away from a mounting face of the header module 536 to engage a backplane circuit board or a daughtercard circuit board.

As described above, in some implementations, each pair of signal mounting pins 544 is positioned in one of two orientations, such as broadside coupled or edge coupled. In other implementations, each pair of signal mounting pins 544 is positioned in one of two orientations where in a first orientation, a pair of signal mounting pins 544 are aligned so that broadsides of the pair are substantially parallel to a substrate, and in a second orientation, a pair of signal mounting pins 544 are aligned so that the broadsides of the pair are substantially perpendicular to the substrate. Further, the signal mounting pins 544 and the ground mounting pins 546 may be positioned to create a noise-cancelling footprint, as described above with respect to FIGS. 26, 27, and 28.

Figure 68:
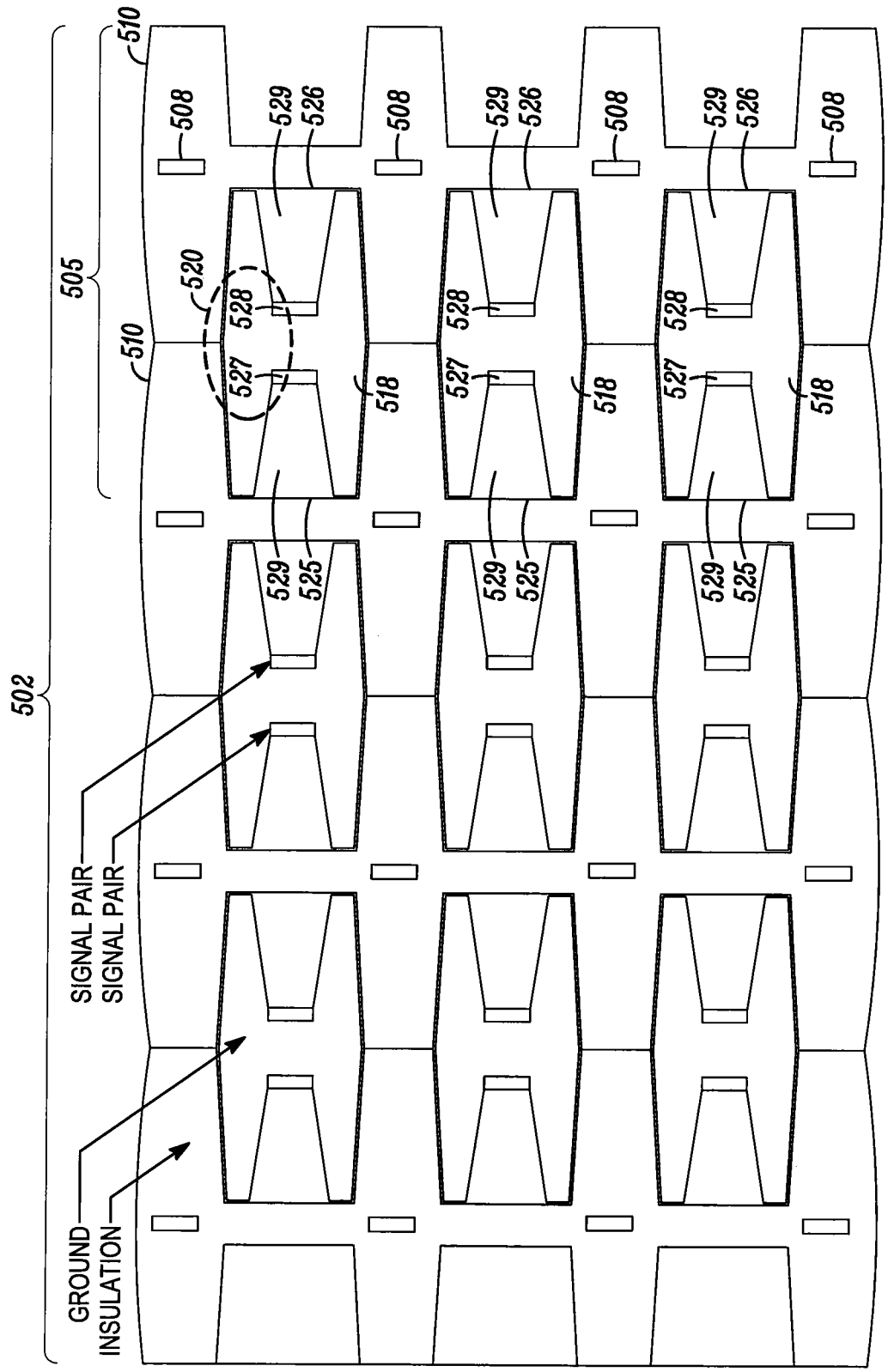

Referring to FIG. 68, in some implementations, electrical signal contacts are not embedded in a signal lead shell 518, but are positioned within channels of the signal lead shell 518. For example, the signal lead shell 518 may define a plurality of first channels 525 and a plurality of second channels 526. A first array of electrical contacts 527 is positioned within the plurality of first channels 525 and a second array of electrical contacts 528 is positioned within the plurality of second channels 526.

When positioned within the channels 525, 526, each electrical contact of the first array of electrical contacts 527 is positioned adjacent to an electrical contact of the second array of electrical contacts 528. Together, the two electrical contacts form the electrical contact pair 520, which may also be a differential pair.

When the signal lead shell 518 is positioned between a frame 510 of a wafer assembly and a frame 510 of an adjacent wafer assembly, a plurality of air gaps 529 are formed between one of the channels 525, 526 of the signal lead shell 518 and a frame 510 of a wafer assembly 505. The air gaps 529 serve to electrically isolate the electrical contact positioned in the air gap from the conductive surfaces of the channels 525, 526.

Figure 69:
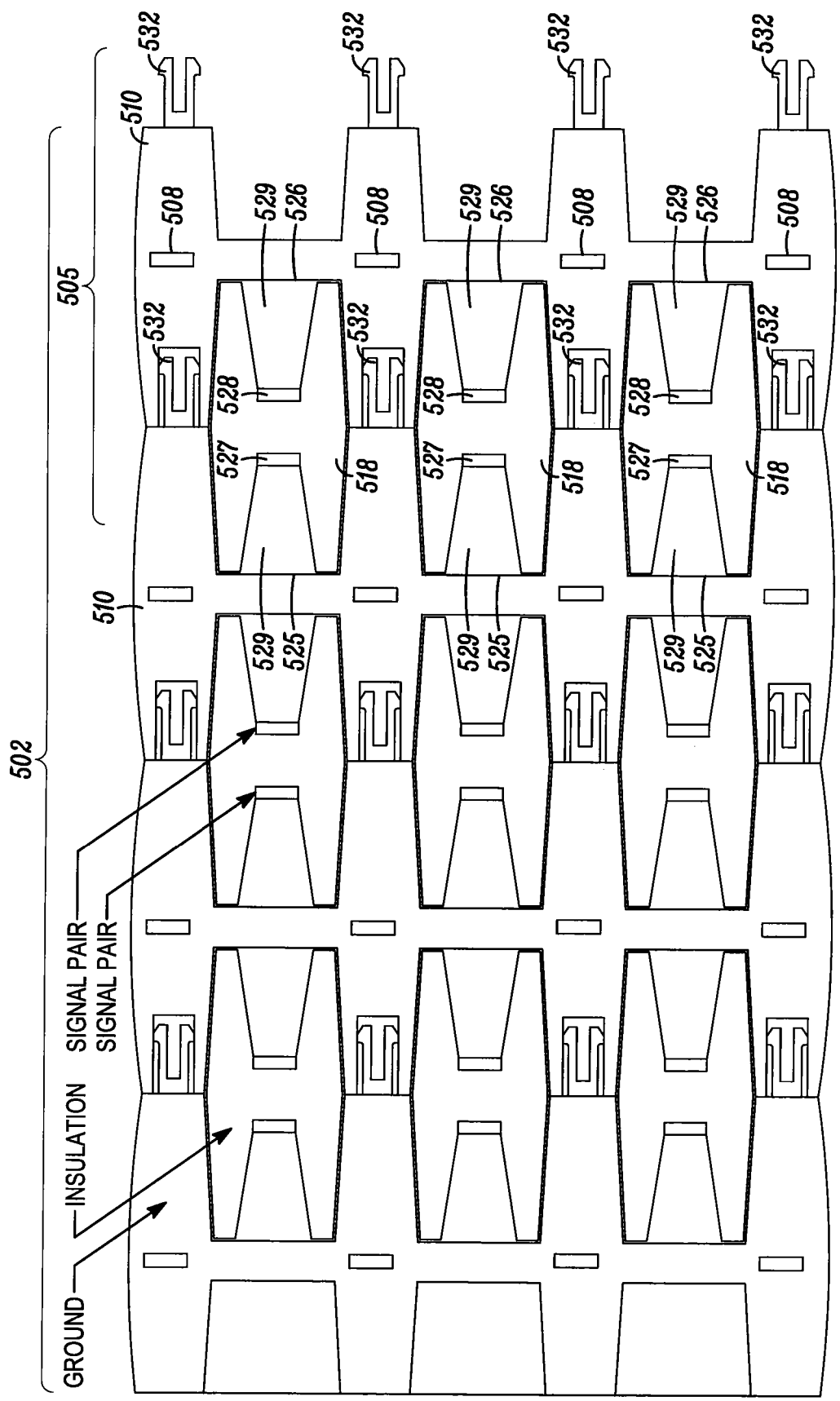

Referring to FIGS. 69 and 70, in some implementations, each wafer assembly 505 may include a locking assembly 532 to secure the plurality of wafer assemblies 502 together. For example, as shown in FIG. 68, the locking assembly 532 may be a fork that extends into an adjacent wafer assembly 505 and mates with a frame 510 of the adjacent wafer assembly 505. Alternatively, as shown in FIG. 69, the locking assembly 532 may be a wave spring that engages two adjacent wafer assemblies 505.

FIGS. 71*a*, 71*b*, 71*c*, and 71*d* are graphs illustrating an approximate performance of the high-speed connector system utilizing the wafer assemblies described above with respect to FIGS. 64-70. FIG. 71*a* is a performance plot illustrating insertion loss vs. frequency for the high-speed connector system; FIG. 71*b* is a performance plot illustrating return loss vs. frequency for the high-speed connector system; FIG. 71*c* is a performance plot illustrating near-end crosstalk noise vs. frequency for the high-speed connector system; and FIG. 71*d* is a performance plot illustrating far-end crosstalk noise vs. frequency for the high-speed connector system. As shown in FIGS. 71*a*, 71*b*, 71*c*, and 71*d*, the electrical connector system provides a substantially uniform impedance profile to electrical signals carried on the electrical contacts 506 operating at speeds of up to at least 25 Gbps.

While various high-speed backplane connector systems have been described with reference to particular embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An electrical connector system for mounting a substrate, the system comprising:
   a plurality of wafer assemblies, each wafer assembly comprising:
      a plurality of electrical contacts;
      a frame defining a first side and a second side, the first side defining a plurality of channels, each channel comprising a conductive surface and each channel adapted to receive at least one electrical contact of the plurality of electrical contacts;
      wherein the frame further defines a plurality of apertures extending into the conductive surfaces of the plurality of channels, the apertures spaced apart from one another and positioned between the channels of the plurality of channels; and
      a plurality of ground-able contacts, each ground-able contact positioned within an aperture of the plurality of apertures; and
   a wafer housing to position the wafer assemblies adjacent to one another in the electrical connector system.

2. The electrical connector system of claim 1, wherein for each wafer assembly, the second side of the frame defines a plurality of channels, each channel comprising a conductive surface and each channel adapted to receive at least one electrical contact of a plurality of electrical contacts of an adjacent wafer assembly.

3. The electrical connector system of claim 1, wherein the frame of each wafer assembly is conductive.

4. The electrical connector system of claim 1, wherein for each wafer assembly, each channel of the plurality of channels receives two electrical contacts of the plurality of electrical contacts.

5. The electrical connector system of claim 4, wherein the two electrical contacts received by a channel form a differential pair.

6. The electrical connector system of claim 4, wherein the two electrical contacts received by a channel are electrically isolated from the conductive surfaces of other channels of the plurality of channels.

7. The electrical connector system of claim 1, wherein the conductive surfaces of the plurality of channels are electrically connected to the plurality of ground-able contacts.

8. The electrical connector system of claim 1, wherein the plurality of electrical contacts are positioned in a signal lead shell.

9. The electrical connector system of claim 1, wherein each wafer assembly comprises a locking assembly to mate with an adjacent wafer assembly.

10. A wafer assembly comprising:
- a plurality of electrical contacts positioned in a signal lead shell;
- a frame defining a first side and a second side, the first side defining a plurality of channels, each channel comprising a conductive surface and each channel adapted to receive at least a portion of the signal lead shell holding at least two electrical contacts;
- wherein the frame further defines a plurality of apertures extending into the conductive surfaces of the plurality of channels, the apertures spaced apart from one another and positioned on the frame between the channels of the plurality of channels; and
- a plurality of ground-able contacts, each ground-able contact positioned within an aperture of the plurality of apertures.

11. The wafer assembly of claim 10, wherein the second side of the frame comprises a plurality of channels, each channel comprising a conductive surface and each channel adapted to receive at least a portion of a signal lead shell of another wafer assembly.

12. The wafer assembly of claim 10, wherein the frame is conductive.

13. The wafer assembly of claim 10, wherein the at least two signal contacts positioned in a portion of the signal lead shell received by a channel are electrically isolated from the conductive surfaces of other channels of the plurality of channels.

14. The wafer assembly of claim 10, wherein the conductive surfaces of the plurality of channels are electrically connected to the plurality of ground-able contacts.

15. The wafer assembly of claim 10, further comprising a locking assembly to mate with another wafer assembly.

16. The wafer assembly of claim 15, wherein the locking assembly comprises a fork.

17. The wafer assembly of claim 15, wherein the locking assembly comprises a wave spring

* * * * *